US012295254B2

(12) United States Patent
Kim et al.

(10) Patent No.: US 12,295,254 B2
(45) Date of Patent: May 6, 2025

(54) COMPOUND FOR ORGANIC OPTOELECTRONIC DEVICE, COMPOSITION FOR ORGANIC OPTOELECTRONIC DEVICE, ORGANIC OPTOELECTRONIC DEVICE, AND DISPLAY DEVICE

(71) Applicant: SAMSUNG SDI CO., LTD., Yongin-si (KR)

(72) Inventors: Jun Seok Kim, Suwon-si (KR); Yoonman Lee, Suwon-si (KR); Dong Min Kang, Suwon-si (KR); Dongyeong Kim, Suwon-si (KR); Sunwoong Shin, Suwon-si (KR); Namheon Lee, Suwon-si (KR); Byoungkwan Lee, Suwon-si (KR); Sangshin Lee, Suwon-si (KR); Kipo Jang, Suwon-si (KR); Jinseok Jang, Suwon-si (KR); Eunjeong Choi, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 754 days.

(21) Appl. No.: 17/223,461

(22) Filed: Apr. 6, 2021

(65) Prior Publication Data

US 2021/0328149 A1 Oct. 21, 2021

(30) Foreign Application Priority Data

Apr. 7, 2020 (KR) ........................ 10-2020-0042305

(51) Int. Cl.
*H10K 85/60* (2023.01)
*H10K 50/11* (2023.01)
(Continued)

(52) U.S. Cl.
CPC ......... *H10K 85/631* (2023.02); *H10K 85/654* (2023.02); *H10K 85/6572* (2023.02);
(Continued)

(58) Field of Classification Search
None
See application file for complete search history.

(56) References Cited

U.S. PATENT DOCUMENTS

| | | | |
|---|---|---|---|
| 5,061,569 | A | 10/1991 | Vanslyke et al. |
| 9,893,300 | B1 | 2/2018 | Cheng et al. |

(Continued)

FOREIGN PATENT DOCUMENTS

| | | | |
|---|---|---|---|
| CN | 101090893 | A | 12/2007 |
| CN | 104341354 | A | 2/2015 |

(Continued)

OTHER PUBLICATIONS

Notice of Allowance, issued on Feb. 13, 2024, in connection with the corresponding Korean Patent Application No. 10-2020-0042305.

(Continued)

*Primary Examiner* — Jeffrey D Washville
(74) *Attorney, Agent, or Firm* — Lee IP Law, P.C.

(57) ABSTRACT

A compound for an organic optoelectronic device, a composition for an organic optoelectronic device including the
(Continued)

same, an organic optoelectronic device, and a display device, the compound being represented by a combination of Chemical Formula 1 and Chemical Formula 2:

[Chemical Formula 1]

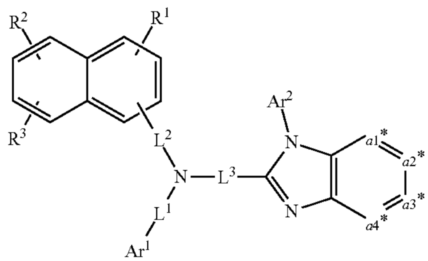

[Chemical Formula 2]

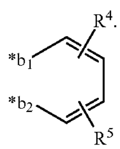

16 Claims, 1 Drawing Sheet

(51) Int. Cl.
*H10K 101/00* (2023.01)
*H10K 101/10* (2023.01)

(52) U.S. Cl.
CPC .......... *H10K 50/11* (2023.02); *H10K 2101/10* (2023.02); *H10K 2101/90* (2023.02)

(56) References Cited

U.S. PATENT DOCUMENTS

2007/0018155 A1* 1/2007 Bae ...................... C07D 401/04 428/917
2014/0151661 A1 6/2014 Miyata
2022/0209127 A1* 6/2022 Kim ...................... H10K 85/633

FOREIGN PATENT DOCUMENTS

| | | | |
|---|---|---|---|
| CN | 104592124 | A | 5/2015 |
| CN | 108203406 | A | 6/2018 |
| CN | 108218787 | A | 6/2018 |
| CN | 108558768 | A | 9/2018 |
| CN | 109761967 | A | 5/2019 |
| JP | 1993-009471 | A | 1/1993 |
| JP | 1995-126615 | A | 5/1995 |
| JP | 1998-095973 | A | 4/1998 |
| JP | 2016-225486 | A | 12/2016 |
| KR | 10-2007-0012220 | A | 1/2007 |
| KR | 10-2016-0064433 | A | 6/2016 |
| KR | 10-2046983 | B1 | 11/2019 |
| KR | 10-2020-0017728 | A | 2/2020 |
| KR | 10-2021-0035041 | A | 3/2021 |
| WO | WO 1995-009147 | A1 | 4/1995 |
| WO | WO 2013/094951 | A1 | 6/2013 |

OTHER PUBLICATIONS

Chinese Office Action (including a search report) dated Nov. 30, 2023, of the corresponding Chinese Patent Application No. 202110366986.4.

* cited by examiner

COMPOUND FOR ORGANIC OPTOELECTRONIC DEVICE, COMPOSITION FOR ORGANIC OPTOELECTRONIC DEVICE, ORGANIC OPTOELECTRONIC DEVICE, AND DISPLAY DEVICE

CROSS-REFERENCE TO RELATED APPLICATION

Korean Patent Application No. 10-2020-0042305, filed on Apr. 7, 2020, in the Korean Intellectual Property Office, and entitled: "Compound for Organic Optoelectronic Device, Composition for Organic Optoelectronic Device, Organic Optoelectronic Device, and Display Device," is incorporated by reference herein in its entirety.

BACKGROUND

1. Field

Embodiments relate to a compound for an organic optoelectronic device, a composition for an organic optoelectronic device, an organic optoelectronic device, and a display device.

2. Description of the Related Art

An organic optoelectronic device (organic optoelectronic diode) is a device capable of converting electrical energy and optical energy to each other.

Organic optoelectronic devices may be divided into two types according to a principle of operation. One type includes a photoelectric device that generates electrical energy by separating excitons formed by light energy into electrons and holes, and transferring the electrons and holes to different electrodes, respectively and the other type includes light emitting device that generates light energy from electrical energy by supplying voltage or current to the electrodes.

Examples of the organic optoelectronic device include an organic photoelectric device, an organic light emitting diode, an organic solar cell, and an organic photo conductor drum.

Among them, organic light emitting diodes (OLEDs) are attracting much attention in recent years due to increasing demands for flat panel display devices. The organic light emitting diode is a device that converts electrical energy into light, and the performance of the organic light emitting diode is greatly influenced by an organic material between electrodes.

SUMMARY

The embodiments may be realized by providing a compound for an organic optoelectronic device, the compound being represented by a combination of Chemical Formula 1 and Chemical Formula 2:

[Chemical Formula 1]

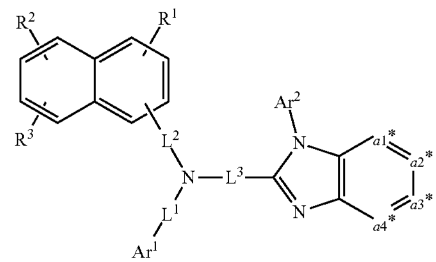

[Chemical Formula 2]

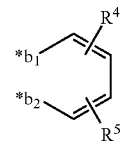

wherein, in Chemical Formula 1 and Chemical Formula 2, $Ar^1$ and $Ar^2$ are each independently a substituted or unsubstituted C6 to C30 aryl group, $L^1$ and $L^2$ are each independently a single bond, or a substituted or unsubstituted C6 to C30 arylene group, $L^3$ is a substituted or unsubstituted C6 to C30 arylene group, *b1 and *b2 of Chemical Formula 2 are each a linking carbon (C), two adjacent ones of a1* to a4* in Chemical Formula 1 are linking carbons linked at *b1 and *b2 in Chemical Formula 2, the remaining two of a1* to a4* of Chemical Formula 1 not linked at *b1 and *b2 are $CR^a$, and $R^a$ and $R^1$ to $R^5$ are each independently hydrogen, deuterium, a cyano group, a halogen, a substituted or unsubstituted amine group, a substituted or unsubstituted C1 to C30 alkyl group, a substituted or unsubstituted C6 to C30 aryl group, a substituted or unsubstituted C2 to C30 heterocyclic group, or a combination thereof.

The compound may be represented by one of Chemical Formula 1A to Chemical Formula 1C:

[Chemical Formula 1A]

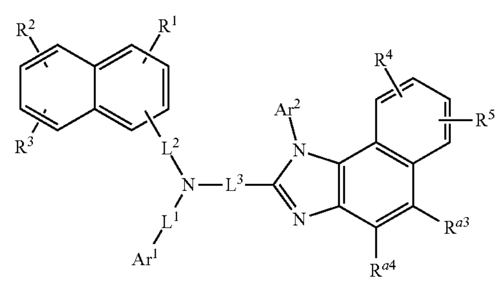

[Chemical Formula 1B]

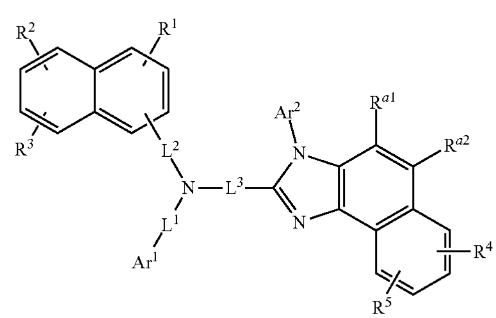

-continued

[Chemical Formula 1C]

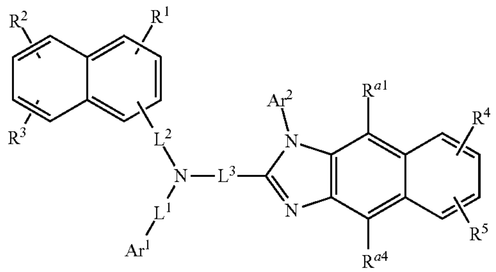

wherein, in Chemical Formula 1A to Chemical Formula 1C, $Ar^1$, $Ar^2$, $L^1$ to $L^3$, and $R^1$ to $R^5$ are defined the same as those of Chemical Formula 1 and Chemical Formula 2, and $R^{a1}$ to $R^{a4}$ are defined the same as $R^a$ of Chemical Formula 1 and Chemical Formula 2.

The compound may be represented by Chemical Formula 1A-1, Chemical Formula 1A-2, Chemical Formula 1B-2, or Chemical Formula 1C-2:

[Chemical Formula 1A-1]

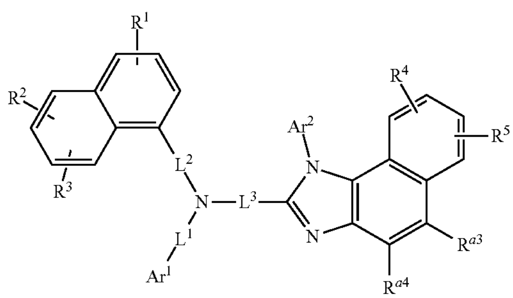

[Chemical Formula 1A-2]

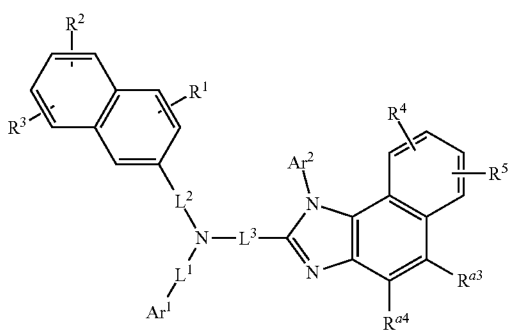

[Chemical Formula 1B-2]

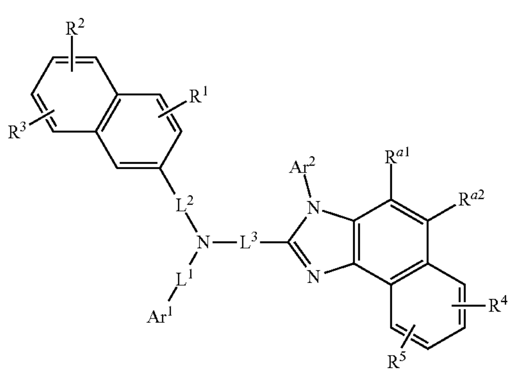

-continued

[Chemical Formula 1C-2]

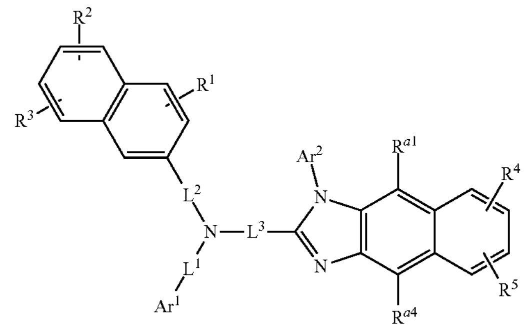

wherein, in Chemical Formula 1A-1, Chemical Formula 1A-2, Chemical Formula 1B-2, and Chemical Formula 1C-2, $Ar^1$, $Ar^2$, $L^1$ to $L^3$, $R^1$ to $R^5$, and $R^{a1}$ to $R^{a4}$ are defined the same as those of Chemical Formula 1A to Chemical Formula 1C.

The compound may be represented by Chemical Formula 1A-2, Chemical Formula 1B-2, or Chemical Formula 1C-2.

$L^3$ may be a substituted or unsubstituted C6 to C12 arylene group.

$L^3$ may be a substituted or unsubstituted meta-phenylene group or a substituted or unsubstituted para-phenylene group.

$Ar^1$ and $Ar^2$ may be each independently a substituted or unsubstituted phenyl group, a substituted or unsubstituted biphenyl group, or a substituted or unsubstituted naphthyl group, $L^1$ and $L^2$ may be each independently a single bond, a substituted or unsubstituted phenylene group, a substituted or unsubstituted biphenylene group, or a substituted or unsubstituted naphthylene group, and $R^1$ to $R^5$ may be each independently hydrogen, deuterium, a cyano group, a substituted or unsubstituted C1 to C10 alkyl group, or a substituted or unsubstituted C6 to C12 aryl group.

The compound may be a compound of Group 1:

[Group 1]

[1]

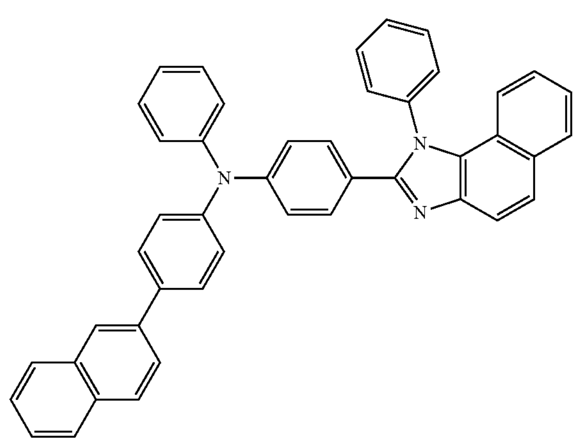

-continued
[2]
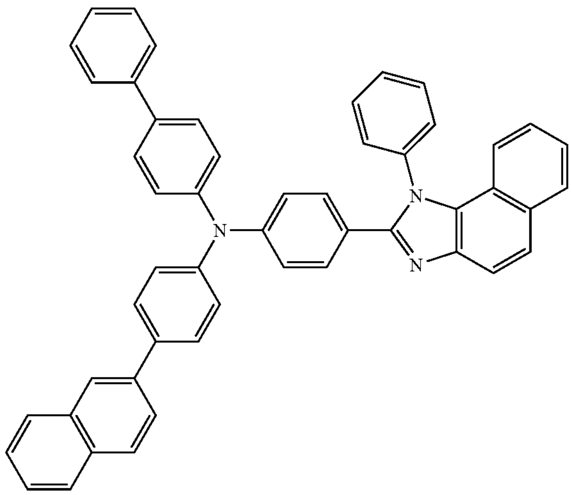
[3]
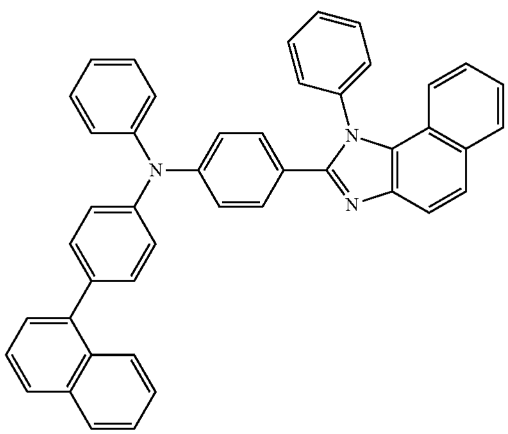
[4]
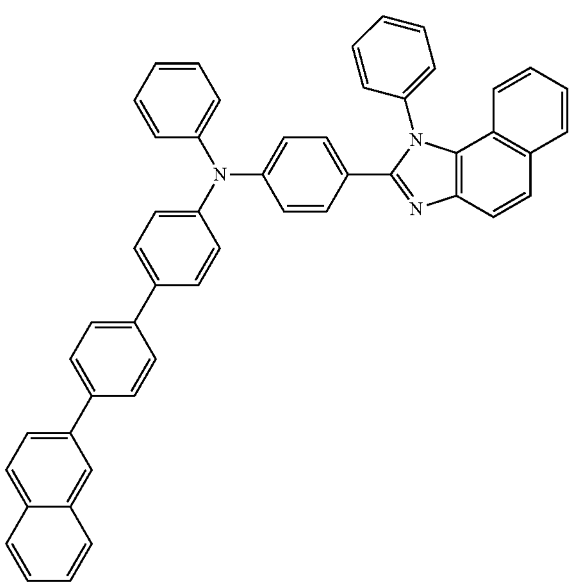
-continued
[5]
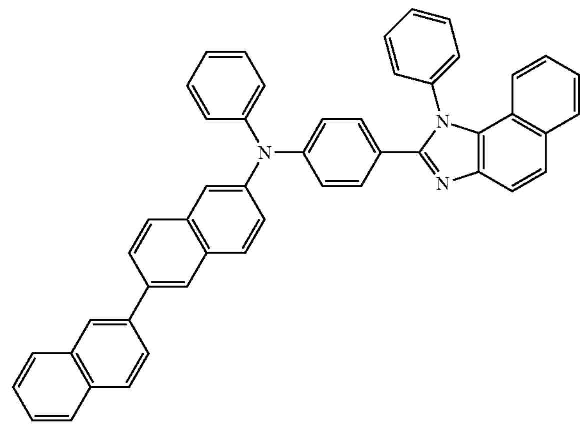
[6]
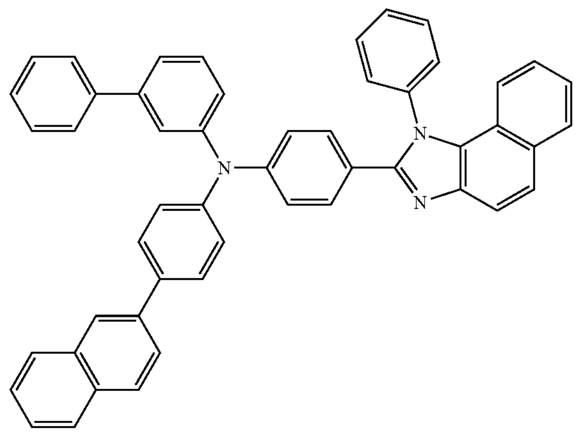
[7]
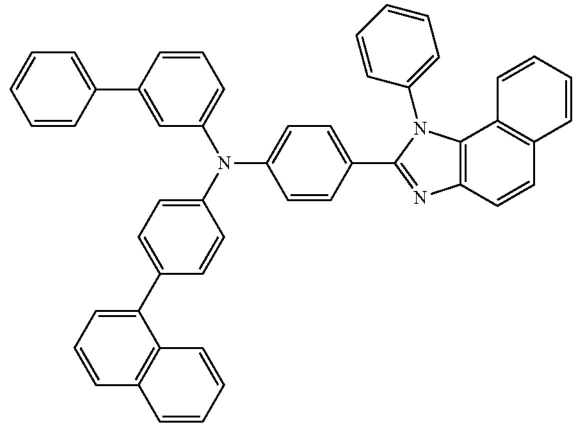

-continued
[8]
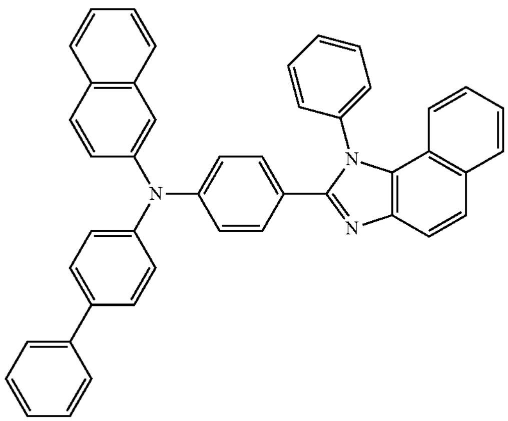
[9]
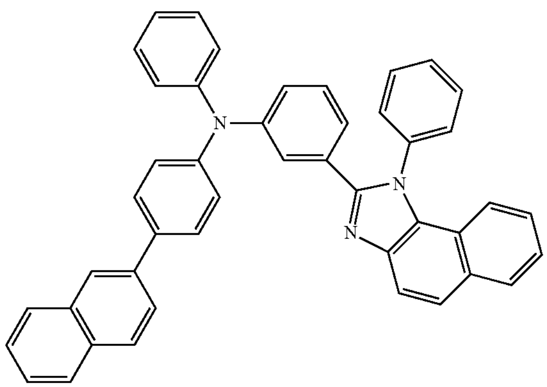
[10]
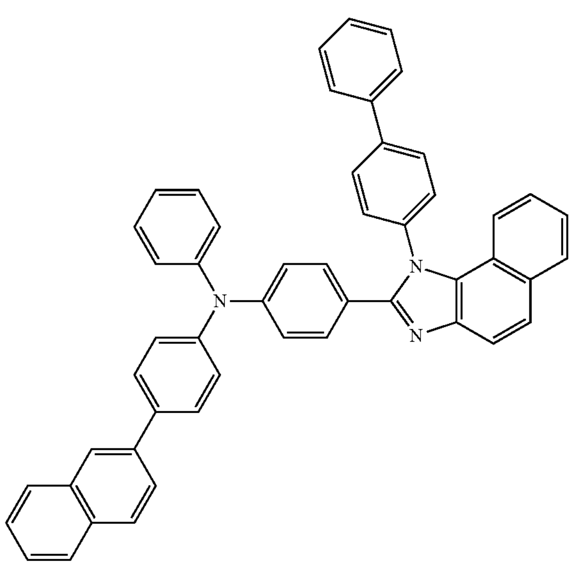
-continued
[11]
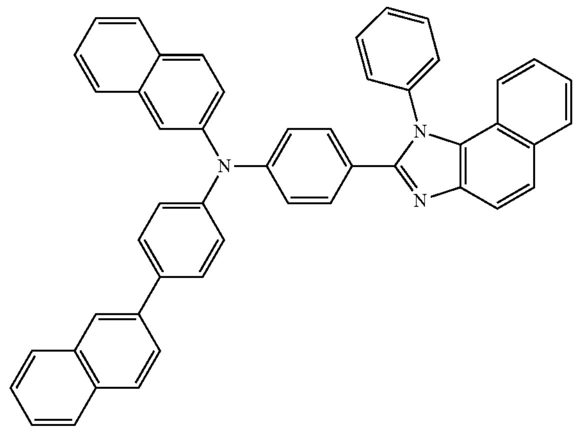
[12]
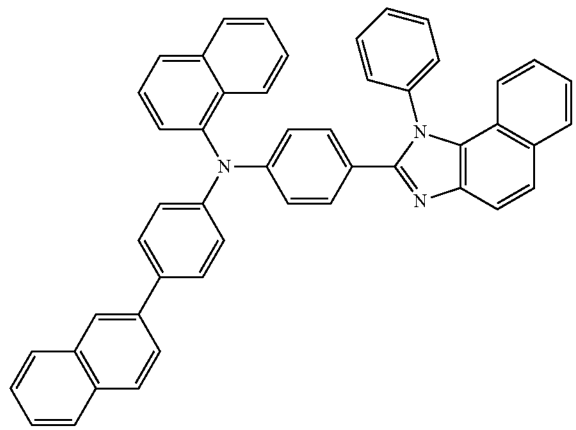
[13]
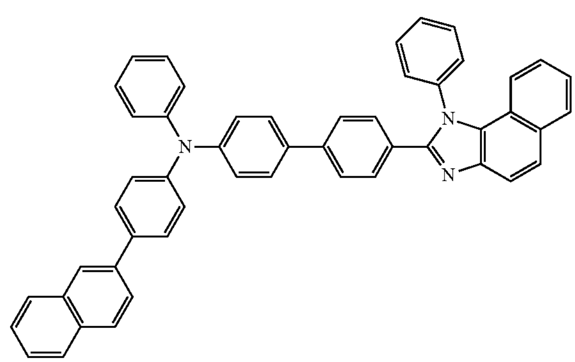

-continued
[14]
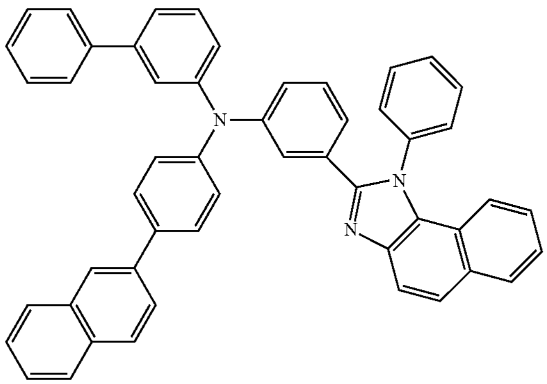
[15]
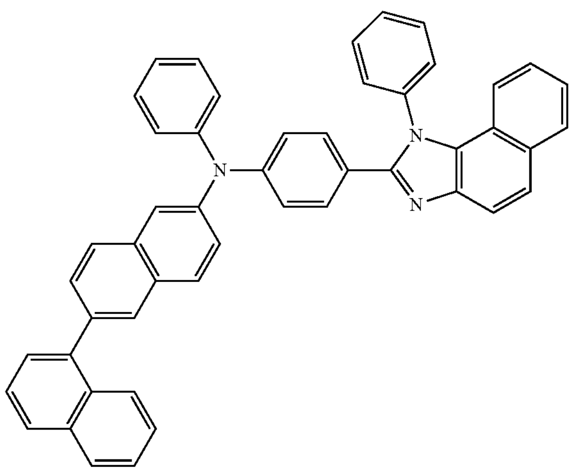
[16]
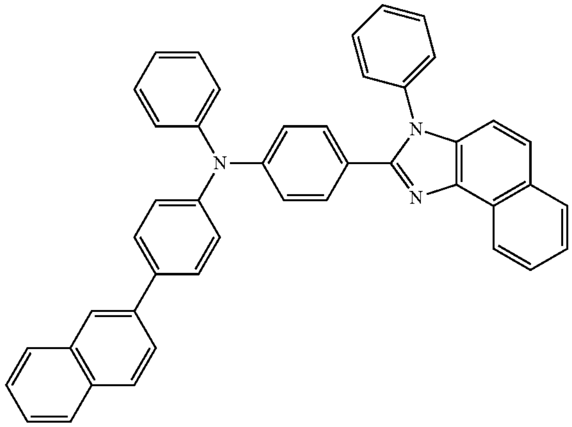
-continued
[17]
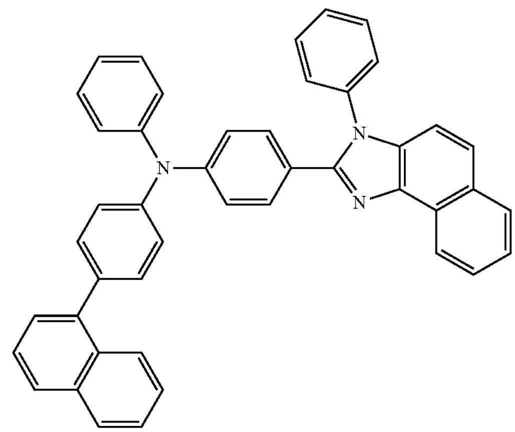
[18]
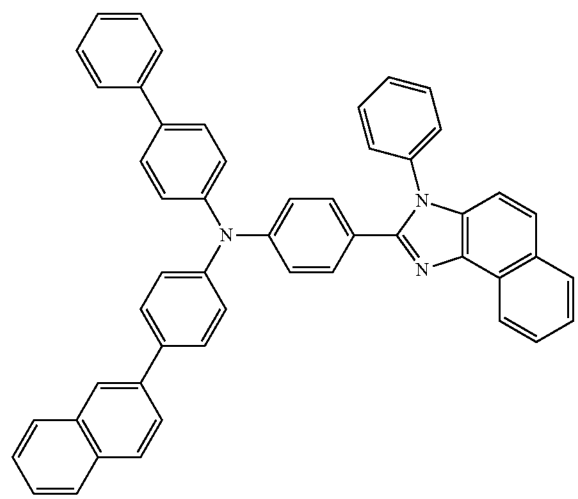
[19]
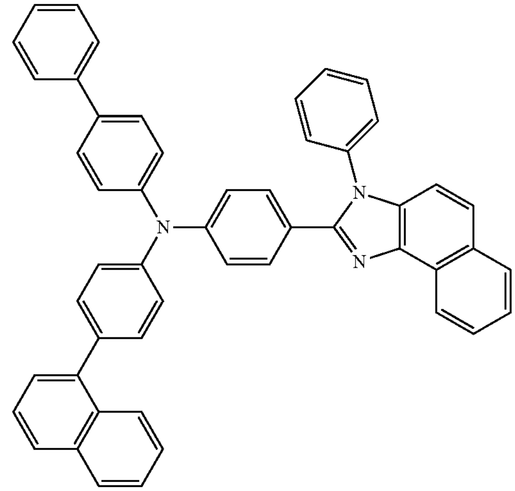

-continued
[20]
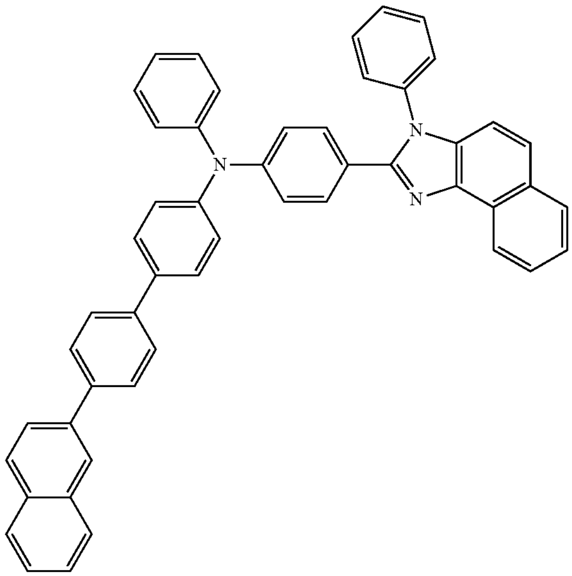
[21]
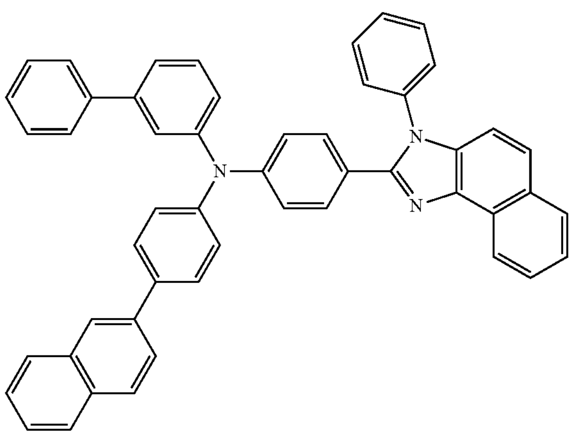
[22]
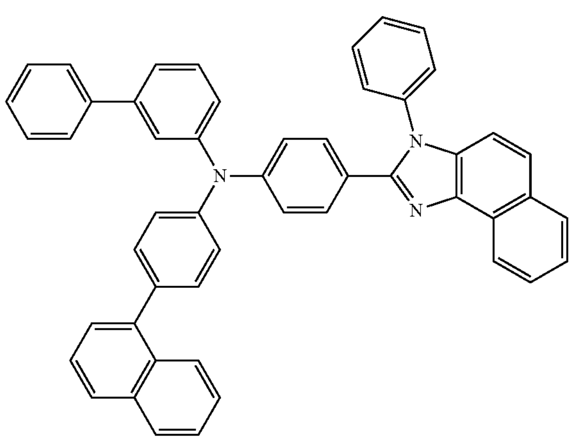
-continued
[23]
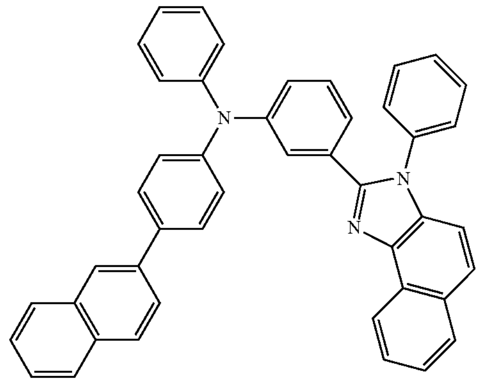
[24]
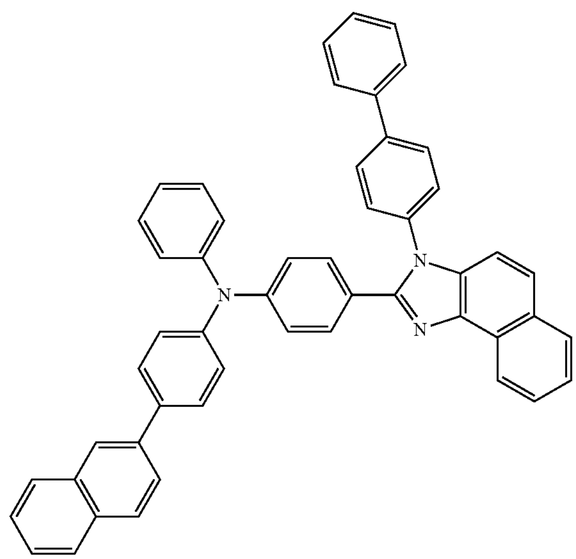
[25]
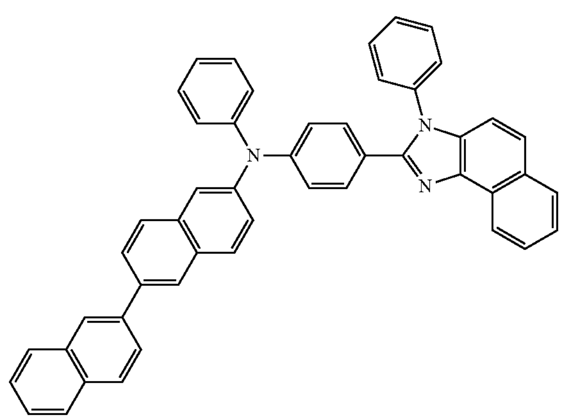

[26]
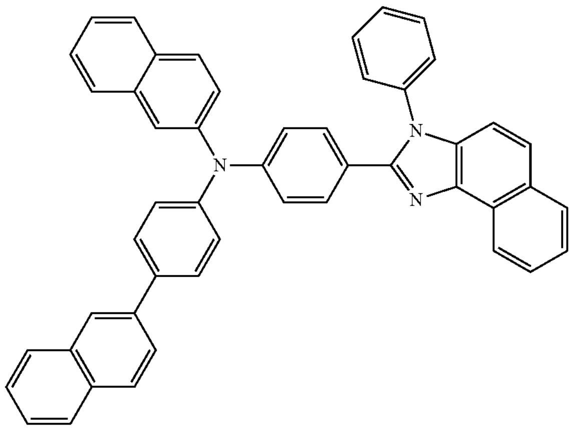
[27]
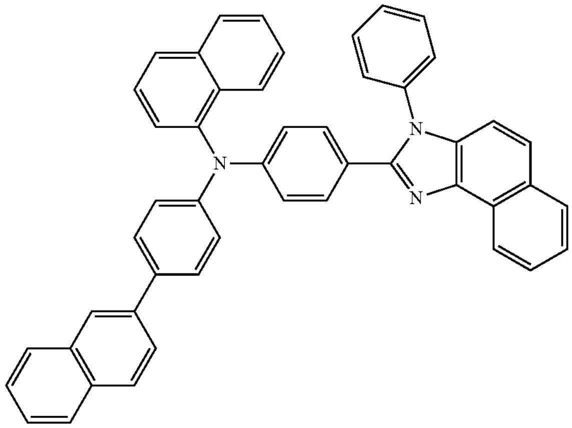
[28]
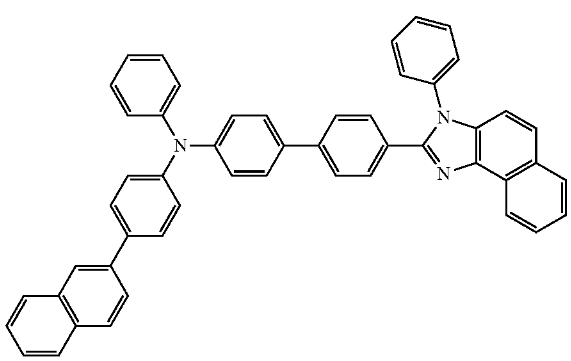
[29]
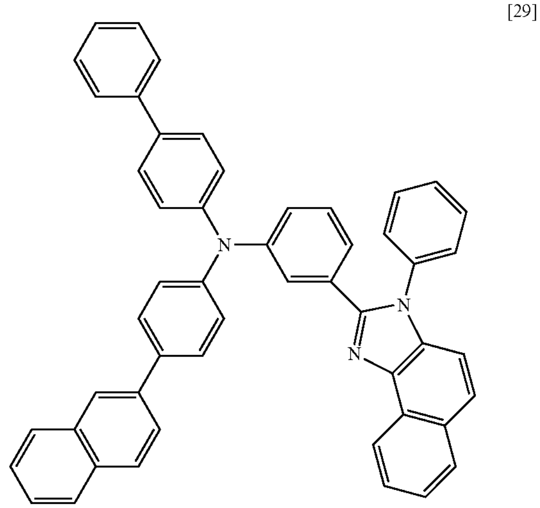
[30]
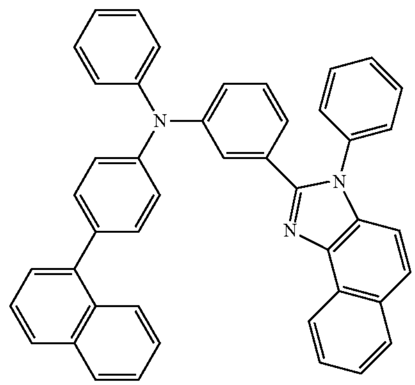
[31]
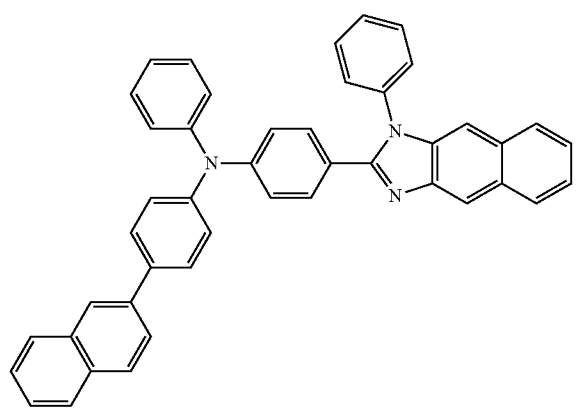

-continued
[32]
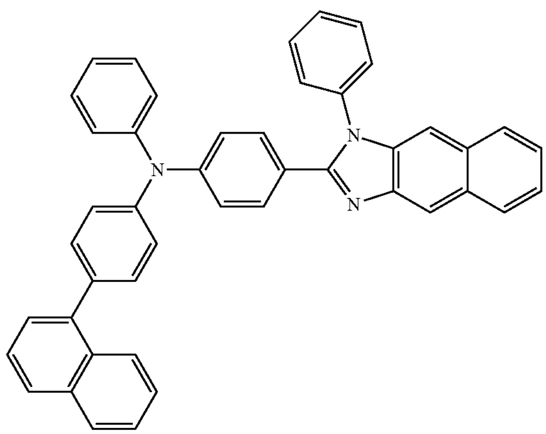
[33]
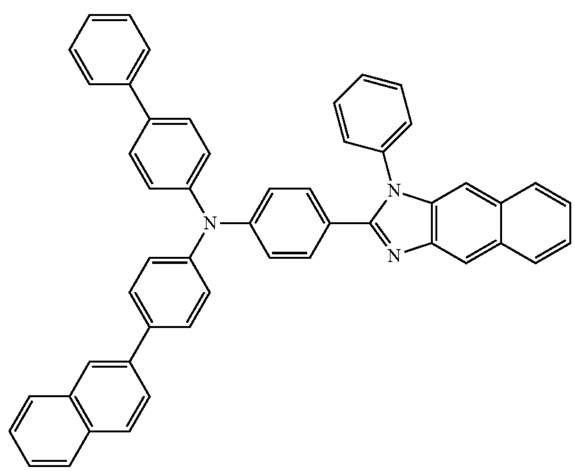
[34]
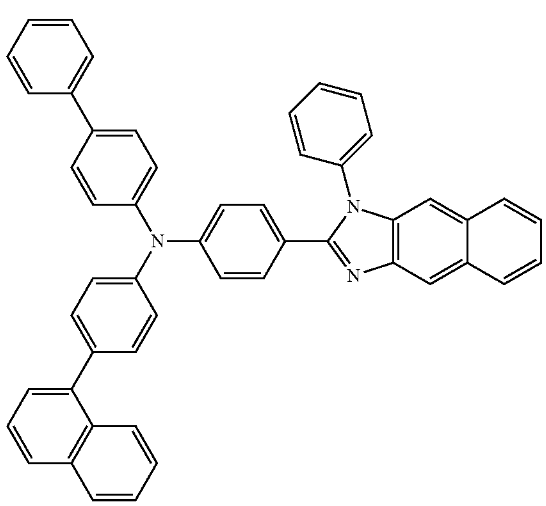
-continued
[35]
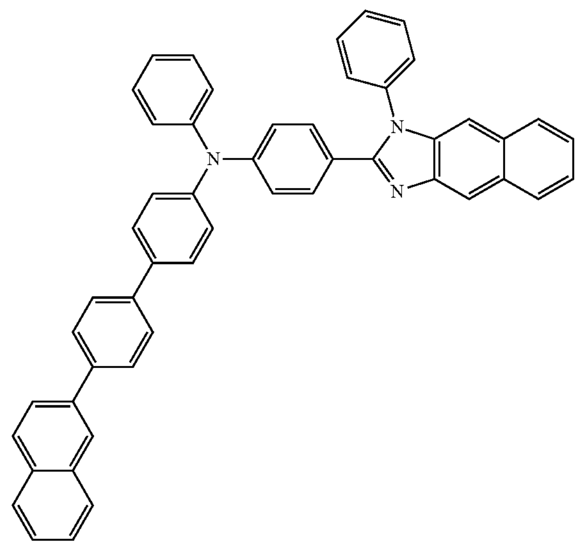
[36]
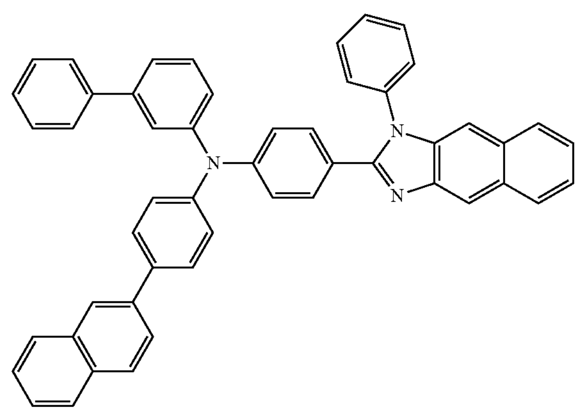
[37]
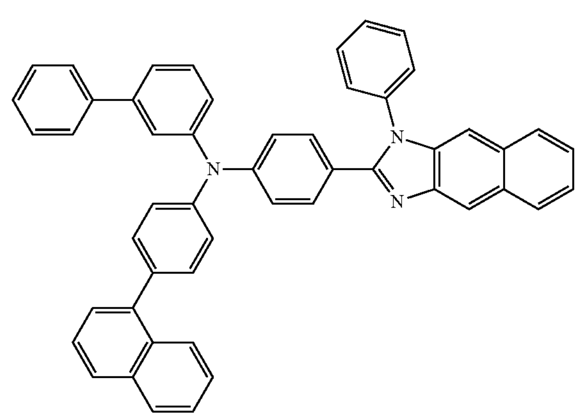

-continued

[38]

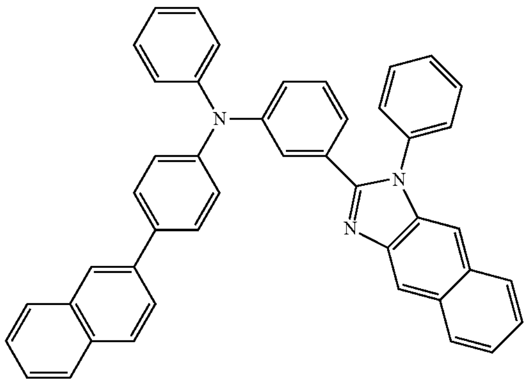

[39]

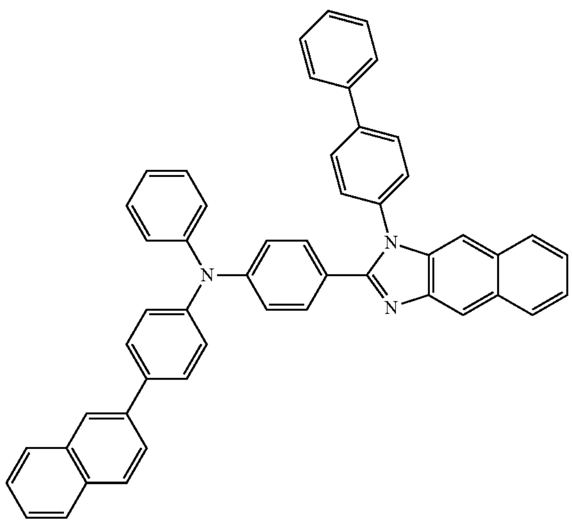

[40]

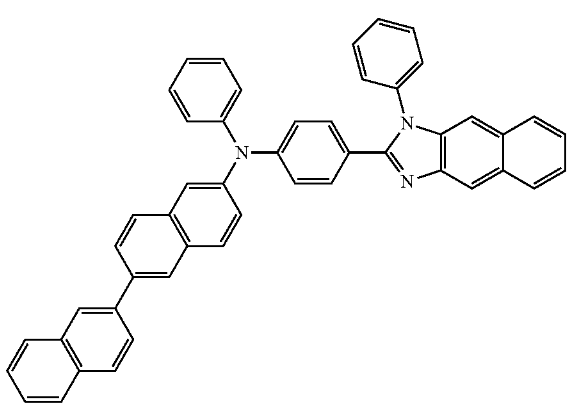

-continued

[41]

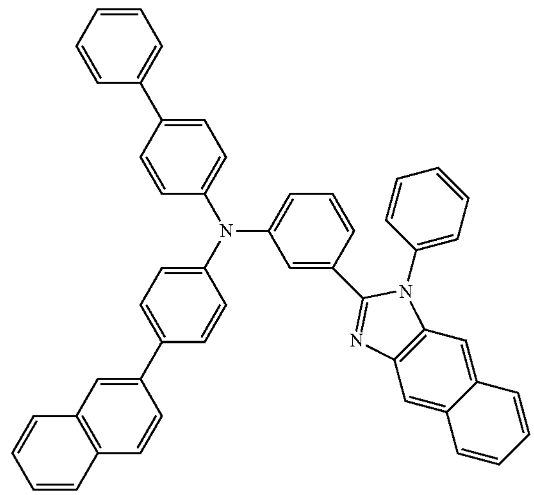

[42]

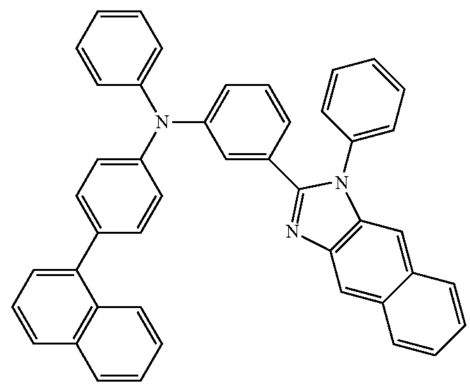

The embodiments may be realized by providing a composition for an organic optoelectronic device, the composition including a first compound for an organic optoelectronic device and a second compound for an organic optoelectronic device, wherein the first compound is the compound as claimed in claim 1, and the second compound is represented by Chemical Formula 3:

[Chemical Formula 3]

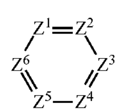

wherein, in Chemical Formula 3, $Z^1$ to $Z^6$ are each independently N or C-$L^b$-$R^b$, at least two of $Z^1$ to $Z^6$ are N, each $L^b$ is independently a single bond, a substituted or unsubstituted C6 to C20 arylene group, a substituted or unsubstituted C2 to C20 heterocyclic group, or a combination thereof, each $R^b$ is independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, and each $R^b$ is separately present or adjacent ones are linked to form a substituted or unsubstituted aliphatic monocyclic ring, a substituted or unsubstituted aliphatic polycyclic ring, a substituted or unsubstituted aromatic monocyclic ring, a substituted or unsubstituted aromatic polycyclic ring, a substituted or unsubstituted heteroaromatic monocyclic ring, or a substituted or unsubstituted heteroaromatic polycyclic ring.

The second compound represented by Chemical Formula 3 may be represented by one of Chemical Formula 3A to Chemical Formula 3C:

[Chemical Formula 3A]

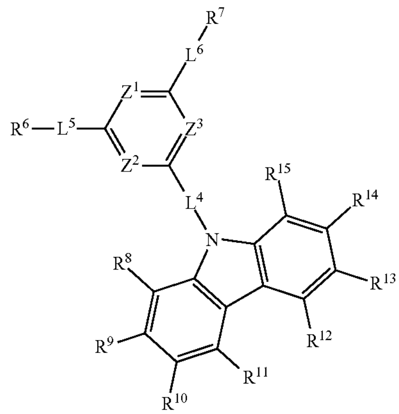

[Chemical Formula 3B]

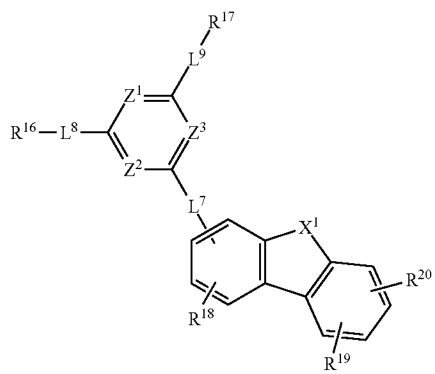

[Chemical Formula 3C]

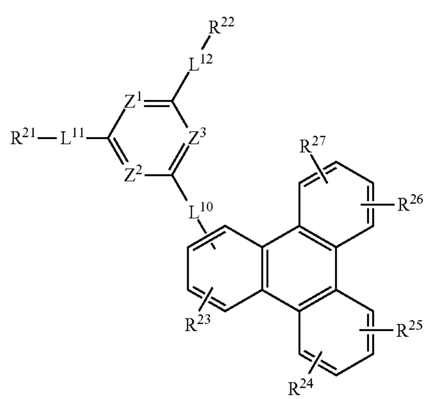

wherein, in Chemical Formulas 3A to 3C, $Z^1$, $Z^3$ and $Z^5$ are each independently N or C-$L^b$-$R^b$, at least two of $Z^1$, $Z^3$, and $Z^5$ are N, $X^1$ is O, S, or $NR^c$, $L^b$ and $L^4$ to $L^{12}$ are each independently a single bond, a substituted or unsubstituted C6 to C20 arylene group, a substituted or unsubstituted C2 to C20 heterocyclic group, or a combination thereof, $R^b$, $R^c$, and $R^6$ to $R^{27}$ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, $R^8$ to $R^{15}$ are separately present or adjacent ones thereof are linked to form a substituted or unsubstituted aromatic monocyclic or polycyclic ring, and $R^b$, $R^6$, $R^7$, $R^{16}$, $R^{17}$, $R^{21}$, and $R^{22}$ are separately present or adjacent ones among $R^b$, $R^6$, and $R^7$; $R^b$, $R^{16}$, and $R^{17}$; and $R^b$, $R^{21}$, and $R^{22}$ are linked to form a substituted or unsubstituted aromatic or heteroaromatic monocyclic ring or a substituted or unsubstituted aromatic or heteroaromatic polycyclic ring.

The second compound represented by Chemical Formula 3 may be represented by Chemical Formula 3A-IV:

[Chemical Formula 3A-IV]

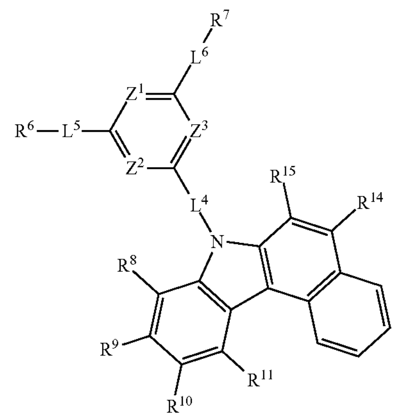

wherein, in Chemical Formula 3A-IV, $Z^1$, $Z^3$ and $Z^5$ are each independently N or C-$L^b$-$R^b$, at least two of $Z^1$, $Z^3$, and $Z^5$ are N, $L^b$ is a single bond, a substituted or unsubstituted C6 to C20 arylene group, a substituted or unsubstituted C2 to C20 heterocyclic group, or a combination thereof, $R^b$ is hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, $L^4$ to $L^6$ are each independently a single bond or a substituted or unsubstituted C6 to C12 aryl group, $R^6$ and $R^7$ are each independently a substituted or unsubstituted phenyl group, a substituted or unsubstituted biphenyl group, a substituted or unsubstituted terphenyl group, a substituted or unsubstituted naphthyl group, a substituted or unsubstituted triphenylene group, a substituted or unsubstituted dibenzofuranyl group, a substituted or unsubstituted dibenzothiophenyl group, or a substituted or unsubstituted carbazolyl group, and $R^8$ to $R^{11}$, $R^{14}$, and $R^{15}$ are each independently hydrogen, deuterium, a substituted or unsubstituted C1 to C10 alkyl group or a substituted or unsubstituted C6 to C12 aryl group.

The embodiments may be realized by providing an organic optoelectronic device including an anode and a cathode facing each other, and at least one organic layer between the anode and the cathode, wherein the at least one organic layer includes the compound according to an embodiment.

The at least one organic layer may include a light emitting layer, and the light emitting layer may include the compound.

The embodiments may be realized by providing an organic optoelectronic device including an anode and a cathode facing each other, and at least one organic layer between the anode and the cathode, wherein the at least one organic layer includes the composition according to an embodiment.

The at least one organic layer may include a light emitting layer, and the light emitting layer may include the composition.

The embodiments may be realized by providing a display device comprising the organic optoelectronic device according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
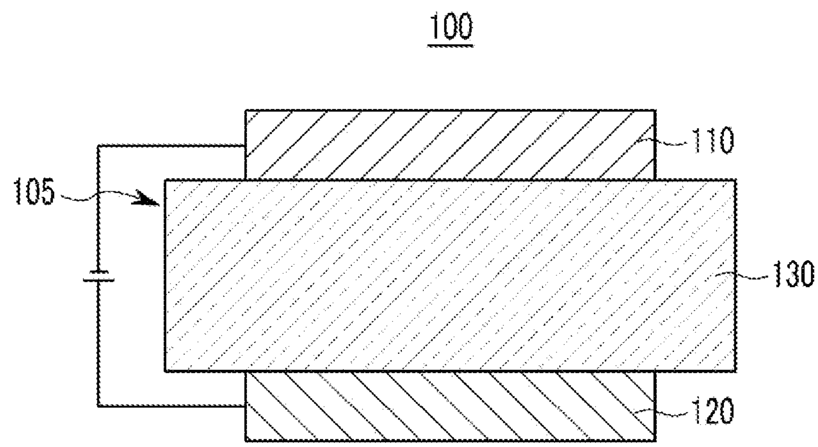
FIGS. 1 and 2 are cross-sectional views of an organic light emitting diode according to embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout. As used herein, the term "or" is not an exclusive term, e.g., "A or B" would include A, B, or A and B.

As used herein, when a definition is not otherwise provided, "substituted" refers to replacement of at least one hydrogen of a substituent or a compound by deuterium, a halogen, a hydroxyl group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, a C1 to C20 alkoxy group, a C1 to C10 trifluoroalkyl group, a cyano group, or a combination thereof.

In one example, "substituted" refers to replacement of at least one hydrogen of a substituent or a compound by deuterium, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, or a cyano group. In addition, in specific examples, "substituted" refers to replacement of at least one hydrogen of a substituent or a compound by deuterium, a C1 to C20 alkyl group, a C6 to C30 aryl group, or a cyano group. In addition, in specific examples, "substituted" refers to replacement of at least one hydrogen of a substituent or a compound by deuterium, a C1 to C5 alkyl group, a C6 to C18 aryl group, or a cyano group. In addition, in specific examples, "substituted" refers to replacement of at least one hydrogen of a substituent or a compound by deuterium, a cyano group, a methyl group, an ethyl group, a propyl group, a butyl group, a phenyl group, a biphenyl group, a terphenyl group, or a naphthyl group.

As used herein, when a definition is not otherwise provided, "hetero" refers to one including one to three heteroatoms selected from N, O, S, P, and Si, and remaining carbons in one functional group.

As used herein, "aryl group" refers to a group including at least one hydrocarbon aromatic moiety, and may include a group in which all elements of the hydrocarbon aromatic moiety have p-orbitals which form conjugation, for example a phenyl group, a naphthyl group, and the like, a group in which two or more hydrocarbon aromatic moieties may be linked by a sigma bond, for example a biphenyl group, a terphenyl group, a quarterphenyl group, and the like, and a group in which two or more hydrocarbon aromatic moieties are fused directly or indirectly to provide a non-aromatic fused ring, for example, a fluorenyl group, and the like.

The aryl group may include a monocyclic, polycyclic or fused ring polycyclic (i.e., rings sharing adjacent pairs of carbon atoms) functional group.

As used herein, "heterocyclic group" is a generic concept of a heteroaryl group, and may include at least one heteroatom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

For example, "heteroaryl group" refers to an aryl group including at least one heteroatom selected from N, O, S, P, and Si. Two or more heteroaryl groups are linked by a sigma bond directly, or when the heteroaryl group includes two or more rings, the two or more rings may be fused. When the heteroaryl group is a fused ring, each ring may include one to three heteroatoms.

More specifically, the substituted or unsubstituted C6 to C30 aryl group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, a substituted or unsubstituted furanyl group, or a combination thereof, but is not limited thereto.

More specifically, the substituted or unsubstituted C2 to C30 heterocyclic group may be a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted carbazolyl group, a substituted or unsubstituted dibenzofuranyl group, or a substituted or unsubstituted dibenzothiophenyl group, or a combination thereof, but is not limited thereto.

In the present specification, hole characteristics refer to an ability to donate an electron to form a hole when an electric field is applied and that a hole formed in the anode may be easily injected into the light emitting layer and transported in the light emitting layer due to conductive characteristics according to the highest occupied molecular orbital (HOMO) level.

In addition, electron characteristics refer to an ability to accept an electron when an electric field is applied and that electron formed in the cathode may be easily injected into the light emitting layer and transported in the light emitting layer due to conductive characteristics according to the lowest unoccupied molecular orbital (LUMO) level.

Hereinafter, a compound for an organic optoelectronic device according to an embodiment is described.

The compound for an organic optoelectronic device according to an embodiment may be represented by a combination of Chemical Formula 1 and Chemical Formula 2.

[Chemical Formula 1]

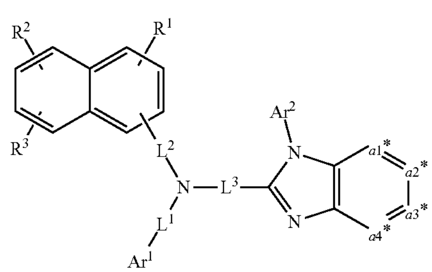

[Chemical Formula 2]

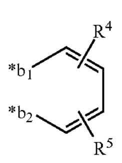

In Chemical Formula 1 and Chemical Formula 2, $Ar^1$ and $Ar^2$ may each independently be or include, e.g., a substituted or unsubstituted C6 to C30 aryl group.

$L^1$ and $L^2$ may each independently be or include, e.g., a single bond or a substituted or unsubstituted C6 to C30 arylene group.

$L^3$ may be or may include, e.g., a substituted or unsubstituted C6 to C30 arylene group.

*b1 and *b2 of Chemical Formula 2 are each a linking carbon (C).

two adjacent ones of a1* to a4* in Chemical Formula 1 may be linking carbons (C) linked at *b1 and *b2 in Chemical Formula 2, and the remaining two (e.g., that are not linking carbons linked at *b1 and *b2) may be $CR^a$. As used herein, the term "linking carbon" refers to a shared carbon at which fused rings are linked.

$R^a$ and $R^1$ to $R^5$ may each independently be or include, e.g., hydrogen, deuterium, a cyano group, a halogen, a substituted or unsubstituted amine group, a substituted or unsubstituted C1 to C30 alkyl group, a substituted or unsubstituted C6 to C30 aryl group, a substituted or unsubstituted C2 to C30 heterocyclic group, or a combination thereof.

The compound represented by the combination of Chemical Formula 1 and Chemical Formula 2 may include a naphthoimidazole and an amine group, imidazole contained in the naphthoimidazole is substituted with the amine group, and the naphthoimidazole and the amine group may have a structure linked through a substituted or unsubstituted arylene group.

In an implementation, the amine group may have a structure substituted with at least one naphthyl group.

Due to the naphthoimidazole, it is possible to help balance holes and electrons together with amine groups, and by further raising the level of HOMO energy and securing a more abundant electron cloud, more holes and electrons may be moved, and an organic light emitting diode having high efficiency/low drive/long life-span may be achieved.

In addition, the amine group may be substituted with at least one naphthyl group, and a T1 energy for the red host may be secured, resulting in high energy efficiency and long life-span effect.

The compound for an organic optoelectronic device represented by a combination of Chemical Formula 1 and Chemical Formula 2 may be represented by, e.g., Chemical Formula 1A, Chemical Formula 1B, or Chemical Formula 1C, depending on the fusion direction of naphthoimidazole.

[Chemical Formula 1A]

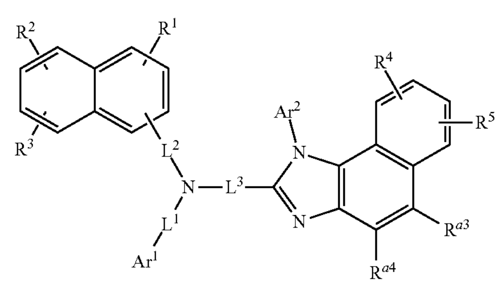

-continued

[Chemical Formula 1B]

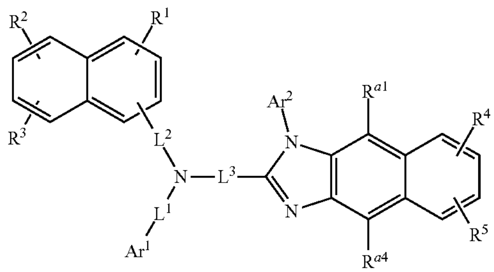

[Chemical Formula 1C]

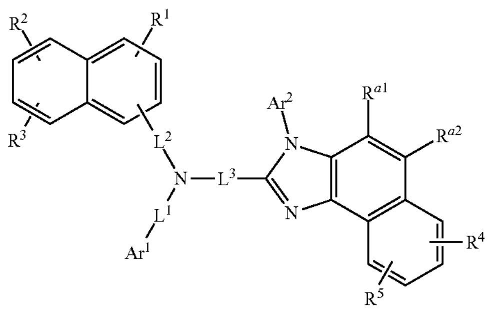

In Chemical Formula 1A to Chemical Formula 1C, $Ar^1$, $Ar^2$, $L^1$ to $L^3$, and $R^1$ to $R^5$ may be defined the same as those described above, and $R^{a1}$ to $R^{a4}$ may be defined the same as $R^a$.

In an implementation, Chemical Formula 1A may be represented by Chemical Formula 1A-1 or Chemical Formula 1A-2.

[Chemical Formula 1A-1]

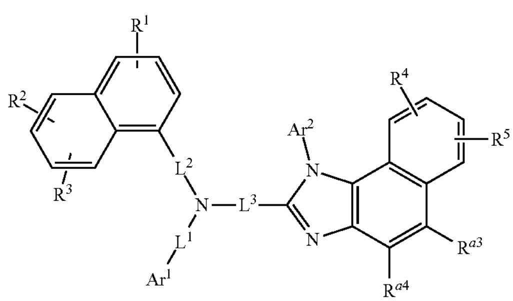

[Chemical Formula 1A-2]

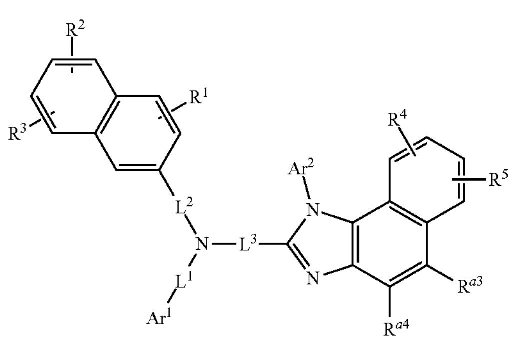

In an implementation, Chemical Formula 1B may be represented by Chemical Formula 1B-1 or Chemical Formula 1B-2.

[Chemical Formula 1B-1]

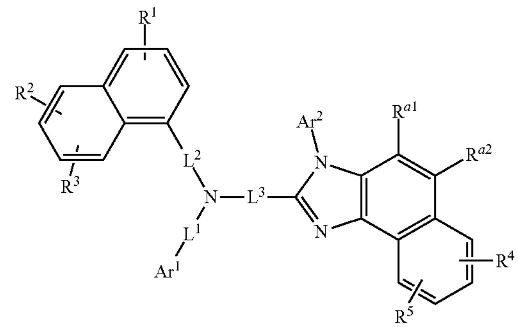

[Chemical Formula 1B-2]

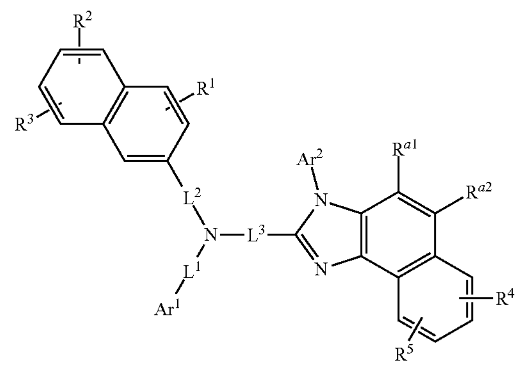

In an implementation, Chemical Formula 1C may be represented by Chemical Formula 1C-1 or Chemical Formula 1C-2.

[Chemical Formula 1C-1]

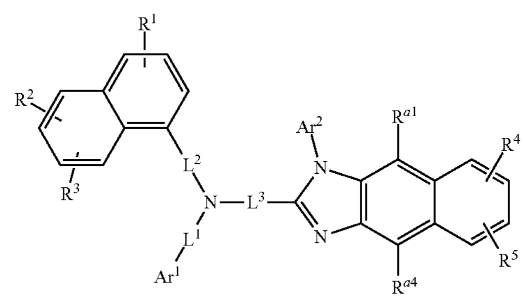

[Chemical Formula 1C-2]

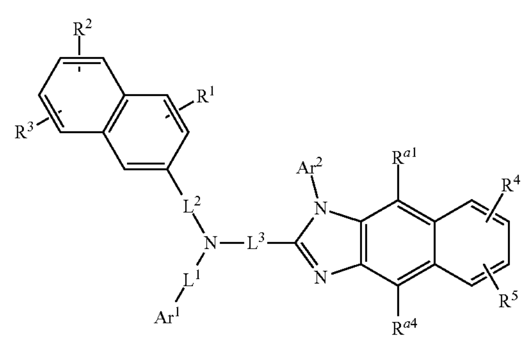

In Chemical Formula 1A-1, Chemical Formula 1A-2, Chemical Formula 1B-1, Chemical Formula 1B-2, Chemical Formula 1C-1, and Chemical Formula 1C-2, $Ar^1$, $Ar^2$, $L^1$ to $L^3$, $R^1$ to $R^5$, and $R^{a1}$ to $R^{a4}$ may be defined the same as those described above.

In an implementation, the compound for an organic optoelectronic device may be represented by Chemical Formula 1A-1, Chemical Formula 1A-2, Chemical Formula 1C-1, or Chemical Formula 1C-2.

In an implementation, the compound for an organic optoelectronic device may be represented by Chemical Formula 1A-2, Chemical Formula 1B-2, or Chemical Formula 1C-2.

In an implementation, $L^3$ in Chemical Formula 1 may be, e.g., a substituted or unsubstituted C6 to C12 arylene group.

An example of the substituted or unsubstituted C6 to C12 arylene group may include a substituted or unsubstituted phenylene group, a substituted or unsubstituted biphenylene group, or a substituted or unsubstituted naphthylene group.

Examples of the substituted or unsubstituted C6 to C12 arylene group may include a substituted or unsubstituted meta-phenylene group or a substituted or unsubstituted para-phenylene group.

In an implementation, $Ar^1$ and $Ar^2$ in Chemical Formula 1 may each independently be, e.g., a substituted or unsubstituted phenyl group, a substituted or unsubstituted biphenyl group, or a substituted or unsubstituted naphthyl group.

In an implementation, $L^1$ and $L^2$ may each independently be, e.g., a single bond, a substituted or unsubstituted phenylene group, a substituted or unsubstituted biphenylene group, or a substituted or unsubstituted naphthylene group.

In an implementation, $R^1$ to $R^2$ in Chemical Formulas 1 and 2 may each independently be, e.g., hydrogen, deuterium, a cyano group, a substituted or unsubstituted C1 to C10 alkyl group, or a substituted or unsubstituted C6 to C12 aryl group.

In an implementation, $Ar^1$ and $Ar^2$ in Chemical Formula 1 may each independently be, e.g., a substituted or unsubstituted phenyl group, a substituted or unsubstituted para-biphenyl group, or a substituted or unsubstituted meta-biphenyl group.

In an implementation, $L^1$ and $L^2$ may each independently be, e.g., a single bond, a substituted or unsubstituted para-phenylene group, or a substituted or unsubstituted meta-phenylene group.

In an implementation, $R^1$ to $R^5$ may each independently be, e.g., hydrogen or a phenyl group.

In an implementation, the compound for an organic optoelectronic device represented by the combination of Chemical Formula 1 and Chemical Formula 2 may be a compound of the following Group I.

[Group 1]

[1]

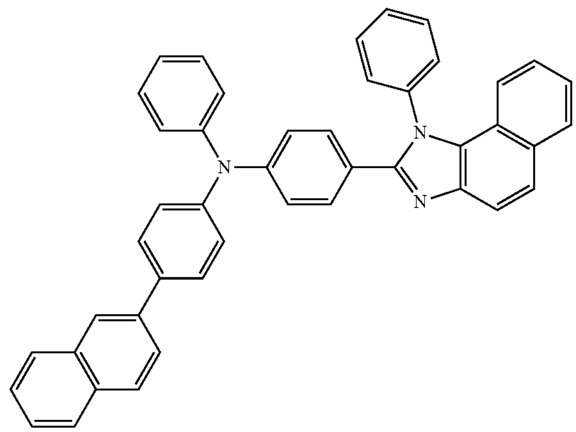

[2]

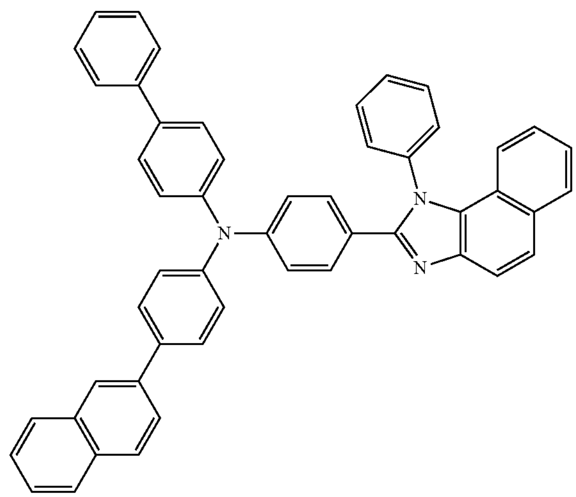

[3]

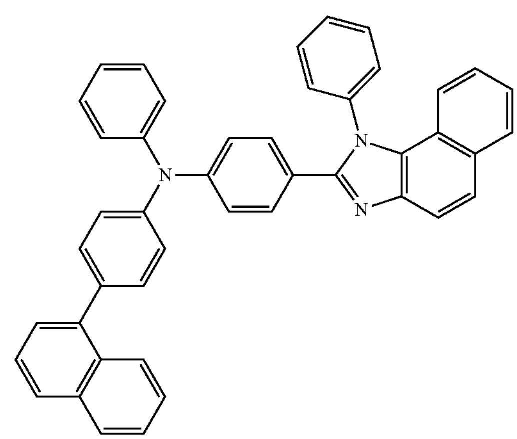

-continued
[4]
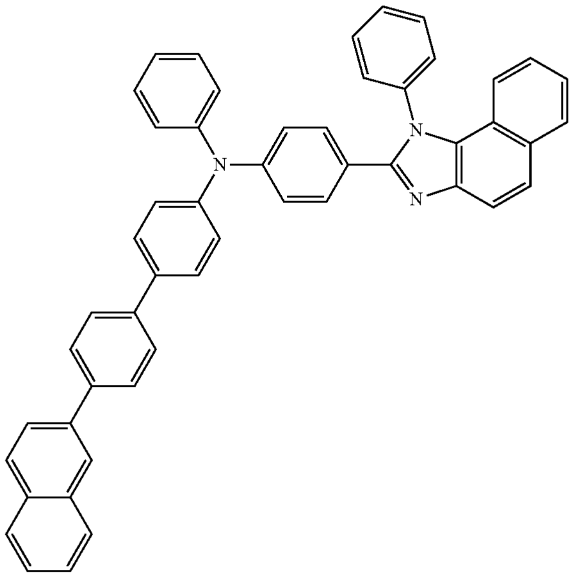
[5]
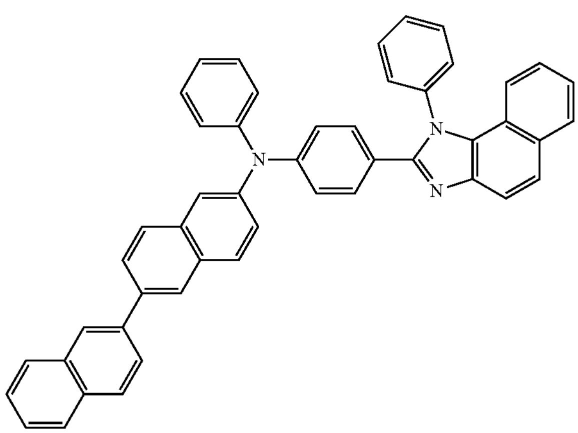
[6]
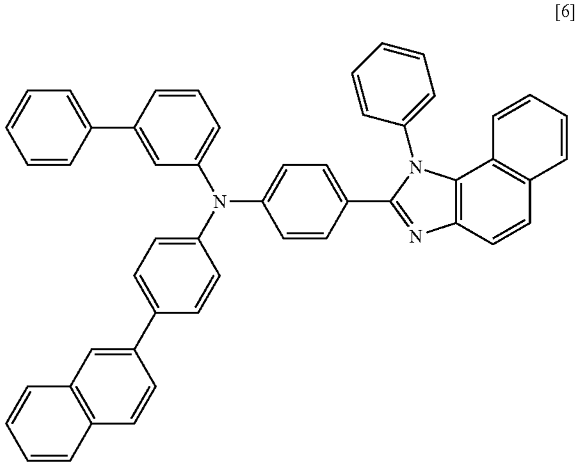
-continued
[7]
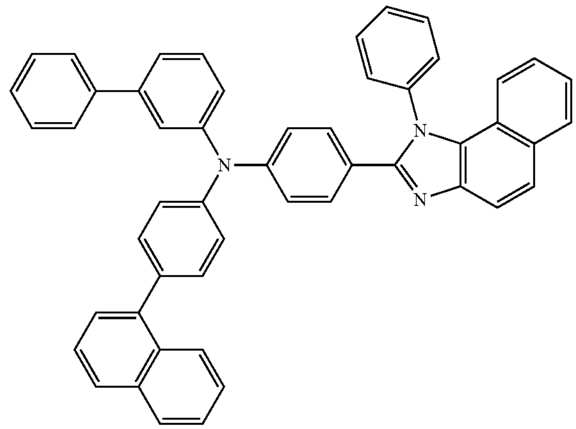
[8]
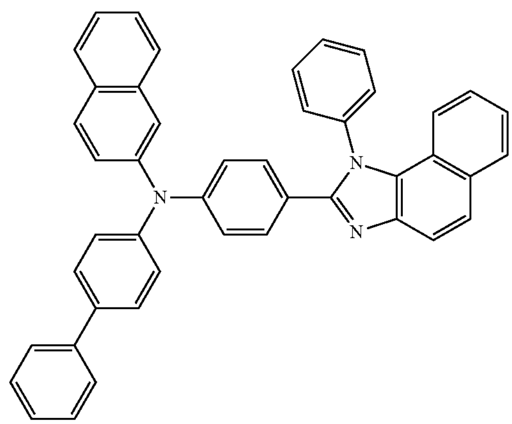
[9]
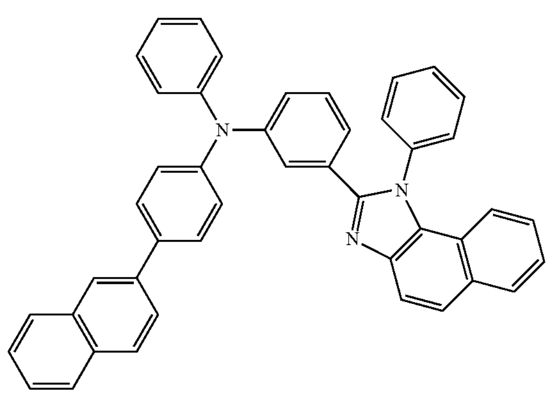

-continued
[10]
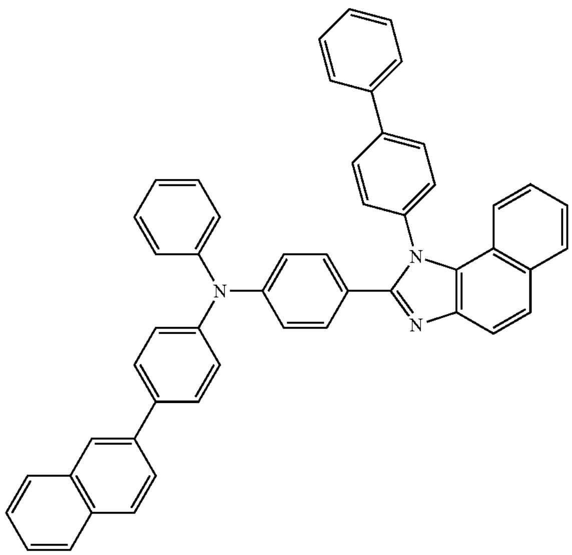
[11]
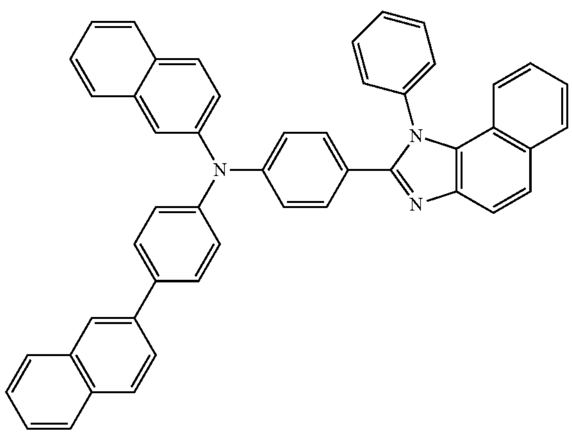
[12]
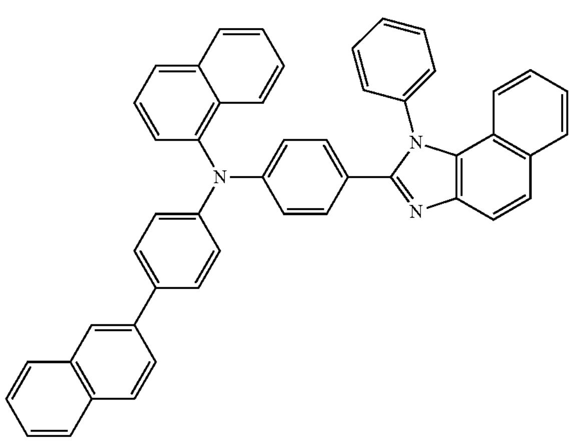
-continued
[13]
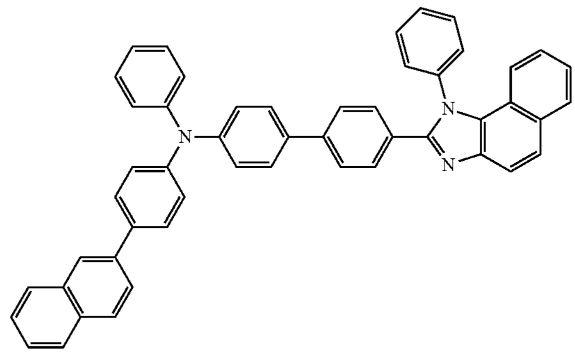
[14]
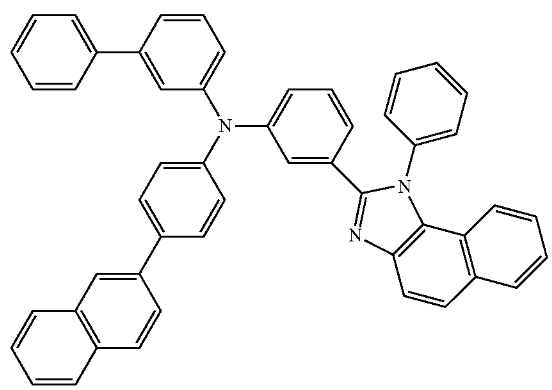
[15]
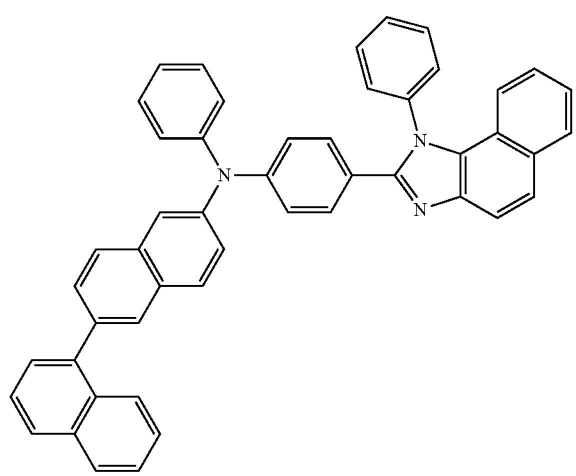

-continued
[16]
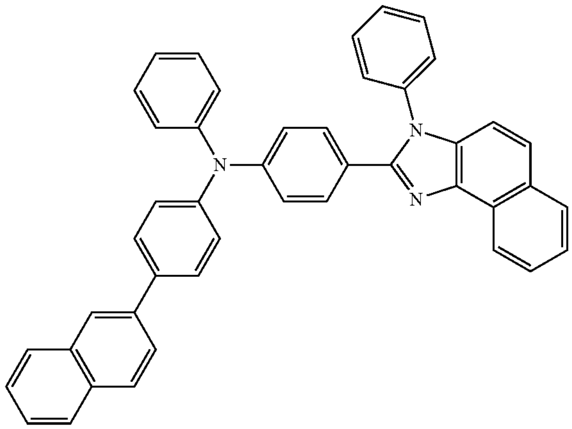
[17]
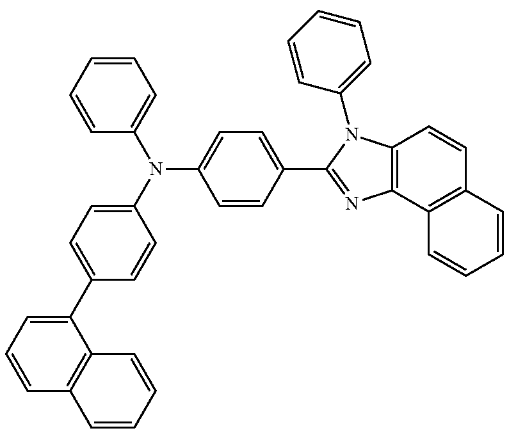
[18]
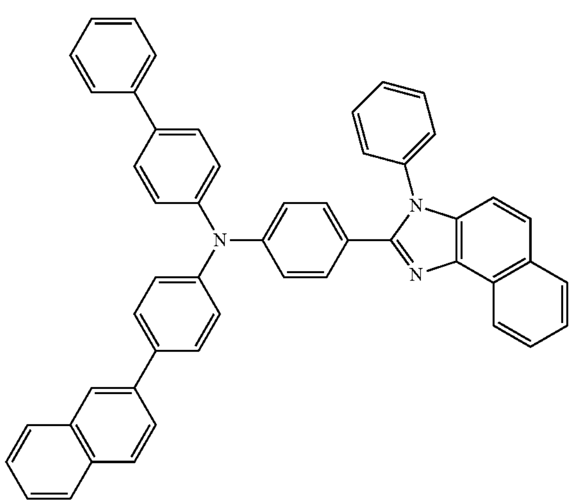
-continued
[19]
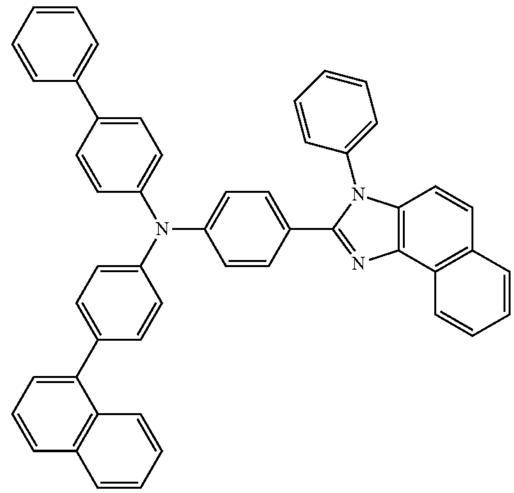
[20]
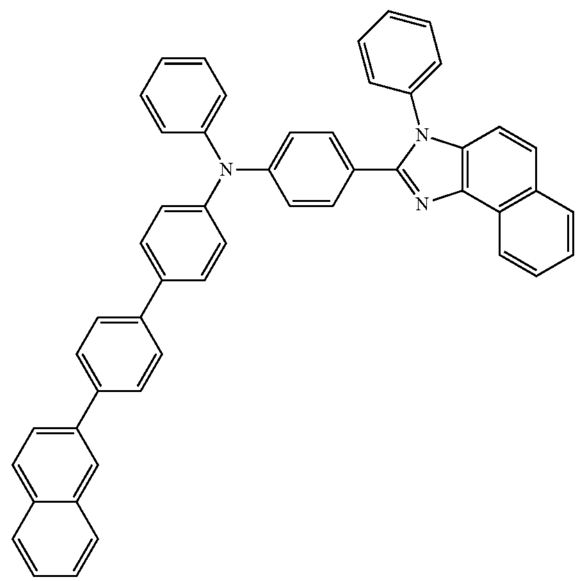
[21]
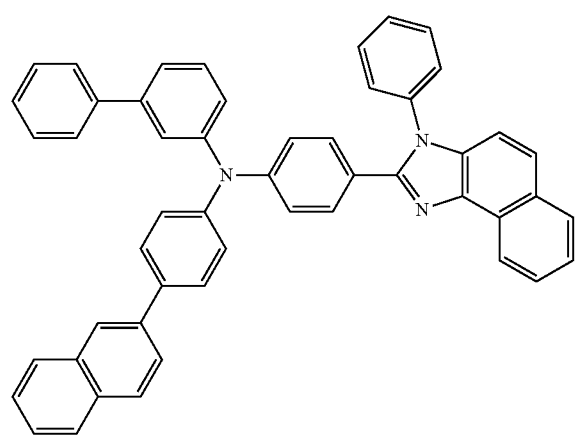

-continued
[22]
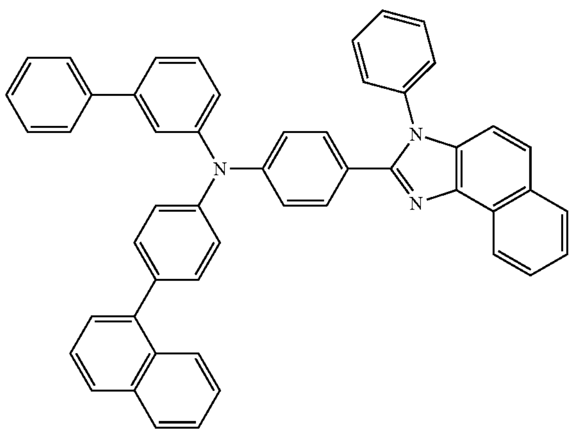
[23]
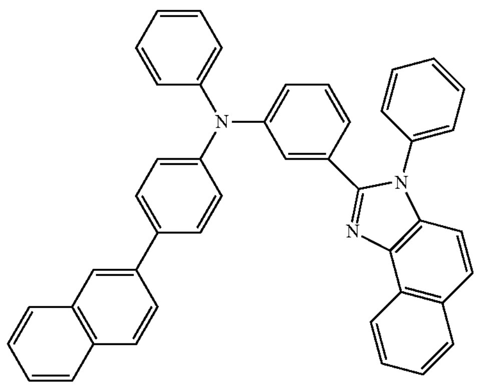
[24]
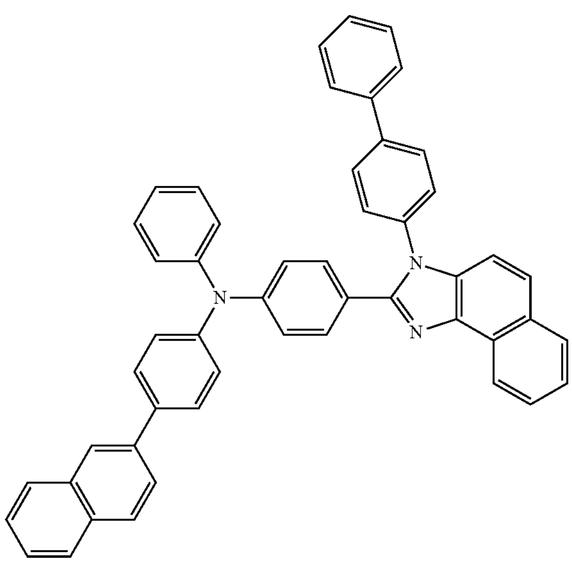
-continued
[25]
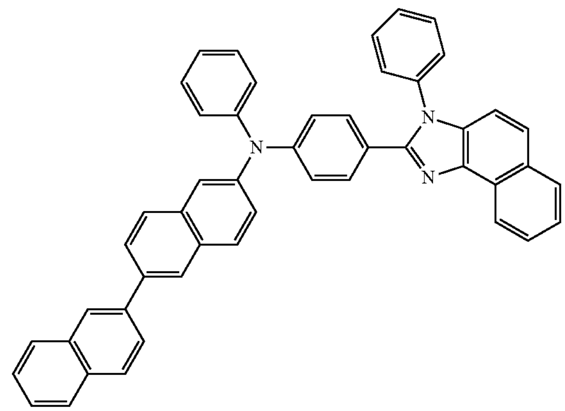
[26]
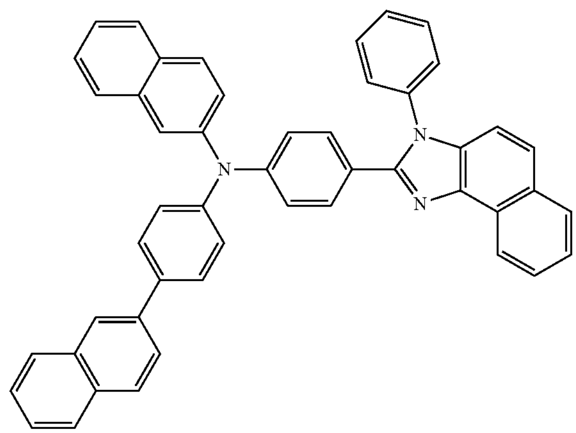
[27]
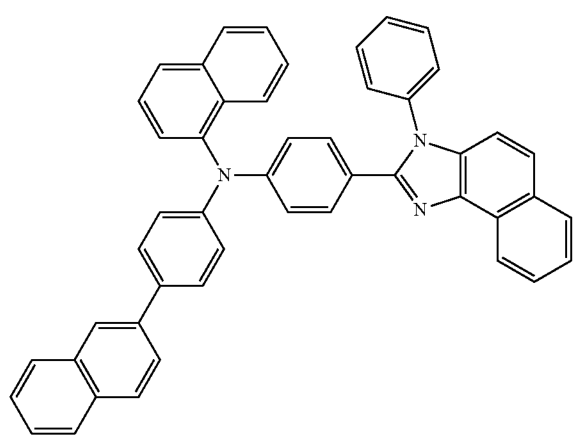

[28]
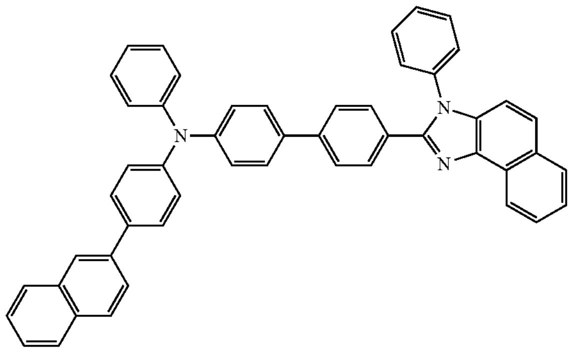
[29]
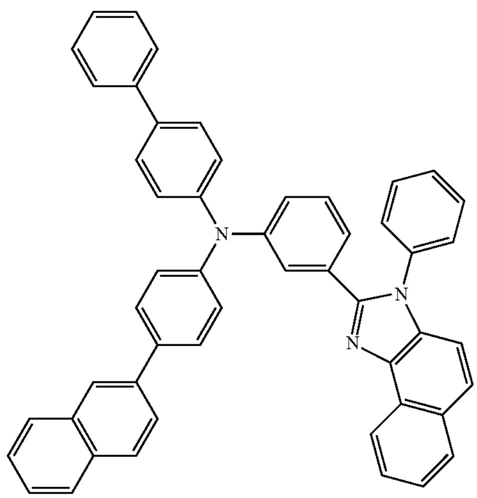
[30]
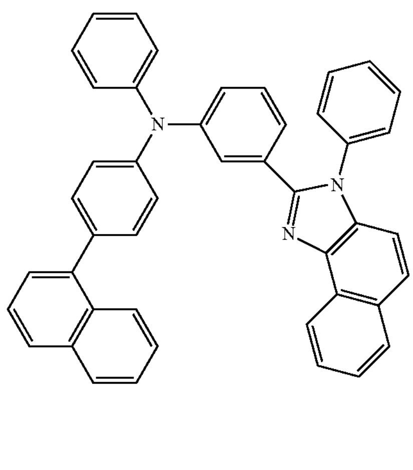
[31]
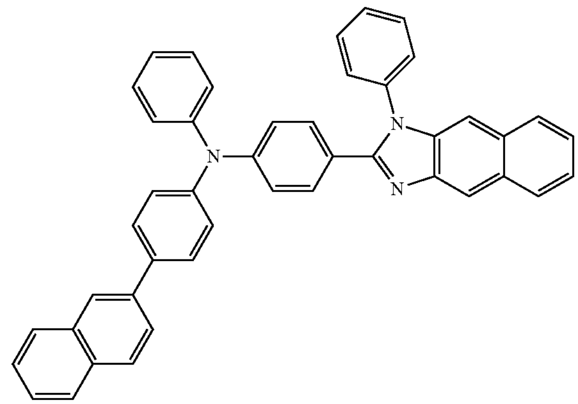
[32]
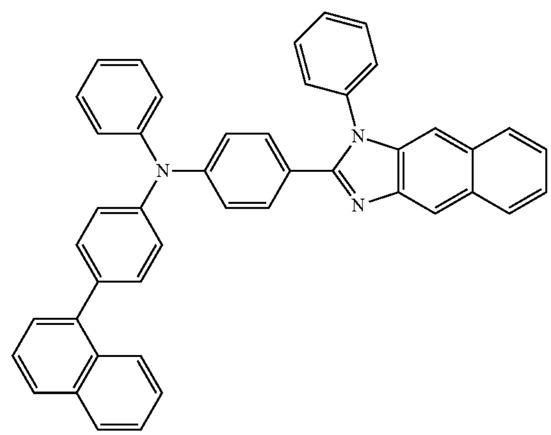
[33]
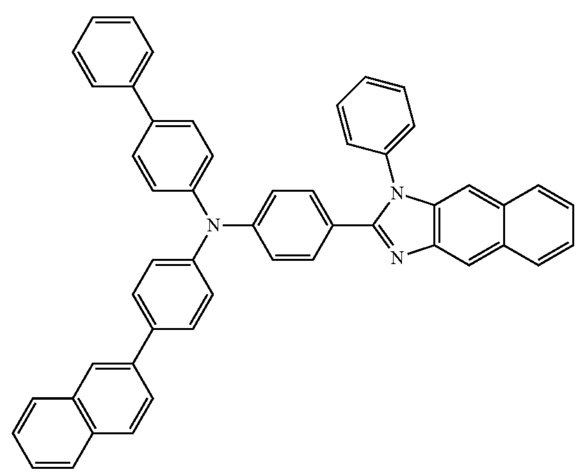

-continued
[34]
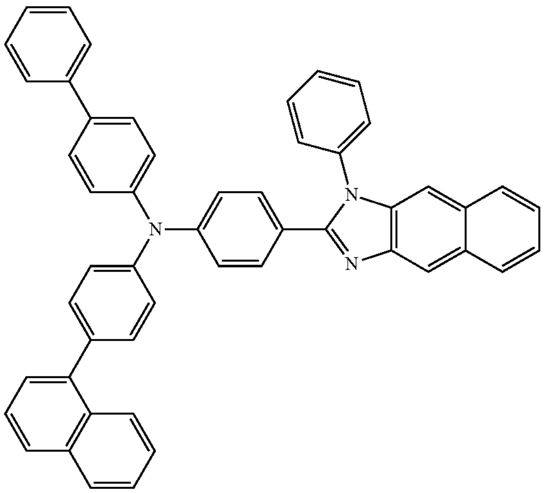
[35]
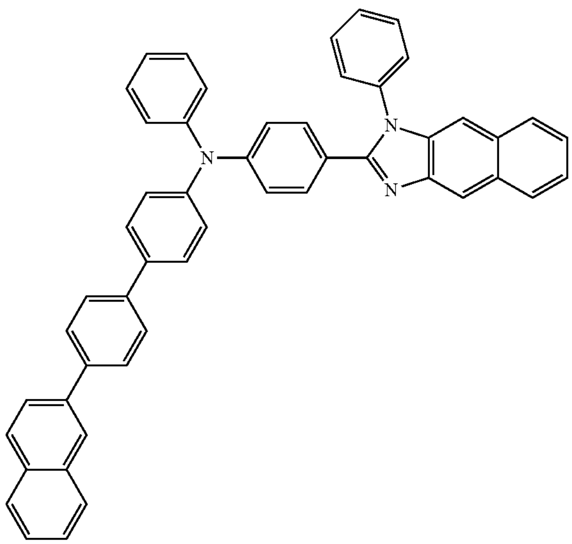
[36]
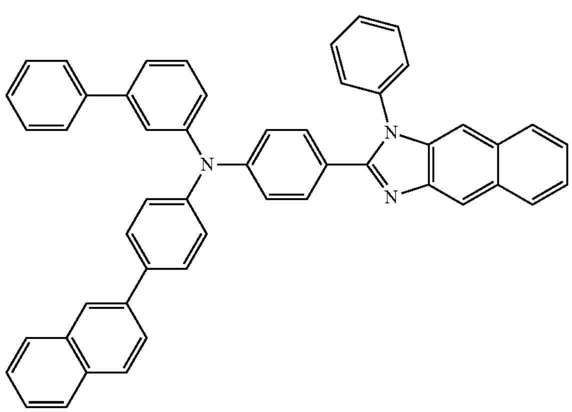
-continued
[37]
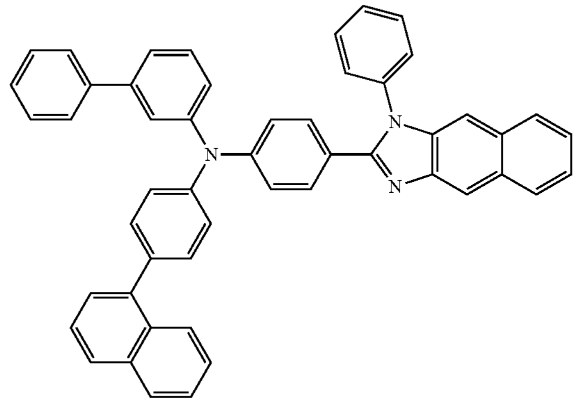
[38]
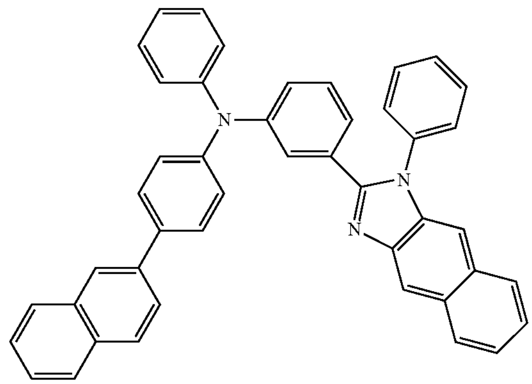
[39]
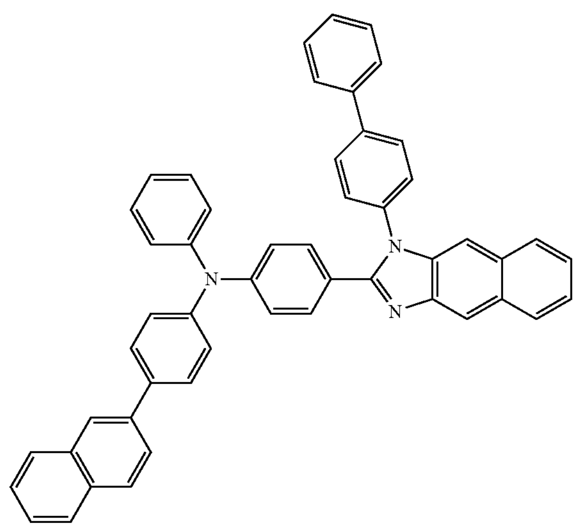

-continued

[40]

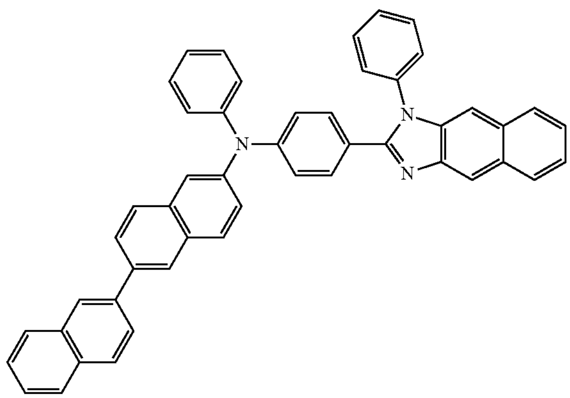

[41]

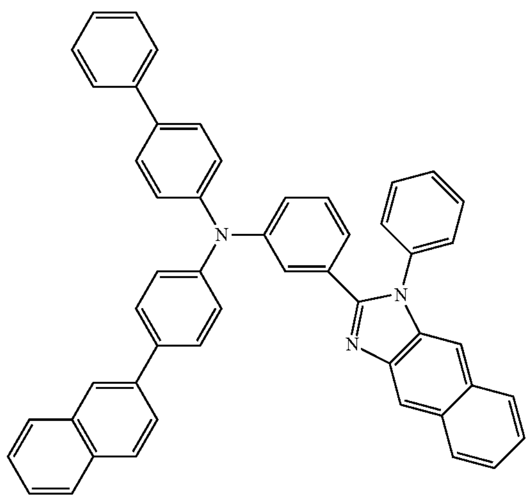

[42]

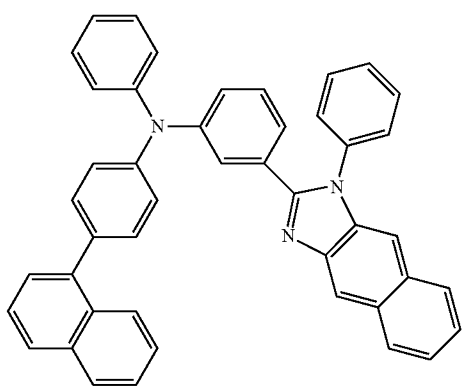

In an implementation, the aforementioned compound for an organic optoelectronic device may further include one or more compounds.

In an implementation, a composition for an organic optoelectronic device may include the compound for an organic optoelectronic device represented by a combination of Chemical Formula 1 and Chemical Formula 2 (hereinafter, referred to as a "first compound").

The composition for an organic optoelectronic device according to an embodiment may include the first compound and a second compound for an organic optoelectronic device represented by Chemical Formula 3, e.g., a mixture of the first compound and the second compound.

The second compound may be represented by Chemical Formula 3 as a compound having relatively strong electronic properties.

[Chemical Formula 3]

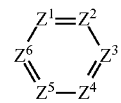

In Chemical Formula 3, $Z^1$ to $Z^6$ may each independently be, e.g., N or C-$L^b$-$R^b$. In an implementation, at least two of $Z^1$ to $Z^6$ may be N.

Each $L^b$ may independently be or include, e.g., a single bond, a substituted or unsubstituted C6 to C20 arylene group, a substituted or unsubstituted C2 to C20 heterocyclic group, or a combination thereof.

Each $R^b$ may independently be or include, e.g., hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof.

In an implementation, each $R^b$ may be independently or separately present or adjacent ones thereof may be linked to form a substituted or unsubstituted aliphatic, aromatic or heteroaromatic monocyclic ring or a substituted or unsubstituted aliphatic, aromatic or heteroaromatic polycyclic ring.

The second compound for an organic optoelectronic device may effectively expand the LUMO energy band by including a nitrogen-containing hexagonal ring moiety, and it may be included with the aforementioned first compound to help increase the balance between holes and electrons, greatly improving life-span characteristics.

In an implementation, two of $Z^1$ to $Z^6$ may be nitrogen (N) and the rest may be C-$L^b$-$R^b$.

In an implementation, $Z^1$ and $Z^3$ may be nitrogen, $Z^2$ may be N or C-$L^b$-$R^b$, $Z^4$ may be N or C-$L^b$-$R^b$, $Z^5$ may be N or C-$L^b$-$R^b$, and $Z^6$ may be N or C-$L^b$-$R^b$.

In an implementation, among $Z^1$ to $Z^6$, three may be nitrogen (N) and the rest may be C-$L^b$-$R^b$.

In an implementation, $Z^1$, $Z^3$, and $Z^5$ may be nitrogen, $Z^2$ may be N or C-$L^b$-$R^b$, $Z^4$ may be N or C-$L^b$-$R^b$, and $Z^6$ may be N or C-$L^b$-$R^b$.

In an implementation, the second compound for an organic optoelectronic device may be represented by Chemical Formula 3A, Chemical Formula 3B, or Chemical Formula 3C, depending on the specific substituent of $R^b$.

[Chemical Formula 3A]

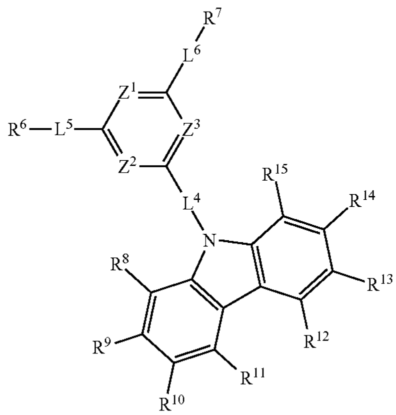

[Chemical Formula 3B]

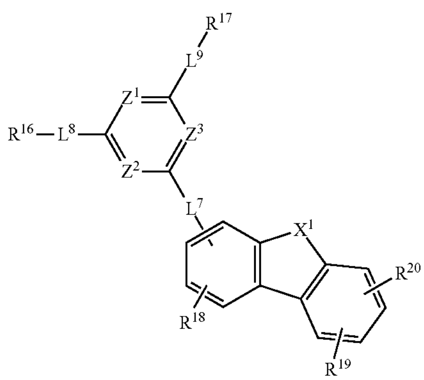

[Chemical Formula 3C]

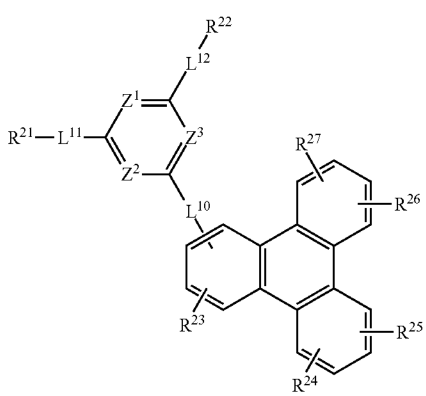

In Chemical Formulas 3A to 3C, $Z^1$, $Z^3$, and $Z^5$ may each independently be, e.g., N or C-$L^b$-$R^b$. In an implementation, at least two of $Z^1$, $Z^3$, and $Z^5$ may be N.

$X^1$ may be, e.g., O, S, or $NR^c$.

$L^b$ and $L^4$ to $L^{12}$ may each independently be or include, e.g., a single bond, a substituted or unsubstituted C6 to C20 arylene group, a substituted or unsubstituted C2 to C20 heterocyclic group, or a combination thereof.

$R^b$, $R^c$, and $R^6$ to $R^{27}$ may each independently be or include, e.g., hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof.

In an implementation, $R^8$ to $R^{15}$ may be separately present or adjacent ones thereof may be linked to form a substituted or unsubstituted aromatic monocyclic or polycyclic ring.

In an implementation, $R^b$, $R^6$, $R^7$, $R^{16}$, $R^{17}$, $R^{21}$, and $R^{22}$ may be separately present or adjacent ones among $R^b$, $R^6$, and $R^7$; $R^b$, $R^{16}$, and $R^{17}$; and $R^b$, $R^{21}$, and $R^{22}$ may be linked to form a substituted or unsubstituted aromatic or heteroaromatic monocyclic ring or a substituted or unsubstituted aromatic or heteroaromatic polycyclic ring.

As used herein, the description of adjacent groups being linked to form a substituted or unsubstituted aromatic or heteroaromatic monocyclic ring or a substituted or unsubstituted aromatic or heteroaromatic polycyclic ring means that any two adjacent substituents may be linked to each other to form a ring. In an implementation, in Chemical Formula 3A, adjacent ones of $R^8$ to $R^{15}$ may be linked to each other to form a substituted or unsubstituted aromatic monocyclic ring. The aromatic monocyclic ring may be, e.g., a substituted or unsubstituted phenyl group.

In an implementation, the second compound represented by Chemical Formula 3A may be represented by one of Chemical Formula 3A-I to Chemical Formula 3A-X.

[Chemical Formula 3A-I]

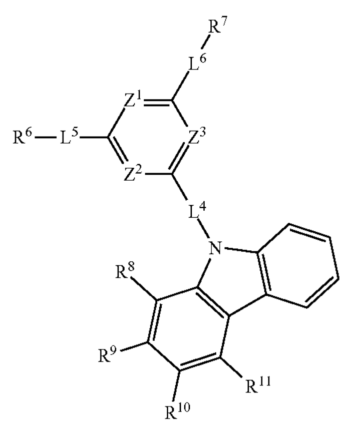

[Chemical Formula 3A-II]

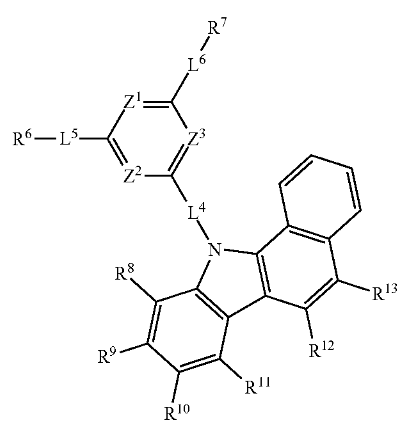

-continued
[Chemical Formula 3A-III]
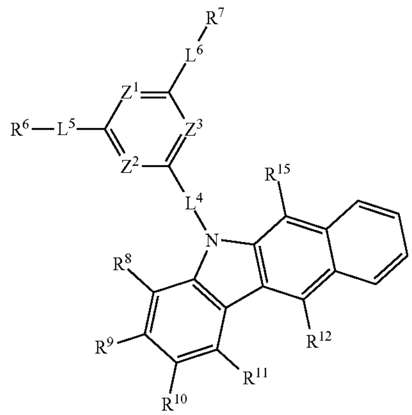
[Chemical Formula 3A-IV]
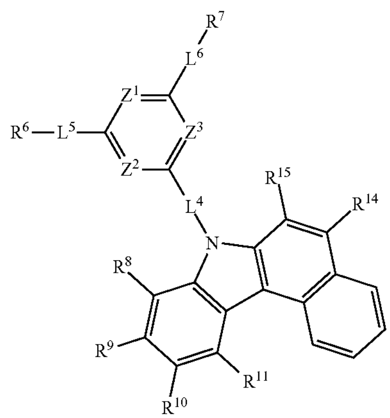
[Chemical Formula 3A]
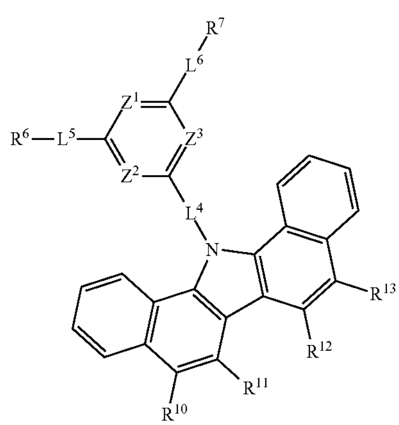
-continued
[Chemical Formula 3A-V]
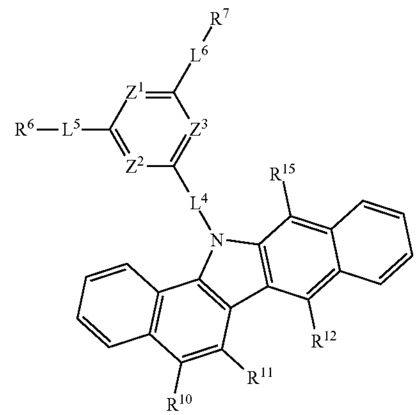
[Chemical Formula 3A-VI]
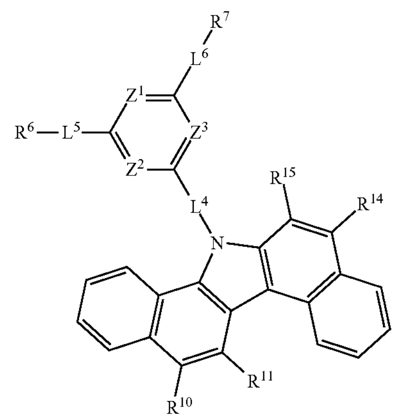
[Chemical Formula 3A-VII]
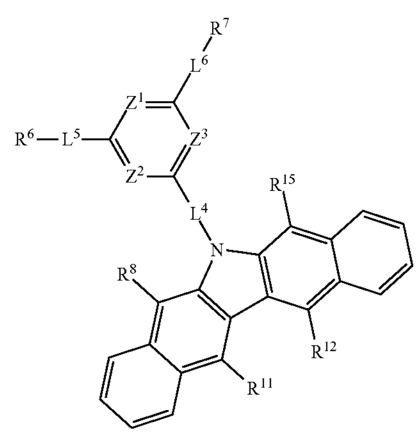

-continued

[Chemical Formula 3A-VIII]

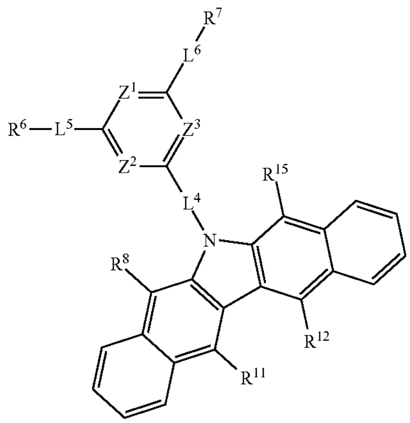

[Chemical Formula 3A-IX]

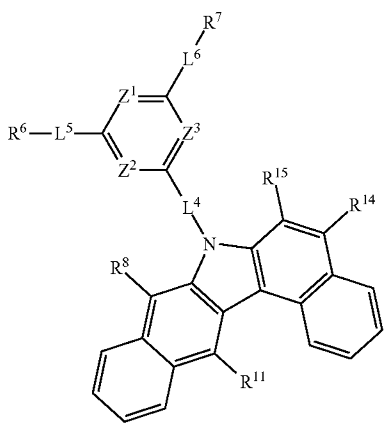

[Chemical Formula 3A-X]

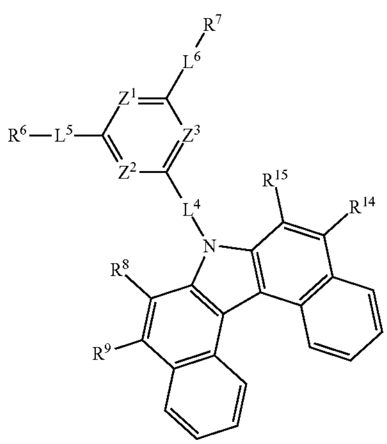

In Chemical Formula 3A-I to Chemical Formula 3A-X, $Z^1$, $Z^3$, and $Z^5$ may be defined the same as those described above.

$L^4$ to $L^6$ may each independently be or include, e.g., a single bond, a substituted or unsubstituted phenylene group, a substituted or unsubstituted biphenylene group, a substituted or unsubstituted naphthylene group, a substituted or unsubstituted dibenzofuranylene group, or a substituted or unsubstituted dibenzothiophenylene group.

$R^6$ and $R^7$ may each independently be or include, e.g., a substituted or unsubstituted phenyl group, a substituted or unsubstituted biphenyl group, a substituted or unsubstituted terphenyl group, a substituted or unsubstituted naphthyl group, a substituted or unsubstituted triphenylene group, a substituted or unsubstituted carbazolyl group, a substituted or unsubstituted dibenzofuranyl group, or a substituted or unsubstituted dibenzothiophenyl group.

$R^8$ to $R^{15}$ may each independently be or include, e.g., hydrogen or a substituted or unsubstituted phenyl group, a substituted or unsubstituted dibenzofuranyl group, or a substituted or unsubstituted dibenzothiophenyl group.

In an implementation, the second compound represented by Chemical Formula 3A-I may be represented by one of Chemical Formula 3A-I-1 to Chemical Formula 3A-I-4.

[Chemical Formula 3A-I-1]

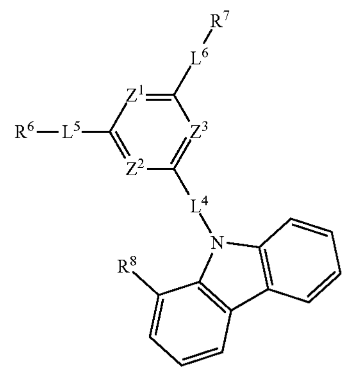

[Chemical Formula 3A-I-2]

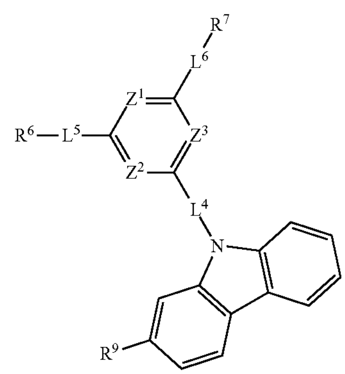

[Chemical Formula 3A-I-3]

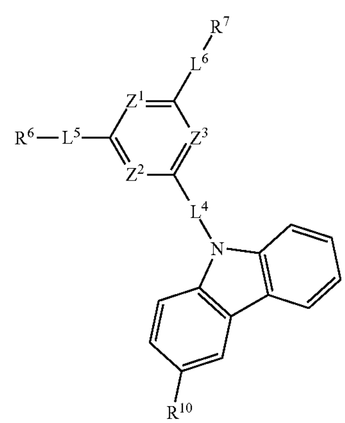

-continued

[Chemical Formula 3A-I-4]

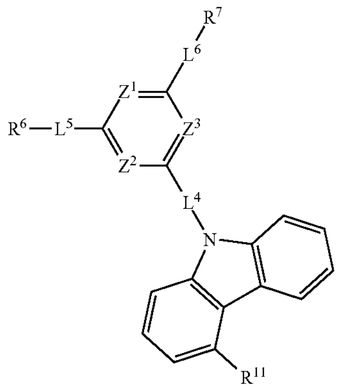

In Chemical Formula 3A-I-1 to Chemical Formula 3A-I-4, each substituent may be defined the same as those described above.

In an implementation, the second compound represented by Chemical Formula 3B may be represented by one of Chemical Formula 3B-I to Chemical Formula 3B-IV.

[Chemical Formula 3B-I]

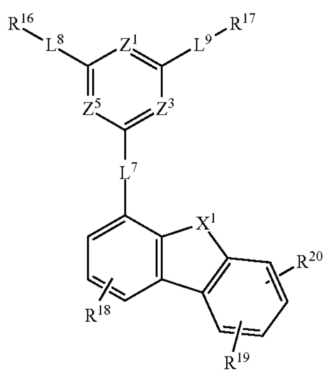

[Chemical Formula 3B-II]

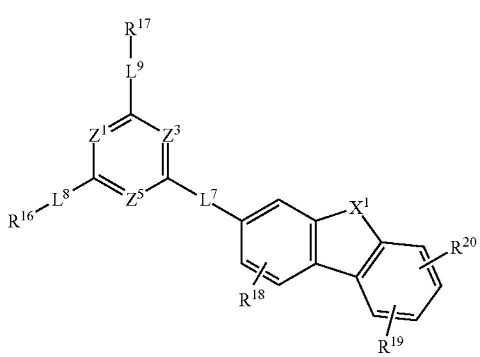

-continued

[Chemical Formula 3B-III]

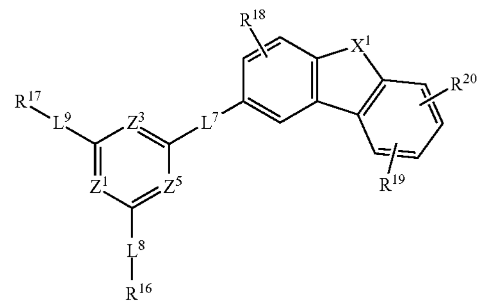

[Chemical Formula 3B-IV]

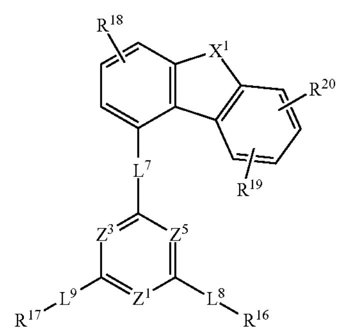

In Chemical Formula 3B-I to Chemical Formula 3B-IV, each substituent may be defined the same as those described above.

In an implementation, the second compound represented by Chemical Formula 3C may be represented by Chemical Formula 3C-I or Chemical Formula 3C-II.

[Chemical Formula 3C-1]

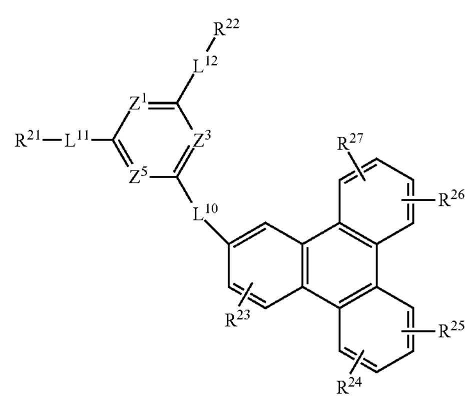

-continued

[Chemical Formula 3C-II]

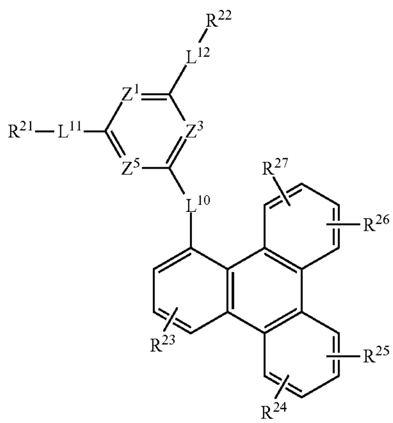

In Chemical Formula 3C-I and Chemical Formula 3C-II, each substituent may be defined the same as those described above.

In an implementation, the second compound represented by Chemical Formula 3 may be represented by Chemical Formula 3A-IV.

In an implementation, in Chemical Formula 3A-IV, $L^4$ to $L^6$ may each independently be or include, e.g., a single bond or a substituted or unsubstituted C6 to C12 aryl group, $R^6$ and $R^7$ may each independently be or include, e.g., a substituted or unsubstituted phenyl group, a substituted or unsubstituted biphenyl group, a substituted or unsubstituted terphenyl group, a substituted or unsubstituted naphthyl group, a substituted or unsubstituted triphenylene group, a substituted or unsubstituted dibenzofuranyl group, a substituted or unsubstituted dibenzothiophenyl group, or a substituted or unsubstituted carbazolyl group, and $R^8$ to $R^{11}$, $R^{14}$, and $R^{15}$ may each independently be or include, e.g., hydrogen, deuterium, a substituted or unsubstituted C1 to C10 alkyl group, or a substituted or unsubstituted C6 to C12 aryl group.

In an implementation, the second compound may be, e.g., a compound of the following Group 2.

[Group 2]

A-1

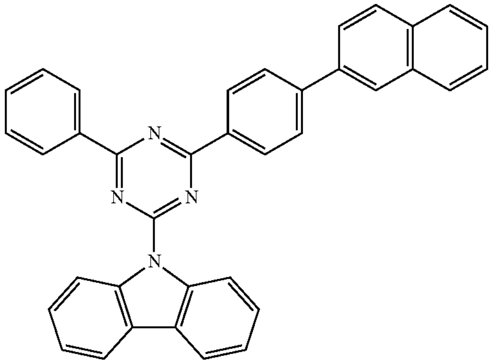

-continued

A-2

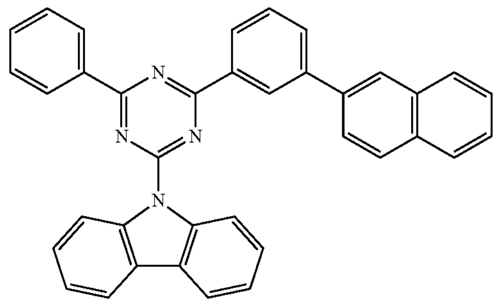

A-3

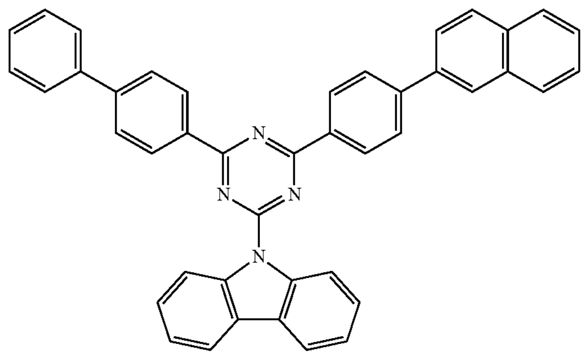

A-4

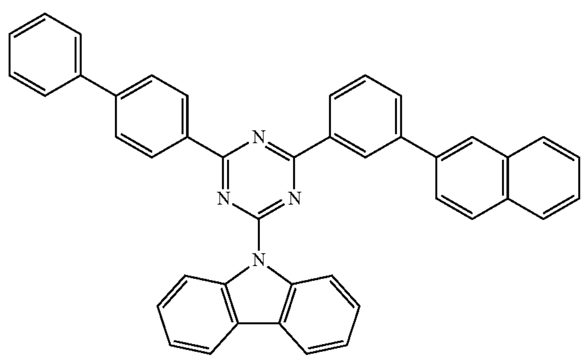

A-5

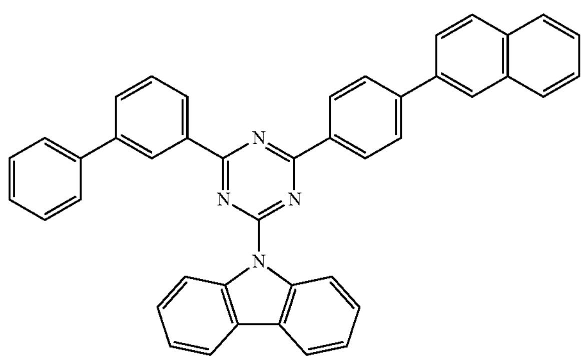

-continued
A-6
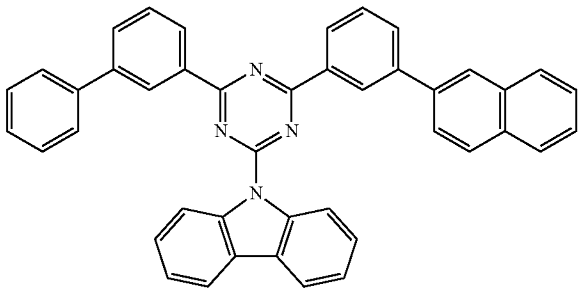
A-7
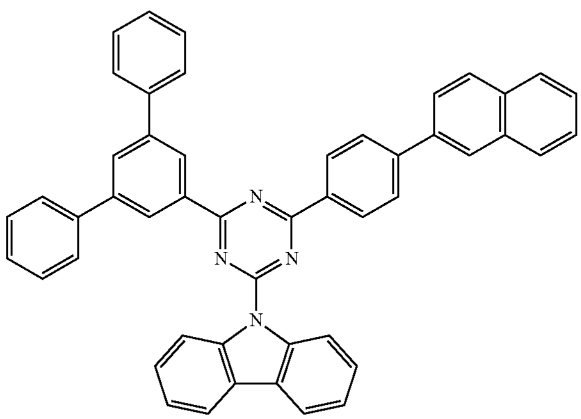
A-8
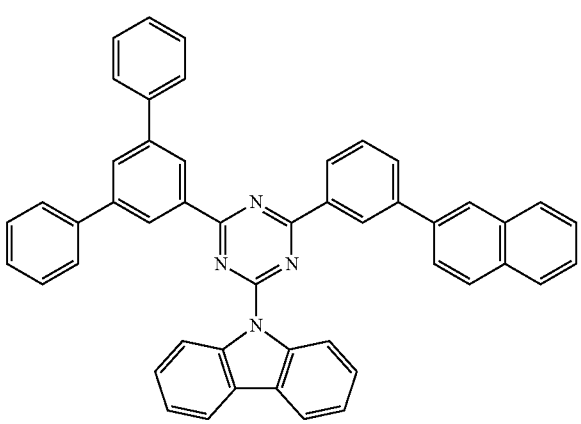
A-9
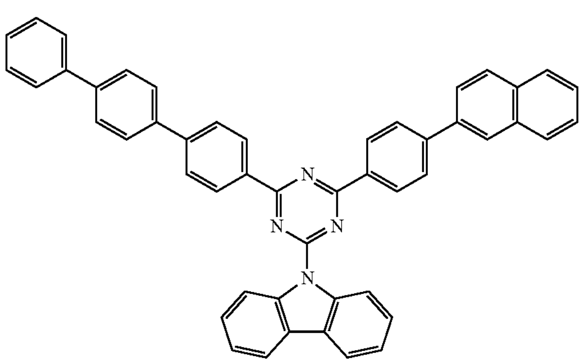
-continued
A-10
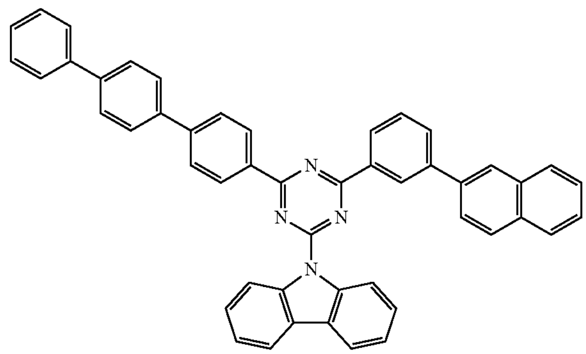
A-11
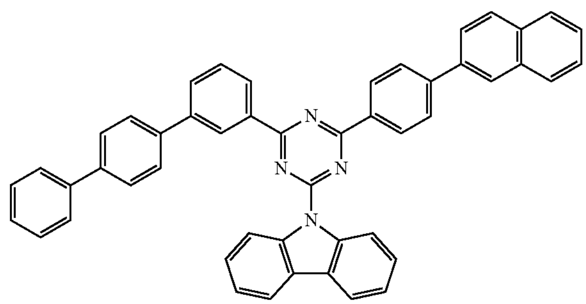
A-12
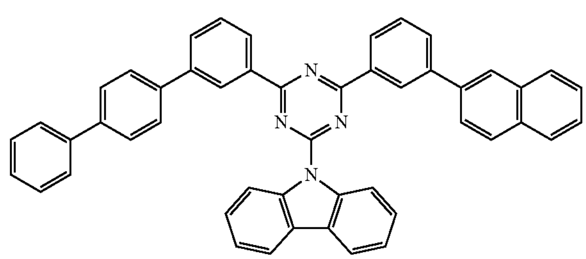
A-13
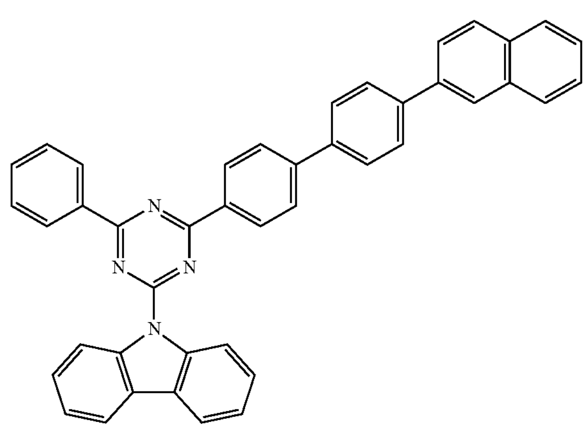

-continued
A-14
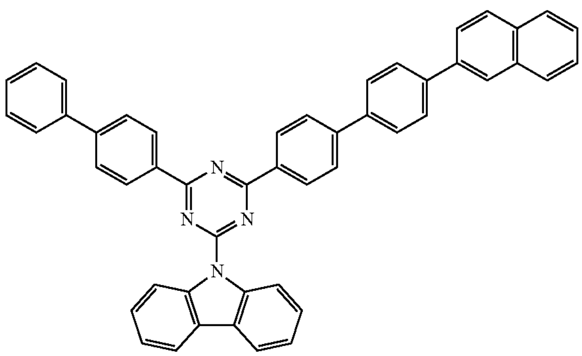
A-15
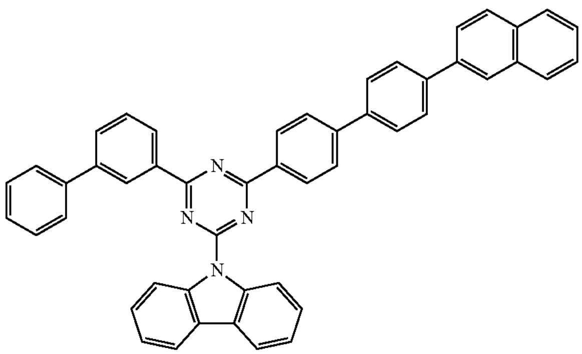
A-16
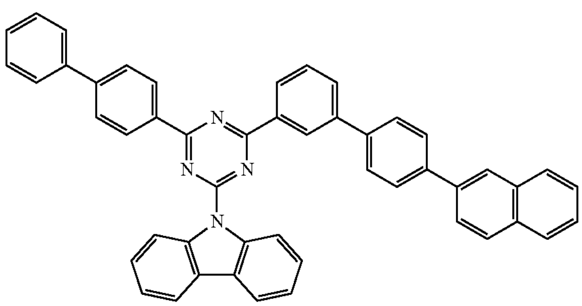
A-17
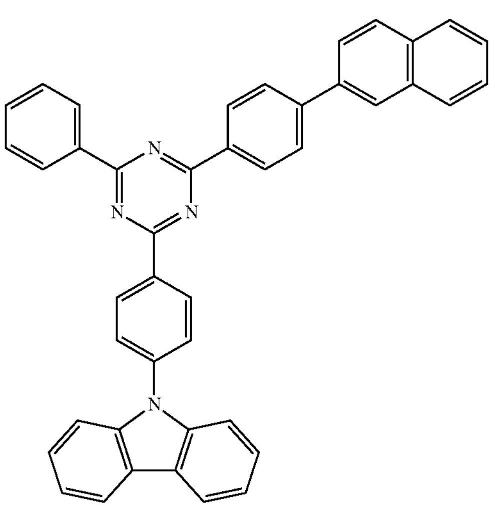
-continued
A-18
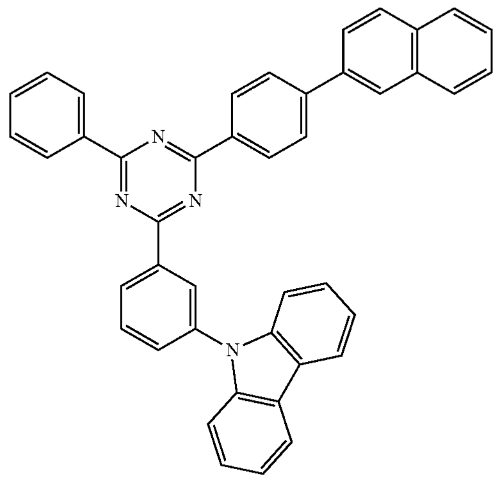
A-19
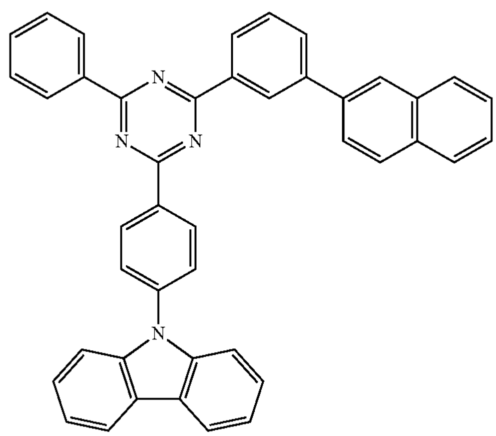
A-20
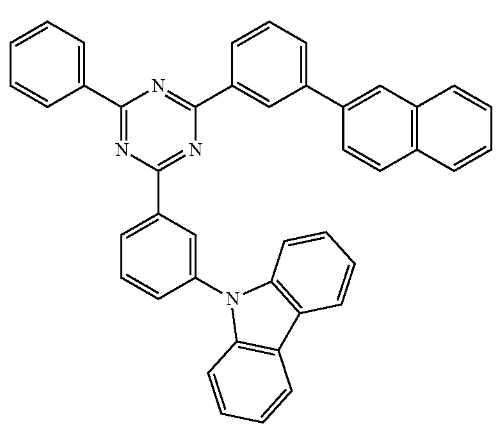

-continued
A-21
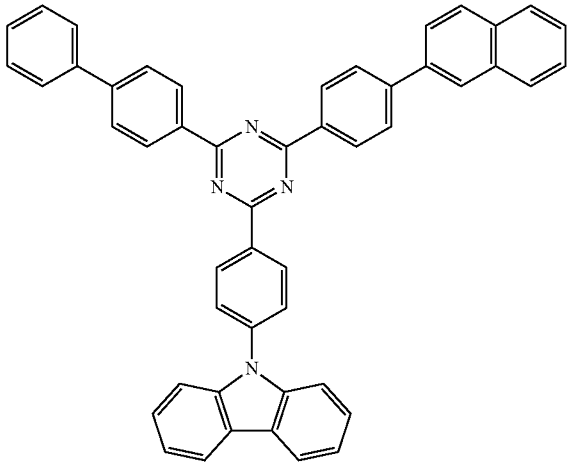
A-22
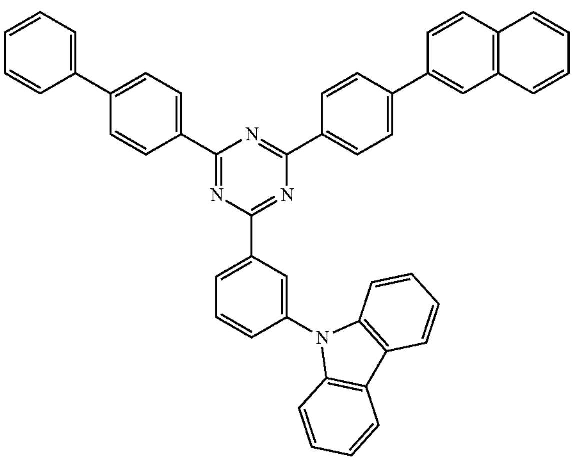
A-23
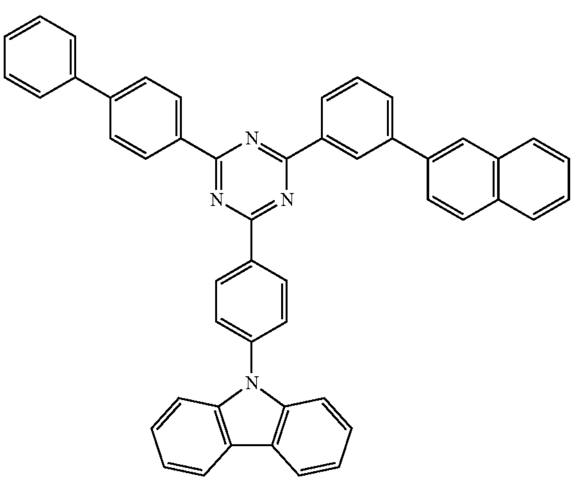
-continued
A-24
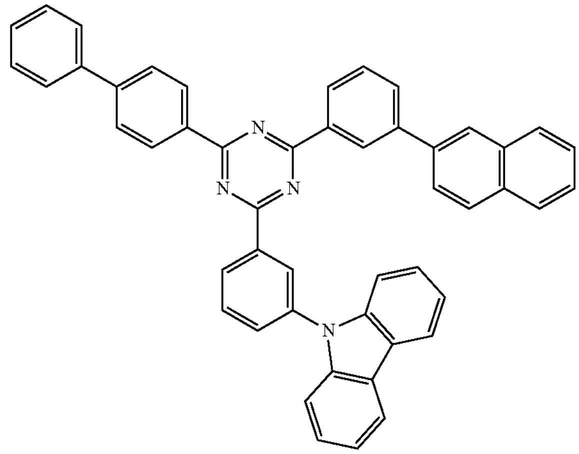
A-25
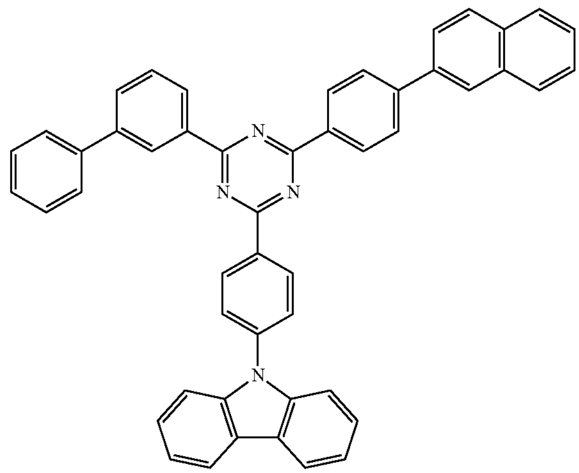
A-26
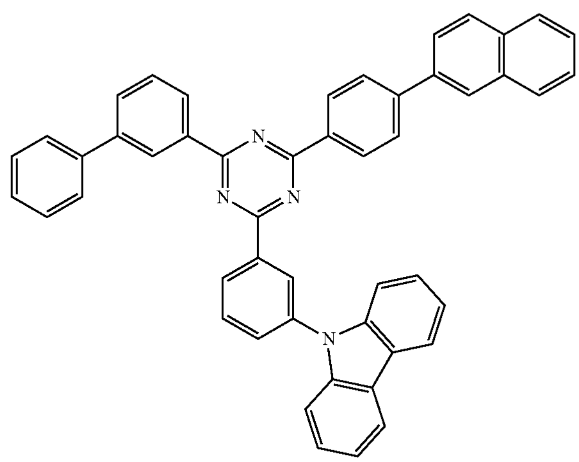

-continued
A-27
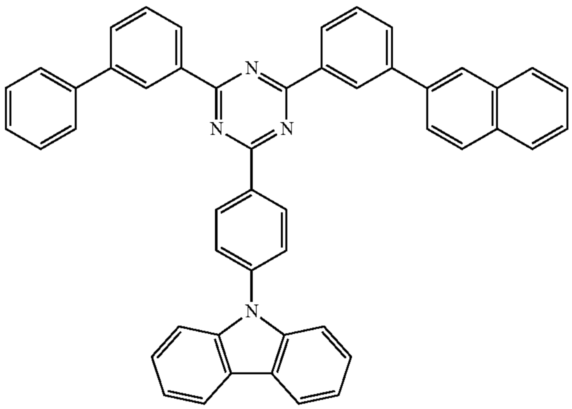
A-28
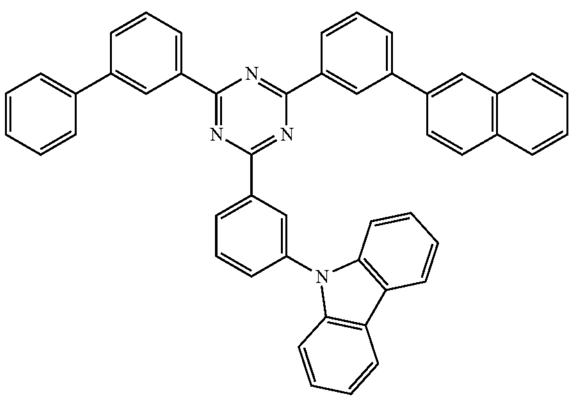
A-29
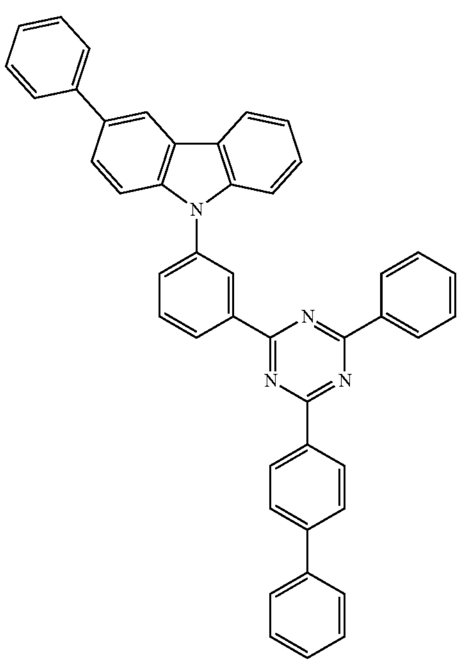
-continued
A-30
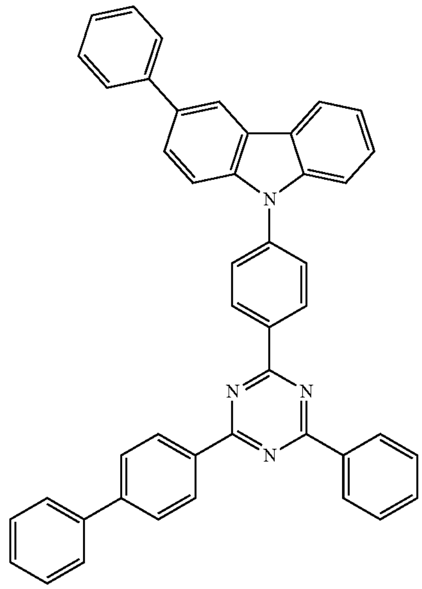
A-31
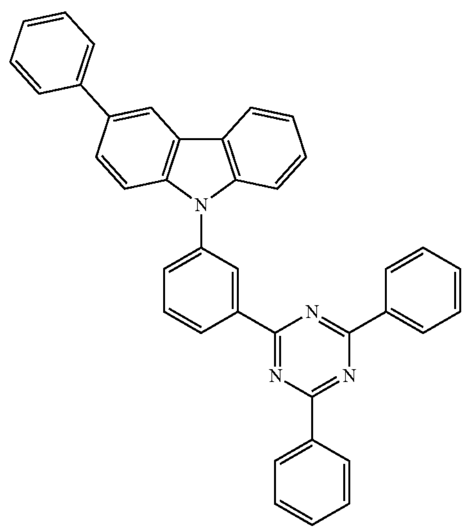
A-32
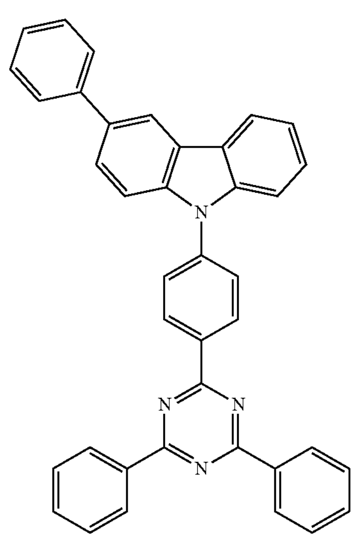

-continued
A-33
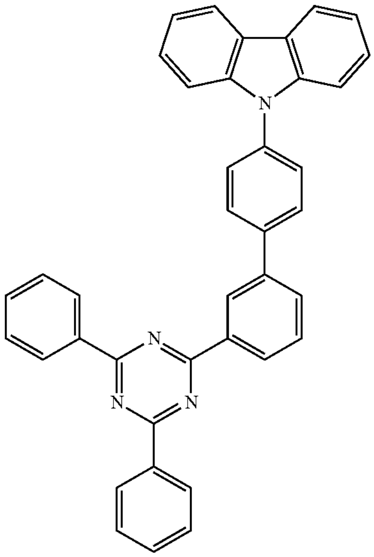
A-34
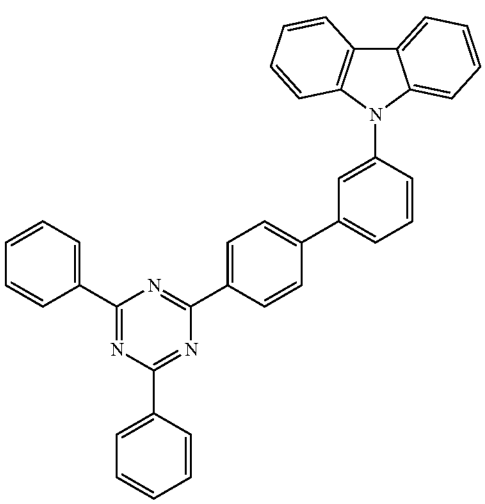
-continued
A-35
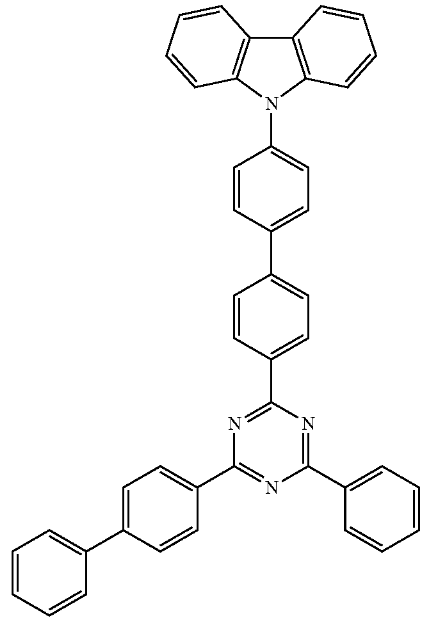
A-36
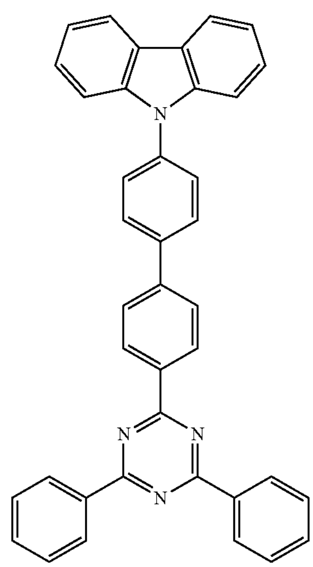

-continued
A-37
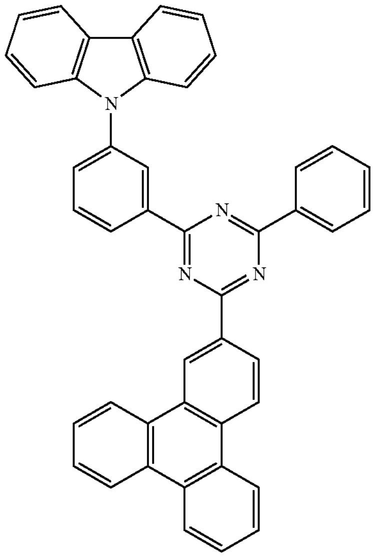
A-38
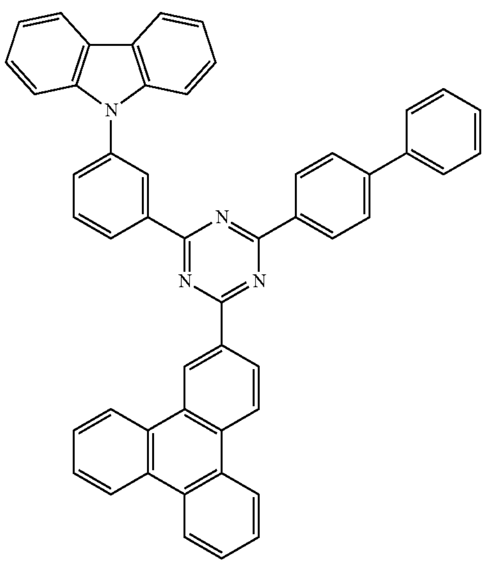
A-39
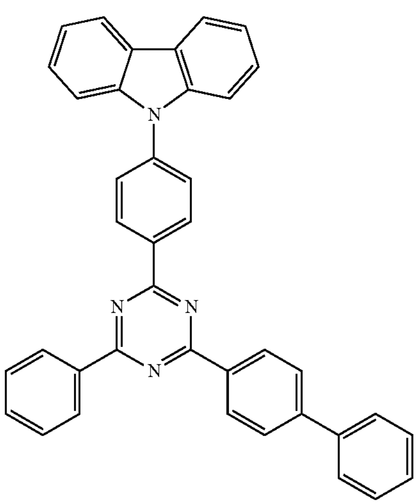
-continued
A-40
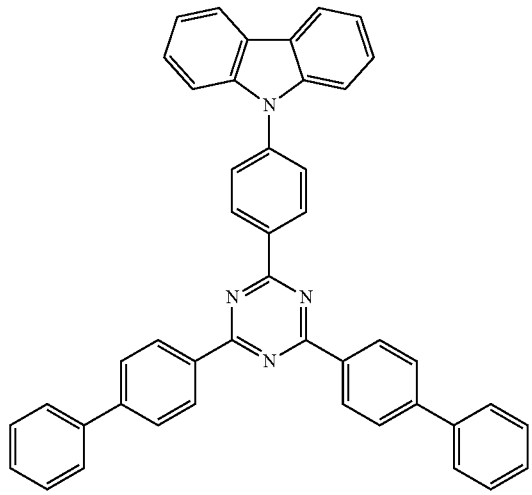
A-41
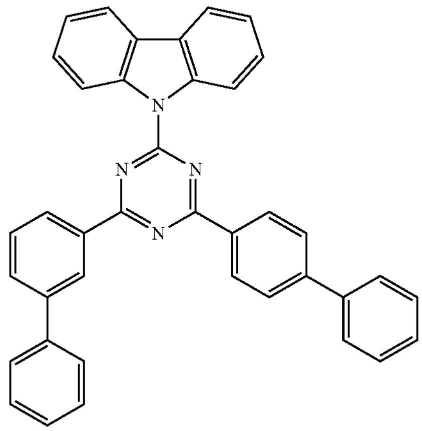
A-42
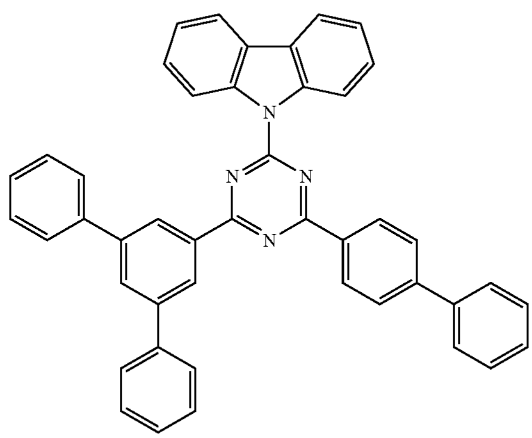

-continued
A-43
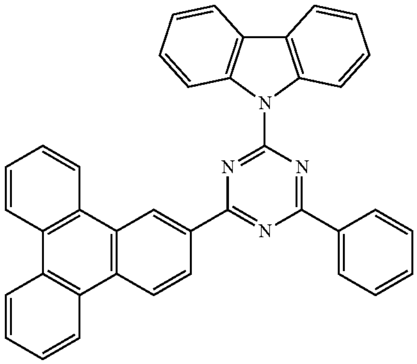
A-44
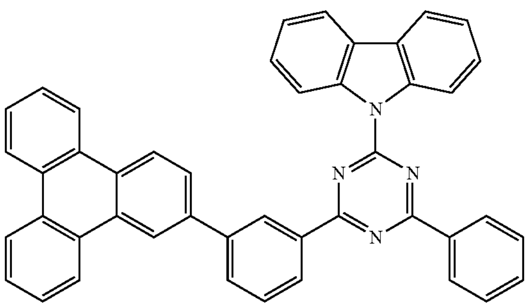
A-45
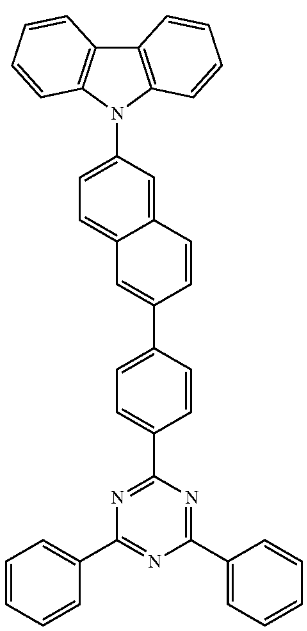
-continued
A-46
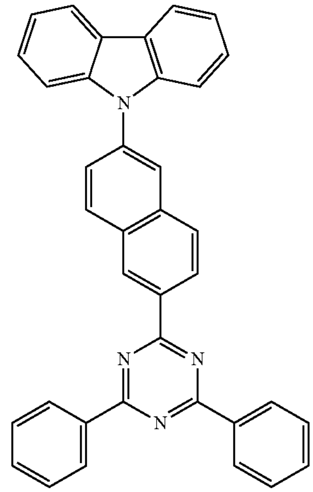
A-47
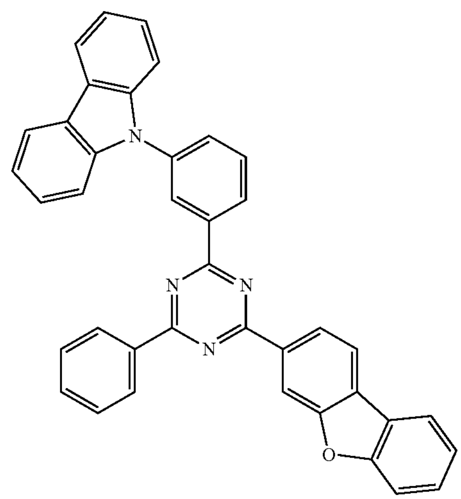
A-48
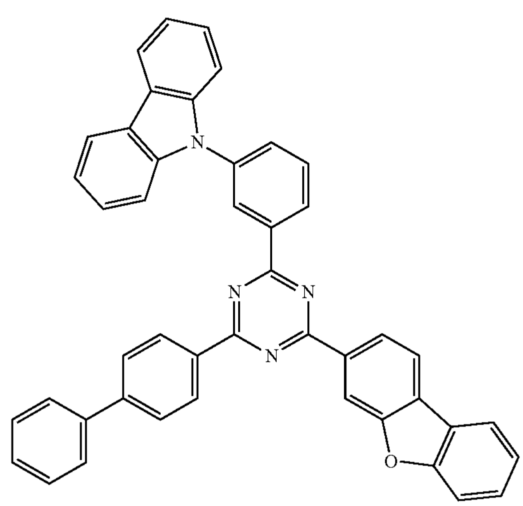

-continued
A-49
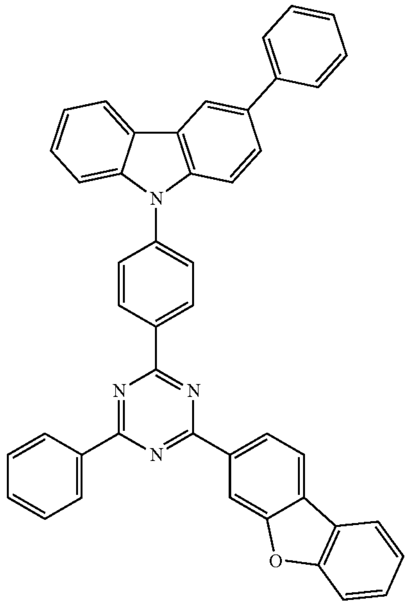
A-50
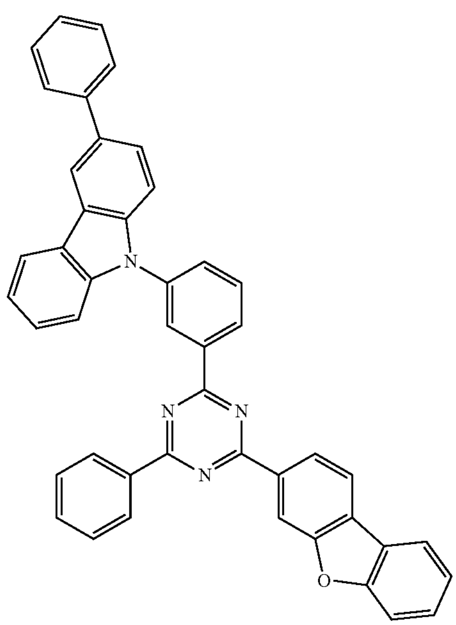
-continued
A-51
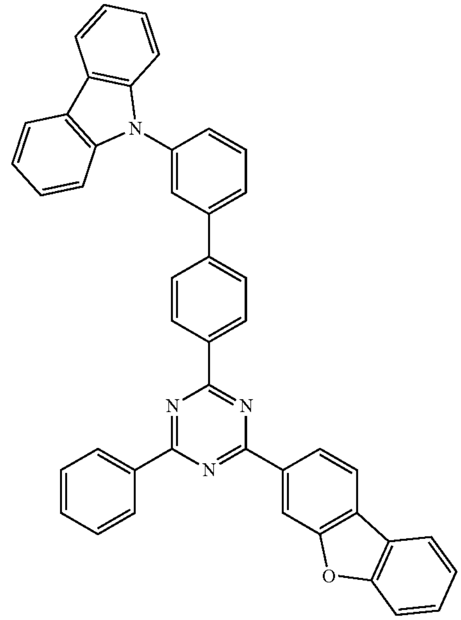
A-52
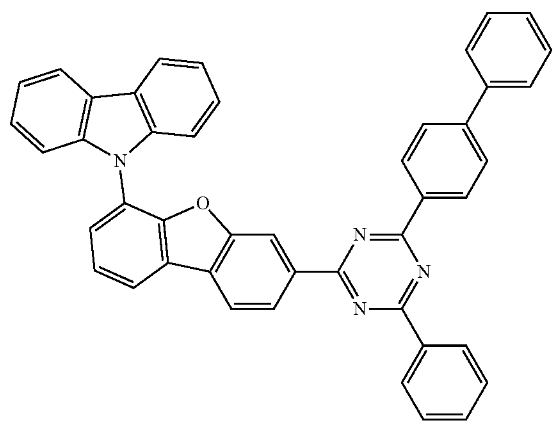
A-53
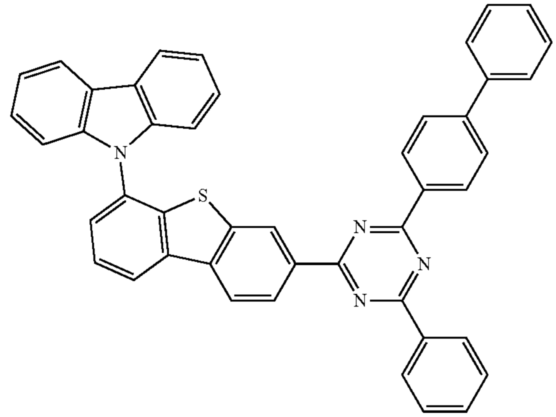

A-54
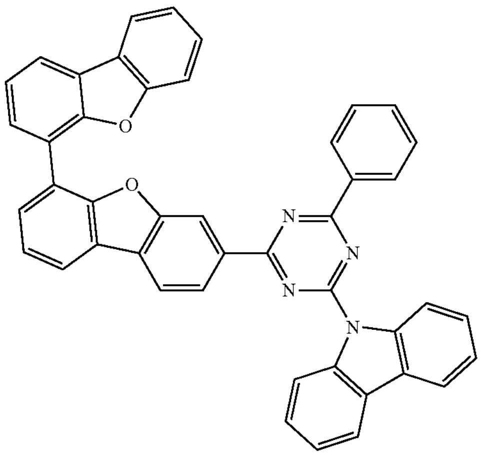
A-55
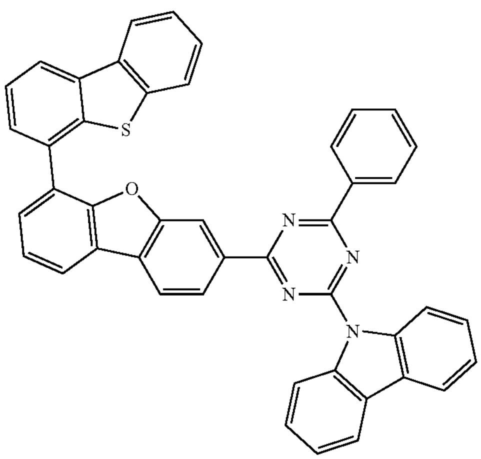
A-56
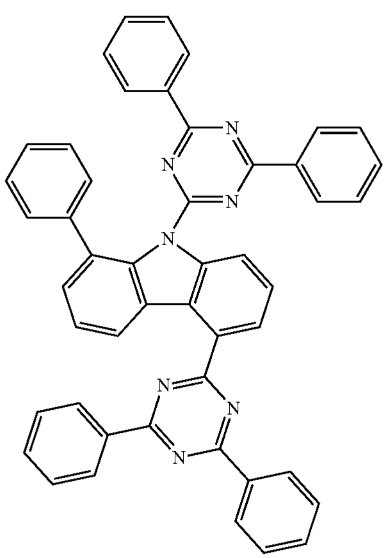
A-57
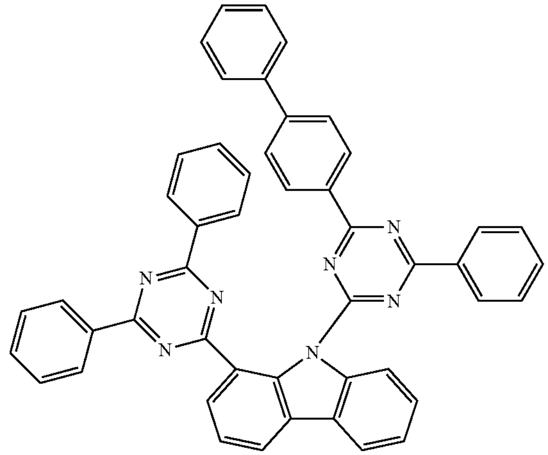
A-58
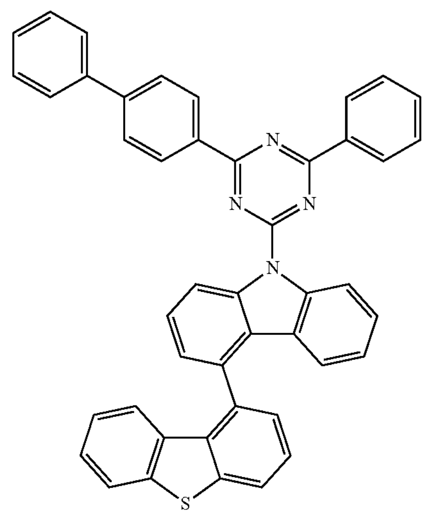
A-59
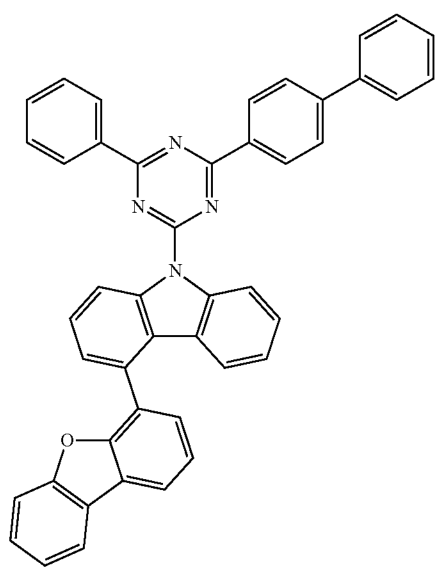

-continued
A-60
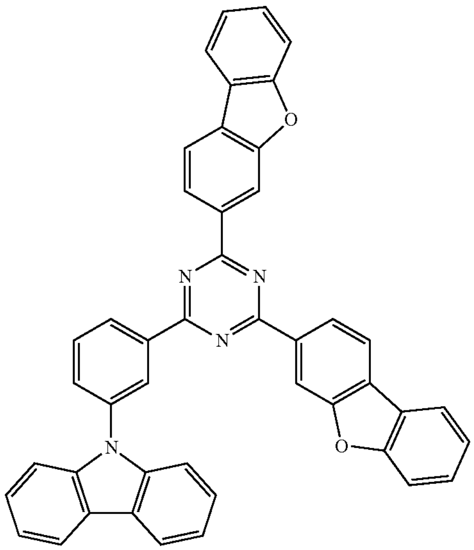
A-61
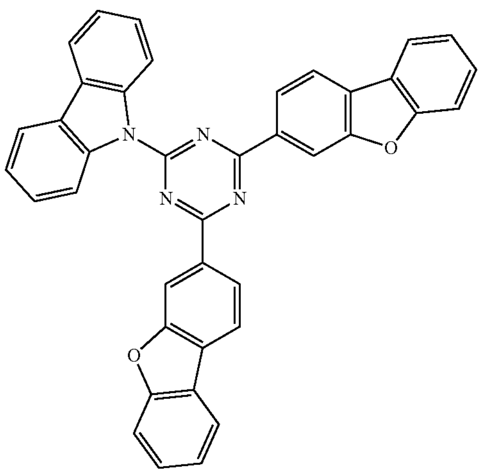
A-62
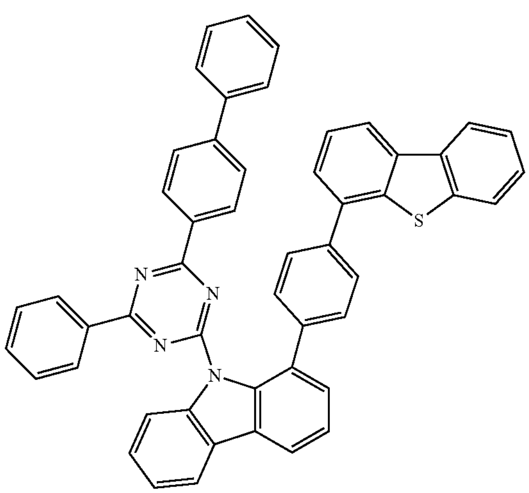
-continued
A-63
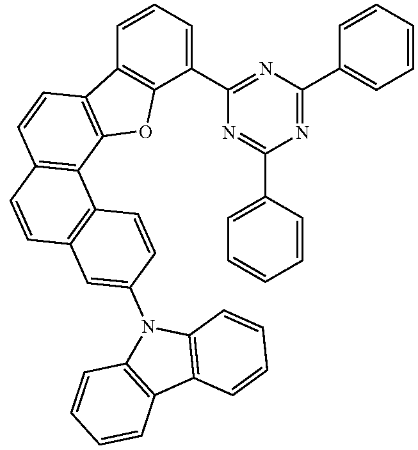
A-64
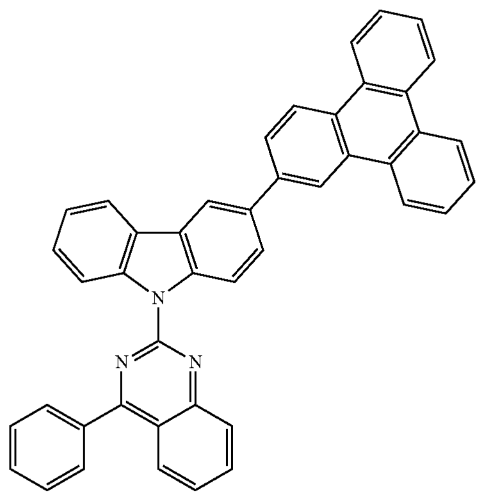
A-65
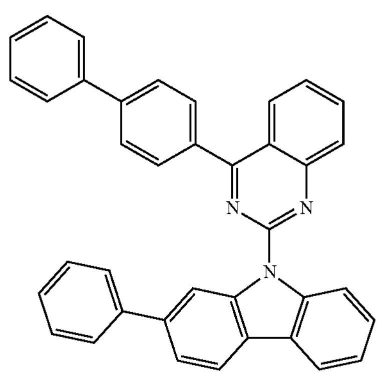

-continued
A-66
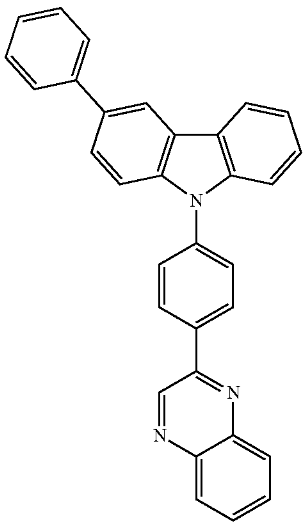
A-67
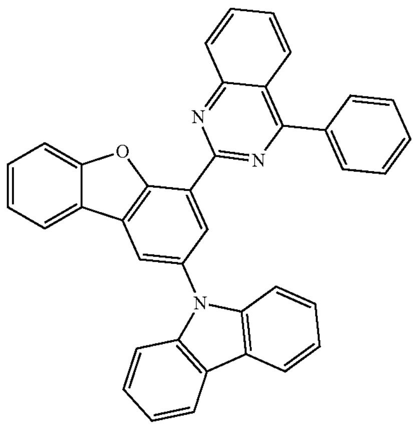
A-68
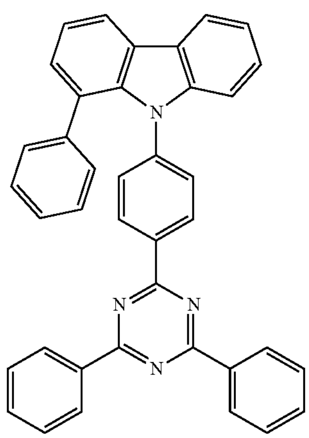
-continued
A-69
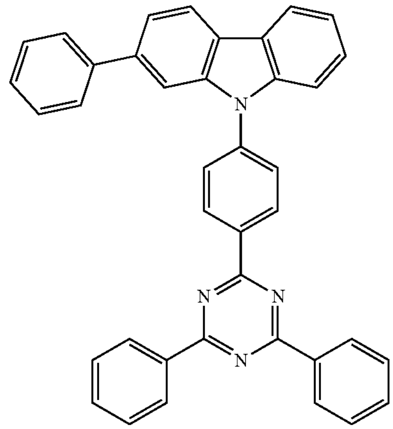
A-70
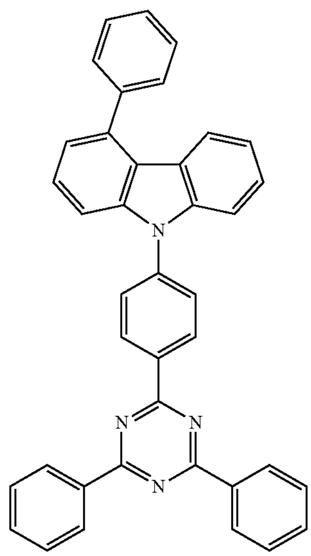
A-71
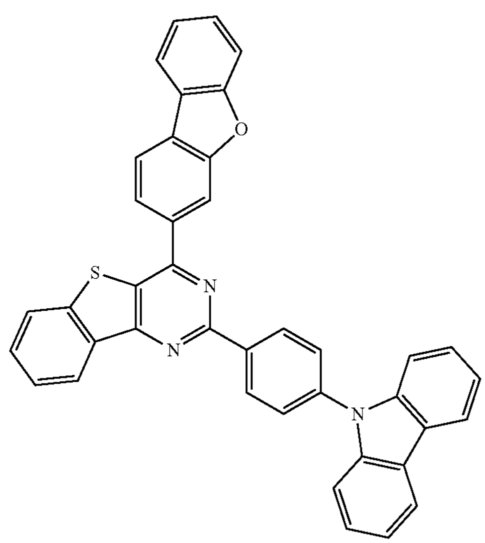

-continued
B-1
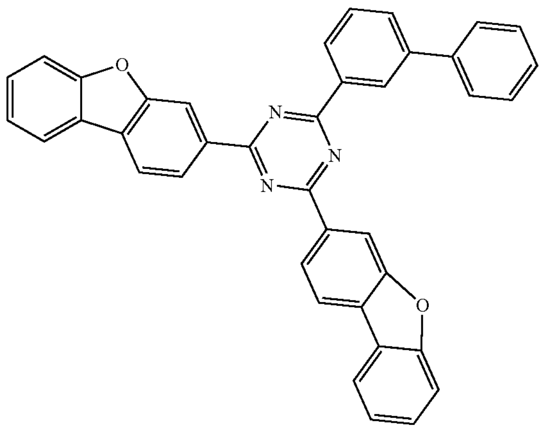
B-2
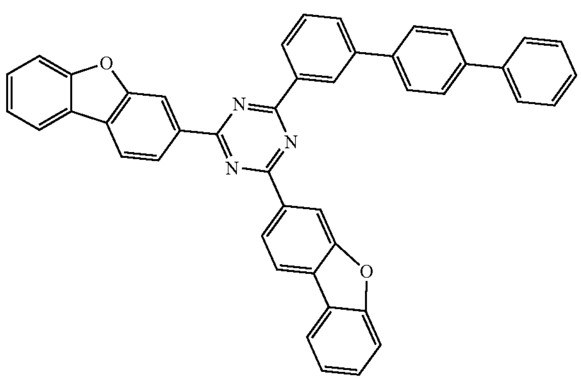
B-3
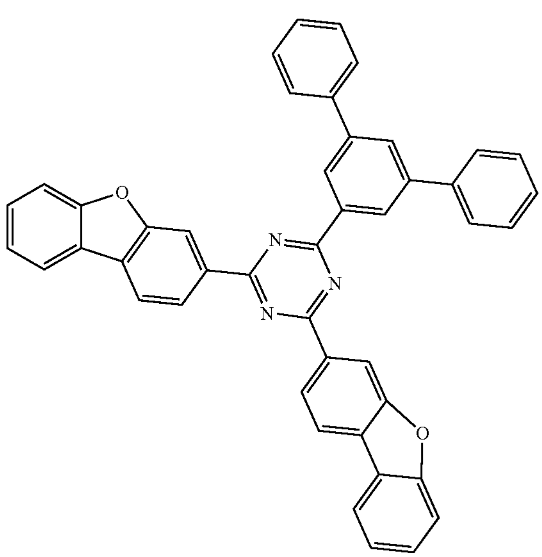
-continued
B-4
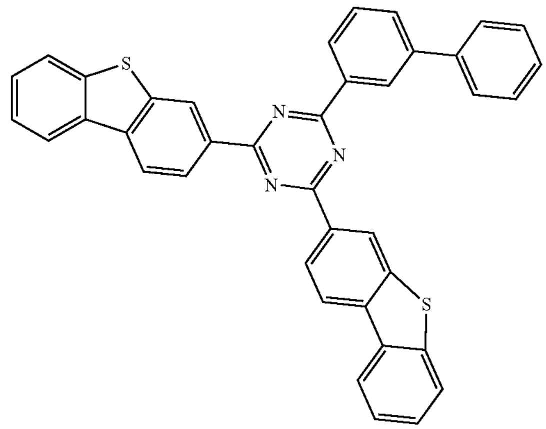
B-5
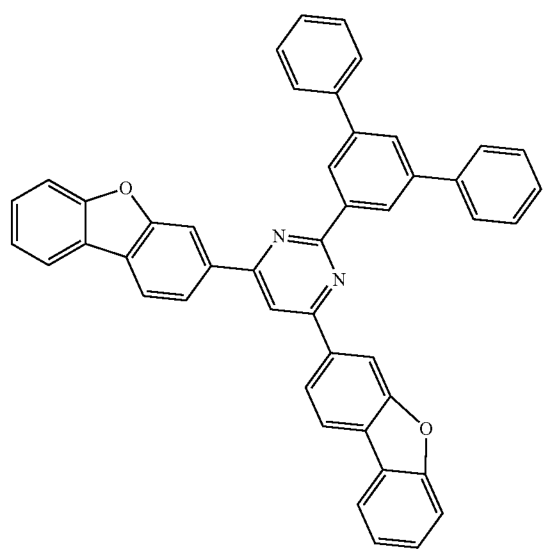
B-6
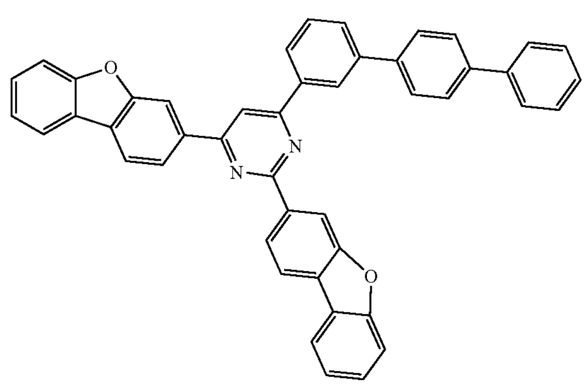

-continued
B-7
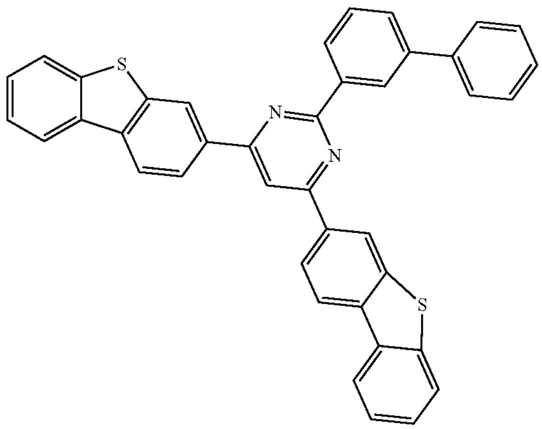
B-8
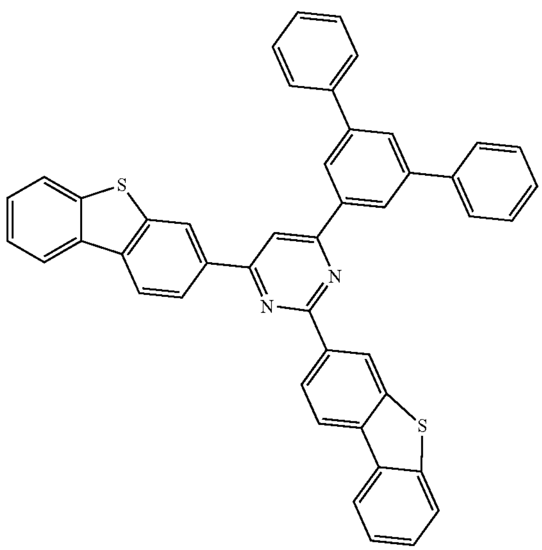
B-9
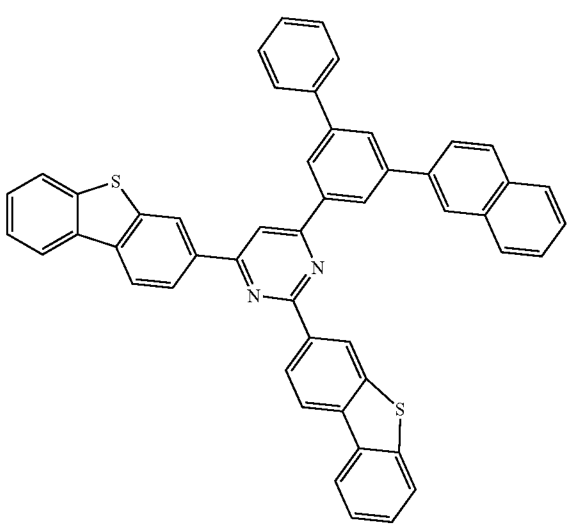
-continued
B-10
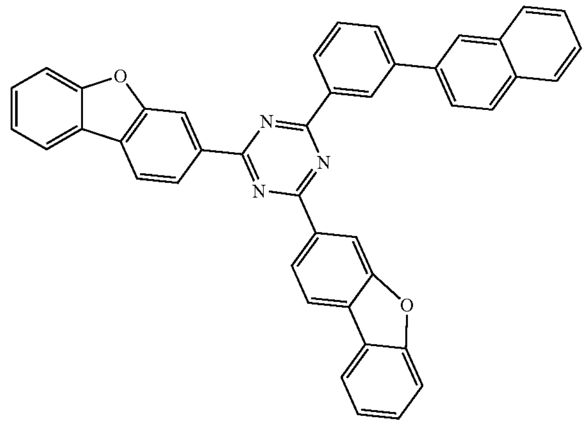
B-11
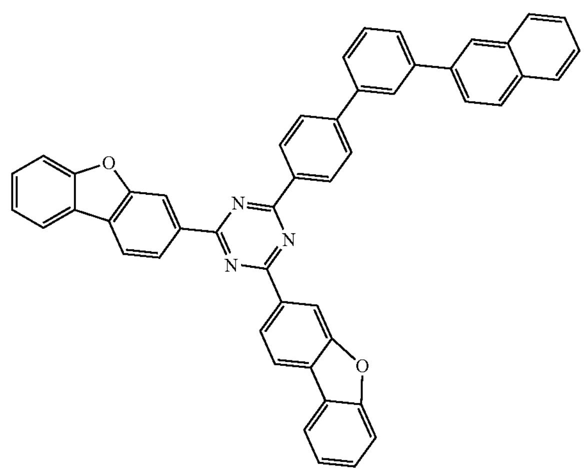
B-12
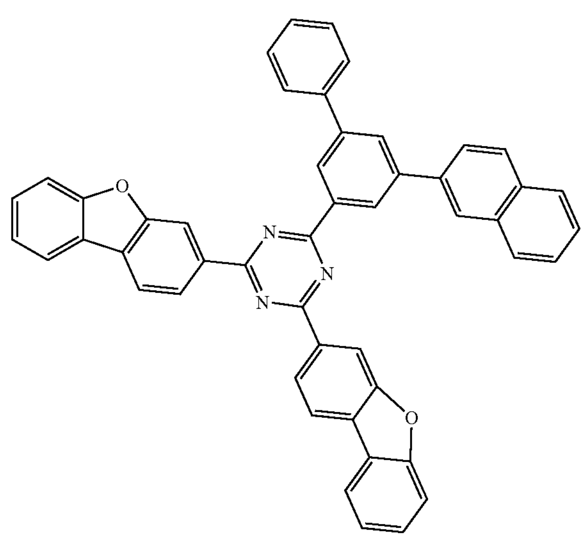

-continued
B-13
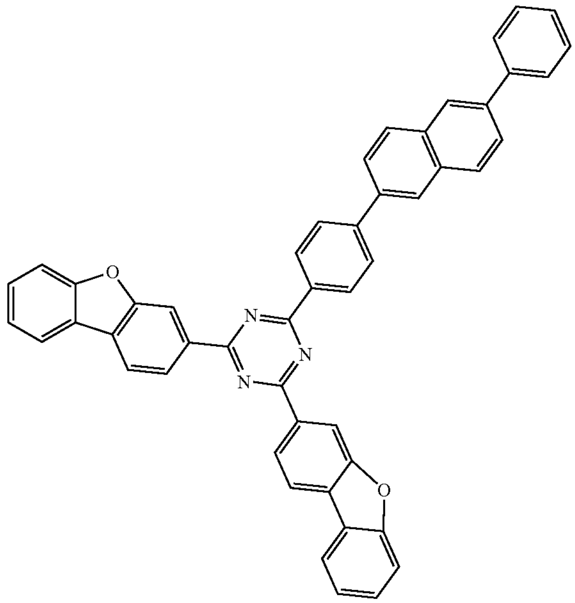
B-14
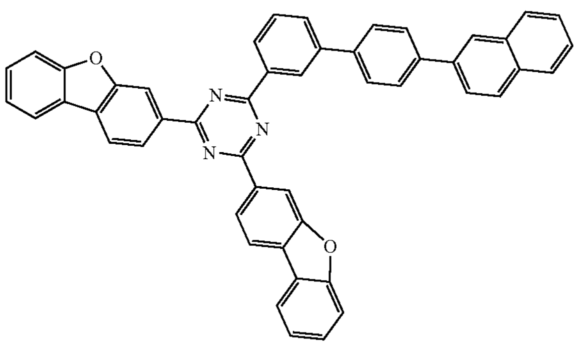
B-15
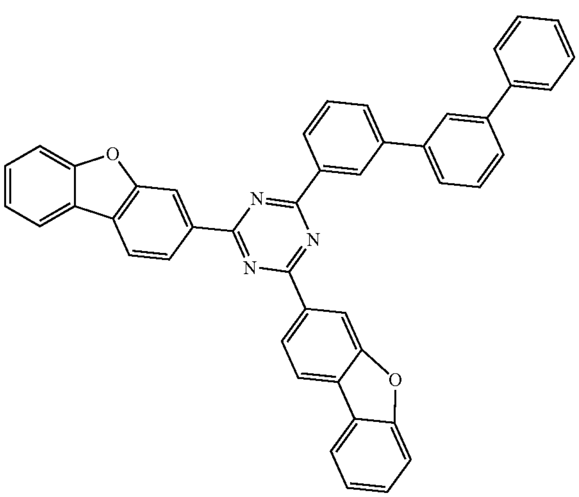
-continued
B-16
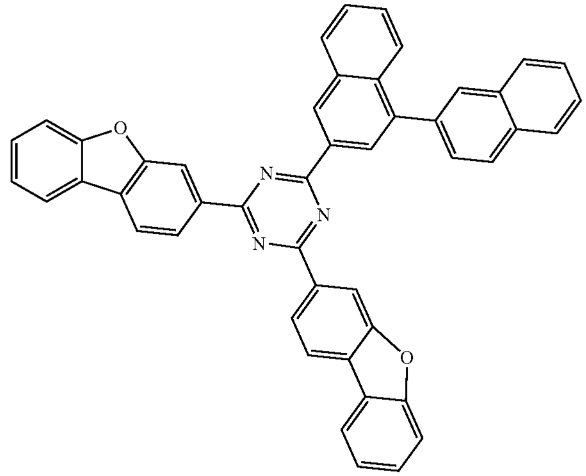
B-17
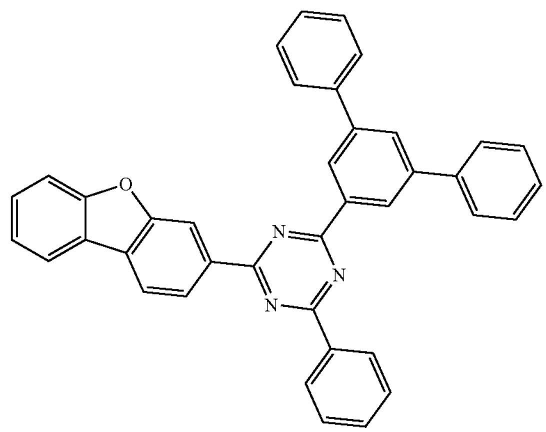
B-18
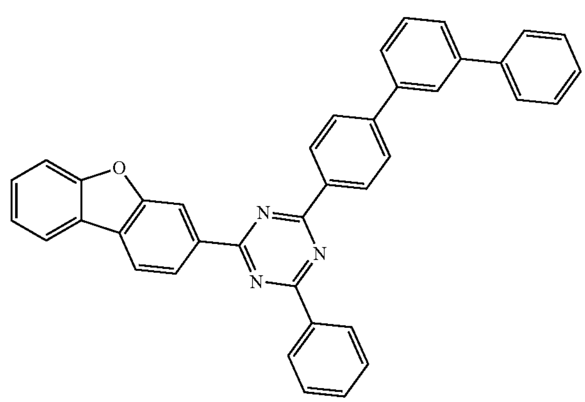

-continued
B-19
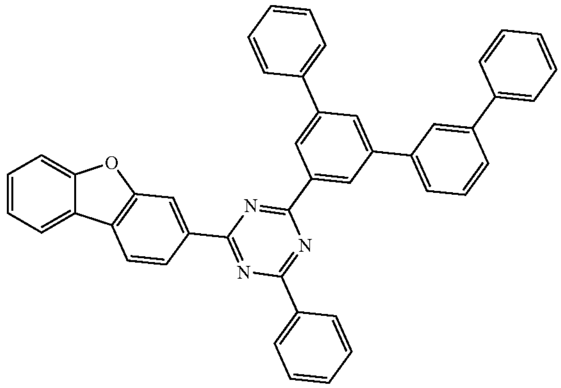
B-20
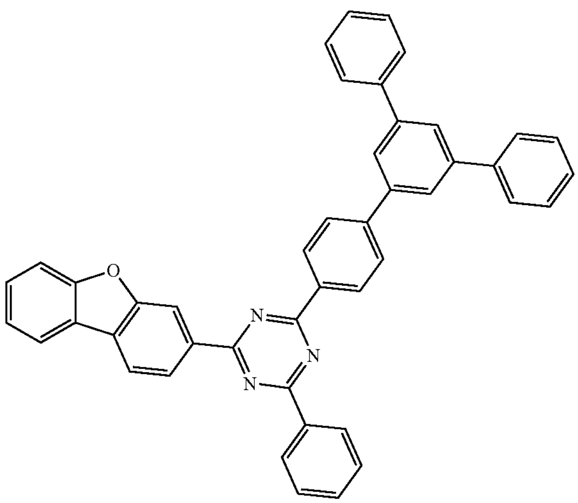
B-21
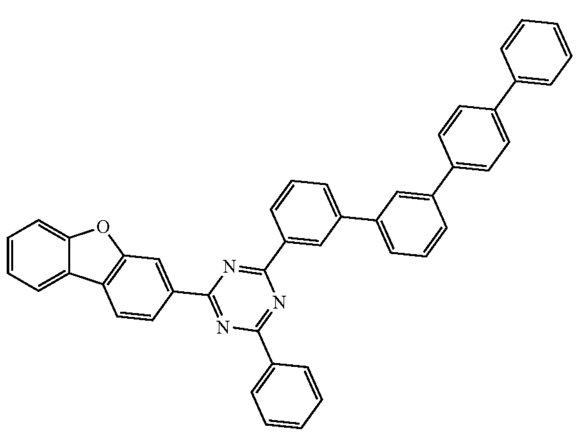
-continued
B-22
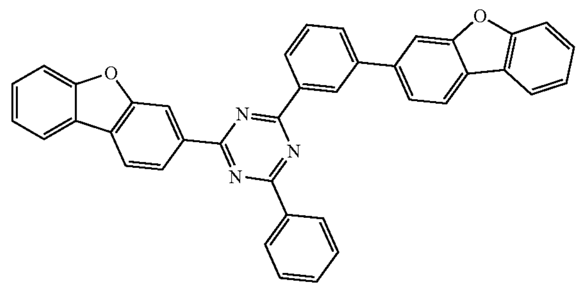
B-23
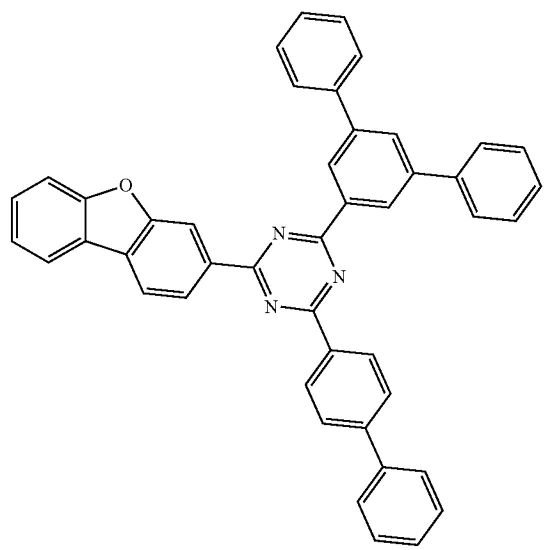
B-24
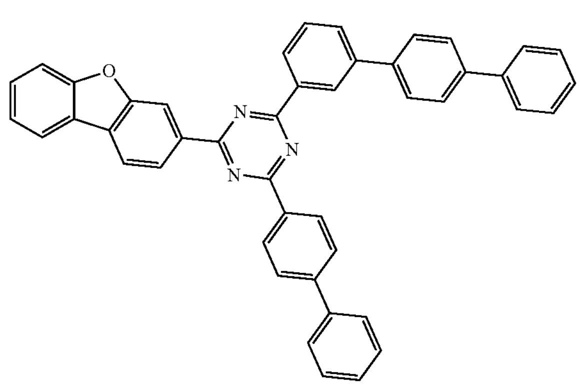

-continued
B-25
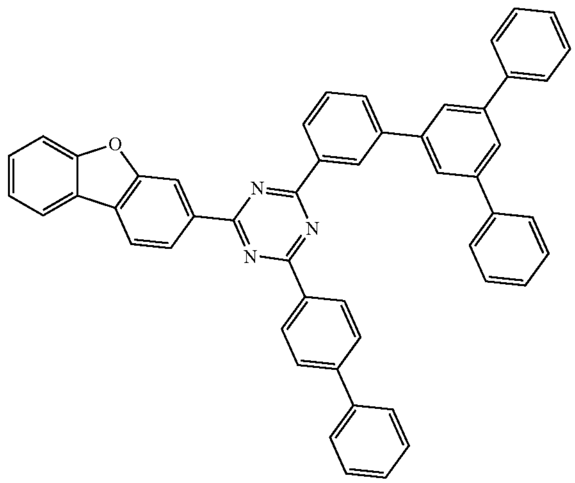
B-26
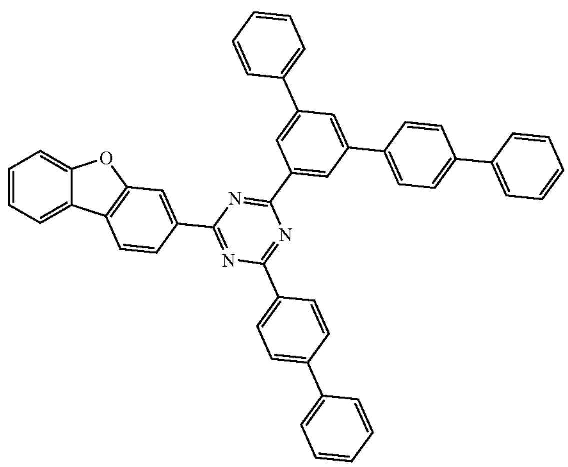
B-27
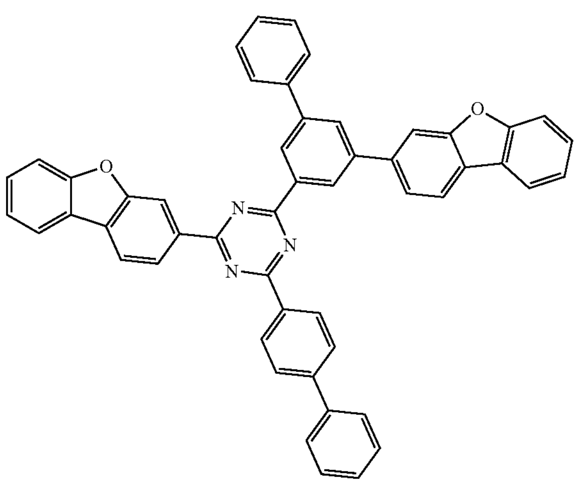
-continued
B-28
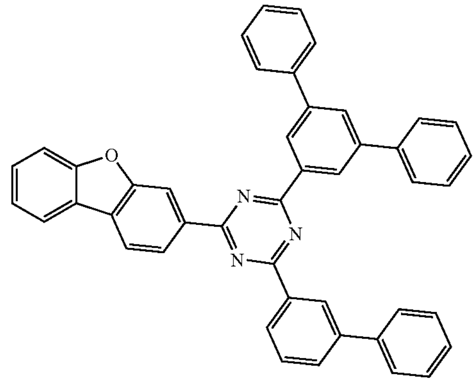
B-29
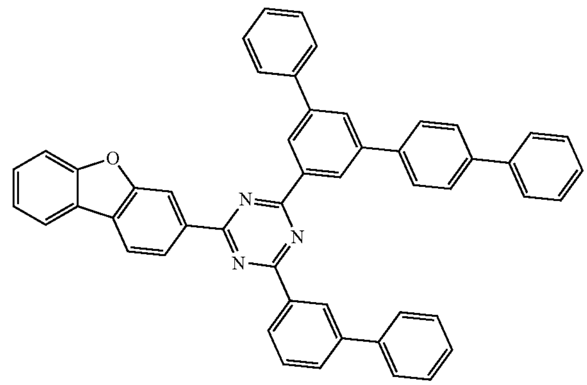
B-30
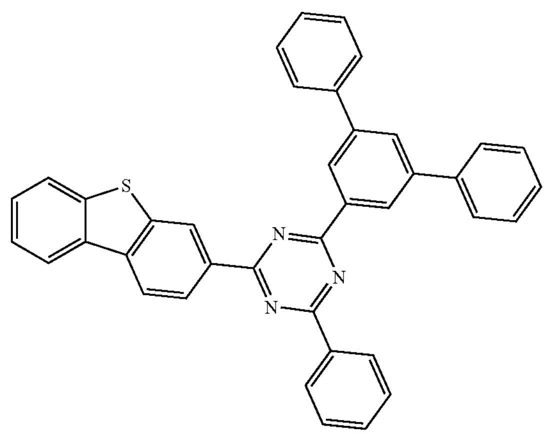
B-31
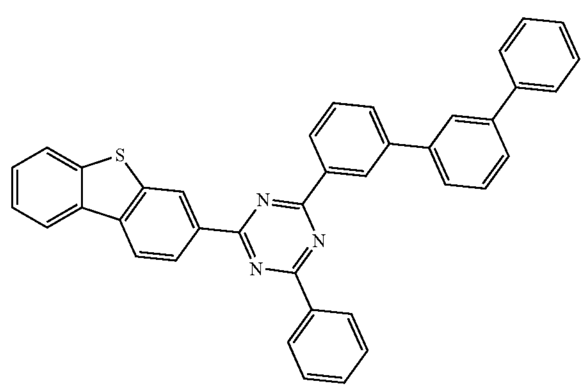

-continued
B-32
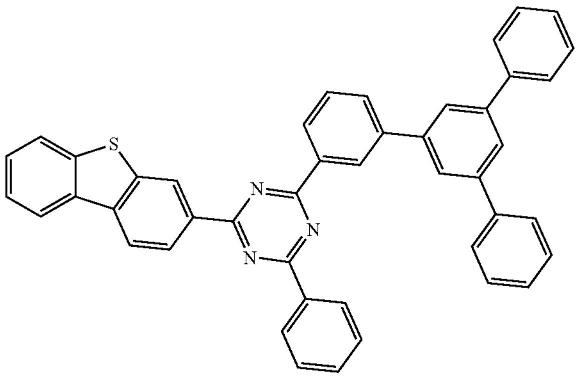
B-33
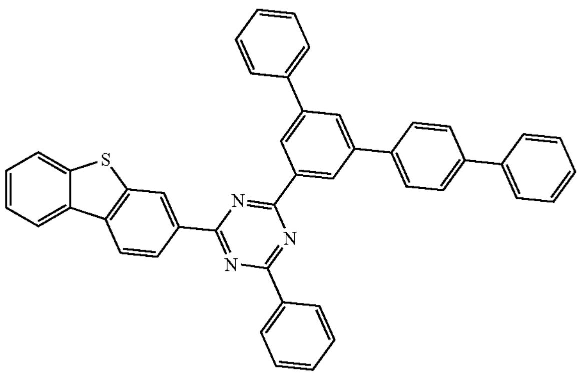
B-34
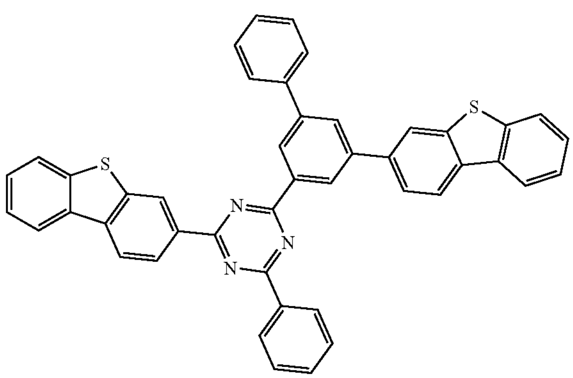
B-35
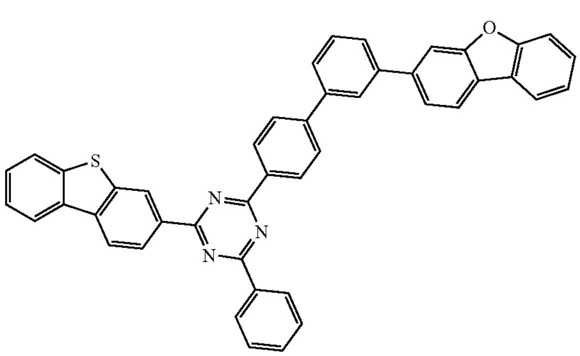
-continued
B-36
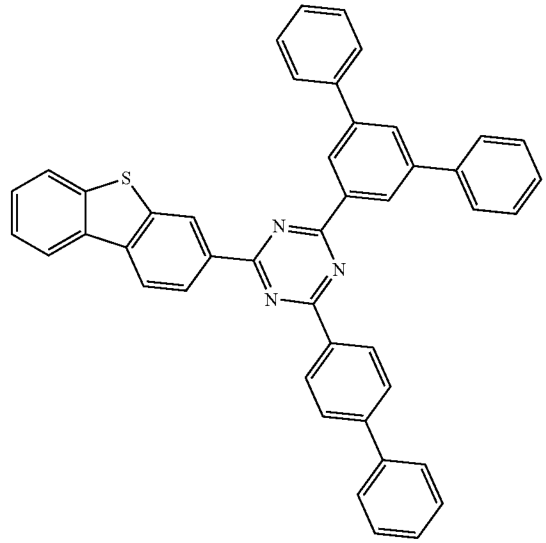
B-37
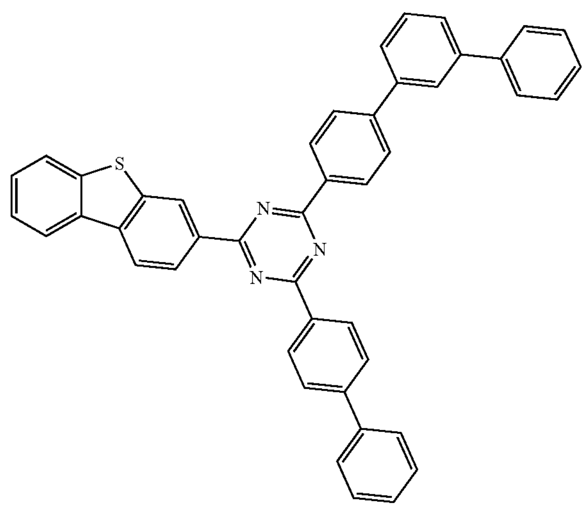
B-38
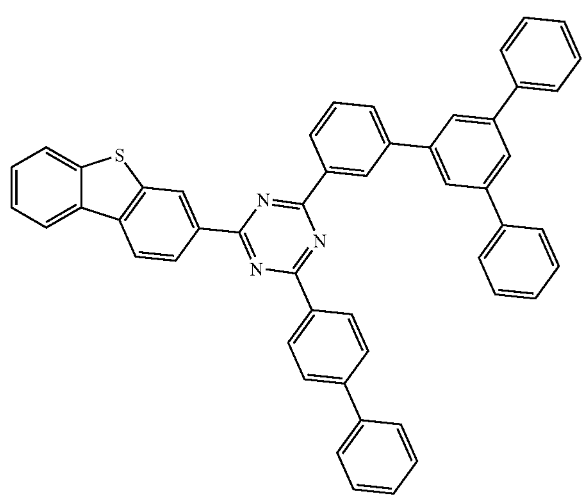

B-39
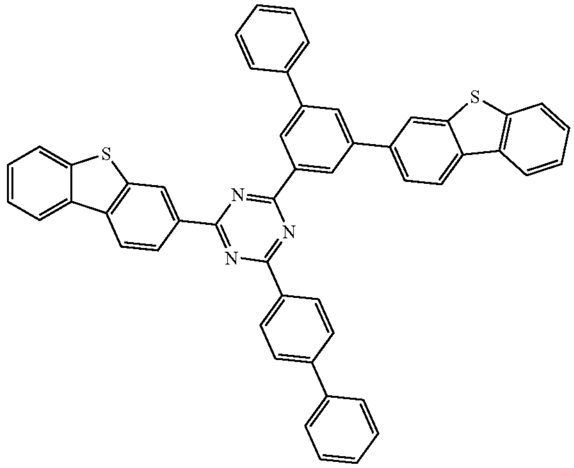
B-40
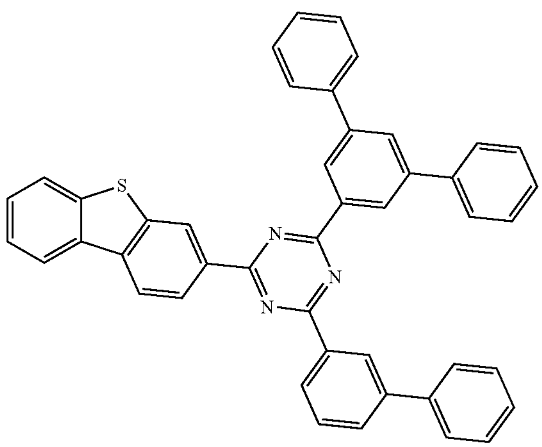
B-41
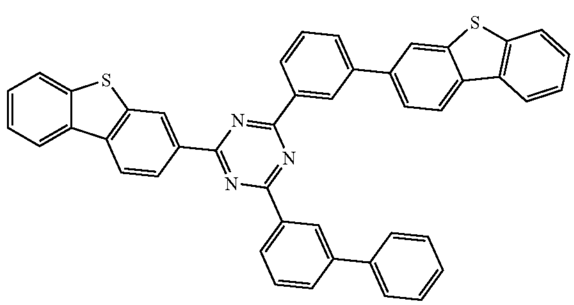
B-42
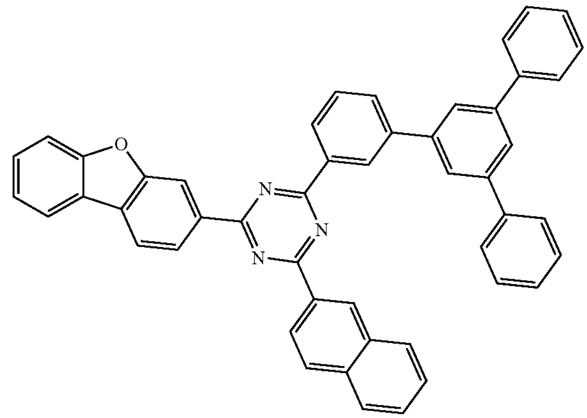
B-43
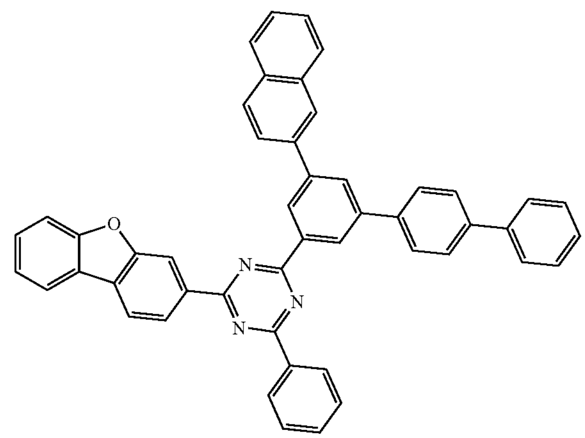
B-44
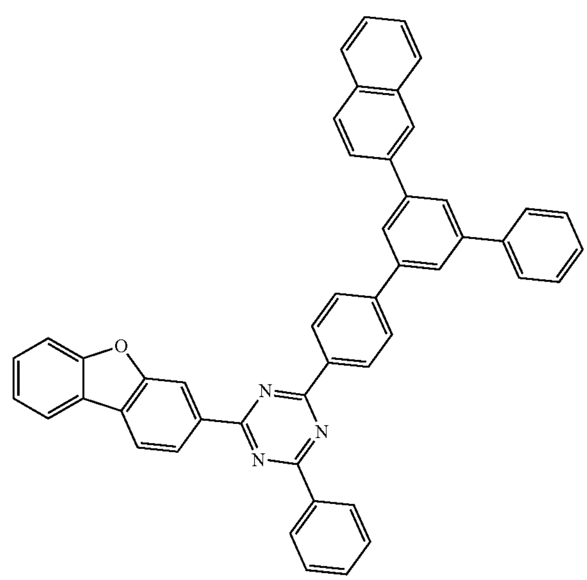

-continued
B-45
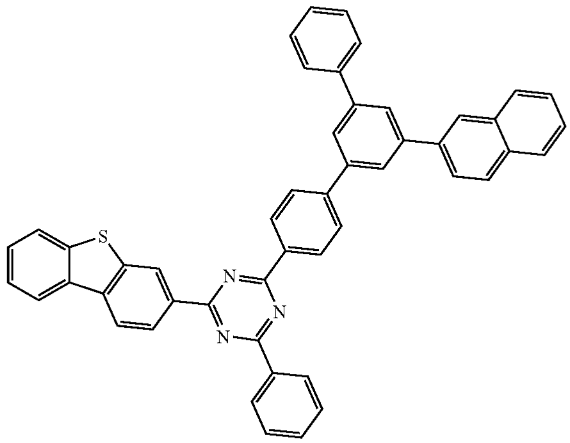
B-46
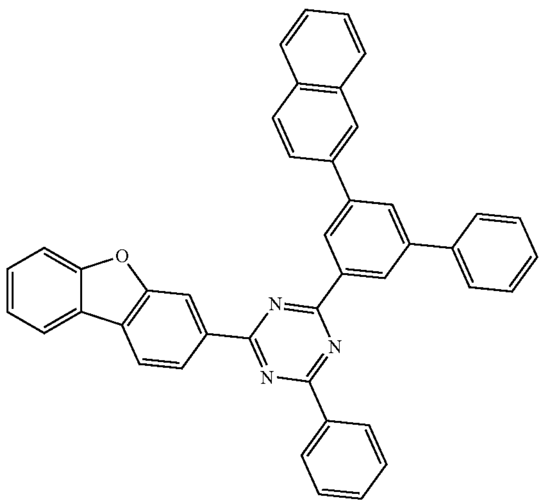
B-47
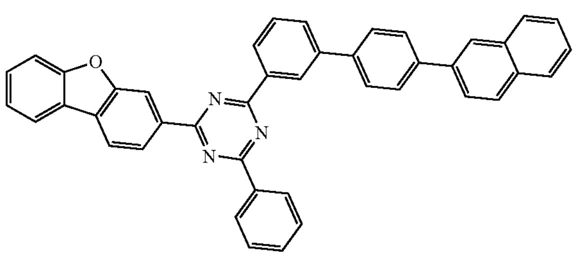
B-48
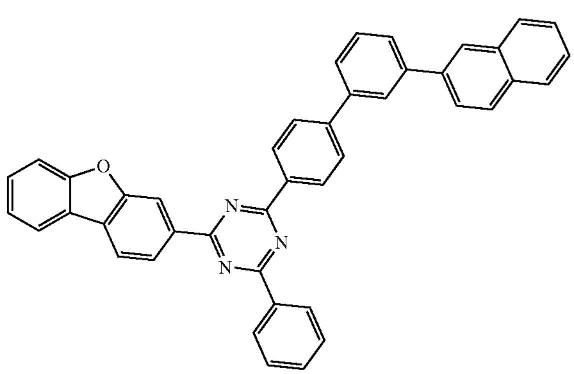
-continued
B-49
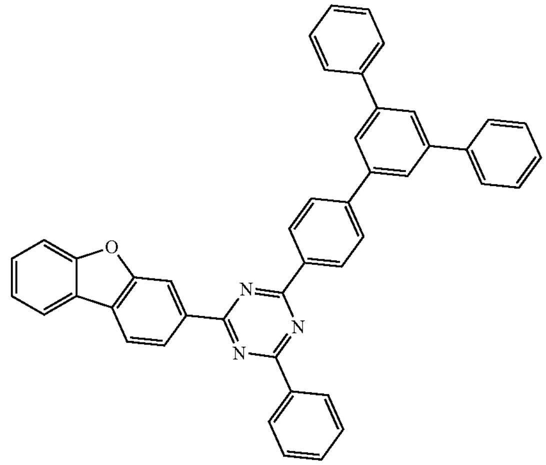
B-50
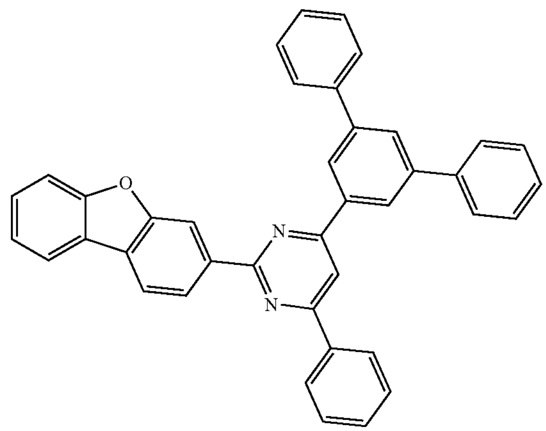
B-51
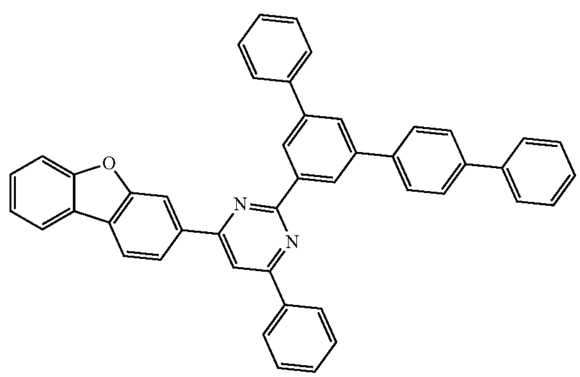

-continued
B-52
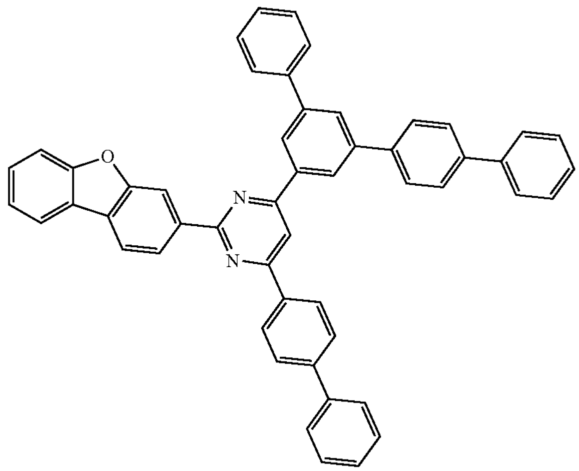
B-53
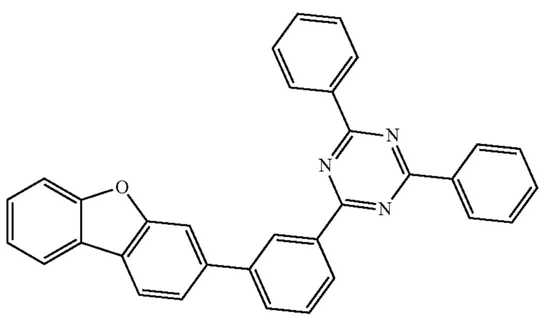
B-54
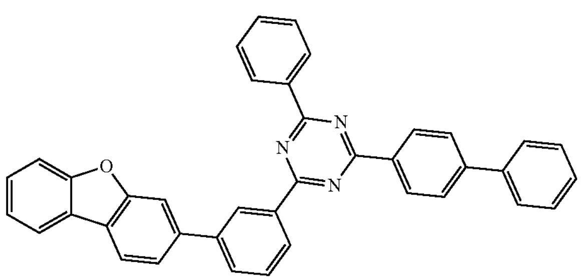
B-55
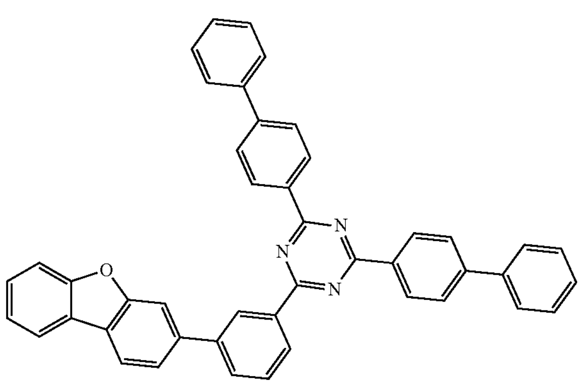
-continued
B-56
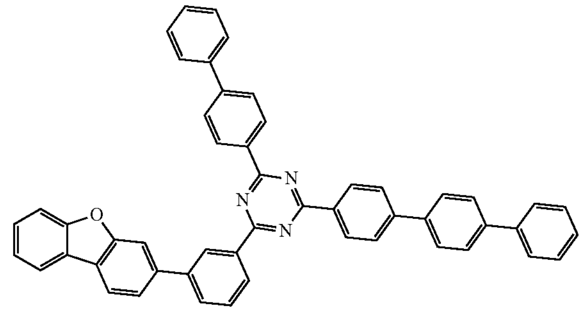
B-57
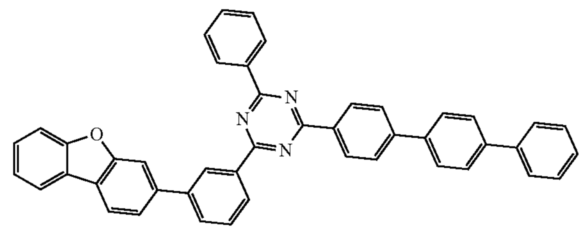
B-58
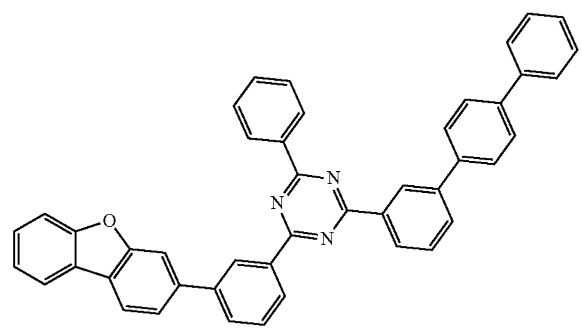
B-59
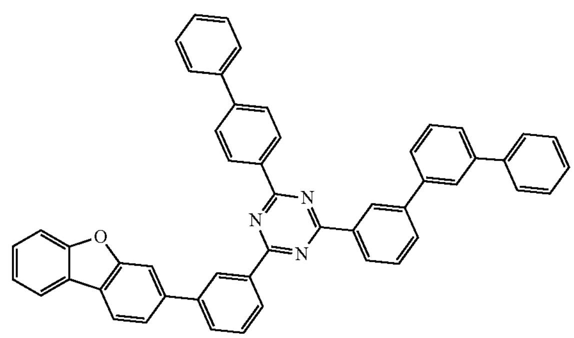
B-60
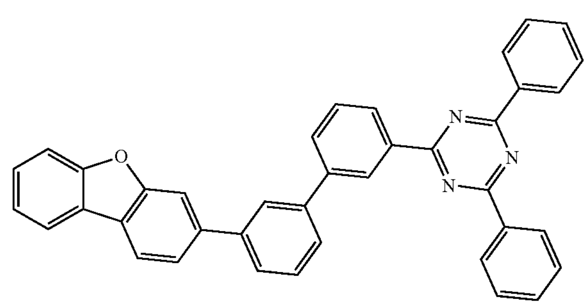

-continued
B-61
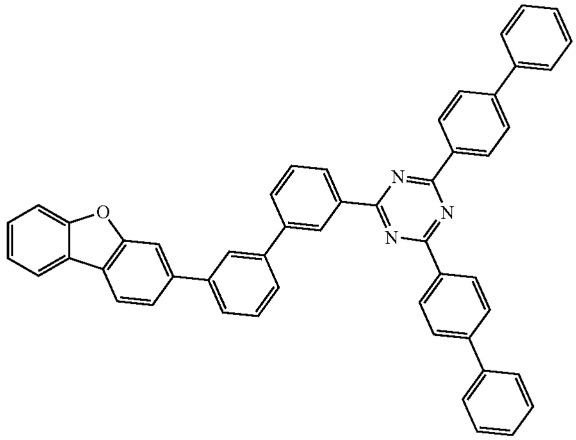
B-62
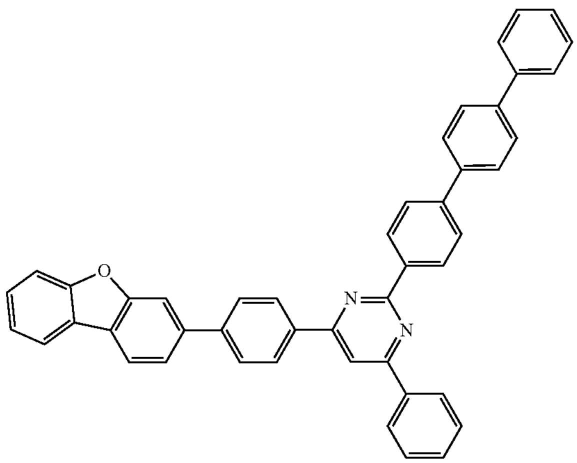
B-63
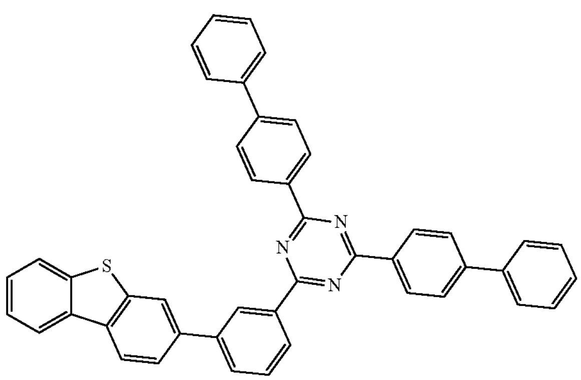
B-64
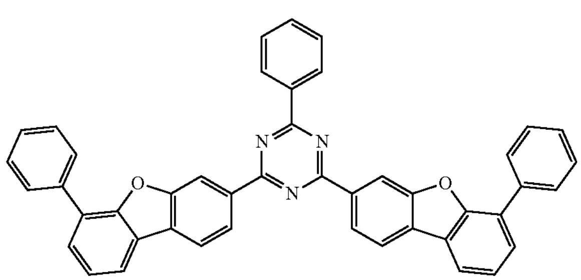
-continued
B-65
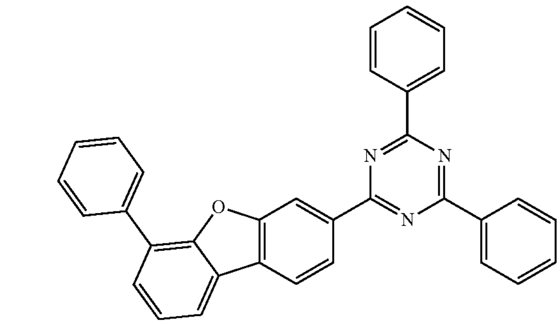
B-66
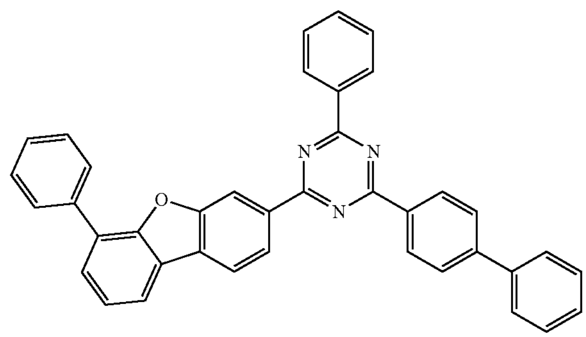
B-67
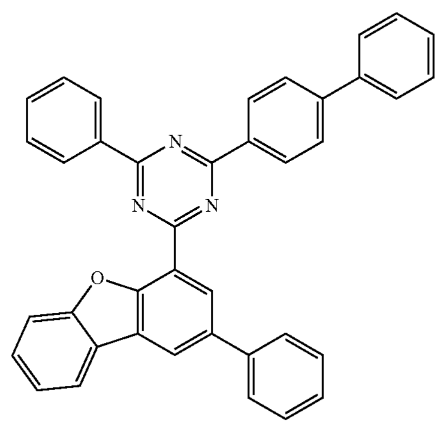
B-68
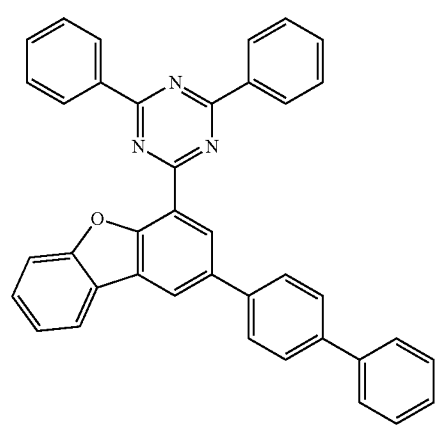

-continued
B-69
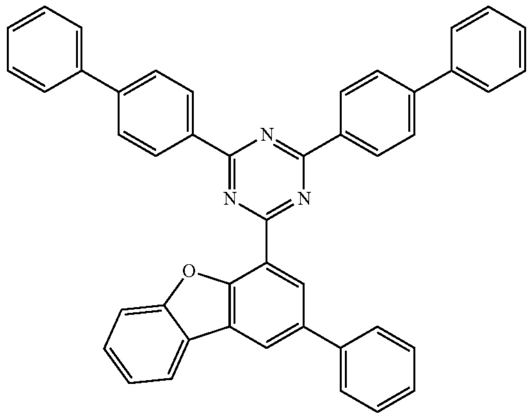
B-70
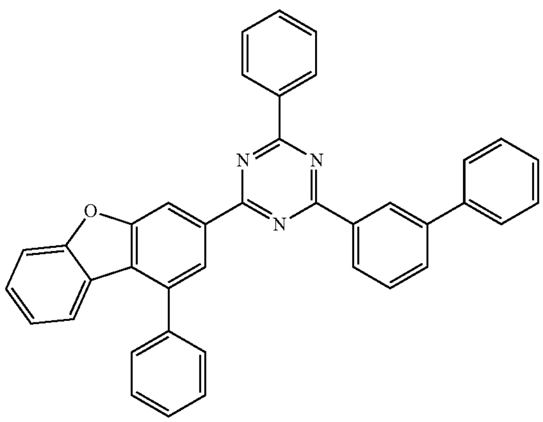
-continued
B-71
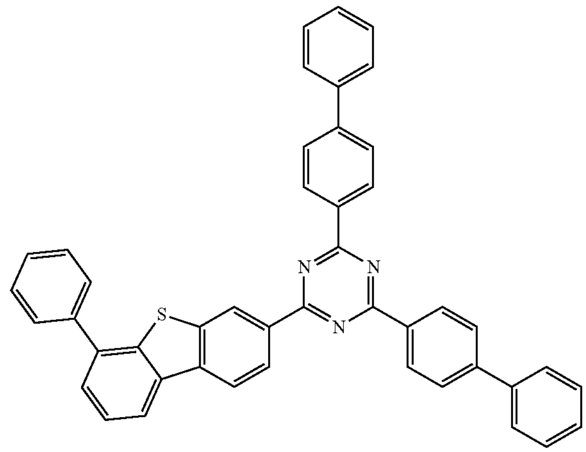
B-72
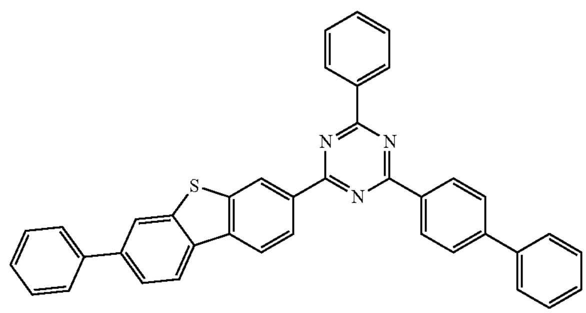
B-73
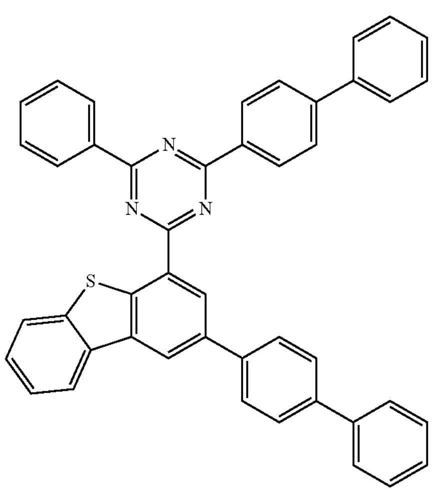
B-74
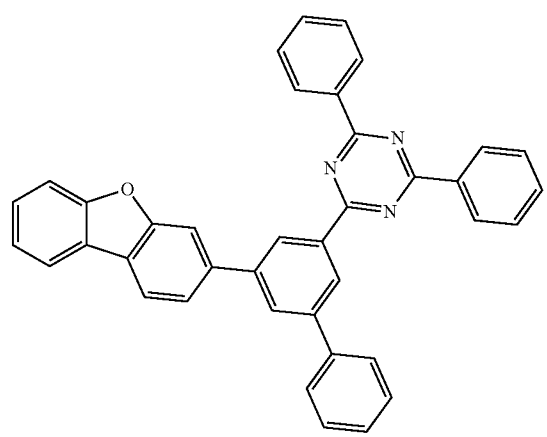

-continued
B-75
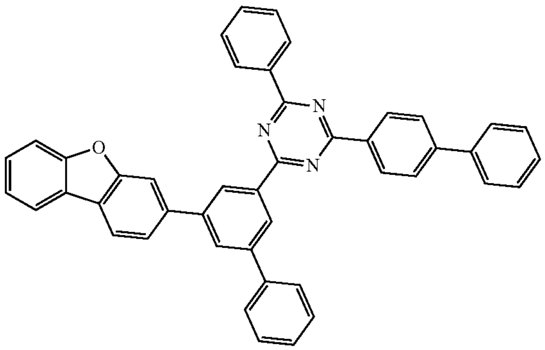
B-76
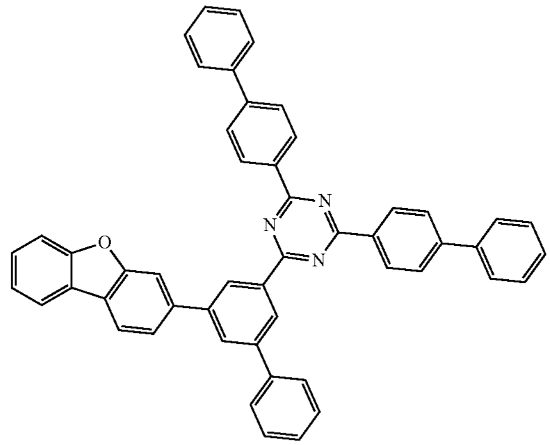
B-77
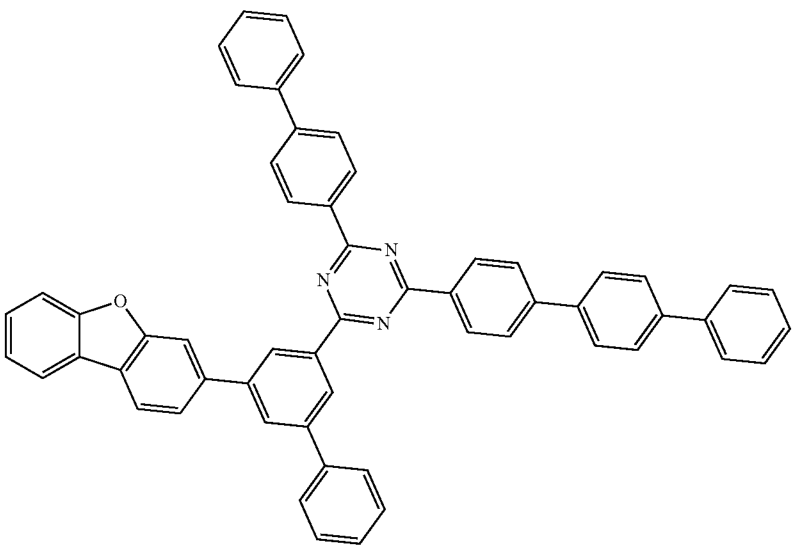
B-78
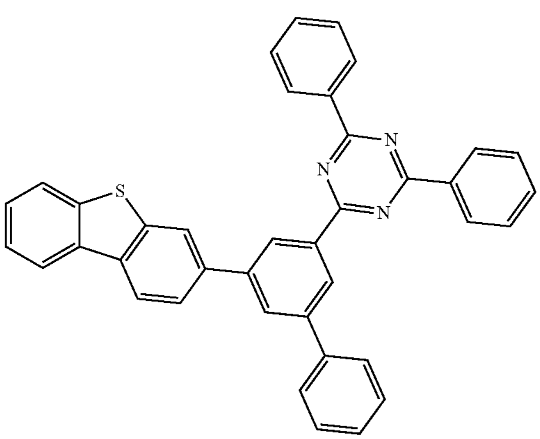
B-79
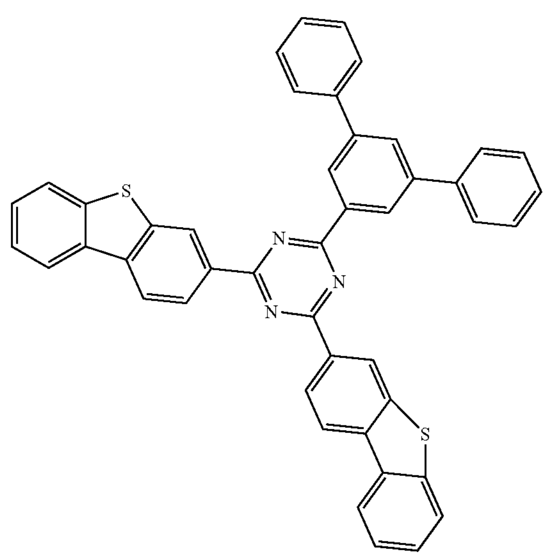

-continued
B-80
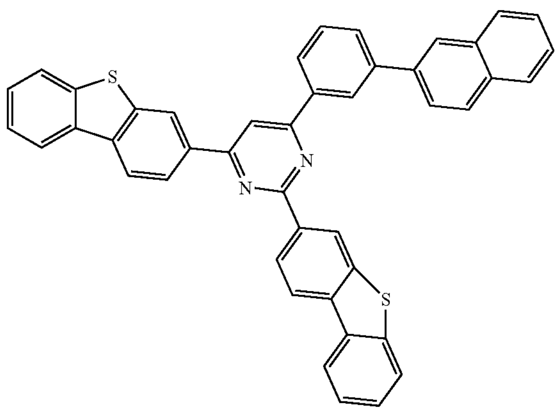
B-81
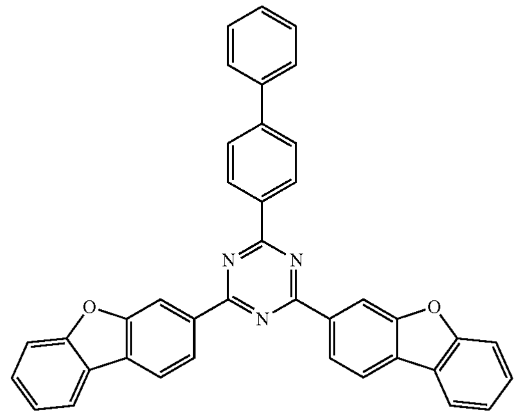
B-82
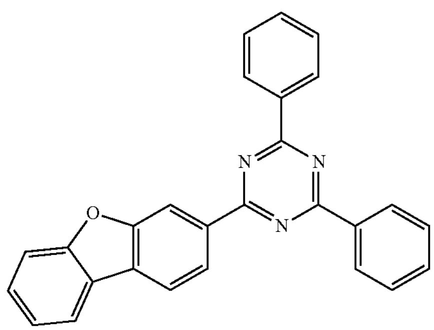
B-83
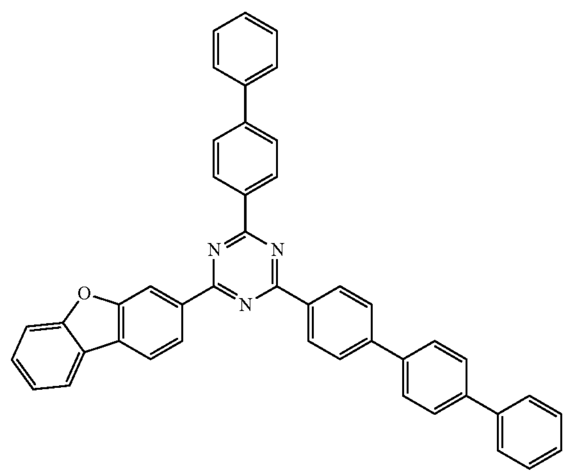
B-84
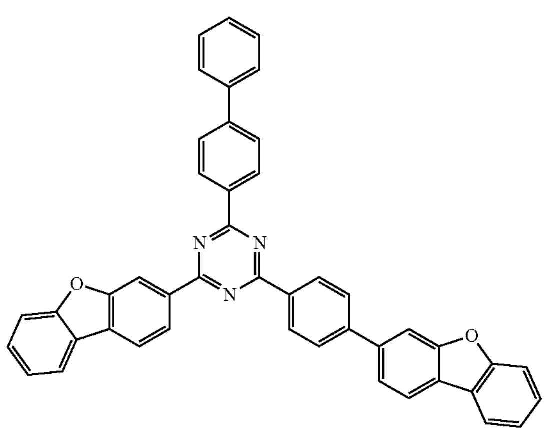
B-85
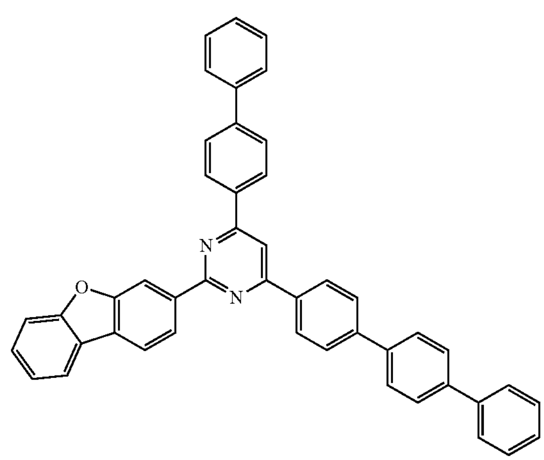

-continued
B-86
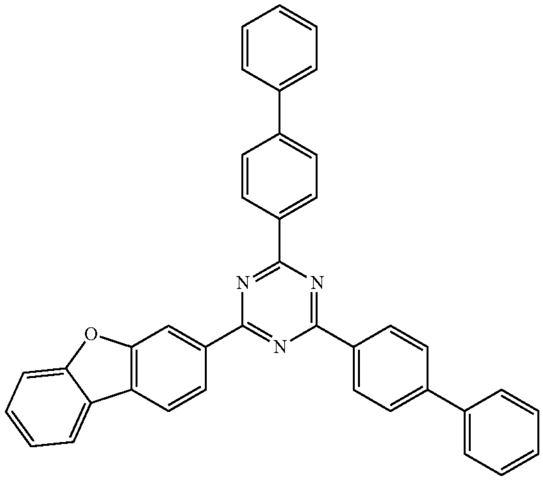
B-87
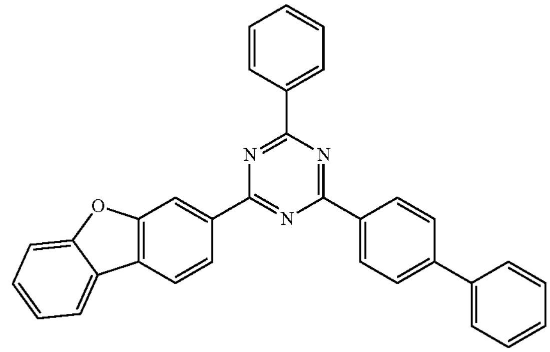
B-88
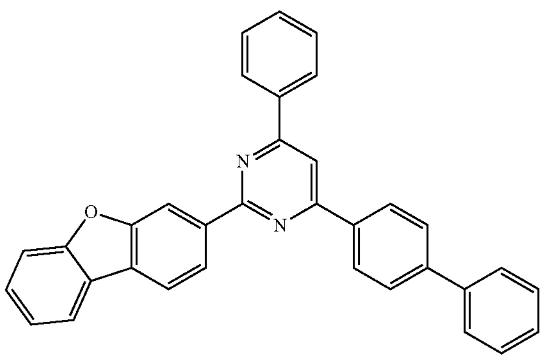
B-89
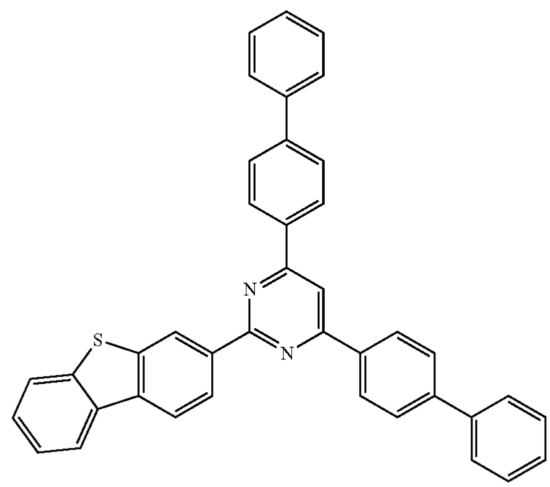
B-90
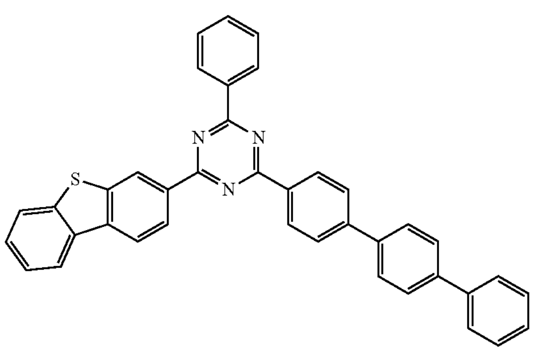
B-91
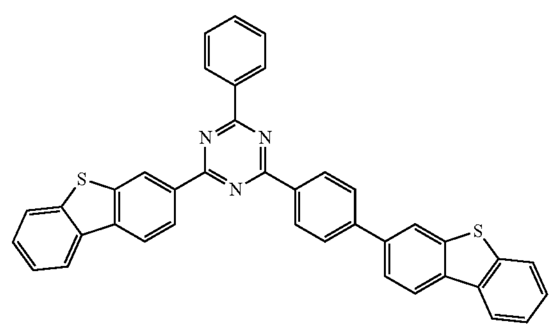

-continued
B-92
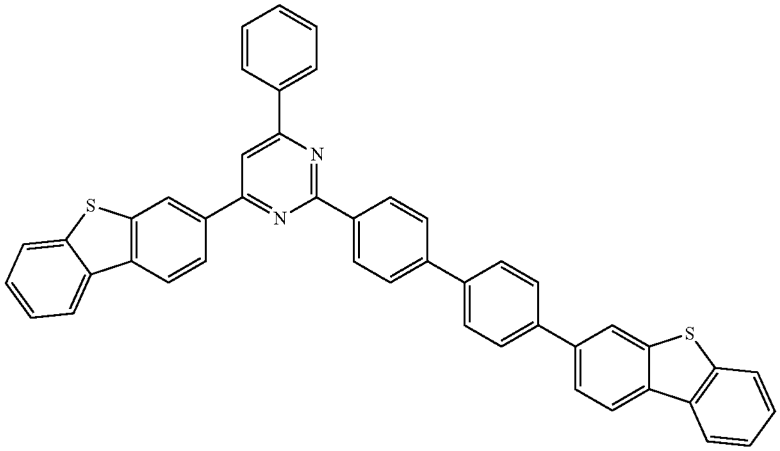
B-93
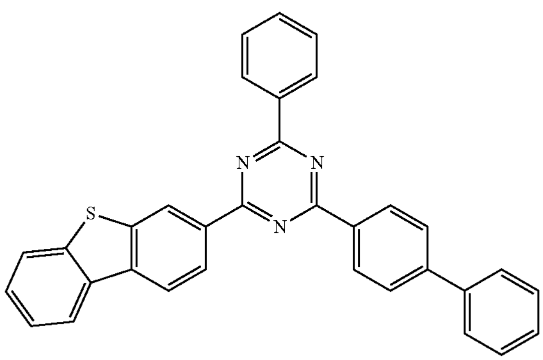
B-94
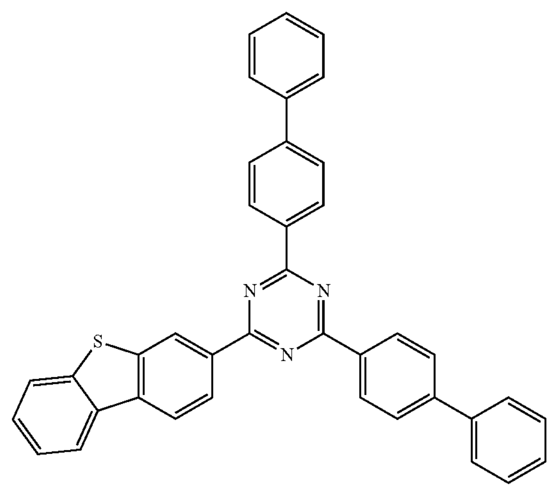
B-95
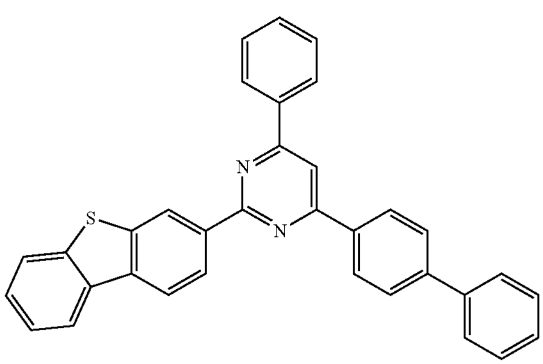
B-96
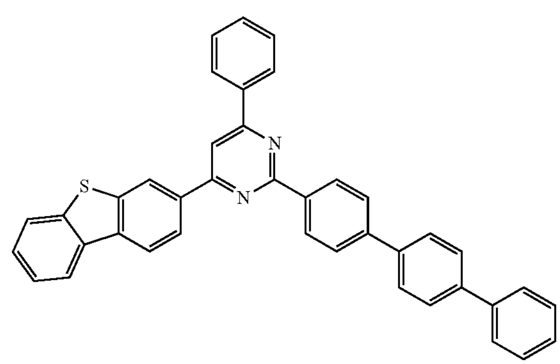

-continued
B-97
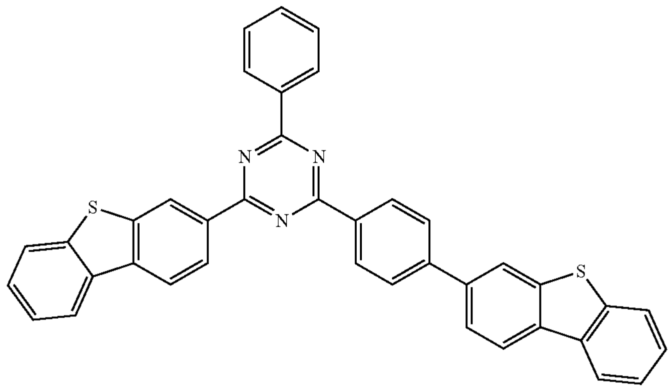
B-98
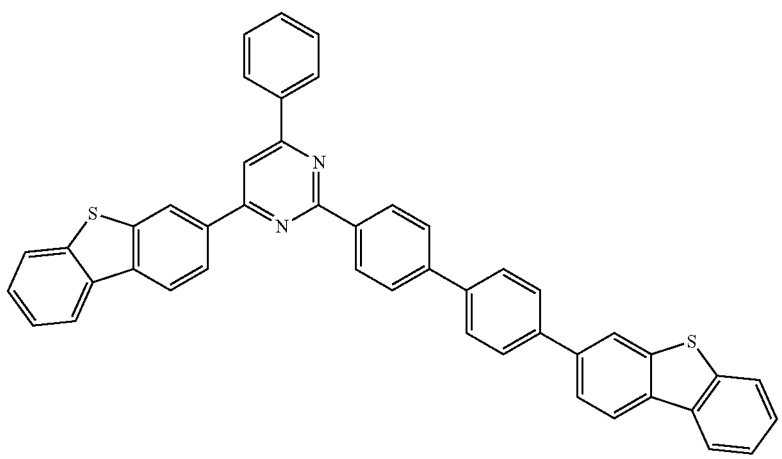
B-99
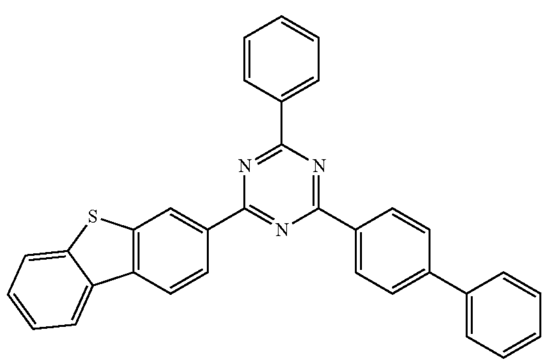
B-100
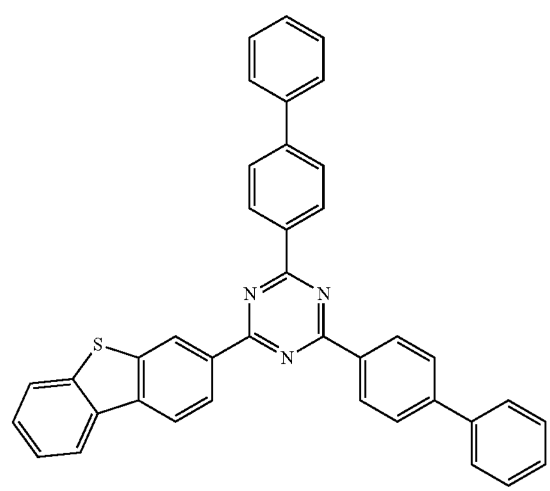

-continued
B-101
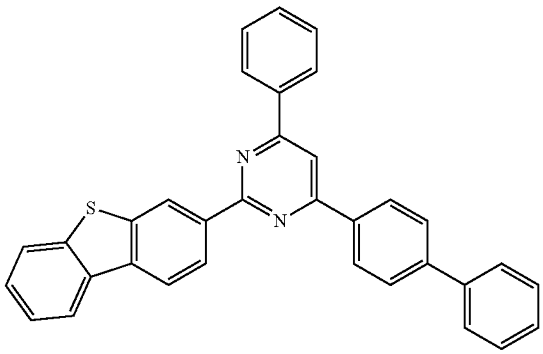
B-102
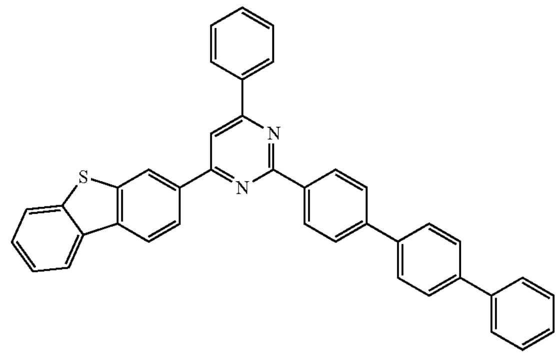
B-103
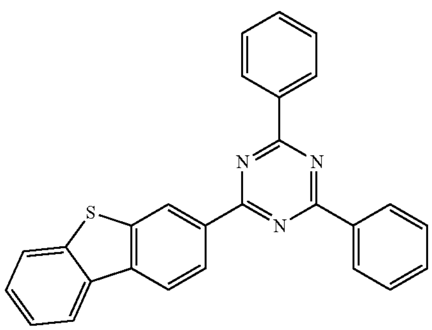
B-104
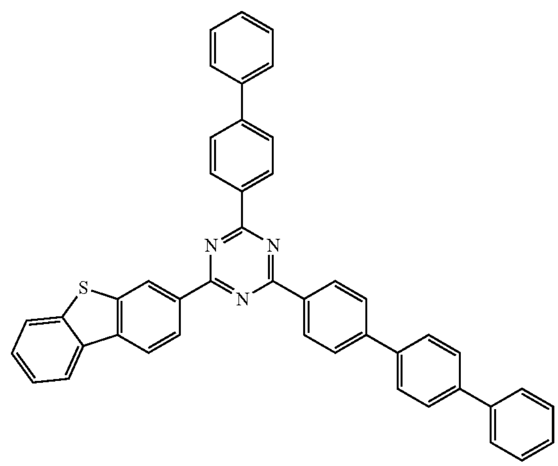
B-105
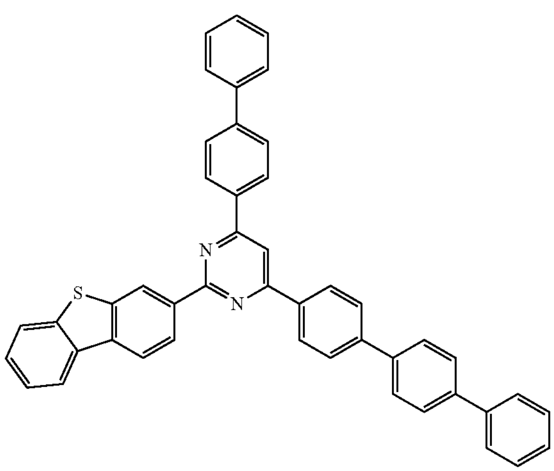
B-106
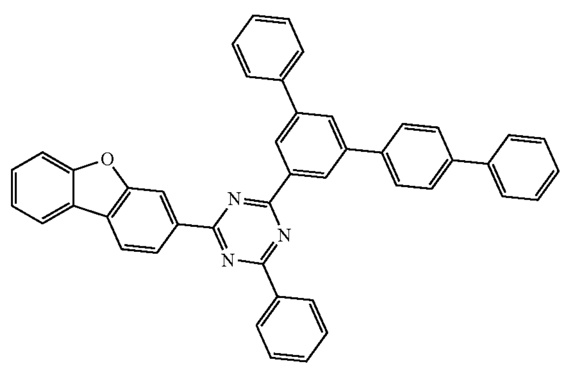

-continued
B-107
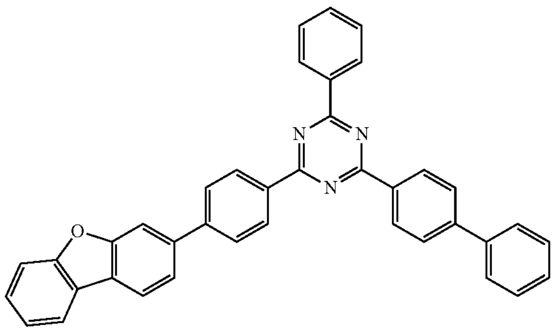
B-108
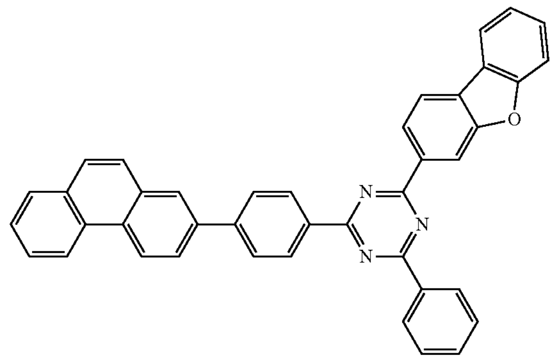
B-109
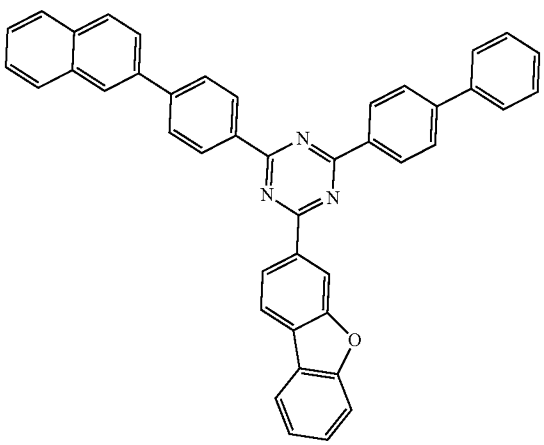
B-110
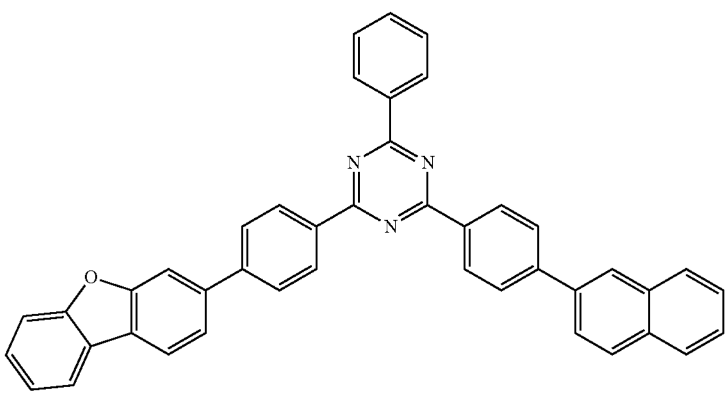

-continued
B-111
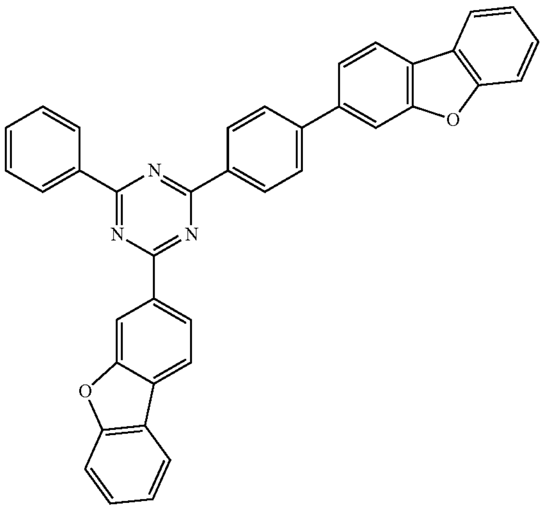
B-112
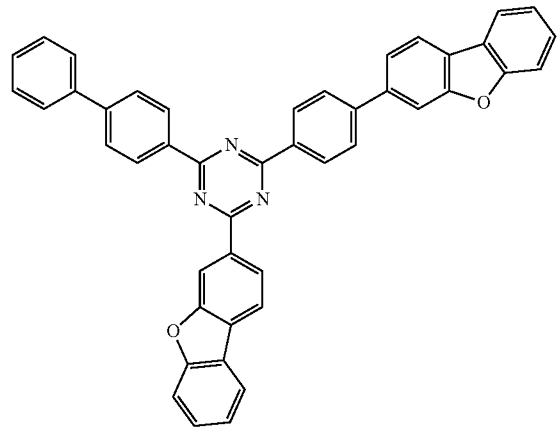
B-113
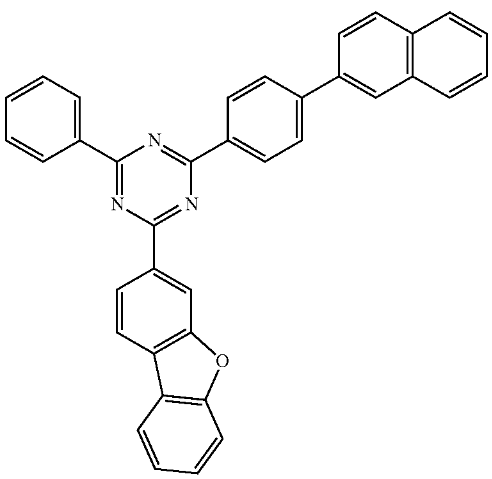
B-114
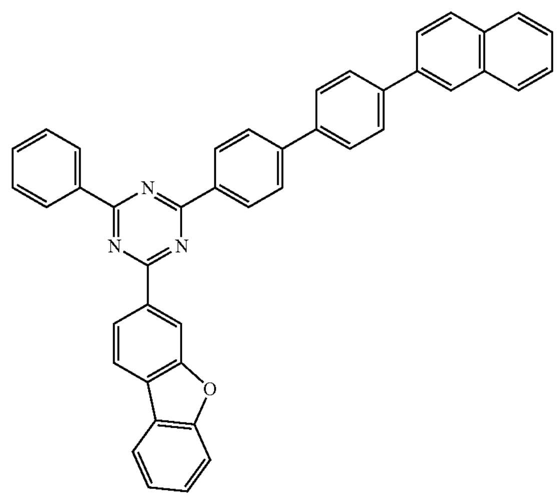
B-115
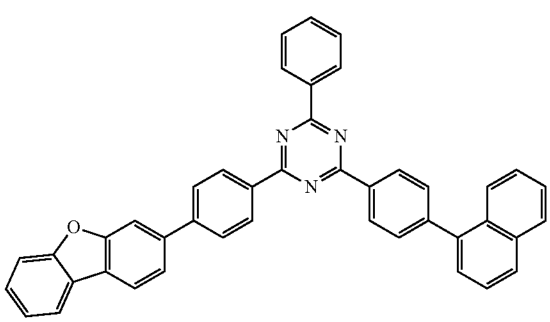
B-116
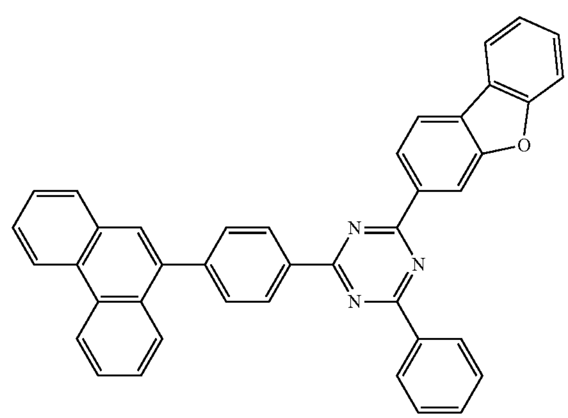

-continued
B-117
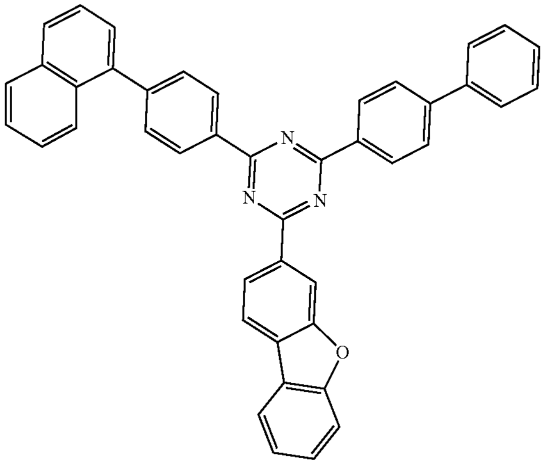
B-118
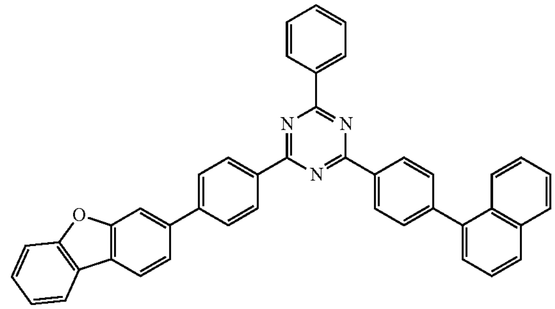
B-119
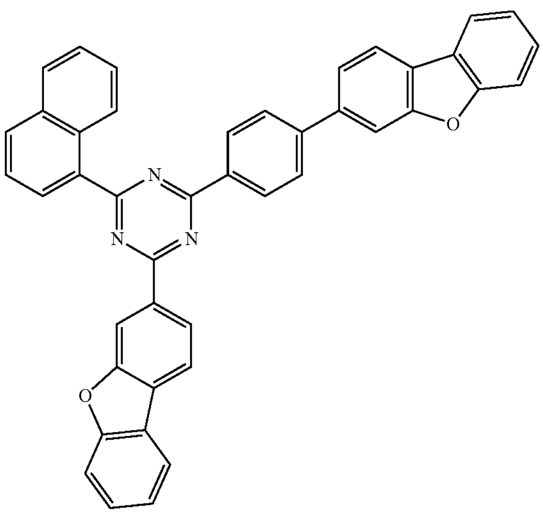
B-120
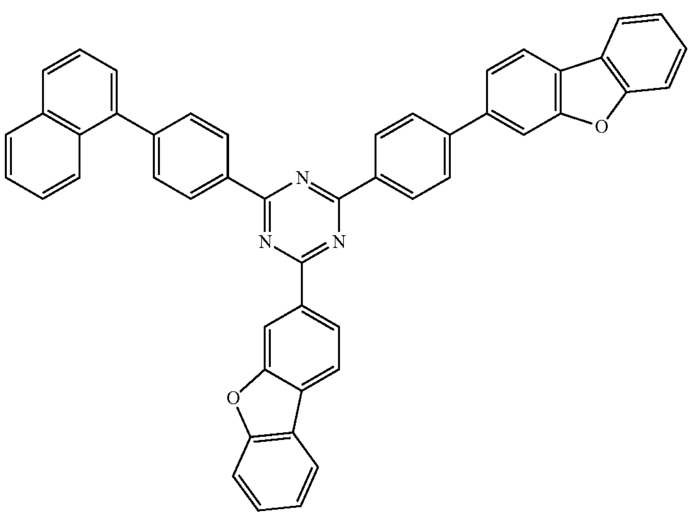

-continued
B-121
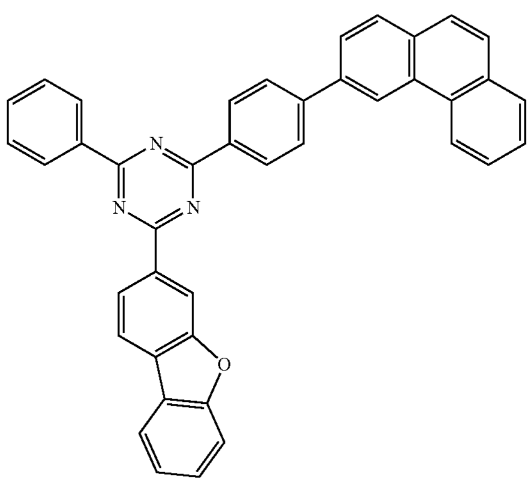
B-122
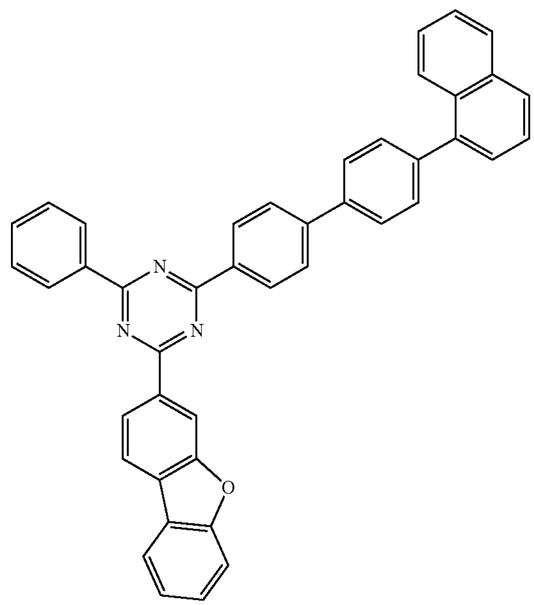
B-123
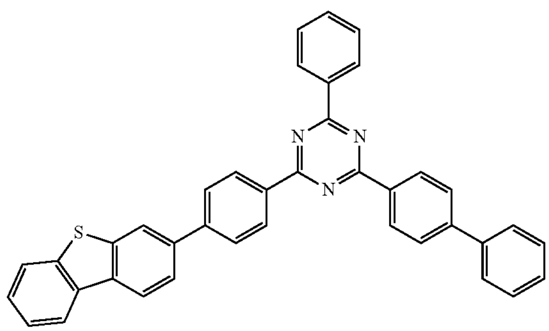
B-124
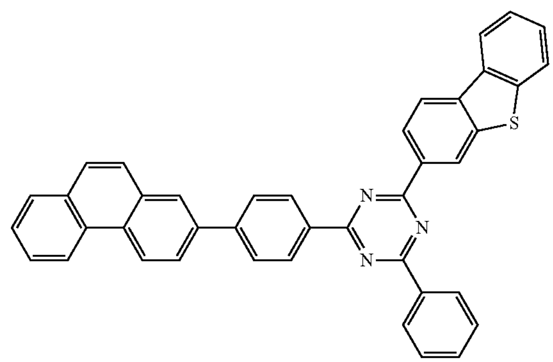
B-125
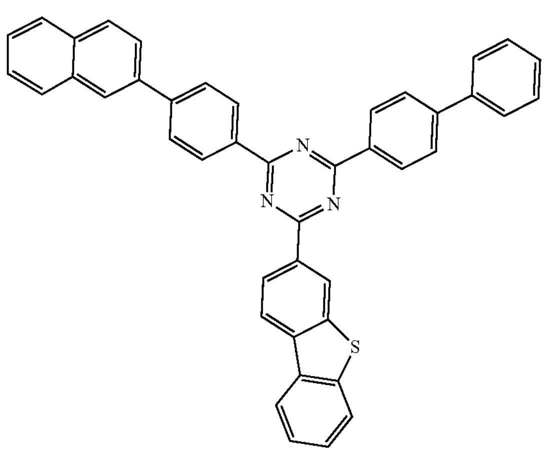
B-126
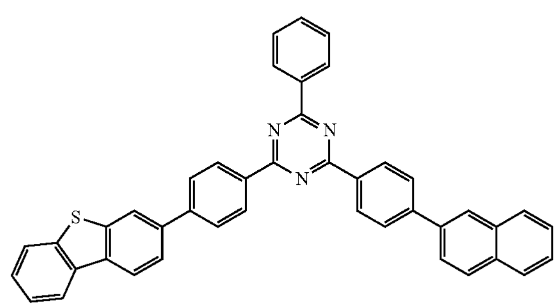

-continued
B-127
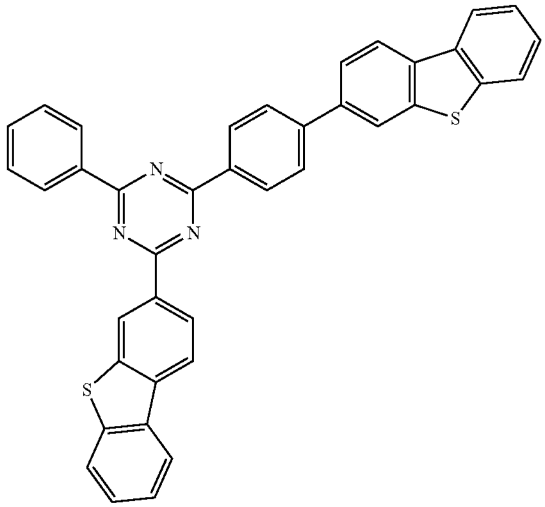
B-128
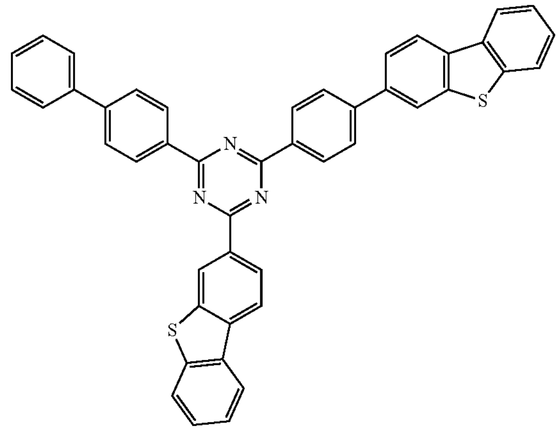
B-129
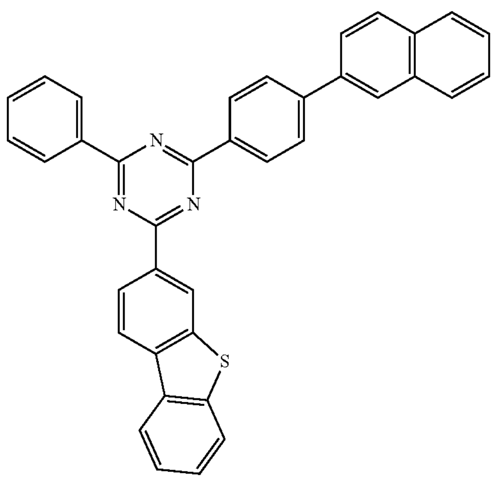
B-130
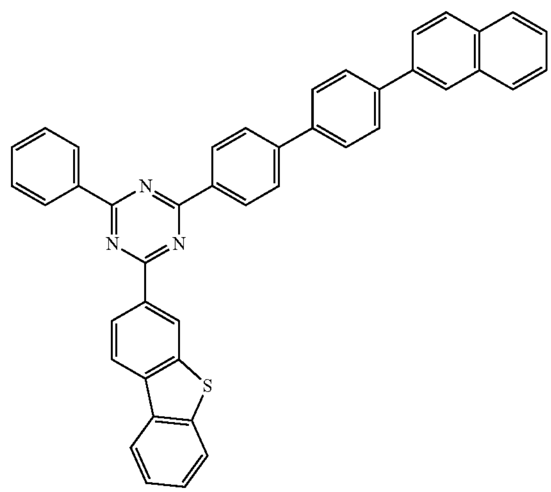
B-131
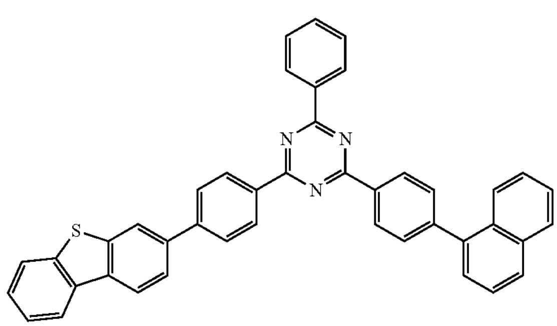
B-132
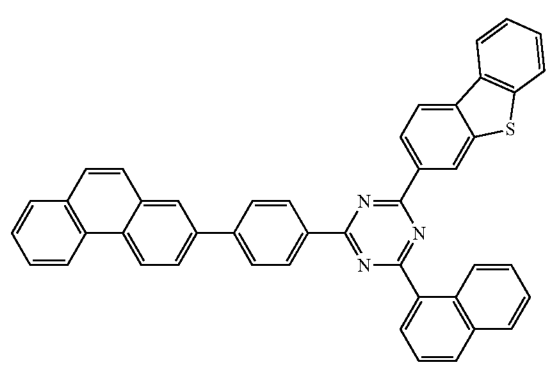

-continued
B-133
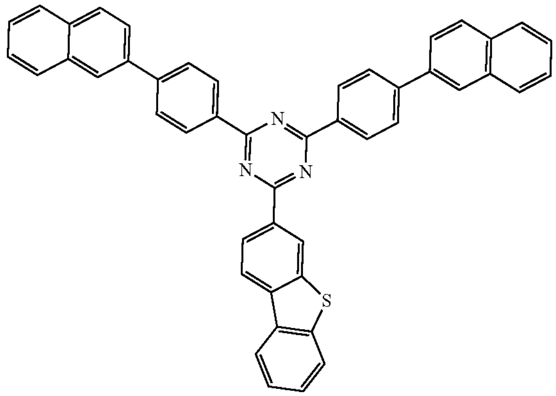
B-134
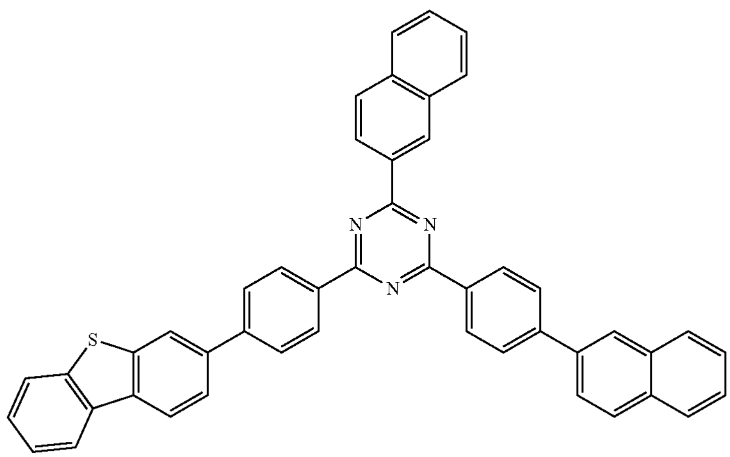
B-135
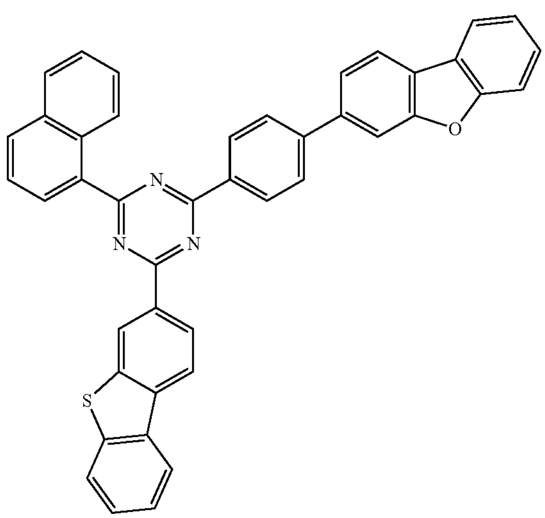

-continued
B-136
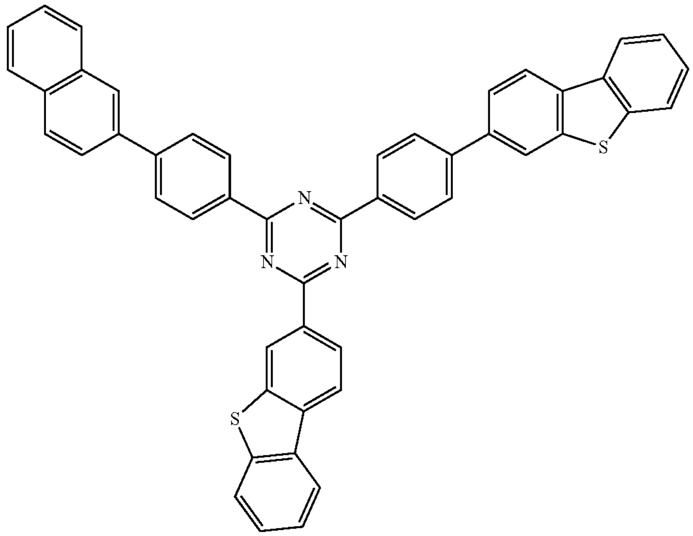
B-137
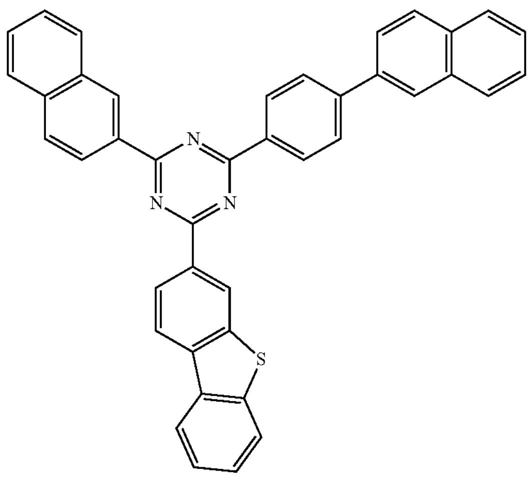
B-138
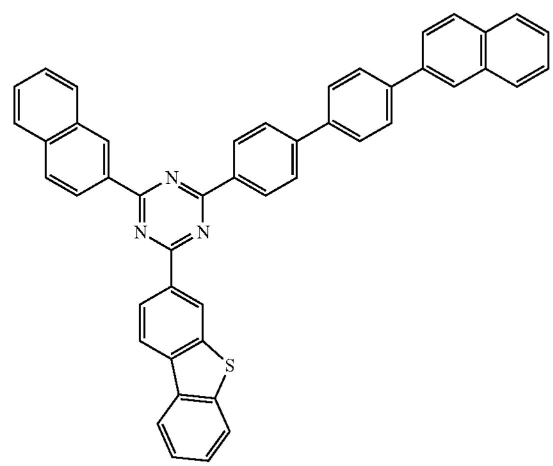
B-139
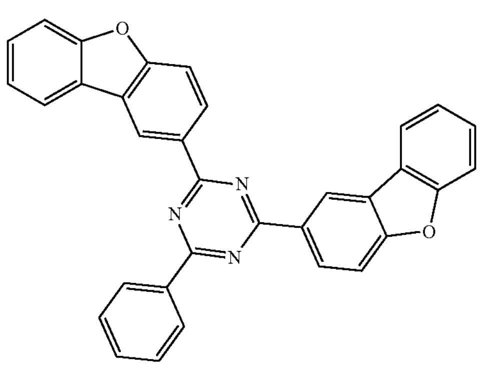
B-140
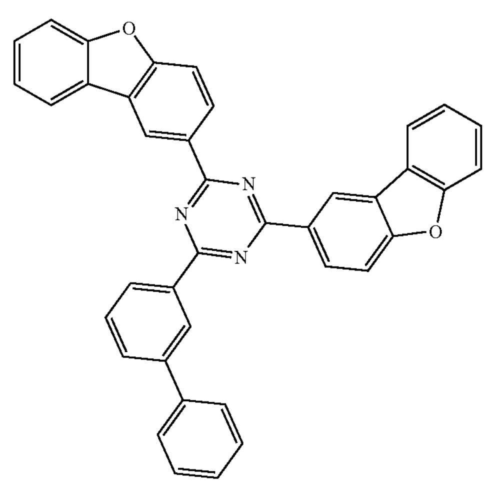

-continued
B-141
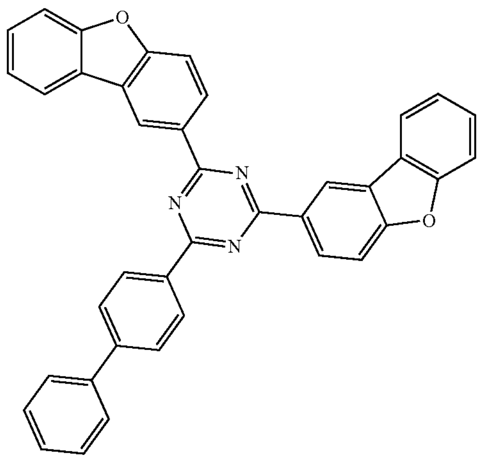
B-142
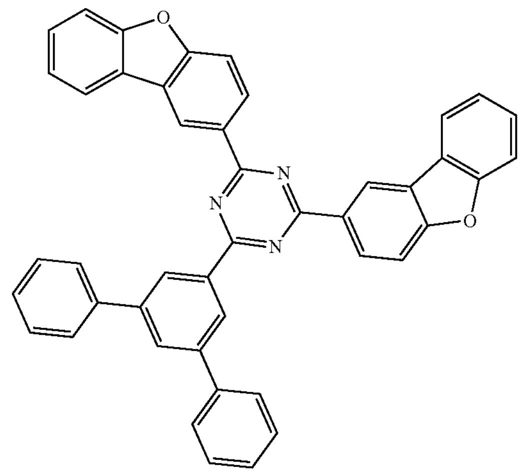
B-143
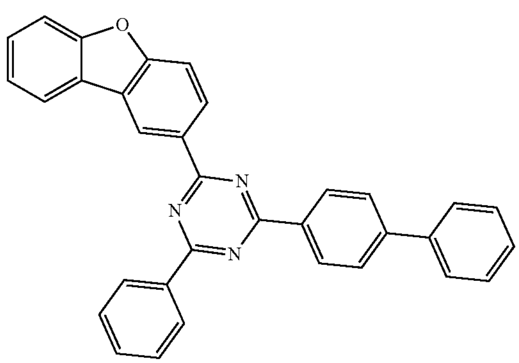
B-144
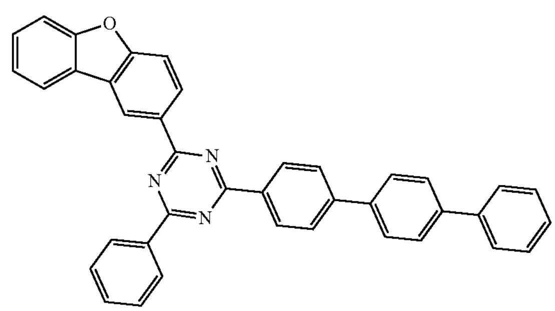
B-145
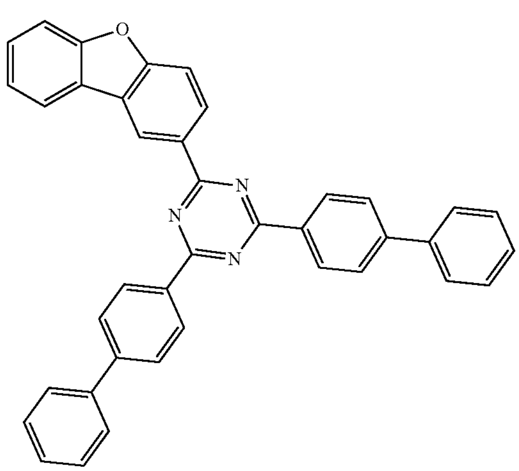
B-146
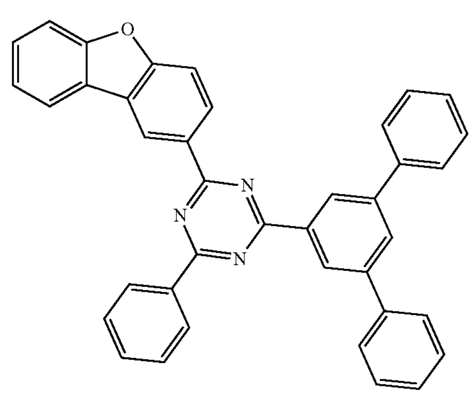

-continued
B-147
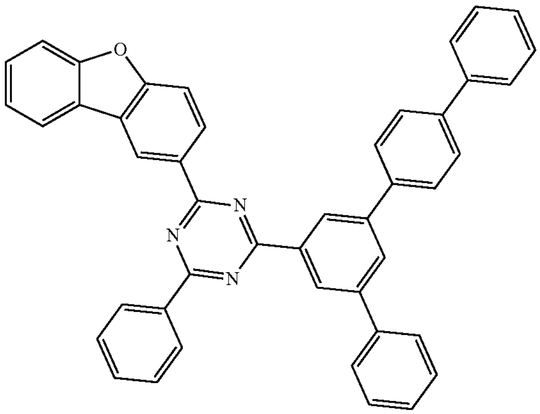
B-148
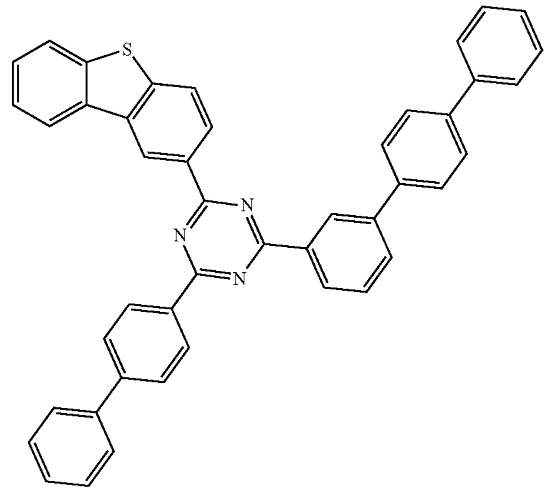
B-149
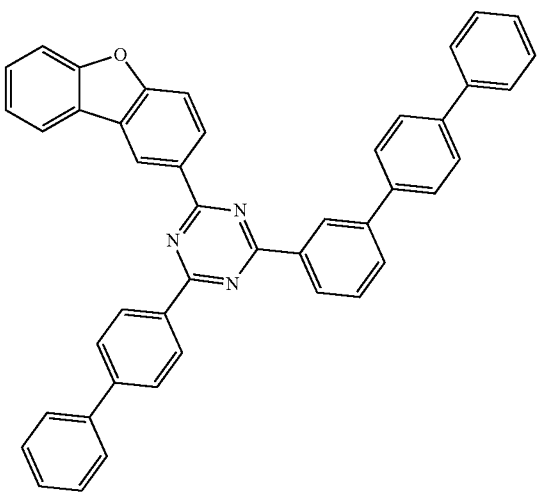
B-150
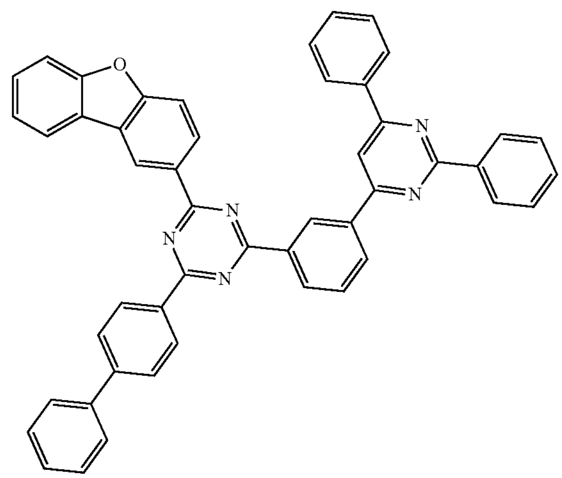
B-151
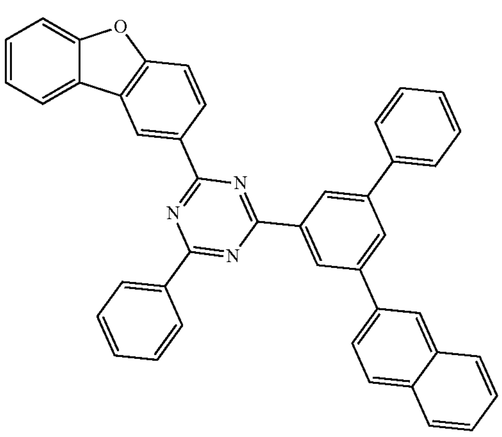
B-152
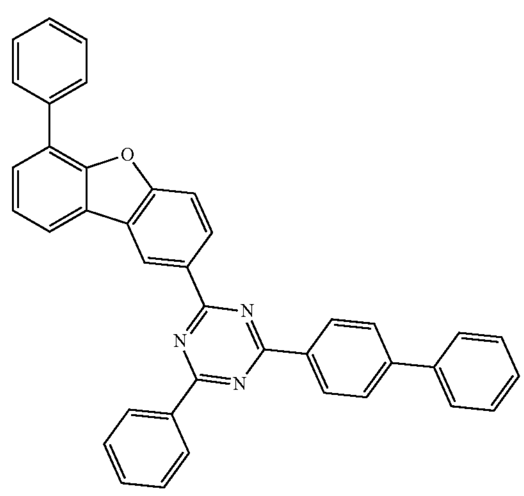

-continued
B-153
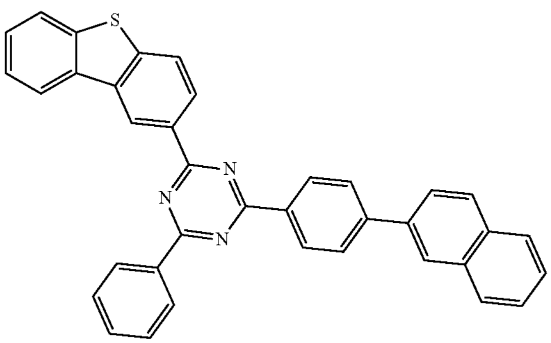
B-154
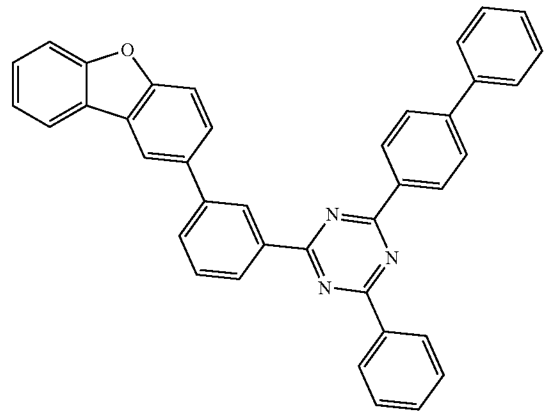
B-155
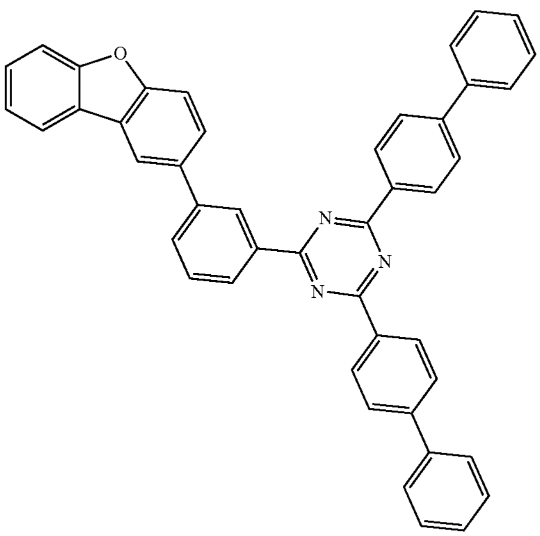
B-156
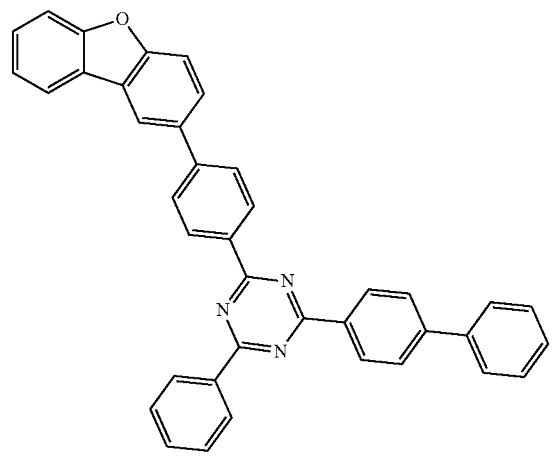
B-157
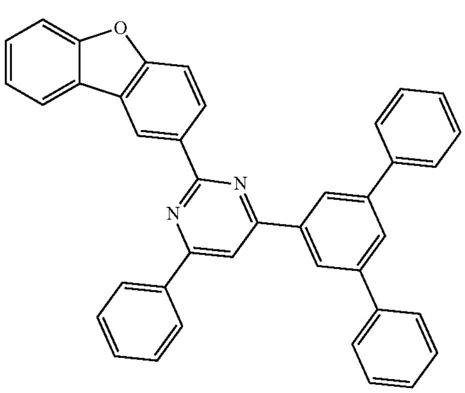
B-158
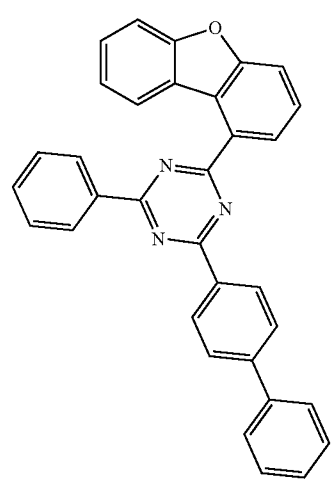

-continued
B-159
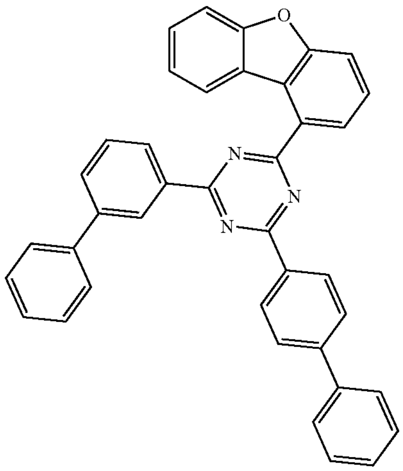
B-160
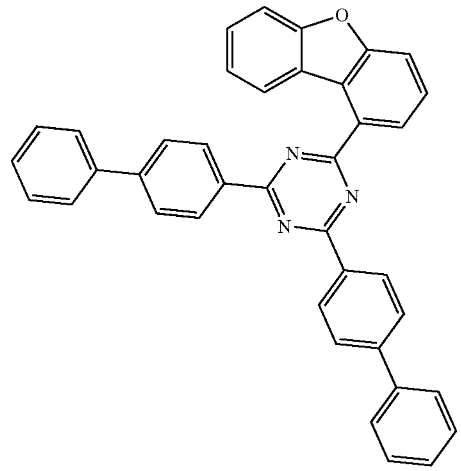
B-161
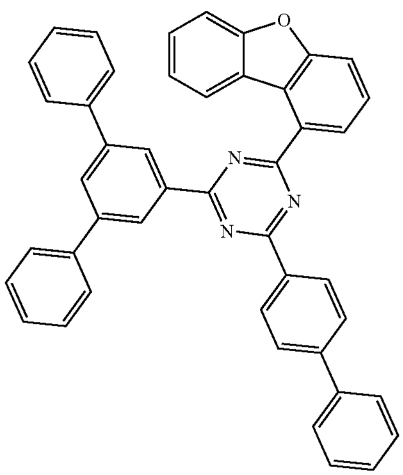
B-162
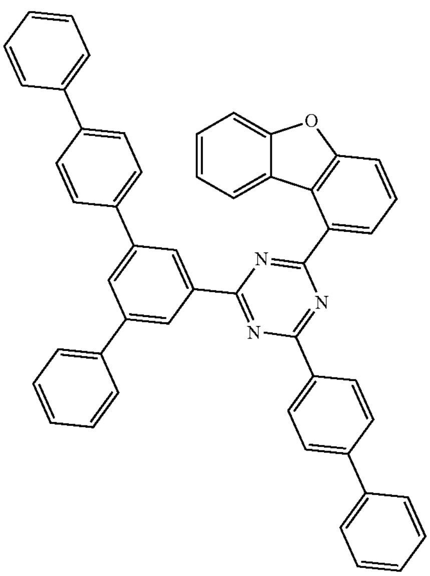
B-163
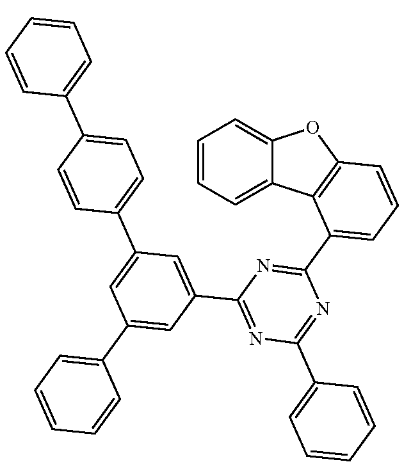
B-164
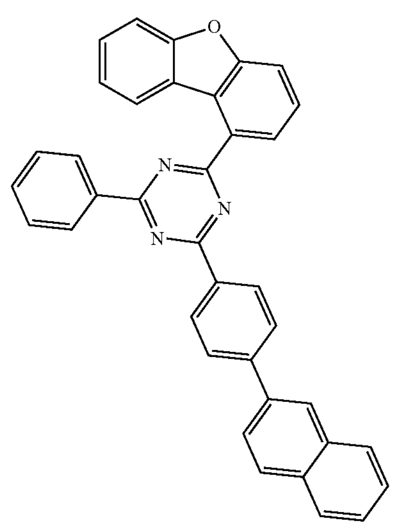

-continued
B-165
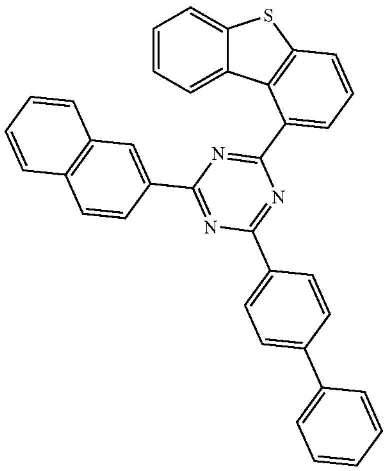
B-166
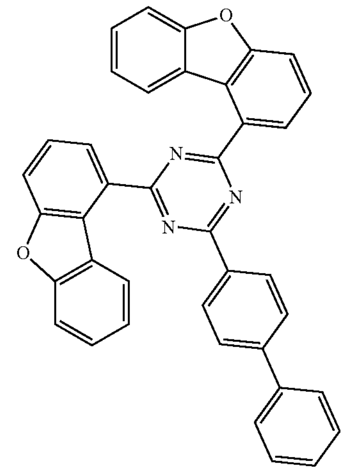
B-167
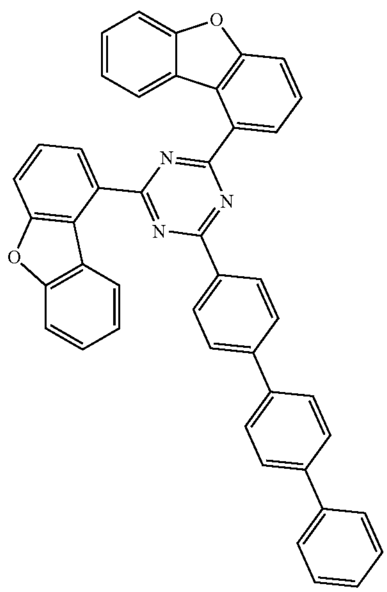
B-168
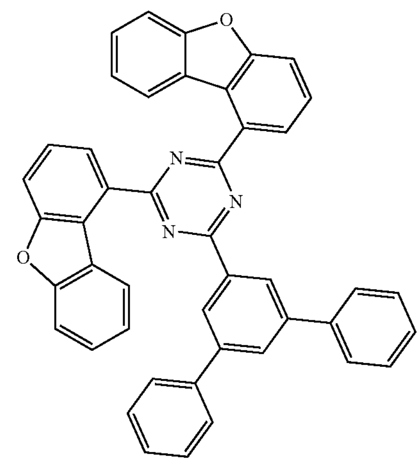
B-169
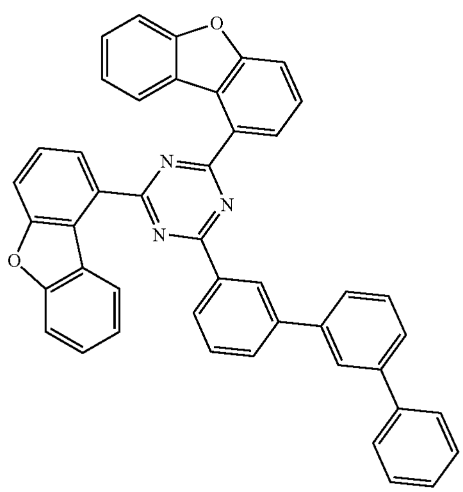
B-170
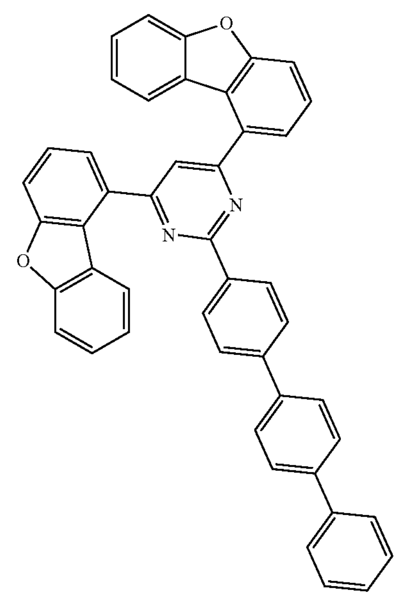

-continued
B-171
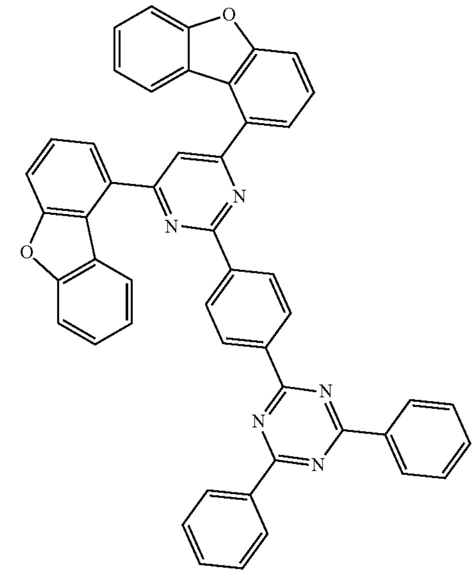
B-172
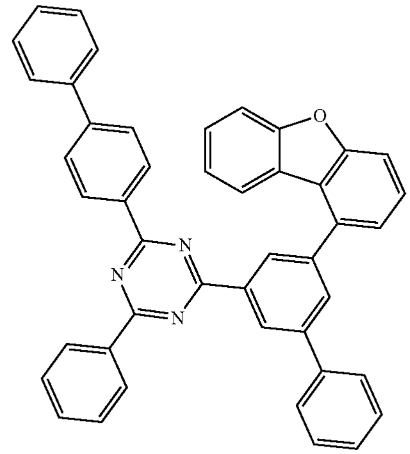
B-173
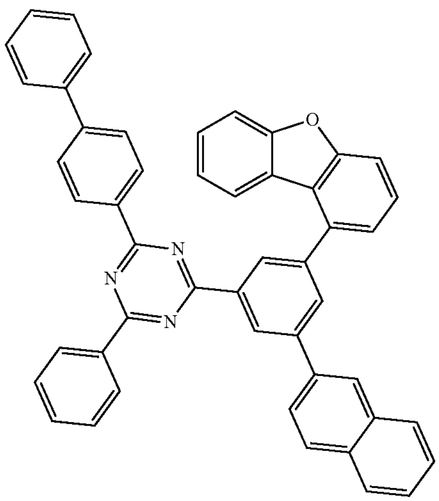
B-174
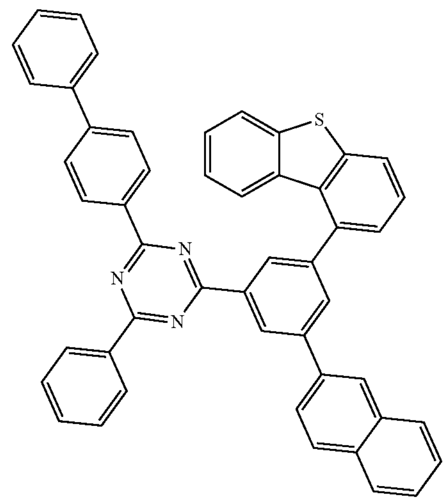
B-175
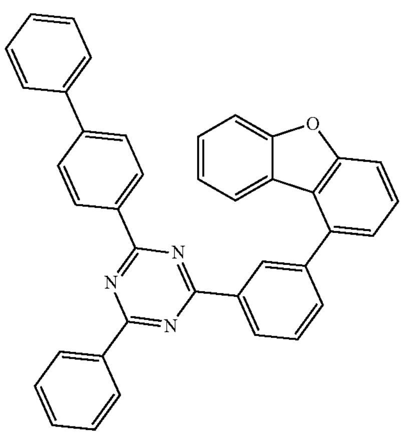
B-176
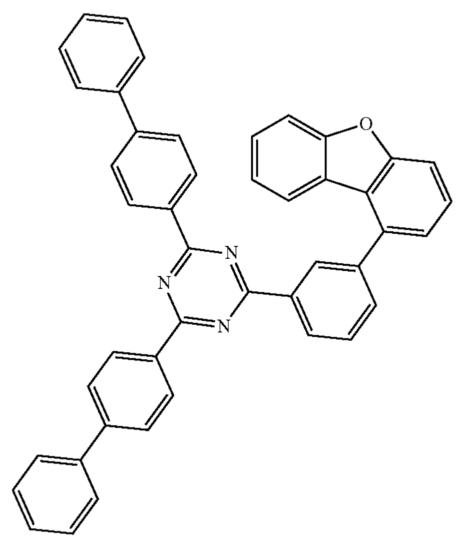

-continued
B-177
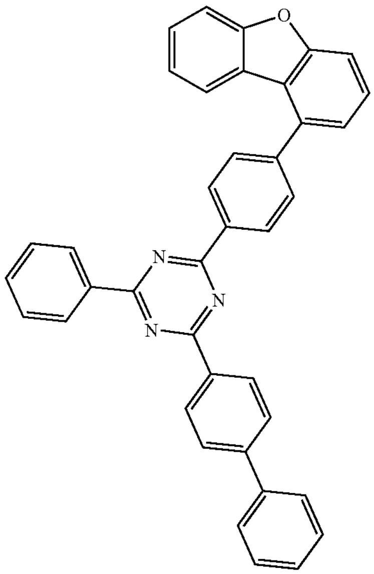
B-178
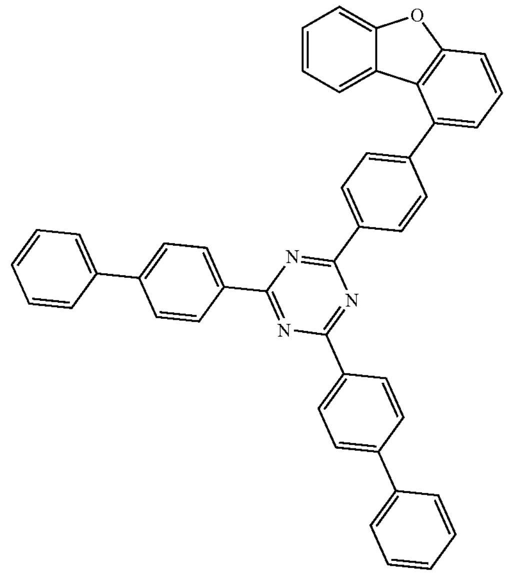
B-179
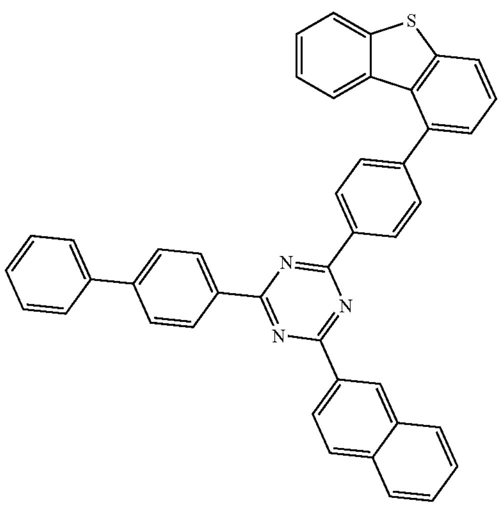
B-180
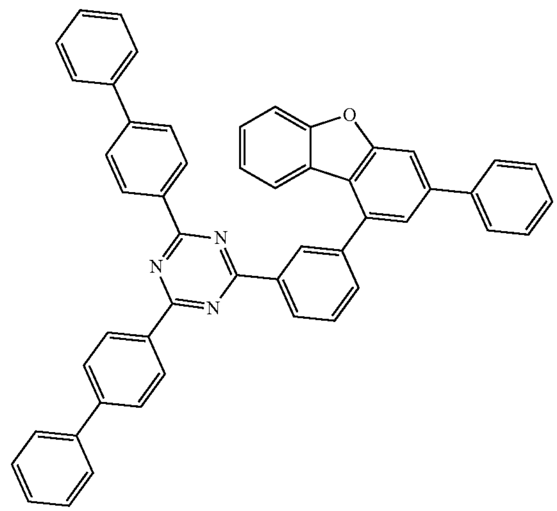
B-181
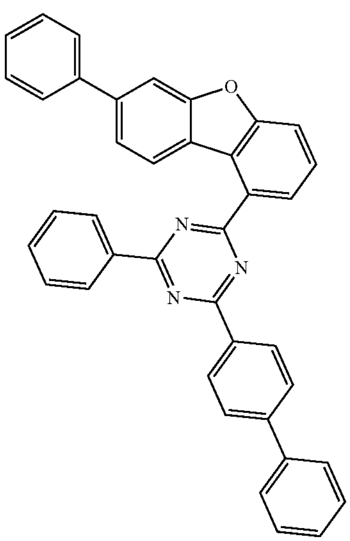
B-182
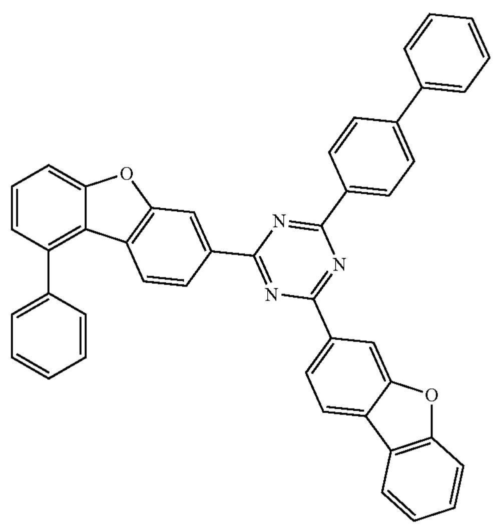

-continued
B-183
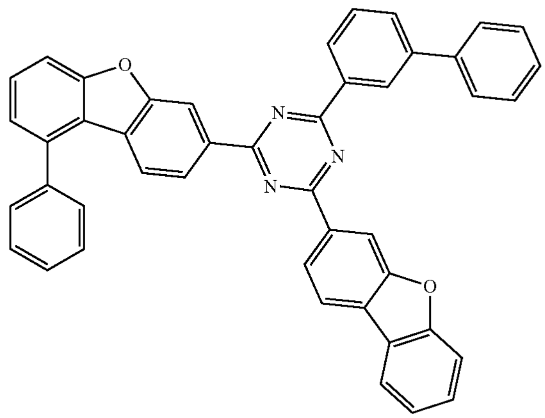
B-184
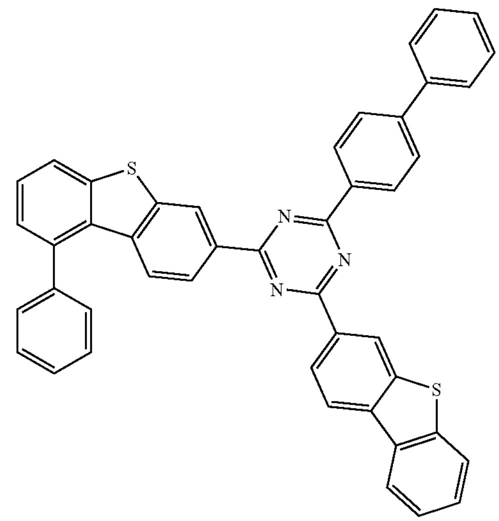
B-185
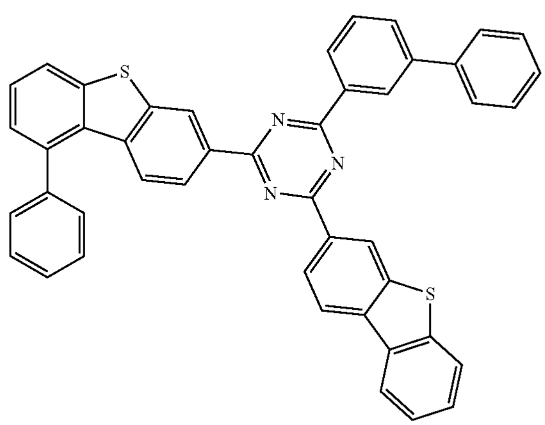
B-186
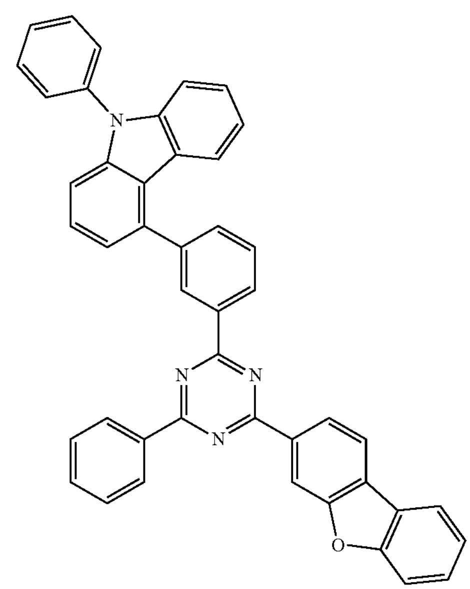

-continued
B-187
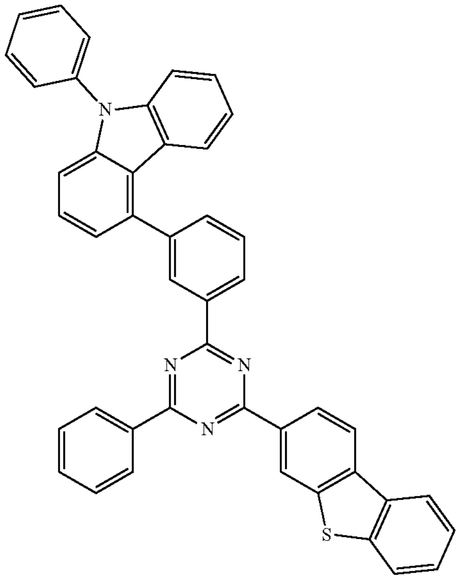
B-188
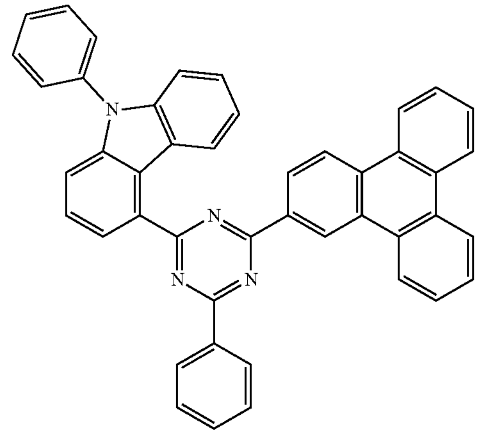
B-189
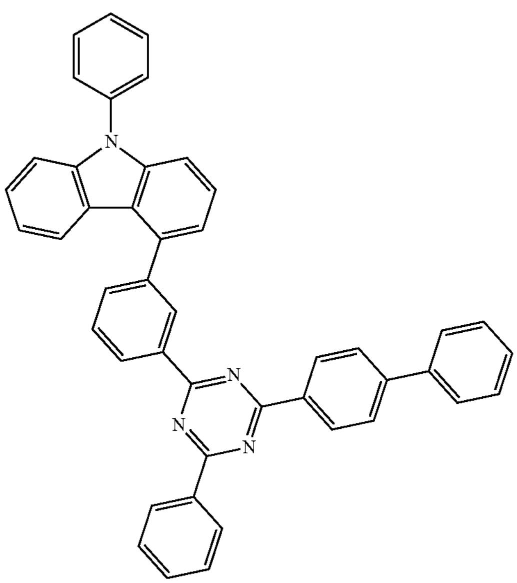
B-190
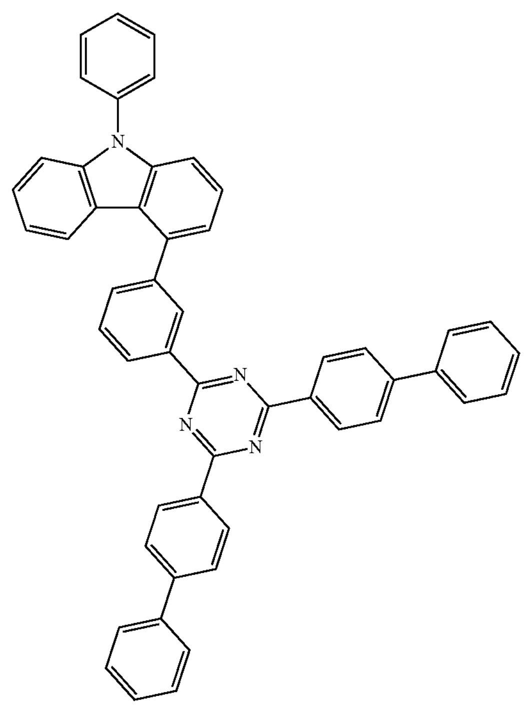

-continued
B-191
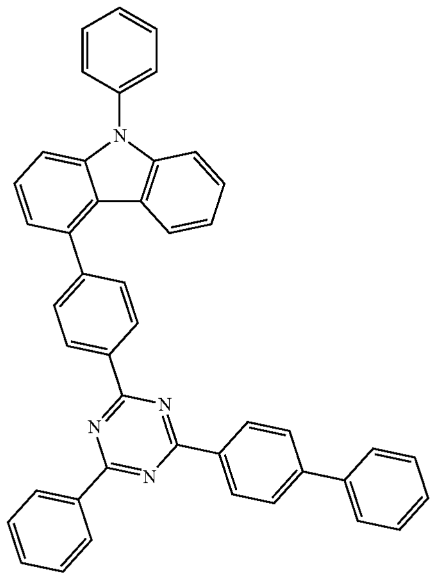
B-192
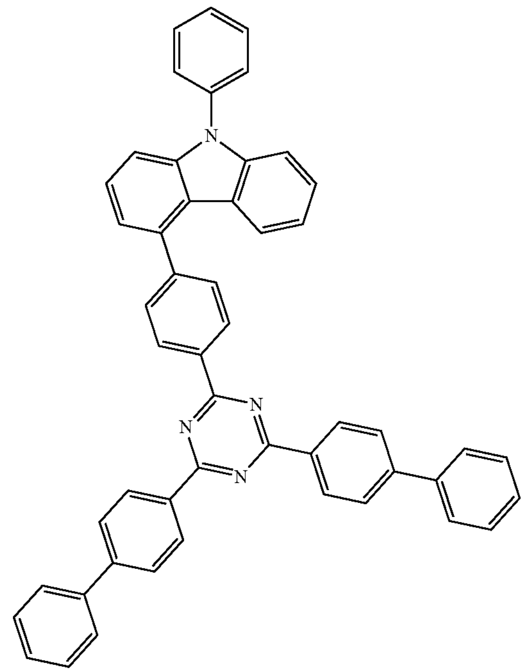
B-193
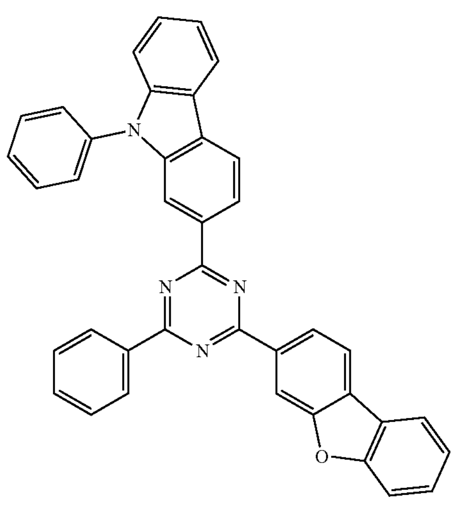
B-194
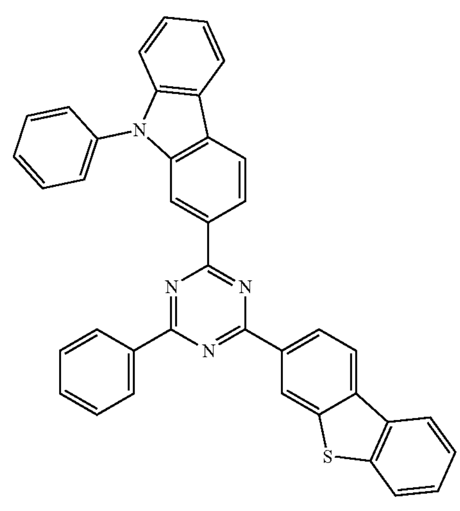

-continued
B-195
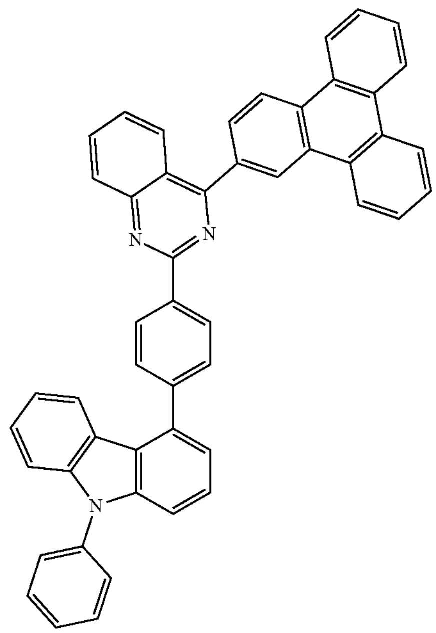
B-196
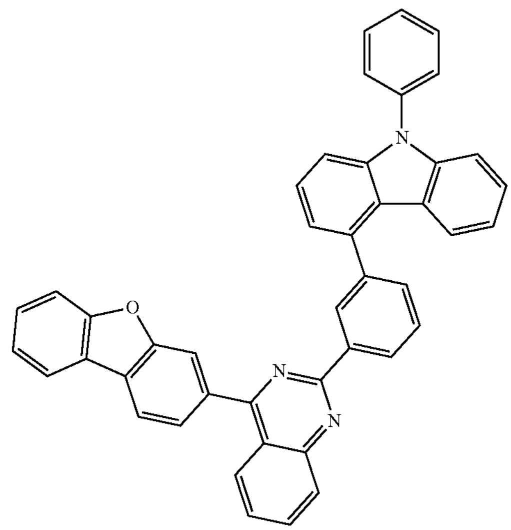
C-1
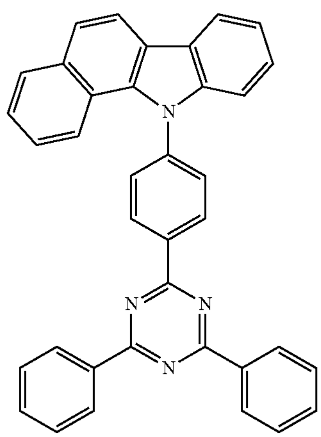
C-2
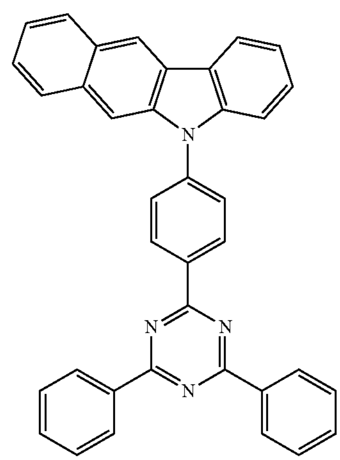
C-3
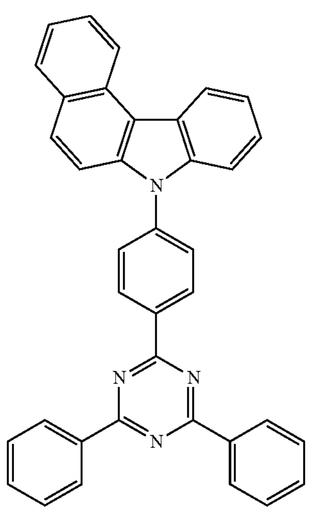
C-4
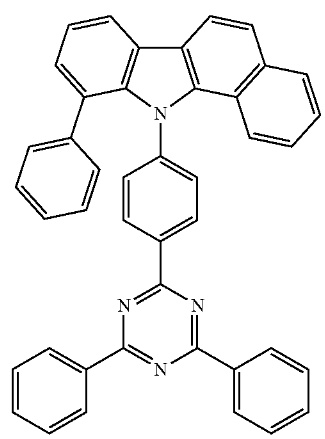

-continued
C-5
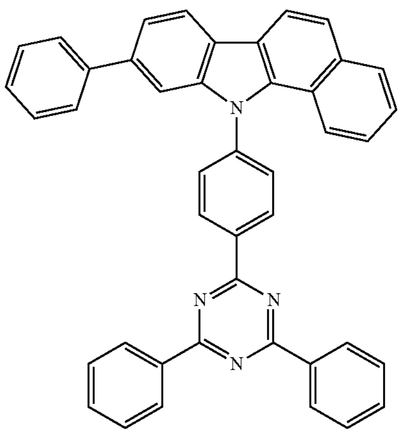
C-6
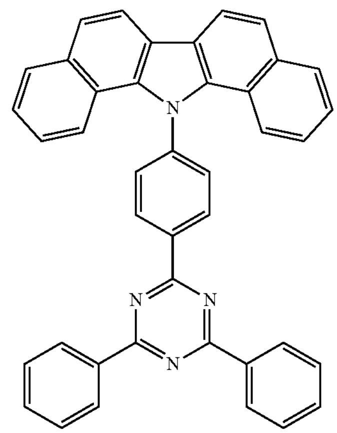
C-7
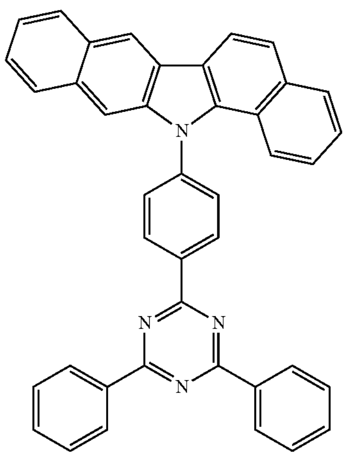
C-8
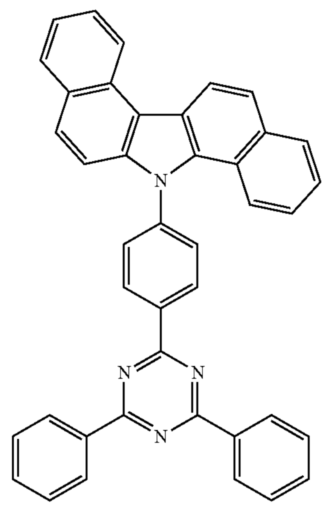
C-9
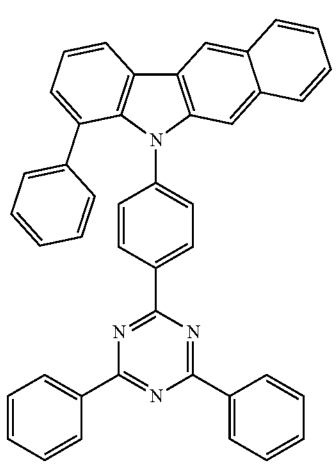
C-10
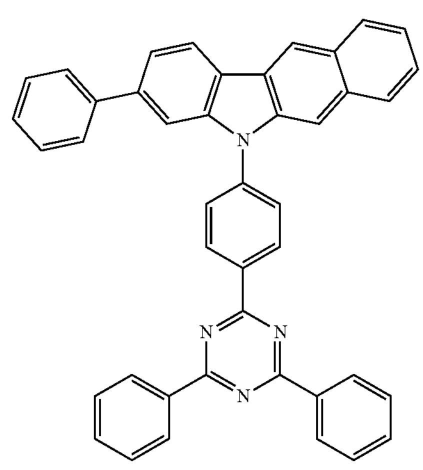

-continued
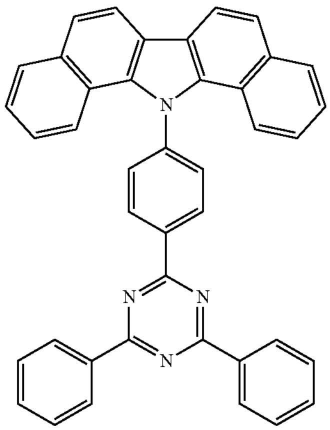
C-11
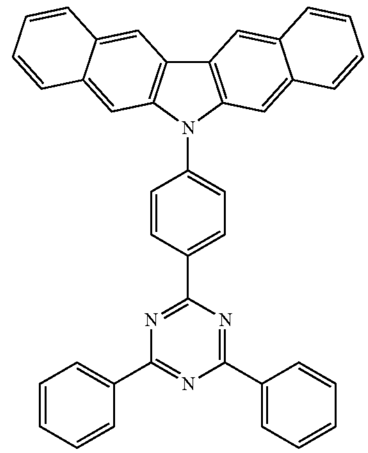
C-12
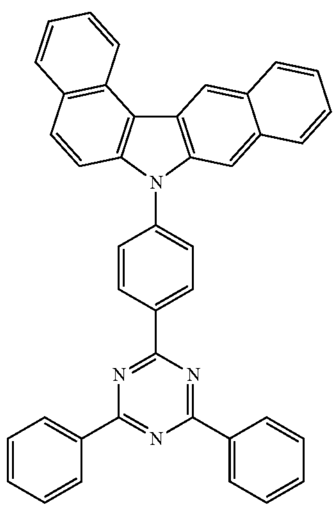
C-13
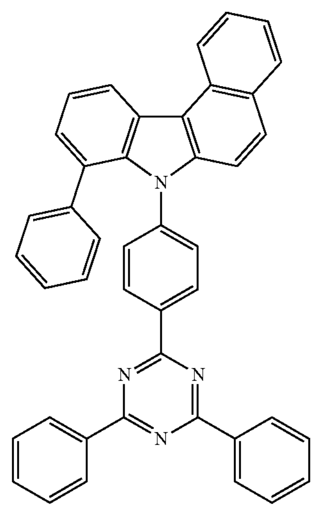
C-14
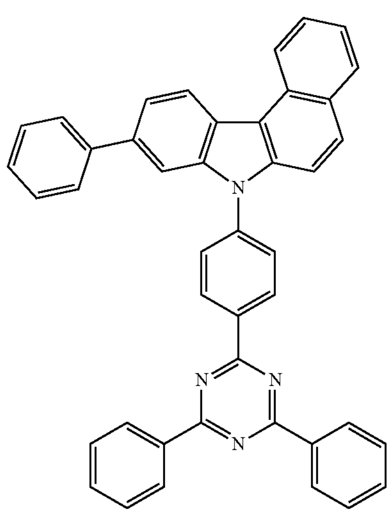
C-15
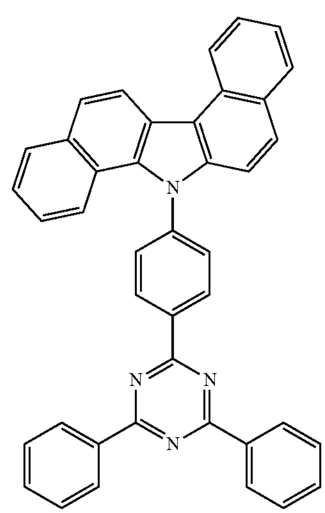
C-16

-continued
C-17
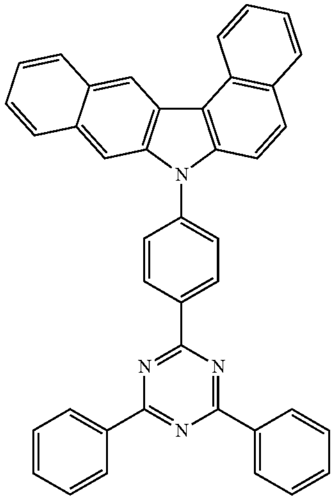
C-18
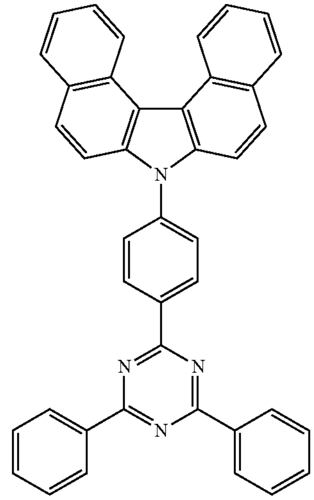
C-19
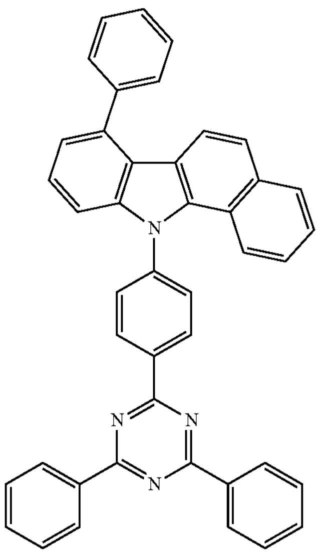
C-20
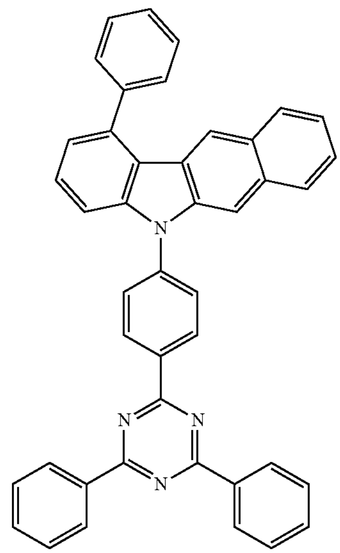
C-21
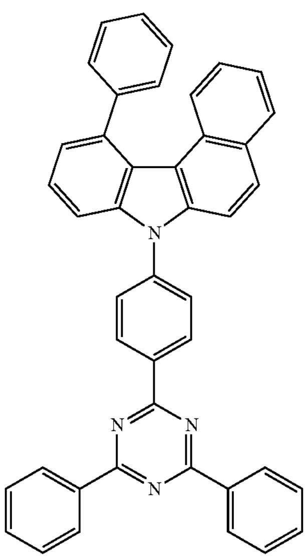
C-22
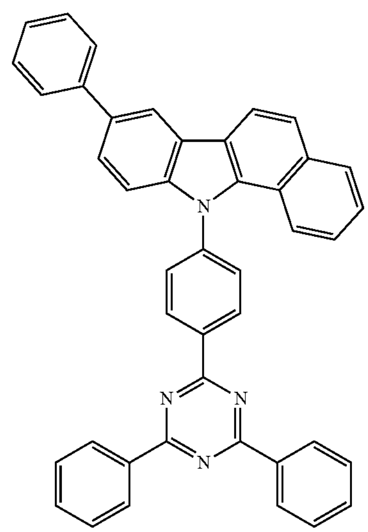

-continued
C-23
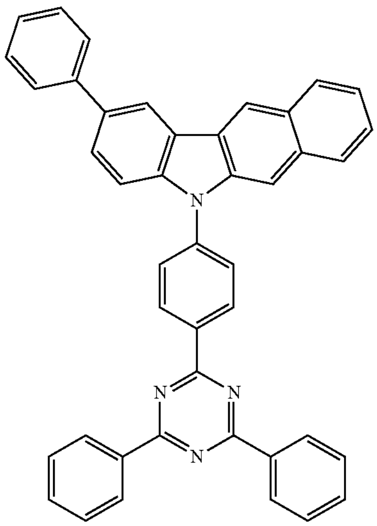
C-24
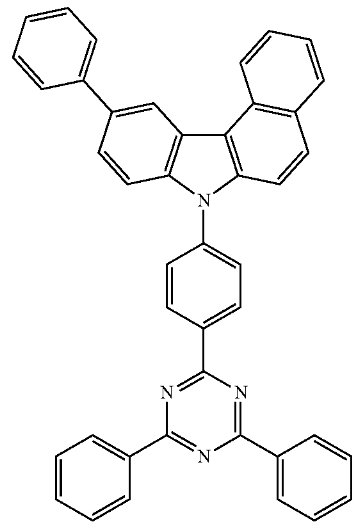
D-1
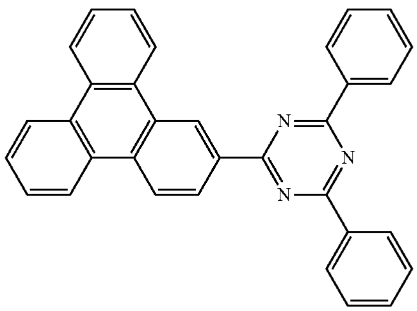
D-2
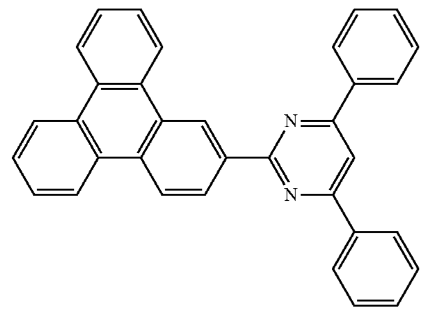
D-3
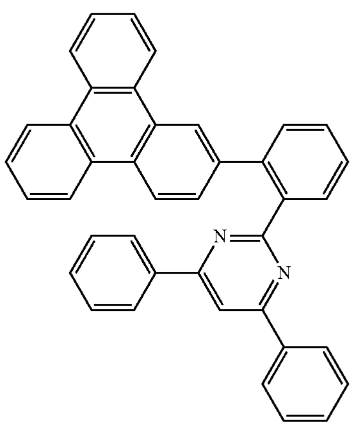
D-4
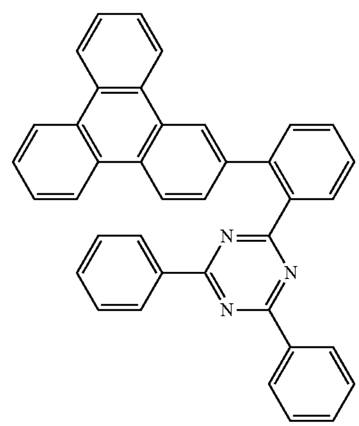
D-5
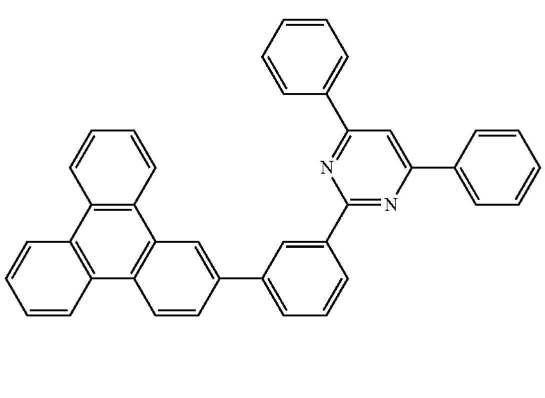
D-6
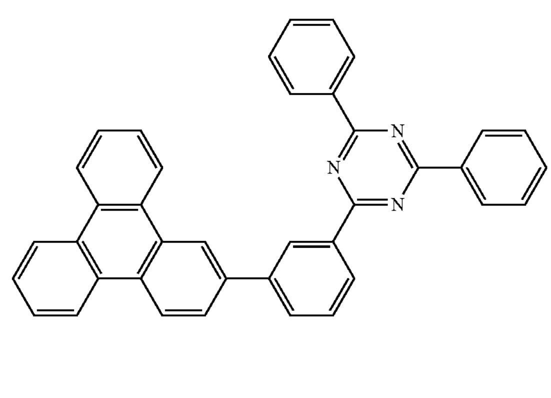

-continued
D-7
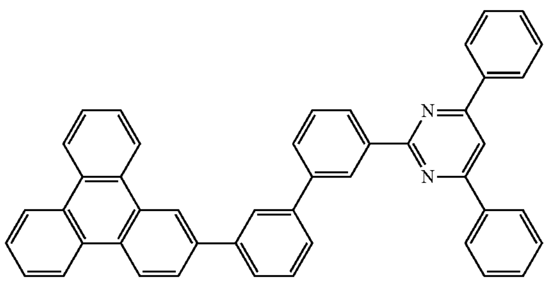
D-8
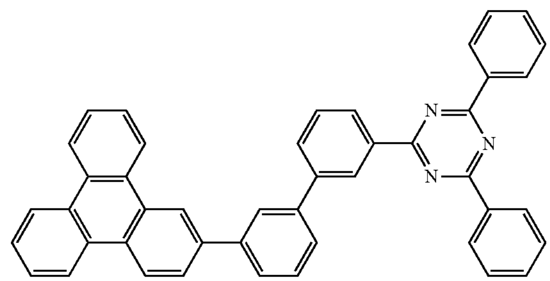
D-9
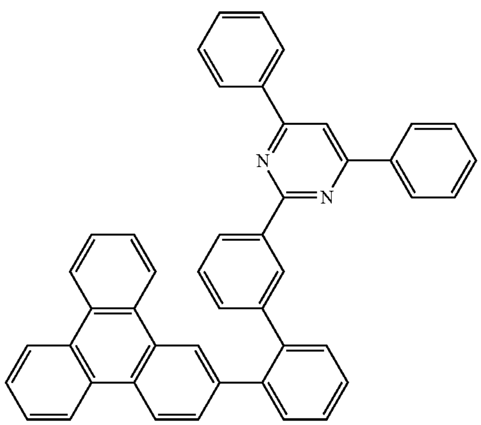
D-10
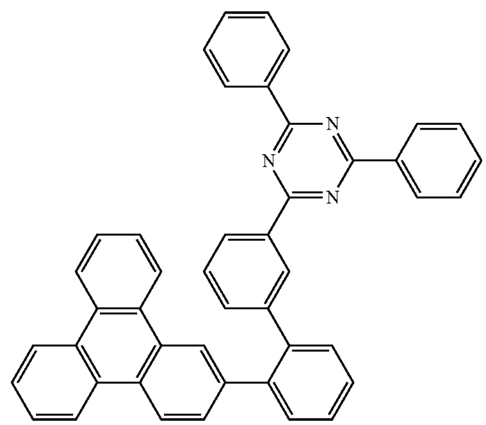
D-11
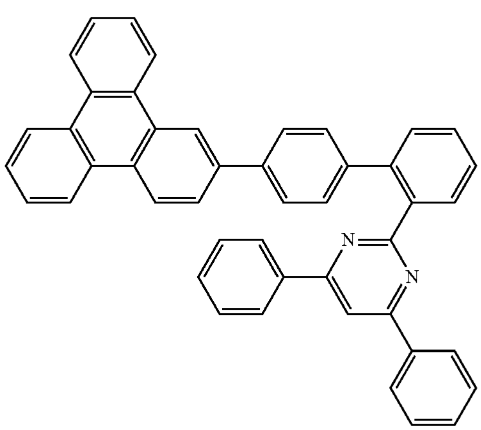
D-12
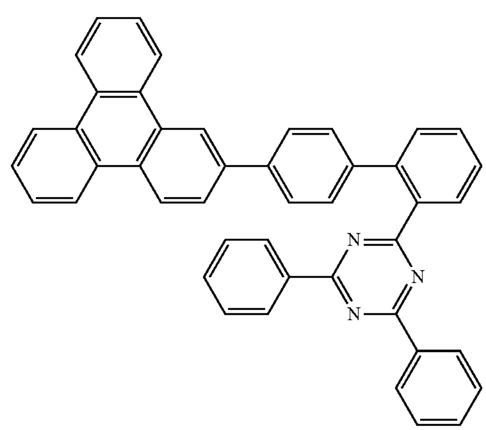
D-13
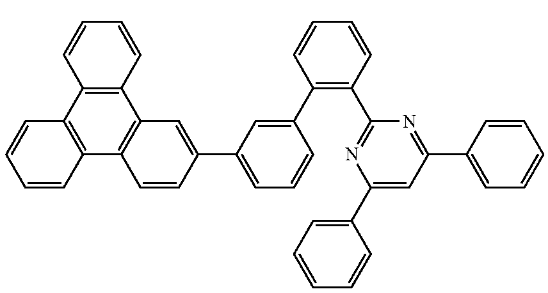
D-14
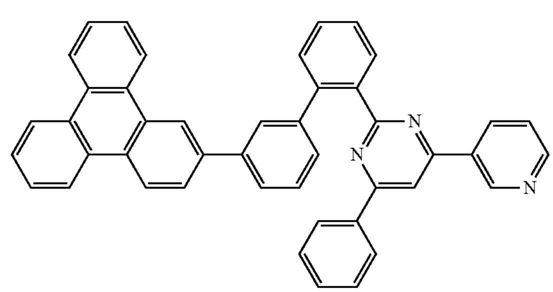

-continued
D-15
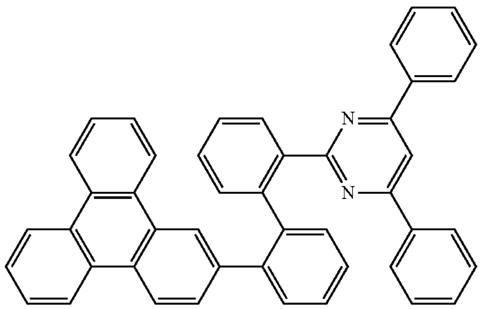
D-16
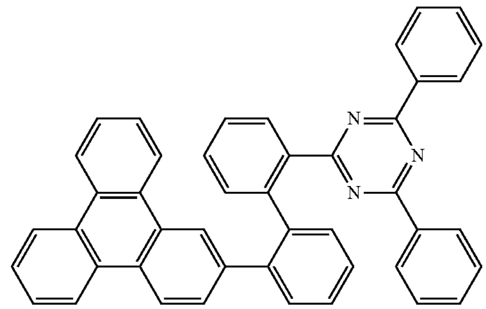
D-17
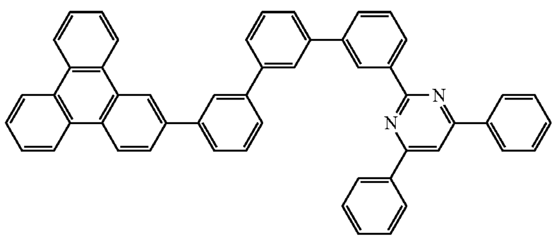
D-18
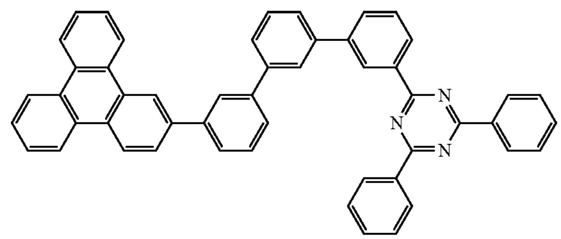
D-19
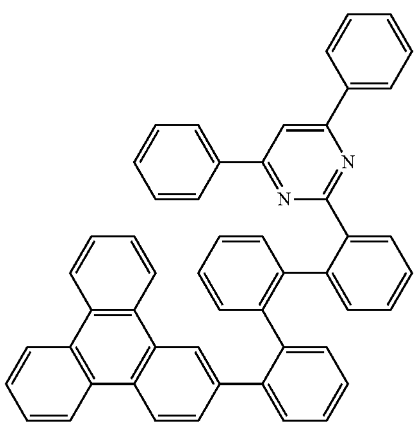
D-20
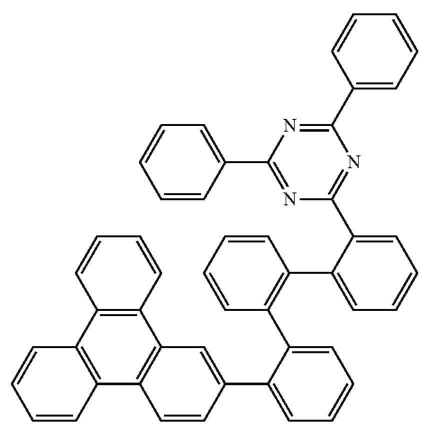
D-21
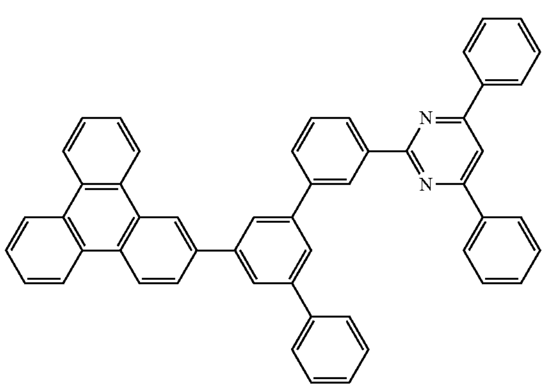
D-22
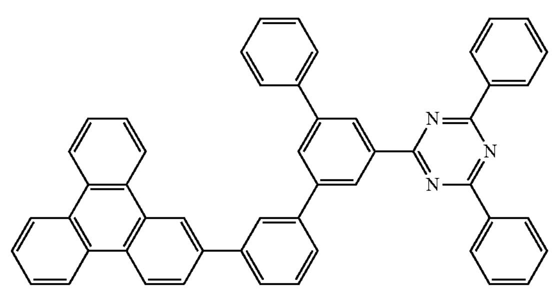

-continued
D-23
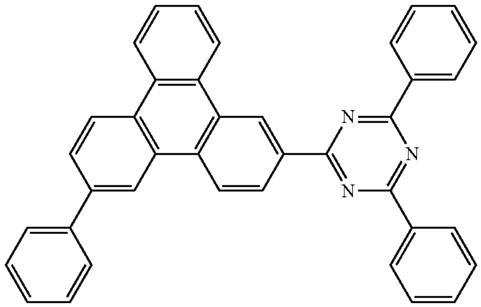
D-24
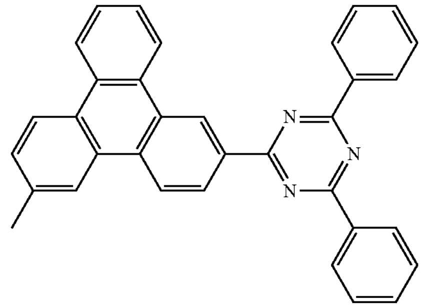
D-25
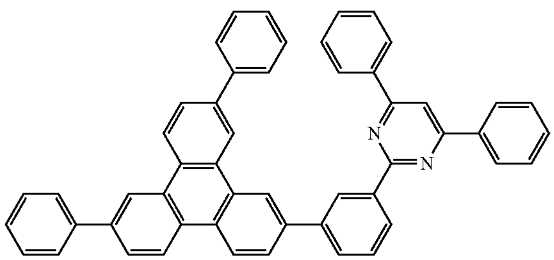
D-26
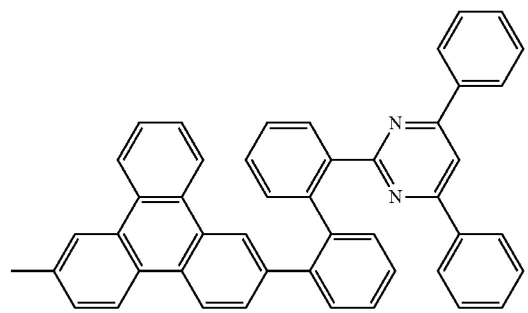
D-27
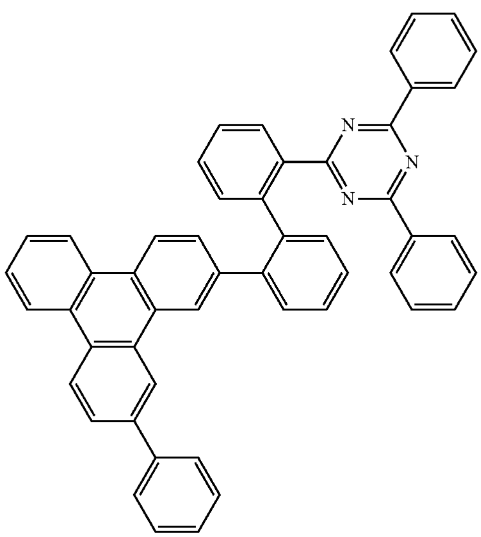
D-28
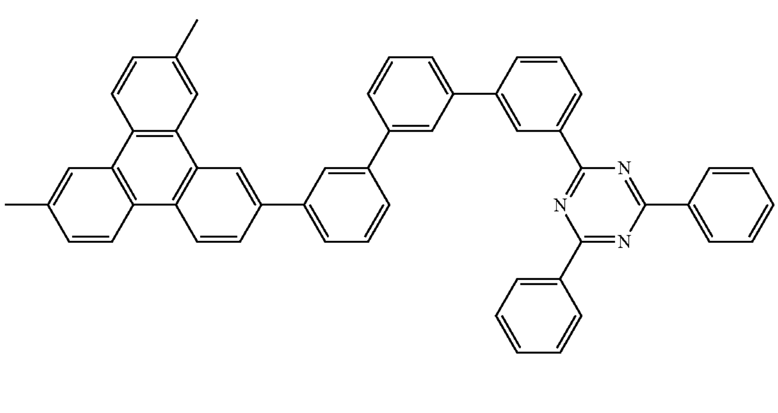

-continued
D-29
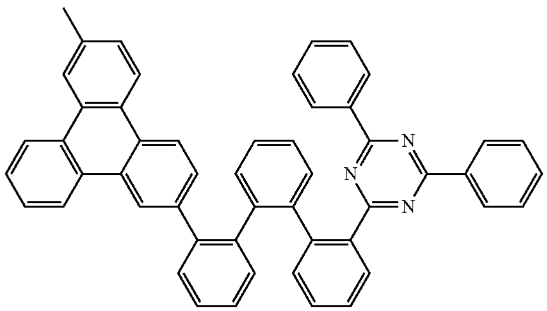
D-30
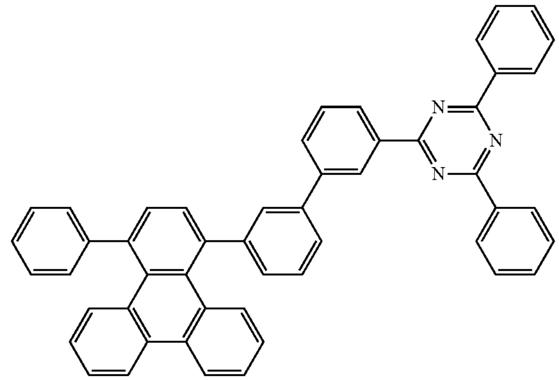
D-31
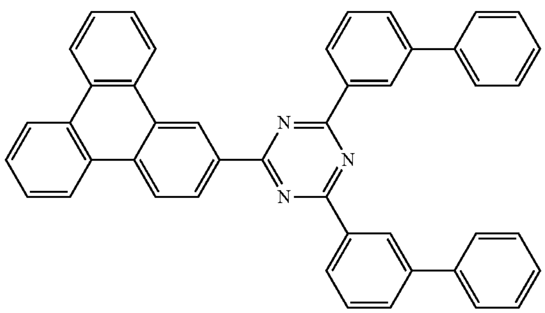
D-32
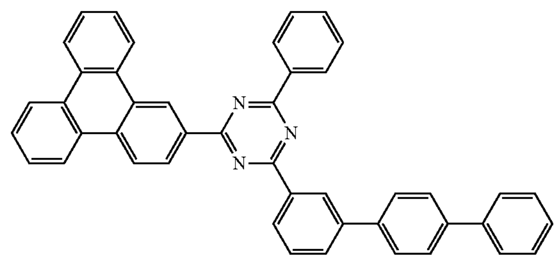
D-33
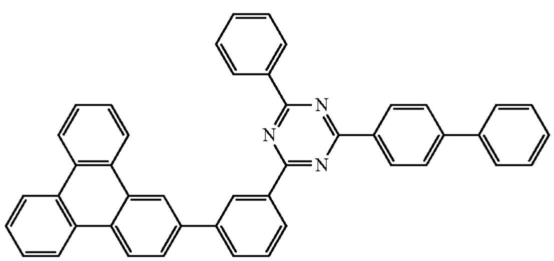
D-34
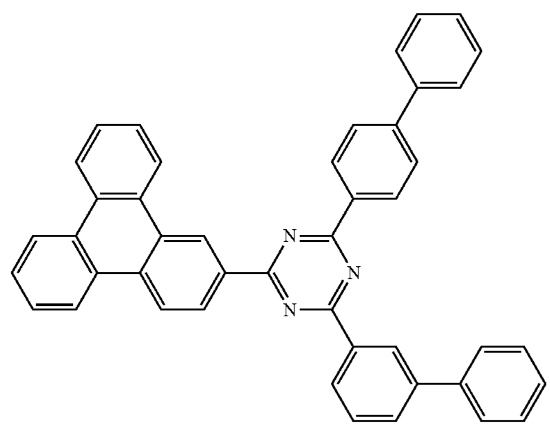
D-35
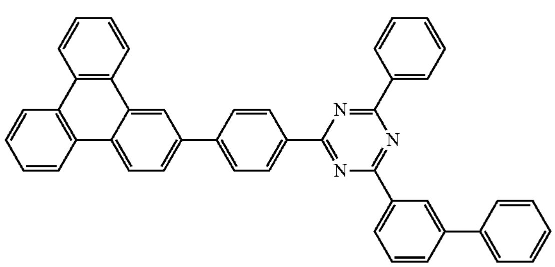
D-36
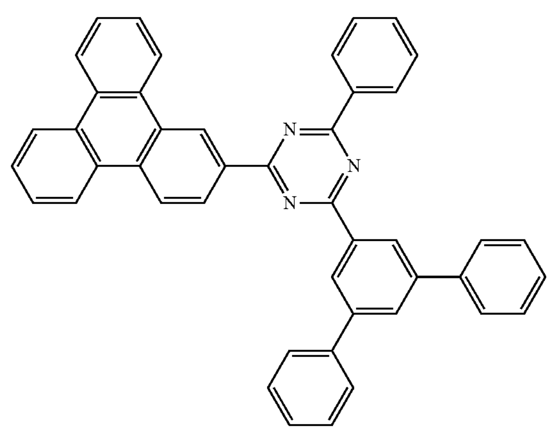

-continued
D-37
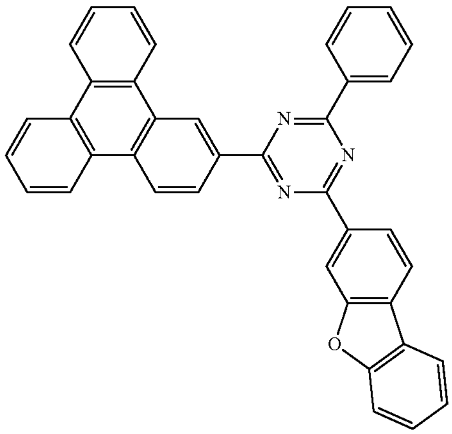
D-38
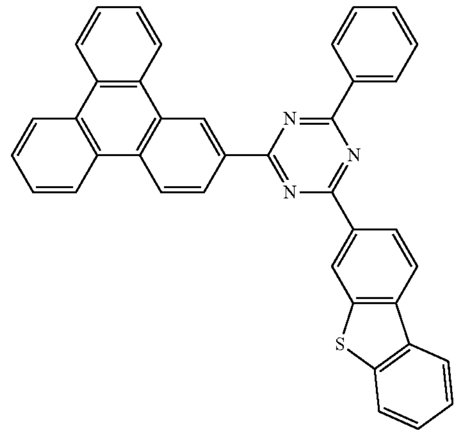
D-39
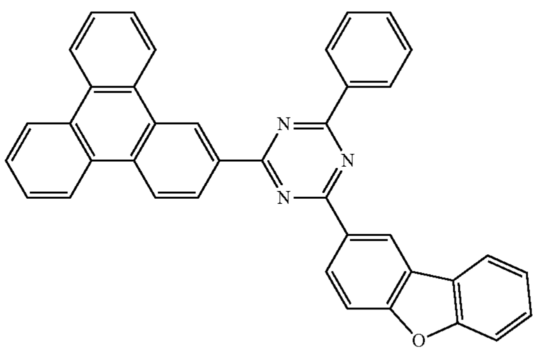
D-40
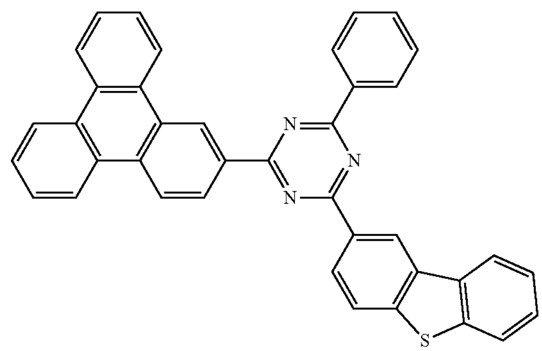
D-41
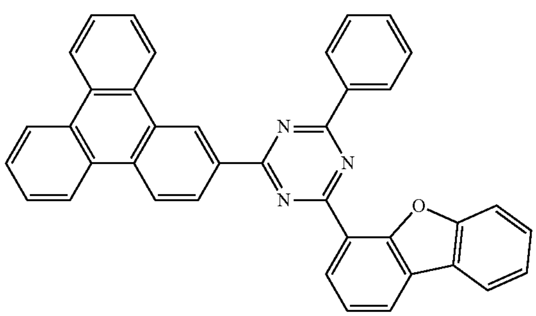
D-42
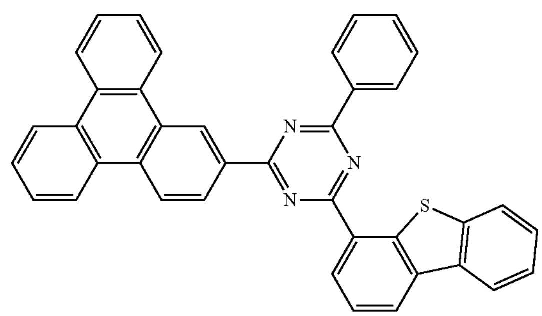
D-43
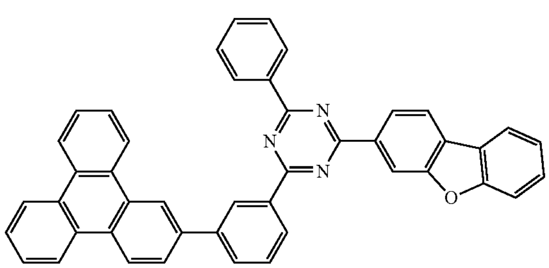
D-44
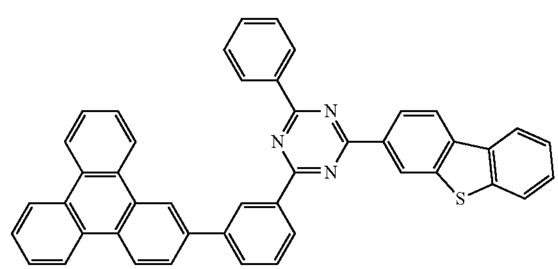

-continued
D-45
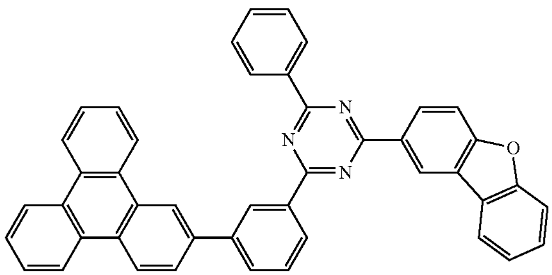
D-46
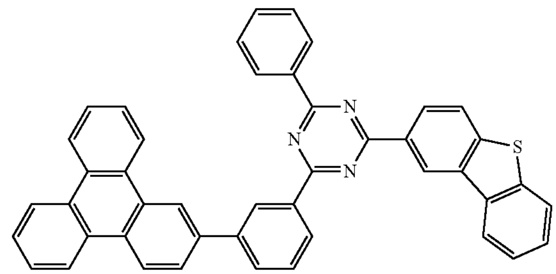
D-47
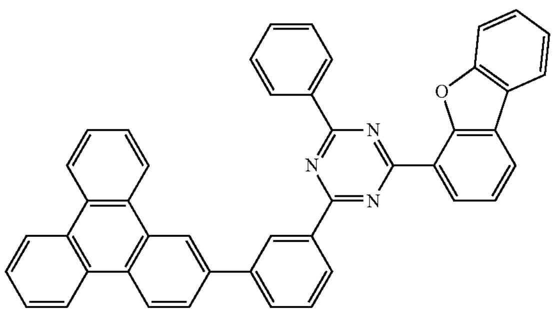
D-48
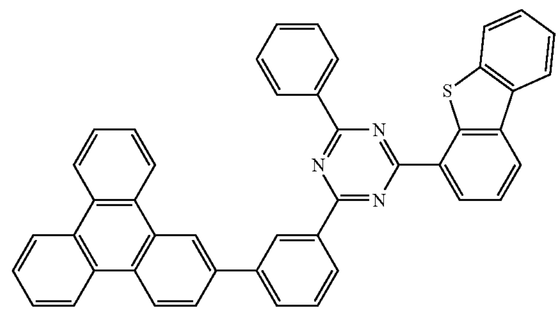
D-49
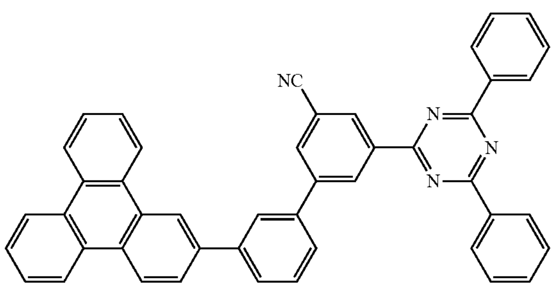
D-50
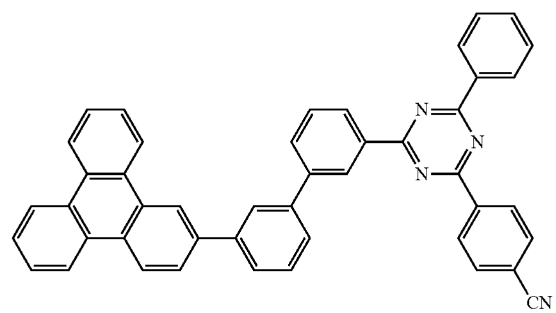
D-51
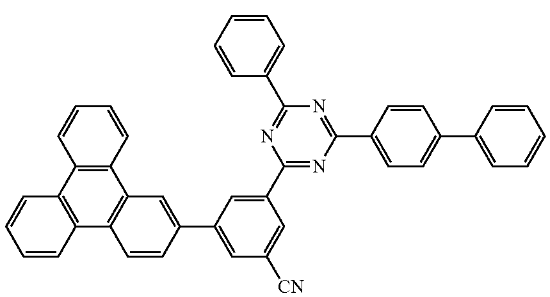
D-52
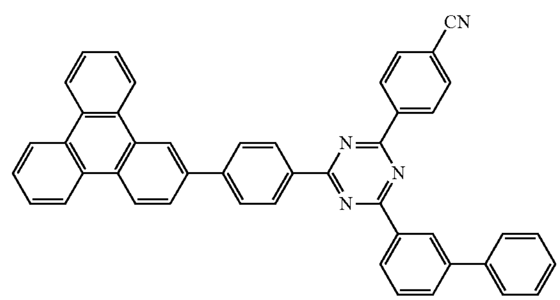
D-53
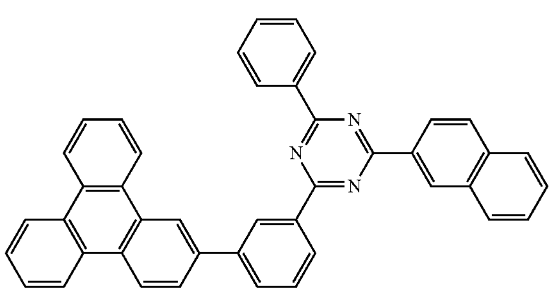
D-54
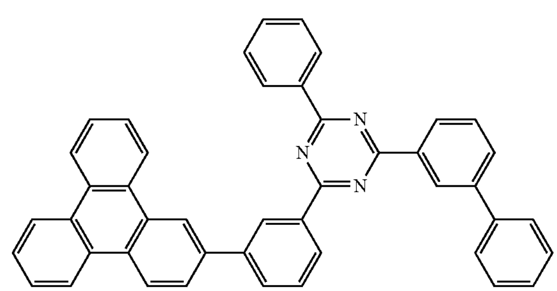

-continued

D-55

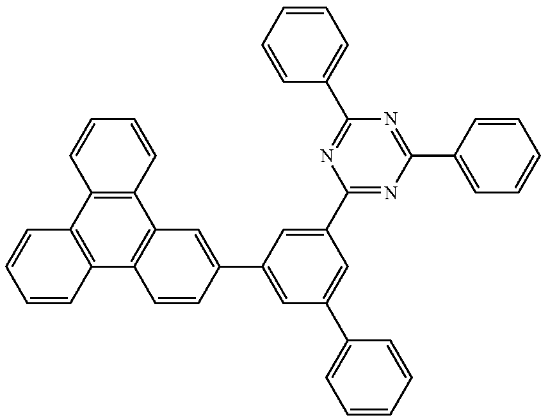

D-56

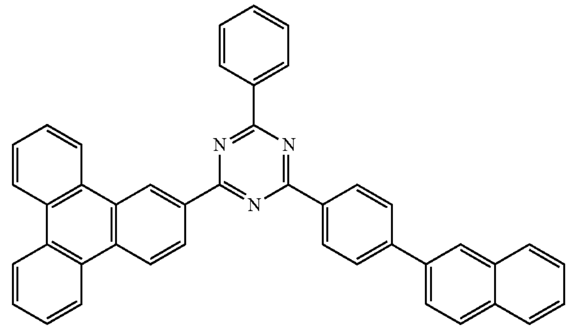

D-57

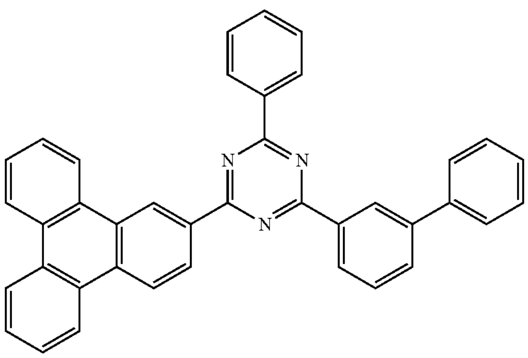

D-58

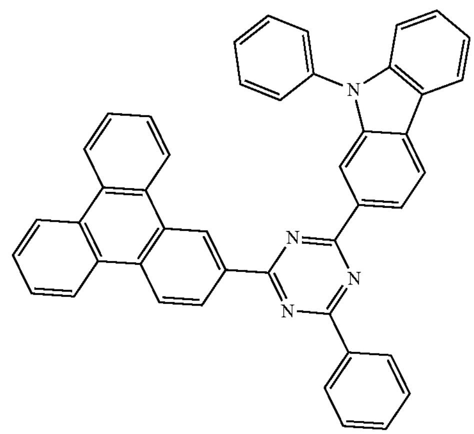

In an implementation, the first compound may be represented by one of Chemical Formula 1A-2, Chemical Formula 1B-2 and Chemical Formula 1C-2, and the second compound may be represented by Chemical Formula 3A-IV.

The first compound and the second compound may be included in a weight ratio of about 1:99 to about 99:1. Within the above range, bipolar characteristics may be implemented by adjusting an appropriate weight ratio using the hole transport capability of the first organic optoelectronic device compound and the electron transport capability of the second organic optoelectronic device compound and thus efficiency and life-span may be improved. Within the above range, e.g., they may be included in a weight ratio of about 10:90 to about 90:10, about 20:80 to about 80:20, about 20:80 to about 70:30, or about 20:80 to about 60:40. In an implementation, they may be included in a weight ratio of about 20:80 to about 50:50, e.g., may be included in a weight ratio of about 30:70.

In an implementation, the first compound and the second compound may be included as a host, e.g., a phosphorescent host of a light emitting layer.

In addition to the aforementioned host, the light emitting layer may further include one or more compounds.

The light emitting layer may further include a dopant. The dopant may be, e.g., a phosphorescent dopant, such as a red, green, or blue phosphorescent dopant. In an implementation, the dopant may be, e.g., a red phosphorescent dopant.

The dopant may be a material mixed with the compound or composition for an organic optoelectronic device in a small amount to cause light emission and may be generally a material such as a metal complex that emits light by multiple excitation into a triplet or more. The dopant may be, e.g., an inorganic, organic, or organic-inorganic compound, and one or more types thereof may be used.

Examples of the dopant may be a phosphorescent dopant and examples of the phosphorescent dopant may include an organic metal compound including Ir, Pt, Os, Ti, Zr, Hf, Eu, Tb, Tm, Fe, Co, Ni, Ru, Rh, Pd, or a combination thereof. The phosphorescent dopant may be, for example, a compound represented by Chemical Formula Z.

$$L^7MX^2 \quad \text{[Chemical Formula Z]}$$

In Chemical Formula Z, M may be a metal, $L^7$ and $X^2$ may each independently be ligands forming a complex compound with M.

The M may be, e.g., Ir, Pt, Os, Ti, Zr, Hf, Eu, Tb, Tm, Fe, Co, Ni, Ru, Rh, Pd, or a combination thereof, and $L^7$ and $X^2$ may be, e.g., a bidentate ligand.

The aforementioned compound for an organic optoelectronic device and composition for an organic optoelectronic device may be formed by a dry film formation method such as chemical vapor deposition (CVD).

Hereinafter, an organic optoelectronic device including the aforementioned compound for an organic optoelectronic device or composition for an organic optoelectronic device is described.

The organic optoelectronic device may be a suitable device to convert electrical energy into photoenergy and vice versa, e.g., an organic photoelectric device, an organic light emitting diode, an organic solar cell, and an organic photoconductor drum.

Herein, an organic light emitting diode as one example of an organic optoelectronic device is described referring to drawings.

Figure 2:
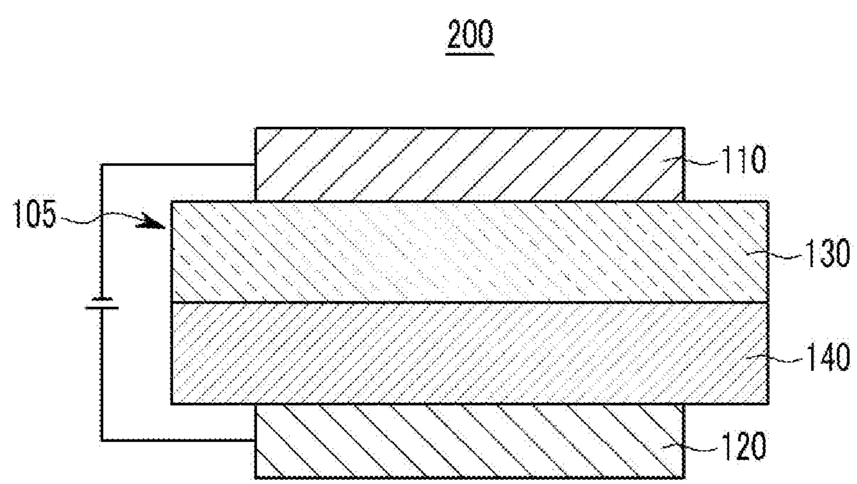

FIGS. 1 and 2 are cross-sectional views showing organic light emitting diodes according to embodiments.

Referring to FIG. 1, an organic light emitting diode 100 according to an embodiment includes an anode 120 and a cathode 110 facing each other and an organic layer 105 disposed between the anode 120 and cathode 110.

The anode 120 may be made of a conductor having a large work function to facilitate hole injection, and may be for example a metal, a metal oxide and/or a conductive polymer. The anode 120 may be, e.g., a metal such as nickel, platinum, vanadium, chromium, copper, zinc, gold, and the like or an alloy thereof; a metal oxide such as zinc oxide, indium oxide, indium tin oxide (ITO), indium zinc oxide (IZO), and the like; a combination of a metal and an oxide such as ZnO and Al or $SnO_2$ and Sb; a conductive polymer such as poly(3-methylthiophene), poly(3,4-(ethylene-1,2-dioxy)thiophene) (PEDOT), polypyrrole, or polyaniline.

The cathode 110 may be made of a conductor having a small work function to facilitate electron injection, and may be, e.g., a metal, a metal oxide and/or a conductive polymer. The cathode 110 may be for example a metal such as magnesium, calcium, sodium, potassium, titanium, indium, yttrium, lithium, gadolinium, aluminum silver, tin, lead, cesium, barium, and the like, or an alloy thereof, a multi-layer structure material such as LiF/Al, $LiO_2$/Al, LiF/Ca, LiF/Al, or $BaF_2$/Ca.

The organic layer 105 may include the aforementioned compound for an organic optoelectronic device or composition for an organic optoelectronic device.

The organic layer 105 may include a light emitting layer 130 and the light emitting layer 130 may include the aforementioned compound for an organic optoelectronic device or composition for an organic optoelectronic device.

The composition for an organic optoelectronic device further including the dopant may be, e.g., a red light emitting composition.

The light emitting layer 130 may include, e.g., the aforementioned compound for an organic optoelectronic device or composition for an organic optoelectronic device as a phosphorescent host.

The organic layer may further include an auxiliary layer in addition to the light emitting layer.

The auxiliary layer may be, e.g., a hole auxiliary layer 140.

Referring to FIG. 2, an organic light emitting diode 200 further includes a hole auxiliary layer 140 in addition to the light emitting layer 130. The hole auxiliary layer 140 further increases hole injection and/or hole mobility and blocks electrons between the anode 120 and the light emitting layer 130.

The hole auxiliary layer 140 may include, e.g., a compound of the following Group A.

In an implementation, the hole auxiliary layer 140 may include a hole transport layer between the anode 120 and the light emitting layer 130 and a hole transport auxiliary layer between the light emitting layer 130 and the hole transport layer, and at least one of compounds of Group A may be included in the hole transport auxiliary layer.

[Group A]

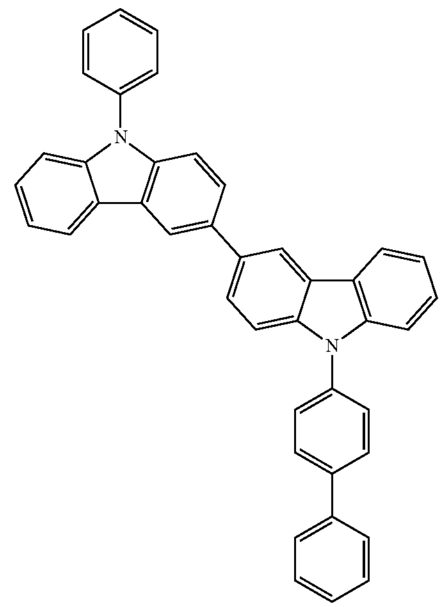

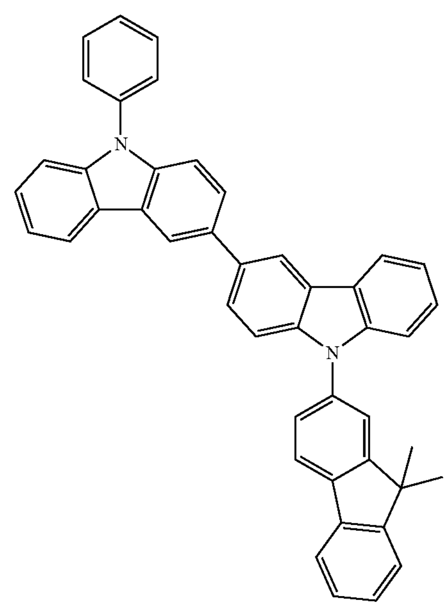

-continued
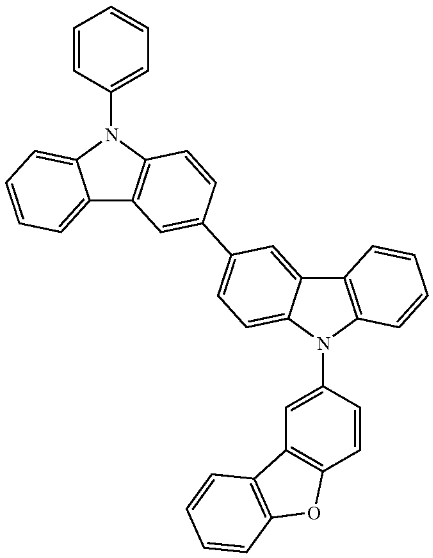
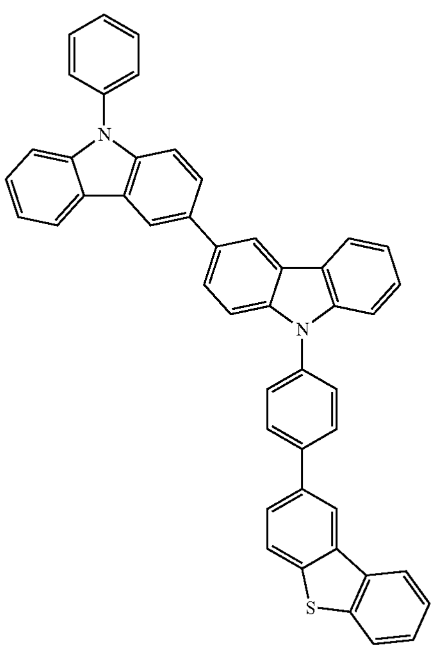
-continued
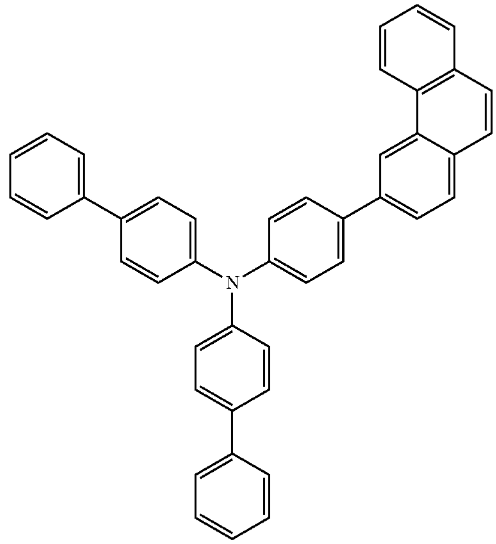
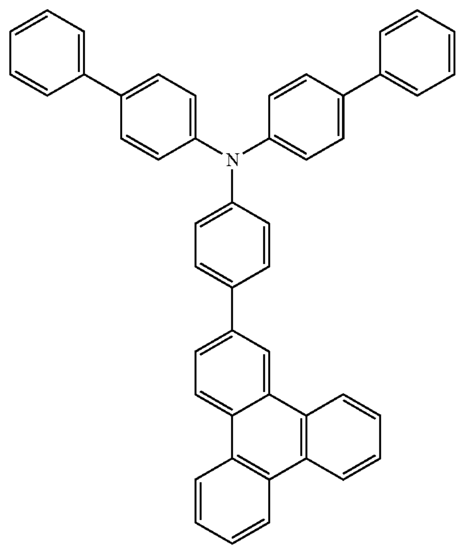
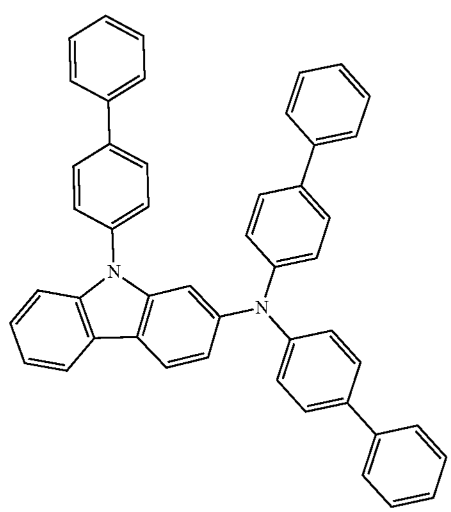

-continued
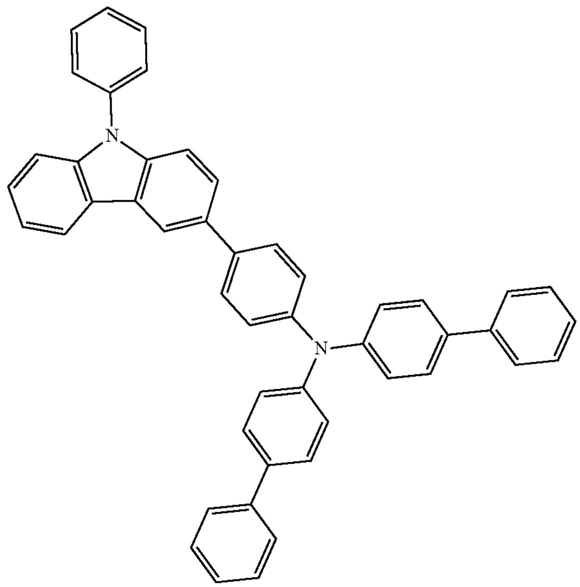
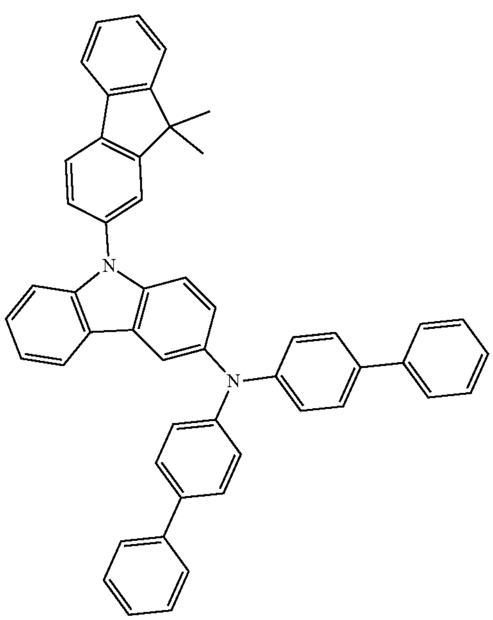
-continued
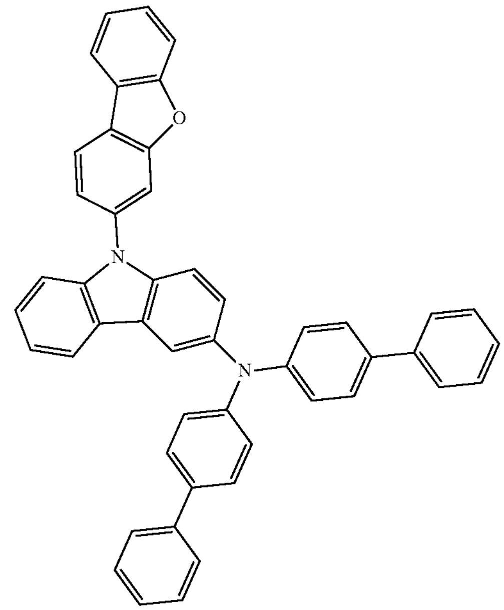
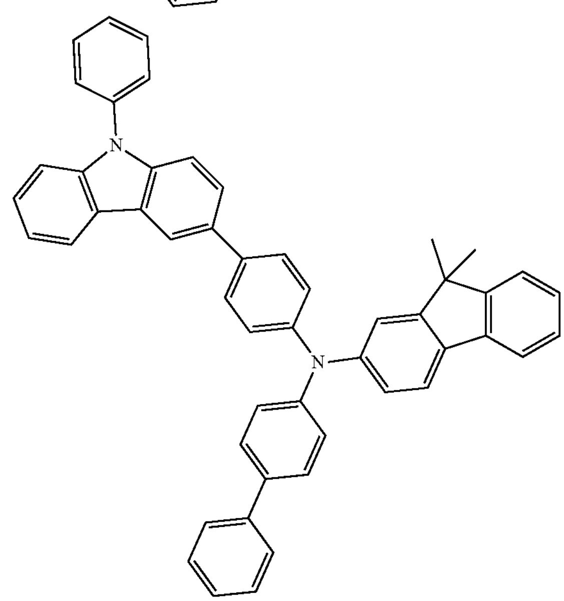
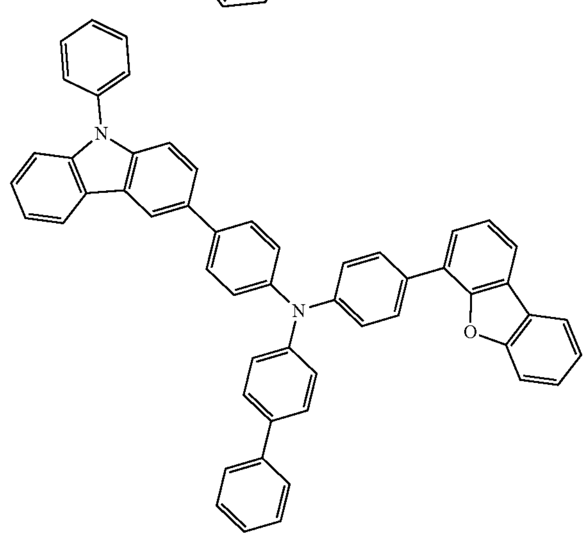

-continued
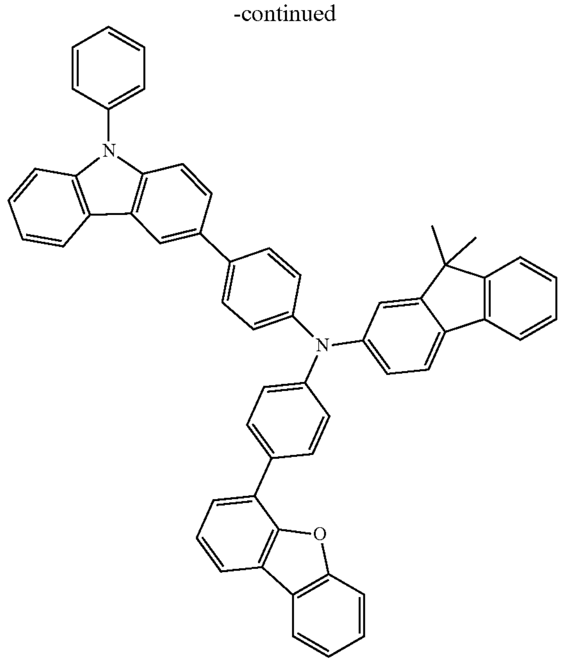
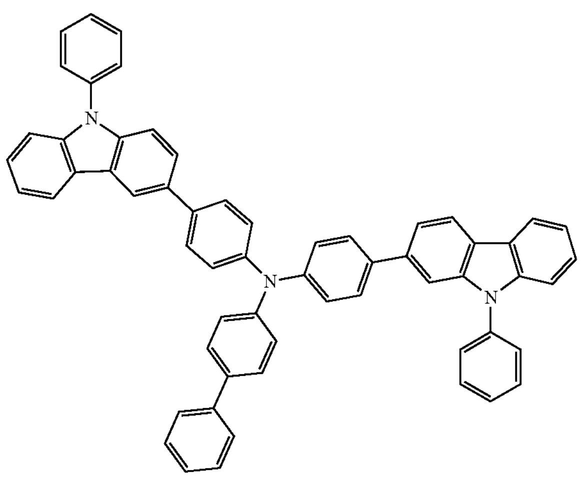
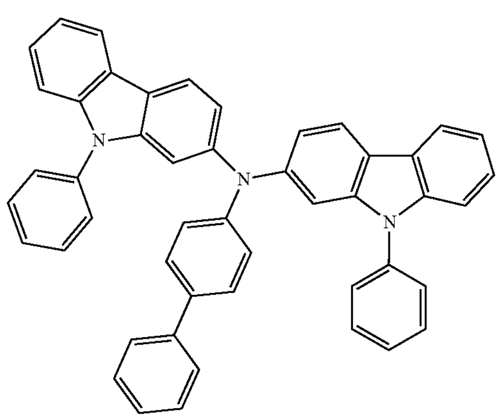
-continued
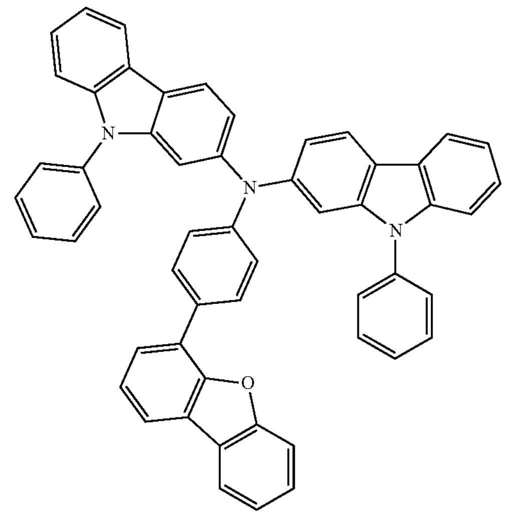
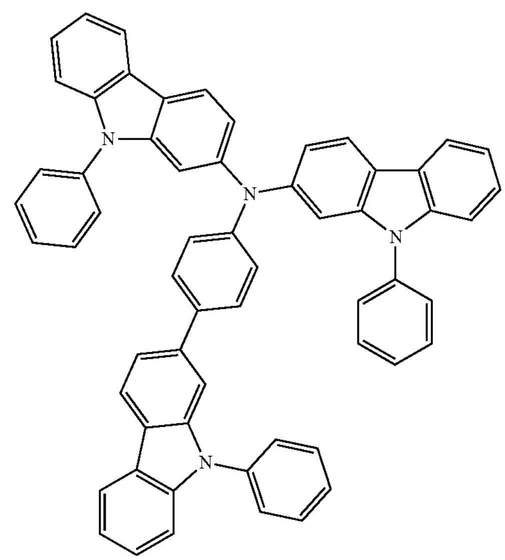
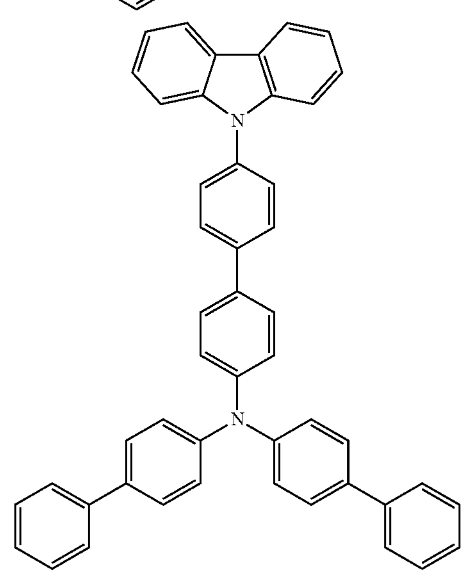

-continued
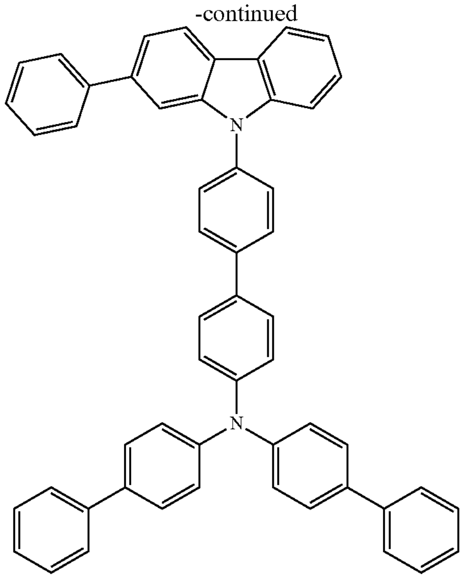
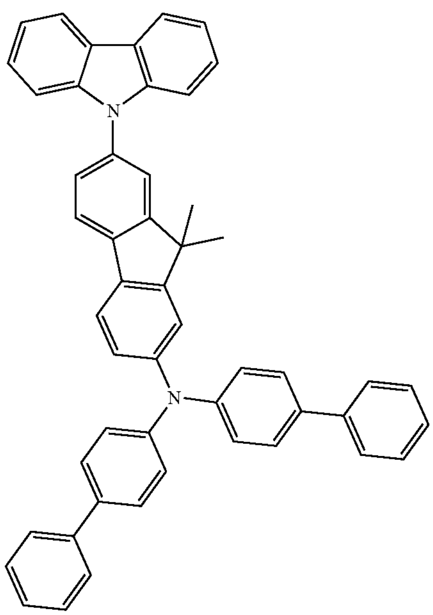
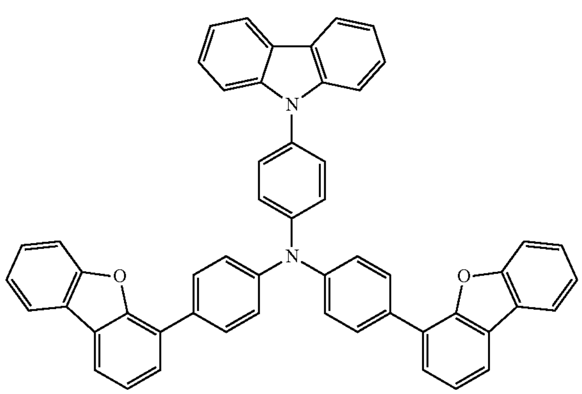
-continued
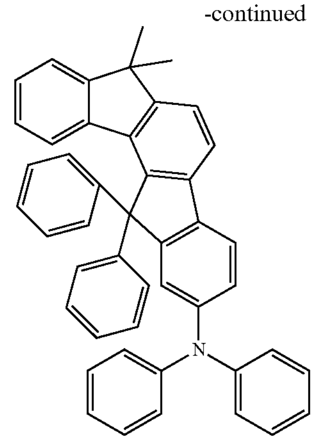
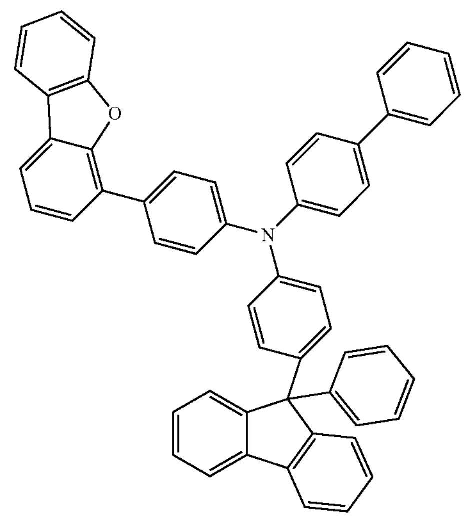
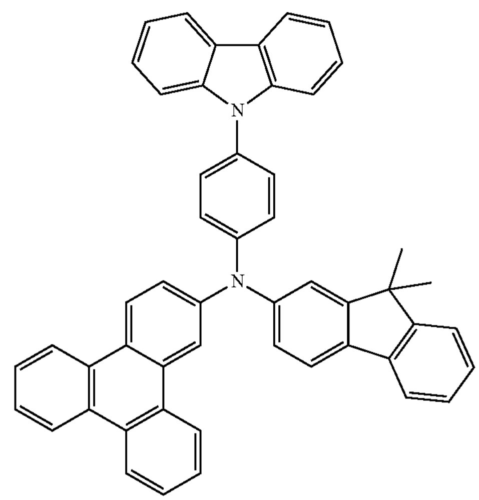

-continued
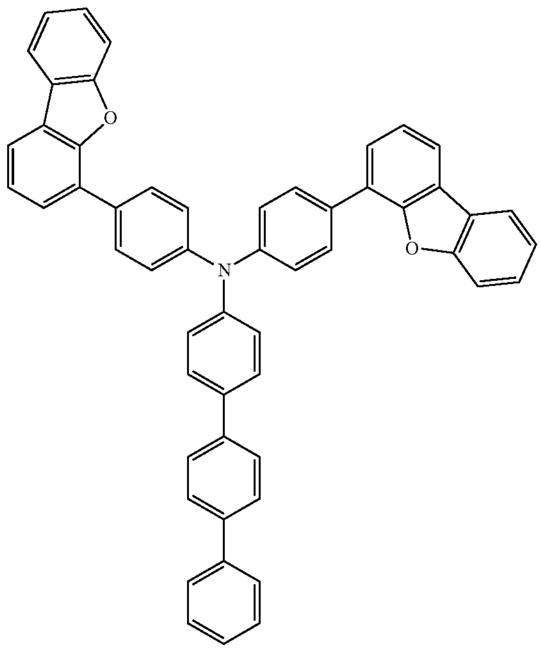
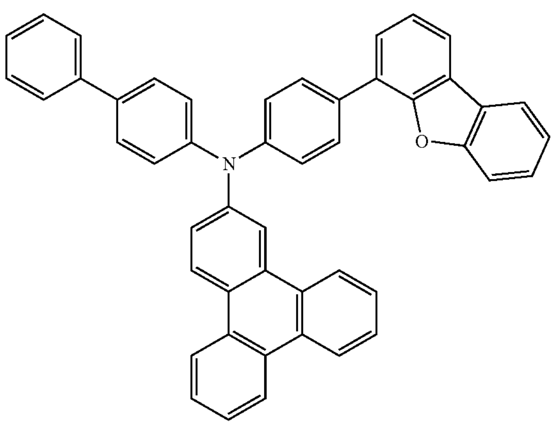
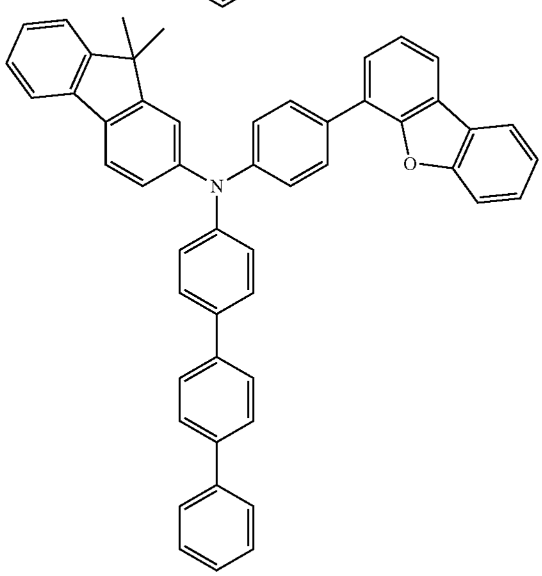
-continued
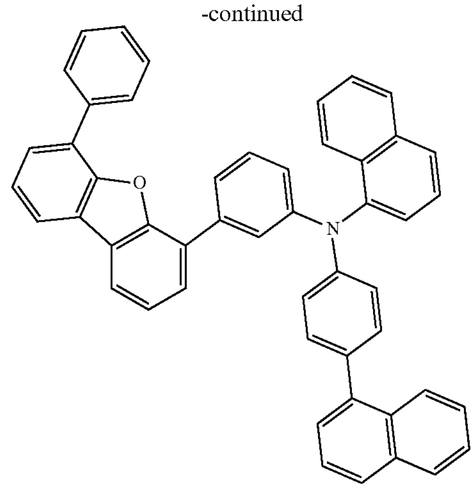
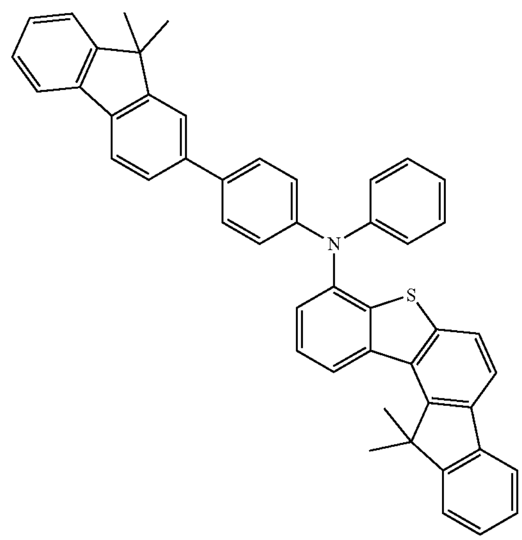
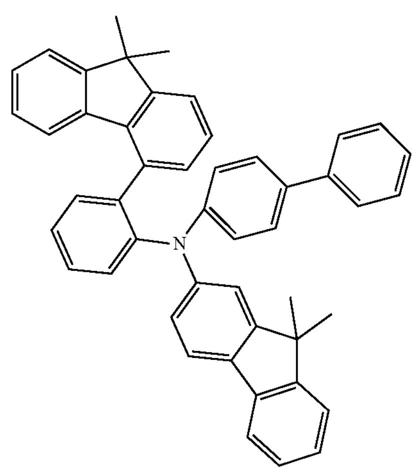

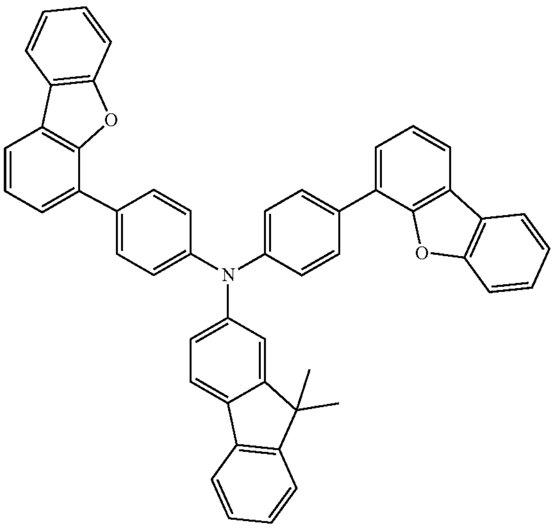
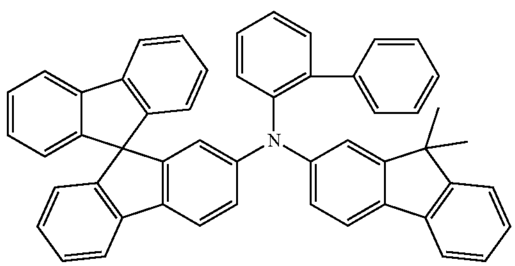
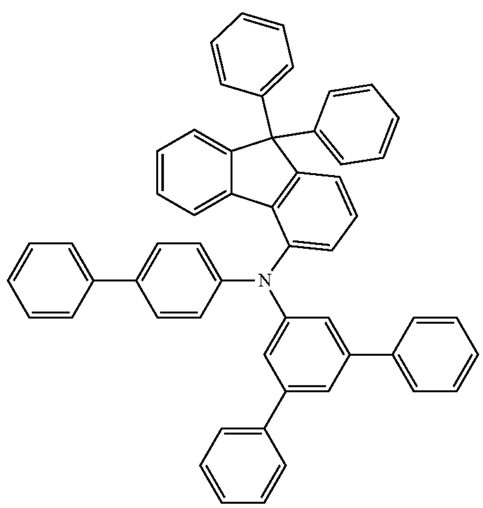
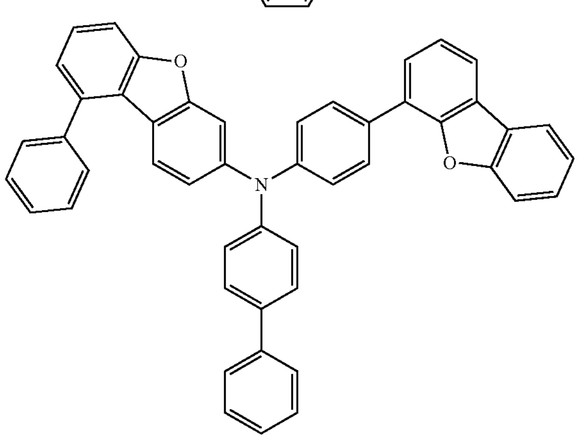
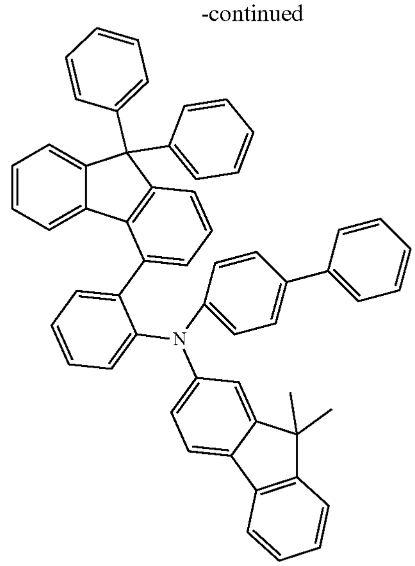
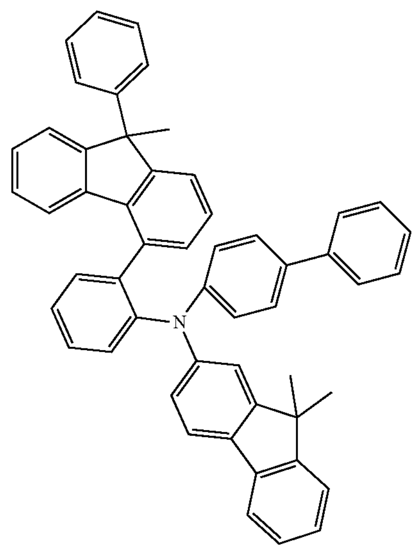
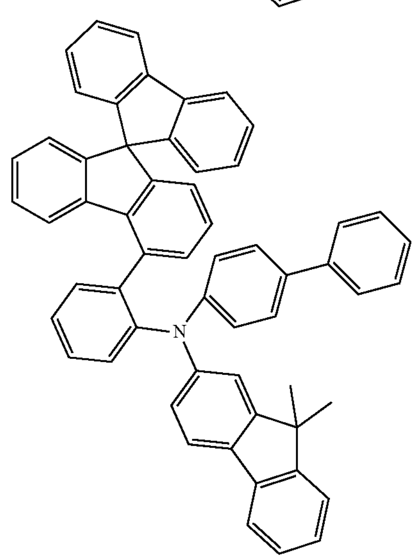

-continued
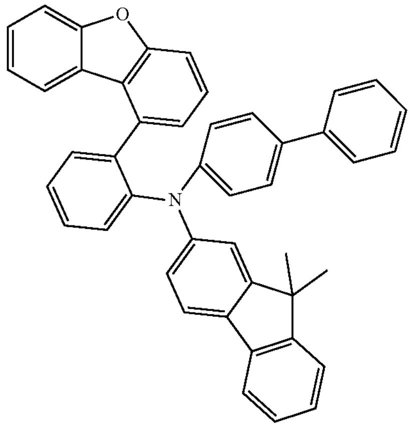
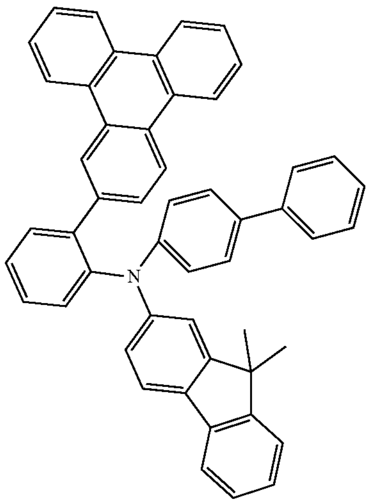
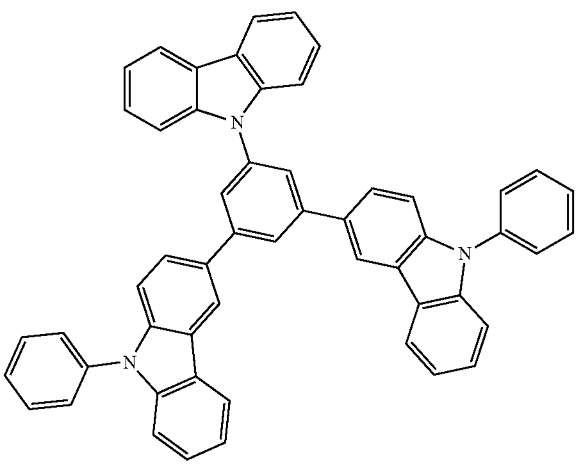
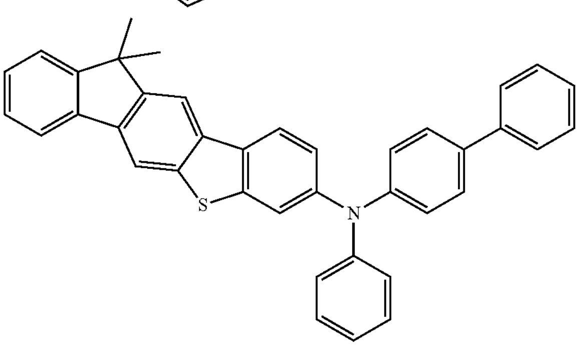
-continued
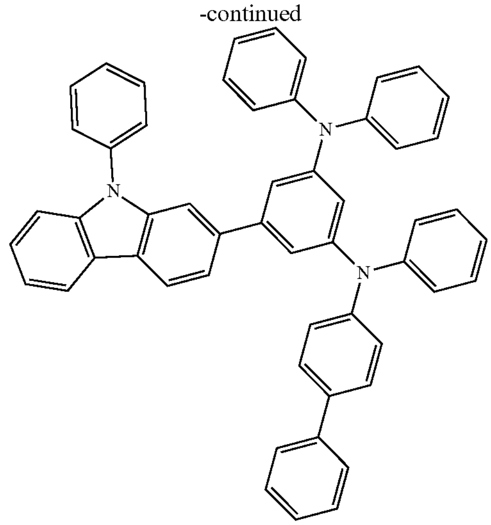
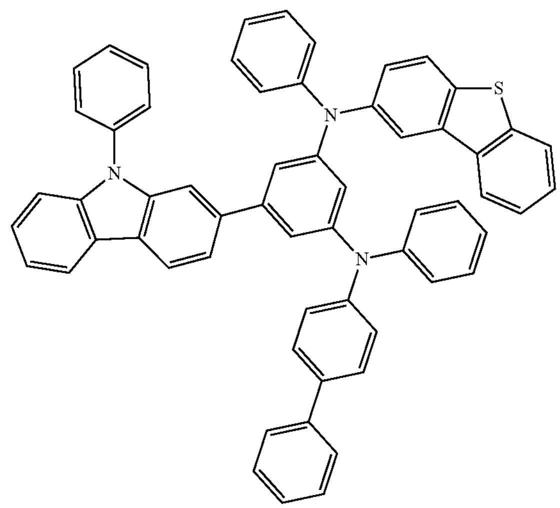
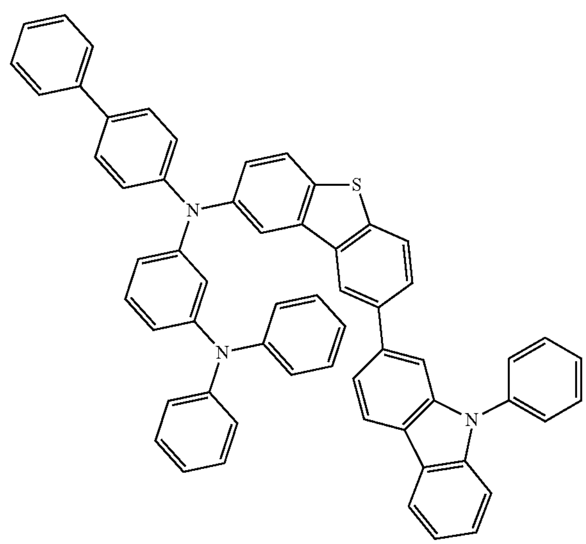

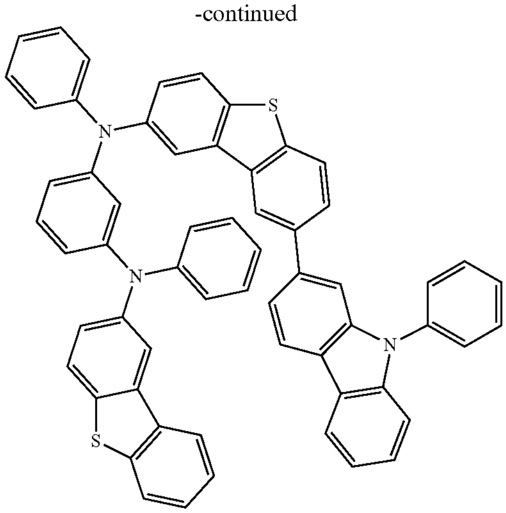
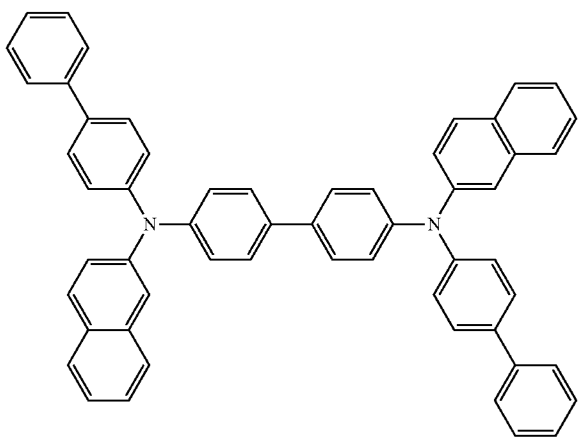
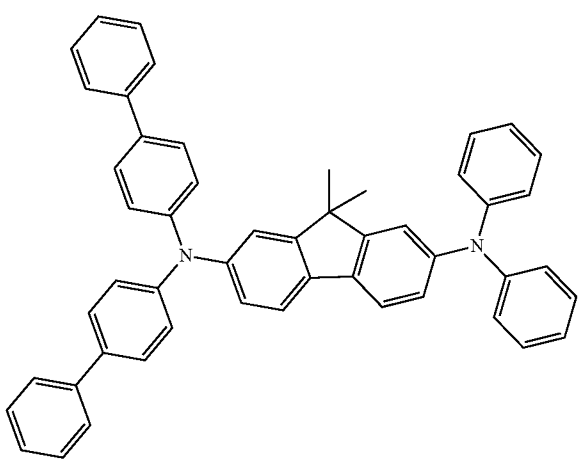
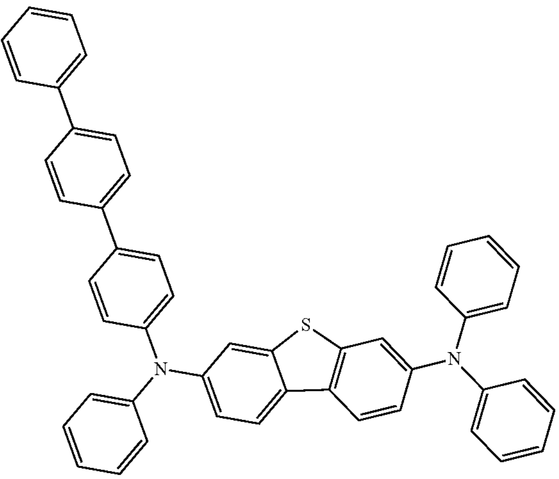
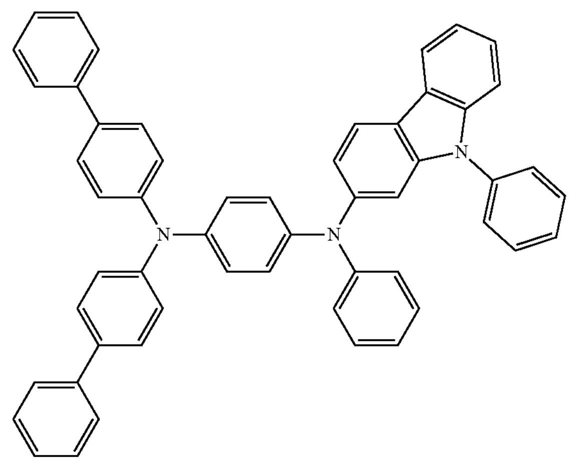
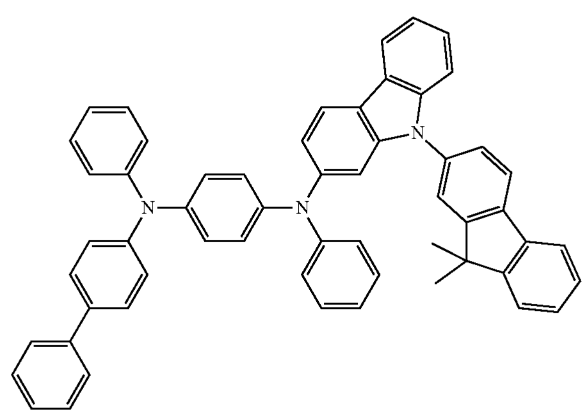

-continued
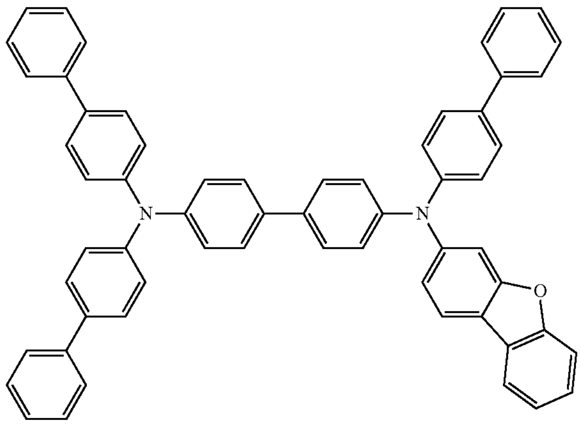
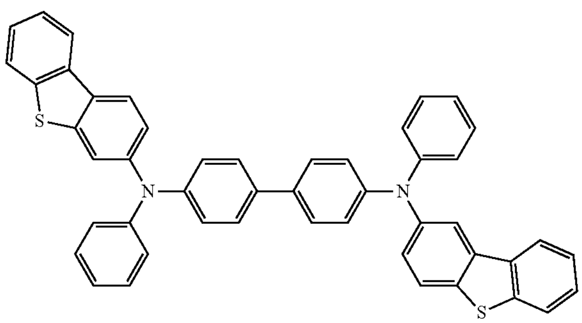
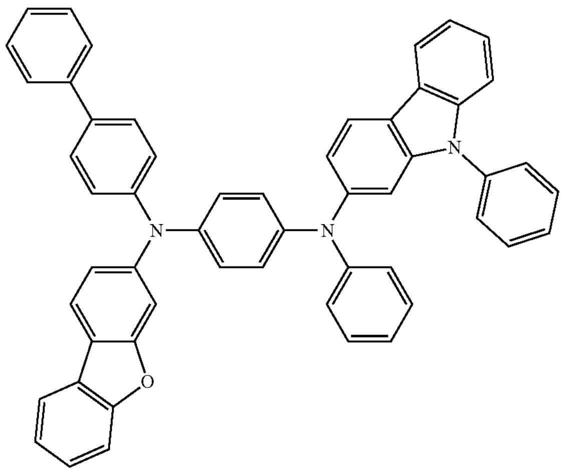
-continued
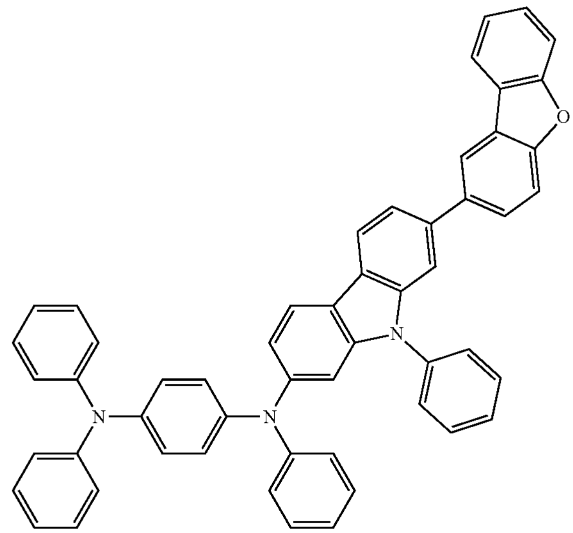
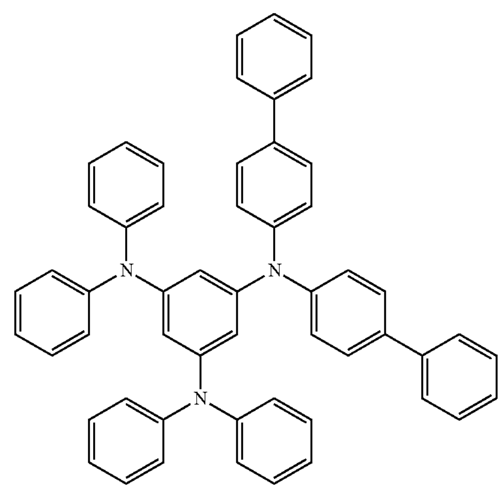
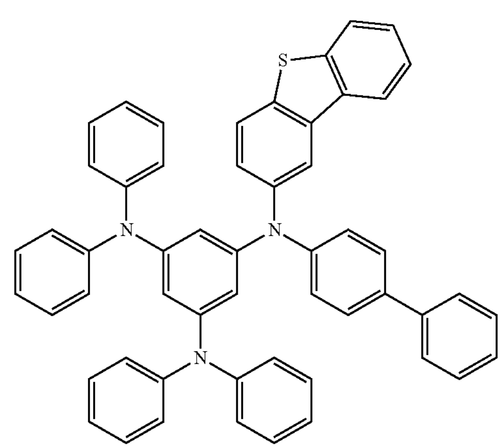

-continued
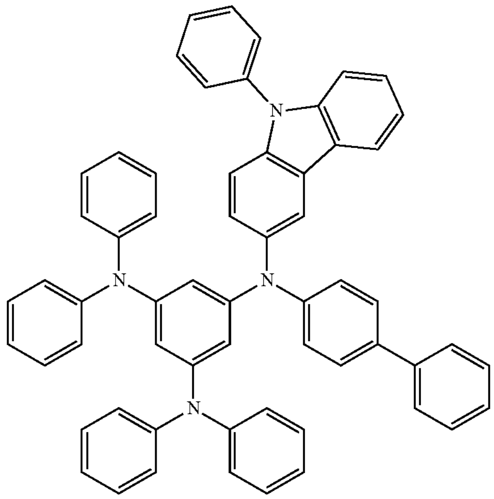
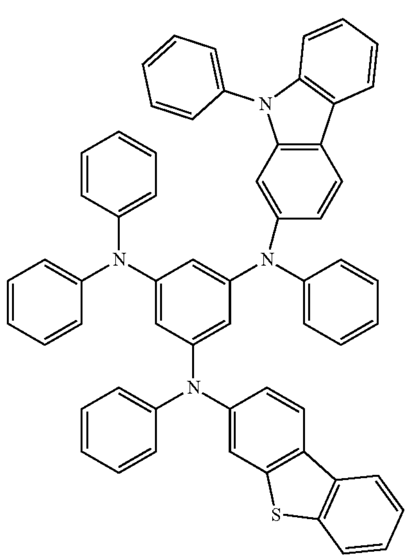
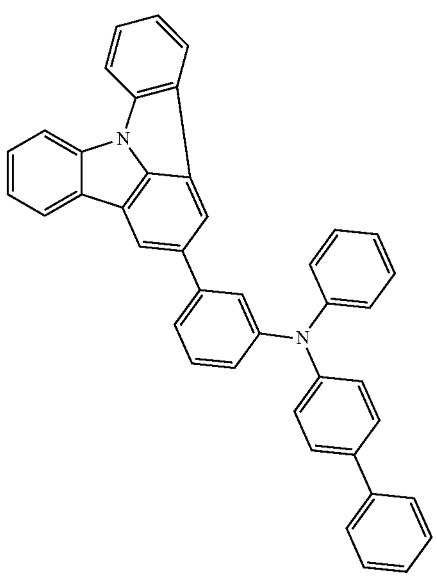
-continued
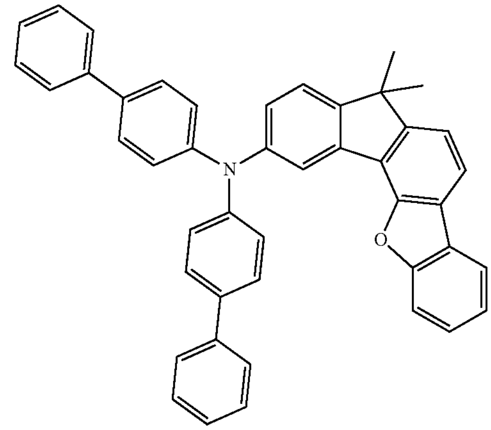
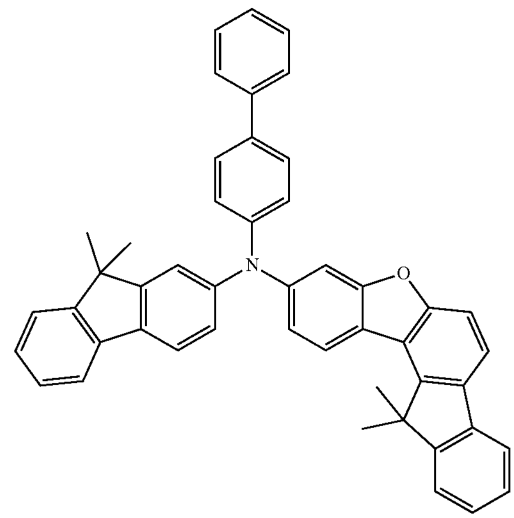
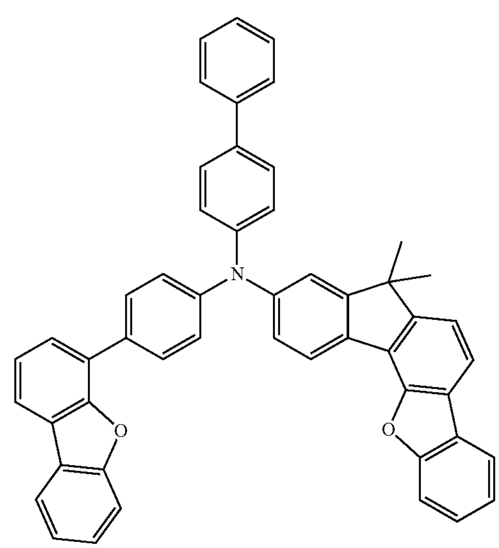

-continued
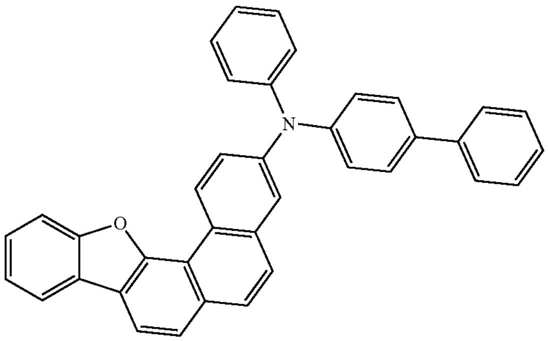
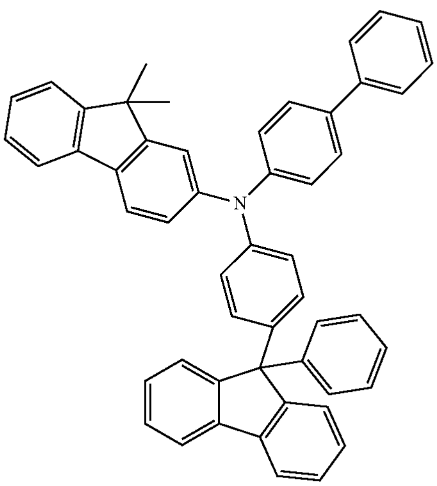
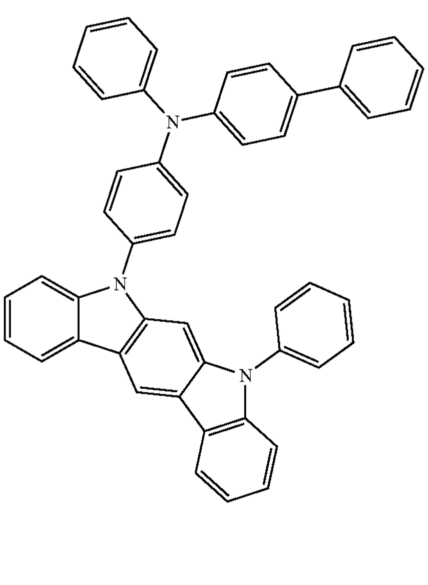
-continued
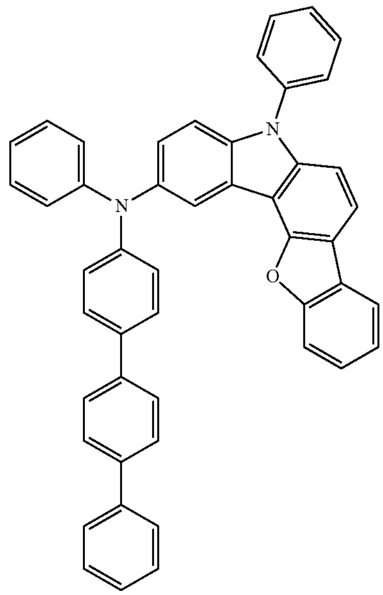
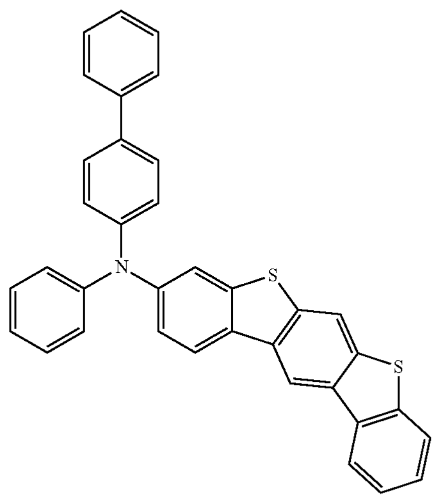
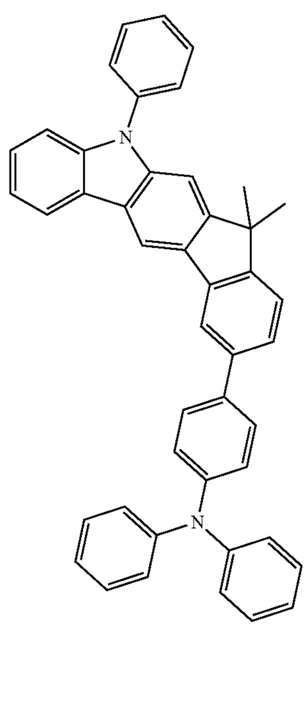

-continued

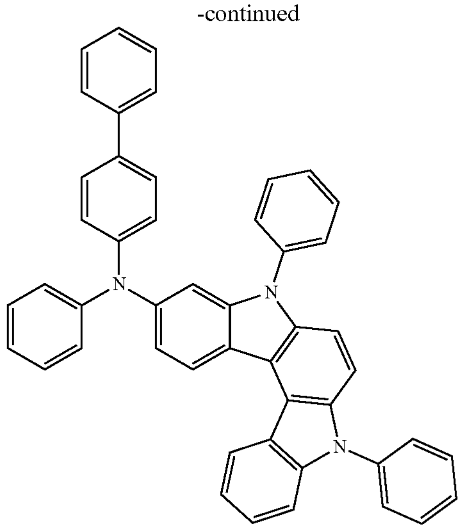

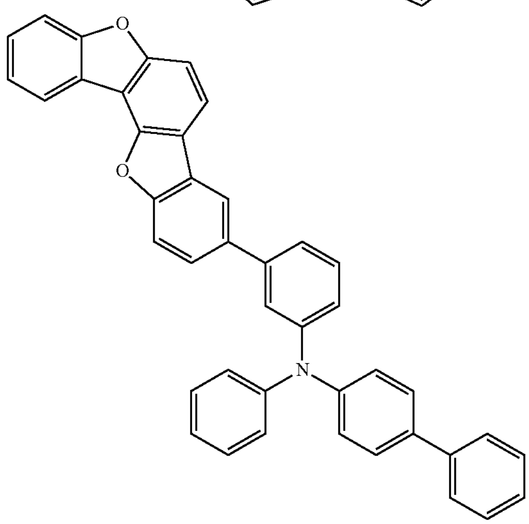

In the hole transport auxiliary layer, other compounds may be used in addition to the aforementioned compound.

In an implementation, the organic light emitting diode may further include an electron transport layer, an electron injection layer, or a hole injection layer as the organic layer 105.

The organic light emitting diodes 100 and 200 may be manufactured by forming an anode or a cathode on a substrate, forming an organic layer using a dry film formation method such as a vacuum deposition method (evaporation), sputtering, plasma plating, and ion plating, and forming a cathode or an anode thereon.

The organic light emitting diode may be applied to an organic light emitting display device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Hereinafter, starting materials and reactants used in examples and synthesis examples were purchased from Sigma-Aldrich Co. Ltd., TCI Inc., Tokyo chemical industry or P&H tech as far as there in no particular comment or were synthesized by known methods.

(Preparation of Compounds for Organic Optoelectronic Device)

Compounds were synthesized through the following steps.

Synthesis Example 1: Synthesis of Compound 1

[Reaction Scheme 1]

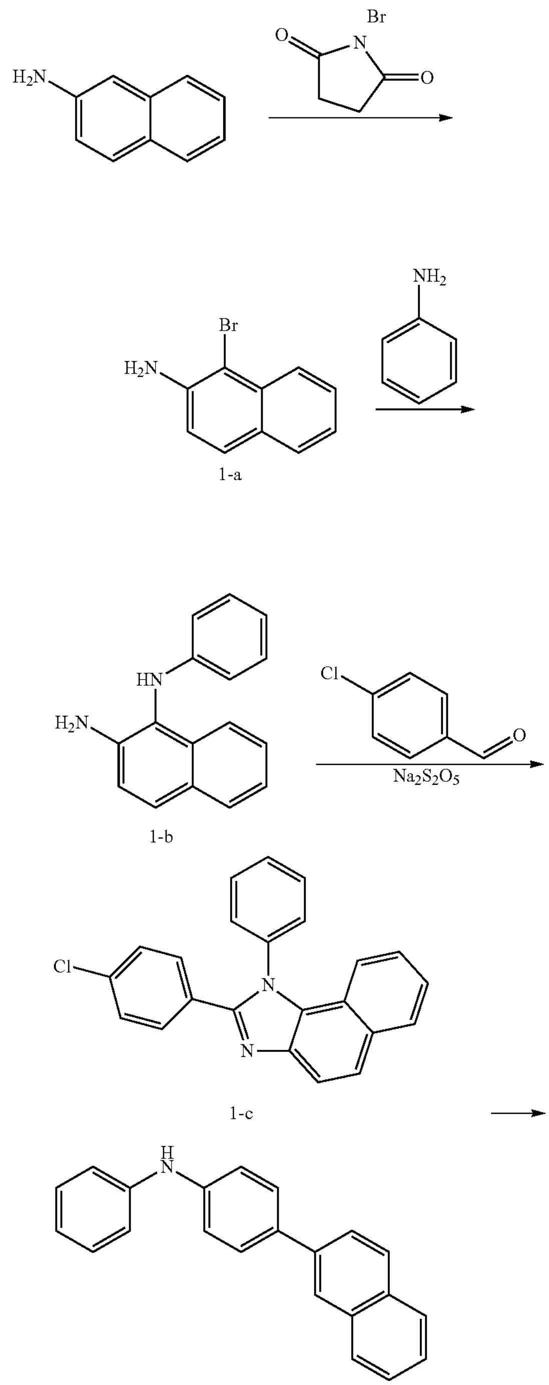

-continued

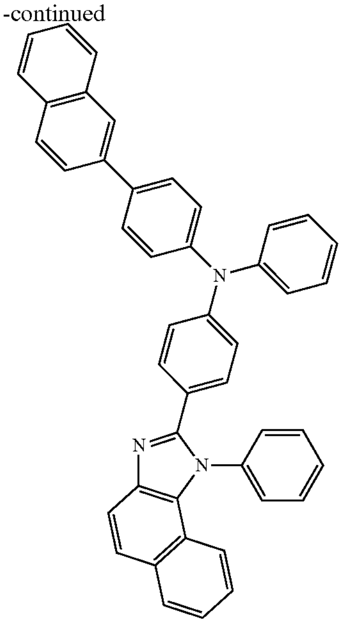

1

$1^{st}$ Step: Synthesis of Intermediate 1-a 1 eq (64.5 g) of 2-aminonaphthalene and 0.95 eq (76.1 g) of n-bromosuccinimide (NBS) were suspended in dichloromethane (1,500 ml) and then, refluxed and stirred under a nitrogen flow for 6 hours. When a reaction was completed, an organic layer was extracted therefrom with dichloromethane and distilled water, dried with magnesium sulfate ($MgSO_4$), and filtered, and a filtrate therefrom was concentrated under a reduced pressure. A solid obtained therefrom was recrystallized with dichloromethane and hexane to obtain 53 g (Y=53%) of Intermediate 1-a.

$2^{nd}$ Step: Synthesis of Intermediate 1-b 1 eq (37.9 g) of Intermediate 1-a and 5 eq (79.5 g) of aniline with 2 eq (32.8 g) of sodium-t-butoxide and 0.03 eq (4.7 g) of $Pd_2(dba)_3$ were suspended in 600 ml of toluene, and 0.09 eq of tri-tertiary-butylphosphine was added thereto and then, refluxed and stirred for 12 hours. When a reaction was completed, an organic layer was extracted therefrom with toluene and distilled water, dried with magnesium sulfate, and filtered, and a filtrate therefrom was concentrated under a reduced pressure. After removing an organic solvent therefrom, a solid obtained therefrom was treated through a silica gel column with hexane:dichloromethane=6:4 (v/v) and recrystallized with dichloromethane and hexane to obtain 38 g (Y=95%) of Intermediate 1-b.

$3^{rd}$ Step: Synthesis of Intermediate 1-c 1 eq (38 g) of Intermediate 1-b and 1 eq (22.8 g) of 4-chloro-phenylaldehyde with 1.5 q (47 g) of sodium metabisulfite ($Na_2S_2O_5$) were suspended in 600 ml of dimethylformamide and then, refluxed and stirred for 12 hours. When a reaction was completed, an organic material was precipitated with distilled water, dissolved in dichloromethane, dried with magnesium sulfate, and filtered, and a filtrate therefrom was concentrated under a reduced pressure. After removing an organic solvent, the residue was treated with hexane:dichloromethane=8:2 (v/v) through a silica gel column, and a solid obtained therefrom was recrystallized with dichloromethane and hexane to obtain 47.5 g (Y=83%) of Intermediate 1-c.

$4^{th}$ Step: Synthesis of Compound 1

1 eq (5.8 g) of intermediate 1-c and 1 eq (4.8 g) of 4-(2-naphthyl)phenyl-benzeneamine with 2 eq (3.13 g) of sodium-t-butoxide and 0.03 eq (0.45 g) of $Pd_2(dba)_3$ were suspended in 70 ml of xylene, and 0.09 eq of tri-tertiary-butylphosphine was added thereto and then, refluxed and stirred for 12 hours. When a reaction was completed, an organic layer was extracted therefrom with xylene and distilled water, dried with magnesium sulfate, and filtered, and a filtrate therefrom was concentrated under reduced pressure. After removing an organic solvent, the residue was treated with hexane:dichloromethane=8:2 (v/v) through a silica gel column, and a solid therefrom was recrystallized with dichloromethane and hexane to obtain 7.75 g (Y=78%) of Compound 1. LC-Mass measurement (theoretical value: 613.75 g/mol, measured value: M=614 g/mol)

Synthesis Example 2: Synthesis of Compound 2

According to the same method as the $4^{th}$ step of Synthesis Example 1, 1 eq (5.8 g) of Intermediate 1-c and 1 eq (6.0 g) of 4-(2-naphthyl)phenyl-(4-biphenyl)-amine with 2 eq (3.13 g) of sodium-t-butoxide and 0.03 eq (0.45 g) of $Pd_2(dba)_3$ were suspended in 70 ml of xylene, and 0.09 eq of tri-tertiary-butylphosphine was added thereto and then, refluxed and stirred for 12 hours. When a reaction was completed, an organic layer was extracted therefrom with xylene and distilled water, dried with magnesium sulfate, and filtered, and a filtrate therefrom was concentrated under a reduced pressure. After removing an organic solvent, the residue was treated with hexane:dichloromethane=8:2 (v/v) through a silica gel column, and a solid obtained therefrom was recrystallized with dichloromethane and hexane to obtain 8.4 g (Y=84%) of Compound 2. LC-Mass measurement (theoretical value: 689.84 g/mol, measured value: M=690 g/mol)

Synthesis Example 3: Synthesis of Compound 3

According to the same method as the $4^{th}$ step of Synthesis Example 1, 1 eq (5.8 g) of Intermediate 1-c and 1 eq (4.8 g) of 4-(1-naphthyl)phenyl-benzeneamine with 2 eq (3.13 g) of sodium-t-butoxide and 0.03 eq (0.45 g) of $Pd_2(dba)_3$ were suspended in 70 ml of xylene, and 0.09 eq of tri-tertiary-butylphosphine was added thereto and then, refluxed and stirred for 12 hours. When a reaction was completed, an organic layer was extracted therefrom with xylene and distilled water, dried with magnesium sulfate, and filtered, and a filtrate therefrom was concentrated under a reduced pressure. After removing an organic solvent, the residue was treated with hexane:dichloromethane=8:2 (v/v) through a silica gel column, and a solid therefrom was recrystallized with dichloromethane and hexane to obtain 7.1 g (Y=71%) of Compound 3. LC-Mass measurement (theoretical value: 613.75 g/mol, measured value: M=614 g/mol)

Synthesis Example 4: Synthesis of Compound 6

According to the same method as the $4^{th}$ step of Synthesis Example 1, 1 eq (5.8 g) of Intermediate 1-c and 1 eq (6.0 g) of 4-(2-naphthyl)phenyl-(3-biphenyl)amine with 2 eq (3.13 g) of sodium-t-butoxide and 0.03 eq (0.45 g) of $Pd_2(dba)_3$ were suspended in 70 ml of xylene, and 0.09 eq of tri-tertiary-butylphosphine was added thereto and then, refluxed and stirred for 12 hours. When a reaction was completed, an organic layer was extracted therefrom with xylene and distilled water, dried with magnesium sulfate, and filtered, and a filtrate therefrom was concentrated under a reduced pressure. After removing an organic solvent, the residue was treated with hexane:dichloromethane=8:2 (v/v) through a silica gel column, and a solid obtained therefrom was recrystallized with dichloromethane and hexane to obtain 8.1 g (Y=81%) of Compound 6. LC-Mass measurement (theoretical value: 689.84 g/mol, measured value: M=690 g/mol)

Synthesis Example 5: Synthesis of Compound 9

[Reaction Scheme 2]

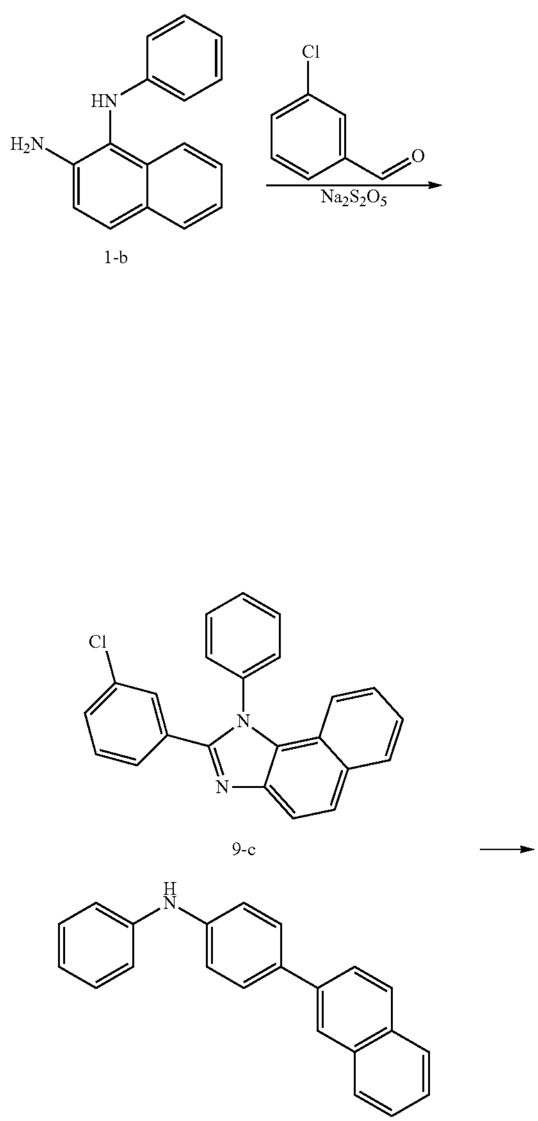

-continued

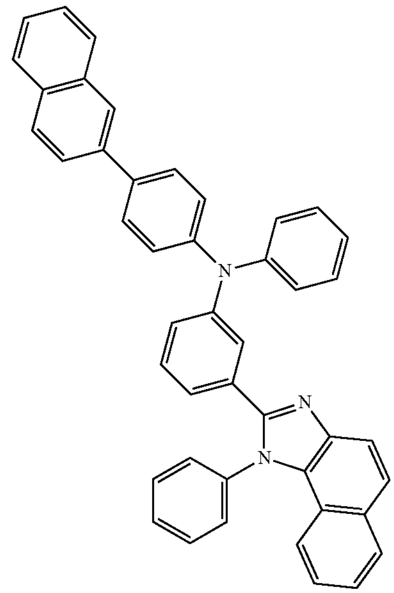

1

1st Step: Synthesis of Intermediate 9-c 1 eq (10 g) of Intermediate 1-b and 1 eq (6.0 g) of 3-chloro-phenylaldehyde with 1.5 eq (12 g) of sodium metabisulfite were suspended in 200 ml of dimethylformamide and then, refluxed and stirred for 12 hours. When a reaction was completed, an organic material was precipitated with distilled water, dissolved in dichloromethane, dried with magnesium sulfate, and filtered, and a filtrate therefrom was concentrated under a reduced pressure. After removing an organic solvent, the residue was treated with hexane:dichloromethane=8:2 (v/v) through a silica gel column, and a solid obtained therefrom was recrystallized with dichloromethane and hexane to obtain 8.4 g (Y=55%) of Intermediate 9-c.

2nd Step: Synthesis of Compound 9

1 eq (5.8 g) of Intermediate 9-c and 1 eq (4.8 g) of 4-(2-naphthyl)phenyl-benzeneamine with 2 eq (3.13 g) of sodium-t-butoxide and 0.03 eq (0.45 g) of $Pd_2(dba)_3$ were suspended in 70 ml of xylene, and 0.09 eq of tri-tertiary-butylphosphine was added thereto and then, refluxed and stirred for 12 hours. When a reaction was completed, an organic layer was extracted therefrom with xylene and distilled water, dried with magnesium sulfate, and filtered, and a filtrate therefrom was concentrated under a reduced pressure. After removing an organic solvent, the residue was treated with hexane:dichloromethane=8:2 (v/v) through a silica gel column, and a solid obtained therefrom was recrystallized with dichloromethane and hexane to obtain 3.2 g (Y=32%) of Compound 9. LC-Mass measurement (theoretical value: 613.75 g/mol, measured value: M=614 g/mol)

Synthesis Example 6: Synthesis of Compound 16

[Reaction Scheme 3]

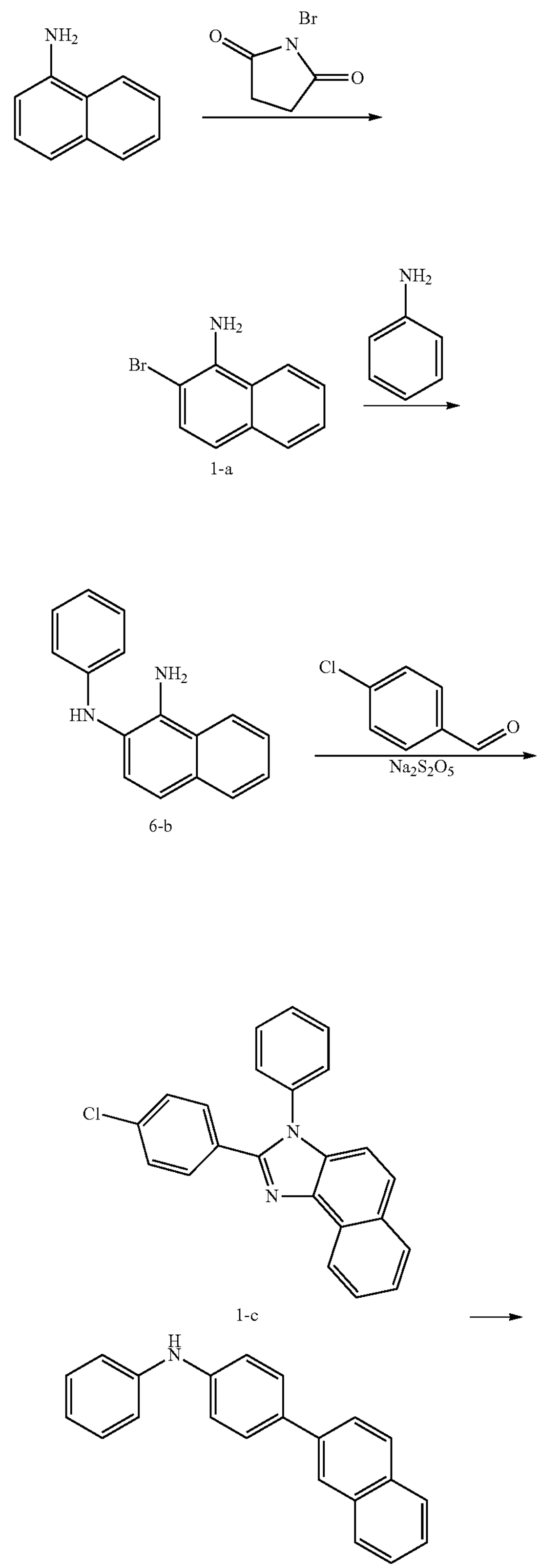

-continued

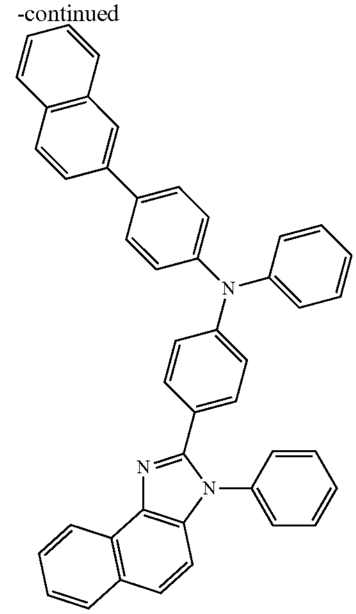

16

1$^{st}$ Step: Synthesis of Intermediate 6-a 1 eq (64.5 g) of 1-aminonaphthalene and 0.95 eq (76.1 g) of n-bromosuccinimide (NBS) were suspended in dichloromethane (1,500 ml) and then, refluxed and stirred under a nitrogen flow for 6 hours. When a reaction was completed, an organic layer was extracted therefrom with dichloromethane and distilled water, dried with magnesium sulfate ($MgSO_4$), and filtered, and a filtrate was concentrated under a reduced pressure. A solid obtained therefrom was recrystallized with dichloromethane and hexane to obtain 28 g (Y=28%) of Intermediate 6-a.

2$^{nd}$ Step: Synthesis of Intermediate 6-b 1 eq (28 g) of Intermediate 6-a and 7 eq (83.5 g) of aniline with 2 eq (24.6 g) of sodium-t-butoxide and 0.03 eq (3.5 g) of $Pd_2(dba)_3$ were suspended in 450 ml of toluene, and 0.09 eq of tri-tertiary-butylphosphine was added thereto and then, refluxed and stirred for 12 hours. When a reaction was completed, an organic layer was extracted with toluene and distilled water, dried with magnesium sulfate, and filtered, and a filtrate therefrom was concentrated under a reduced pressure. After removing an organic solvent, the residue was treated with hexane:dichloromethane=7:3 (v/v) through a silica gel column, and a solid obtained therefrom was recrystallized with dichloromethane and hexane to obtain 17 g (Y=57%) of Intermediate 6-b.

3$^{rd}$ Step: Synthesis of Intermediate 6-c 1 eq (17 g) of Intermediate 6-b and 1 eq (10.2 g) of 4-chloro-phenylaldehyde with 1.5 q (21 g) of sodium metabisulfite were suspended in 250 ml of dimethylformamide and then, refluxed and stirred for 12 hours. When a reaction was completed, an organic material was precipitated with distilled water, dissolved in dichloromethane, dried with magnesium sulfate, and filtered, and a filtrate therefrom was concentrated under a reduced pressure. After removing an organic solvent, the residue was treated with hexane:dichloromethane=8:2 (v/v) through a silica gel column, and a solid obtained therefrom was recrystallized with dichloromethane and hexane to obtain 17.1 g (Y=66%) of Intermediate 6-c.

4$^{th}$ Step: Synthesis of Compound 16

1 eq (5.8 g) of Intermediate 6-c and 1 eq (4.8 g) of 4-(2-naphthyl)phenyl-benzeneamine with 2 eq (3.13 g) of sodium-t-butoxide and 0.03 eq (0.45 g) of $Pd_2(dba)_3$ were suspended in 70 ml of xylene, and 0.09 eq of tri-tertiary-butylphosphine was added thereto and then, refluxed and stirred for 12 hours. When a reaction was completed, an organic layer was extracted with xylene and distilled water, dried with magnesium sulfate, and filtered, and a filtrate therefrom was concentrated under a reduced pressure. After removing an organic solvent, the residue was treated with hexane:dichloromethane=8:2 (v/v) through a silica gel column, and a solid obtained therefrom was recrystallized with dichloromethane and hexane to obtain 3.5 g (Y=35%) of Compound 16. LC-Mass measurement (theoretical value: 613.75 g/mol, measured value: M=614 g/mol)

Synthesis Example 7: Synthesis of Compound 18

According to the same method as the 4$^{th}$ step of Synthesis Example 6, 1 eq (5.8 g) of Intermediate 6-c and 1 eq (6.0 g) of 4-(2-naphthyl)phenyl-(4-biphenyl)-amine with 2 eq (3.13 g) of sodium-t-butoxide and 0.03 eq (0.45 g) of $Pd_2(dba)_3$ were suspended in 70 ml of xylene, and 0.09 eq of tri-tertiary-butylphosphine was added thereto and then, refluxed and stirred for 12 hours. When a reaction was completed, an organic layer was extracted therefrom with xylene and distilled water, dried with magnesium sulfate, and filtered, and a filtrate therefrom was concentrated under a reduced pressure. After removing an organic solvent, the residue was treated with hexane:dichloromethane=8:2 (v/v) through a silica gel column, and a solid therefrom was recrystallized with dichloromethane and hexane to obtain 3.3 g (Y=33%) of Compound 18. LC-Mass measurement (theoretical value: 689.84 g/mol, measured value: M=690 g/mol)

Synthesis Example 8: Synthesis of Compound 31

[Reaction Scheme 4]

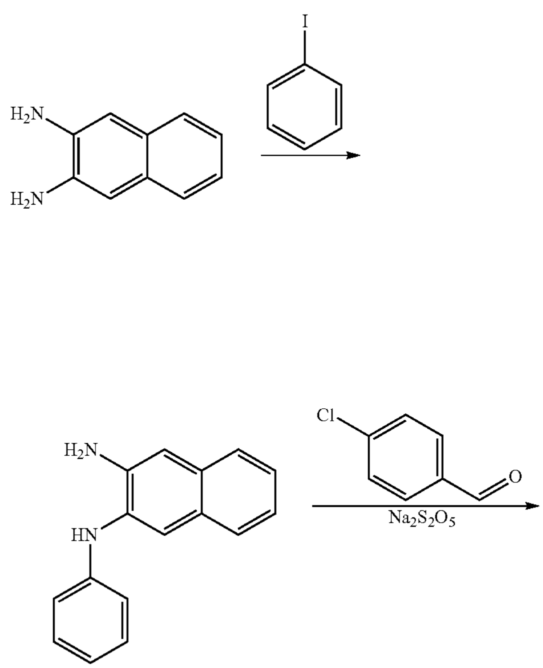

8-b

-continued

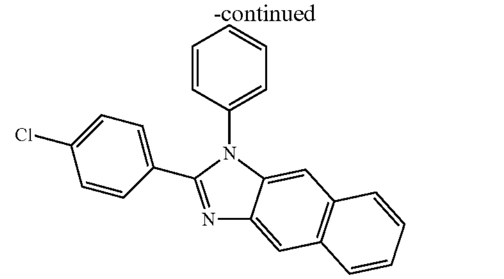

8-c

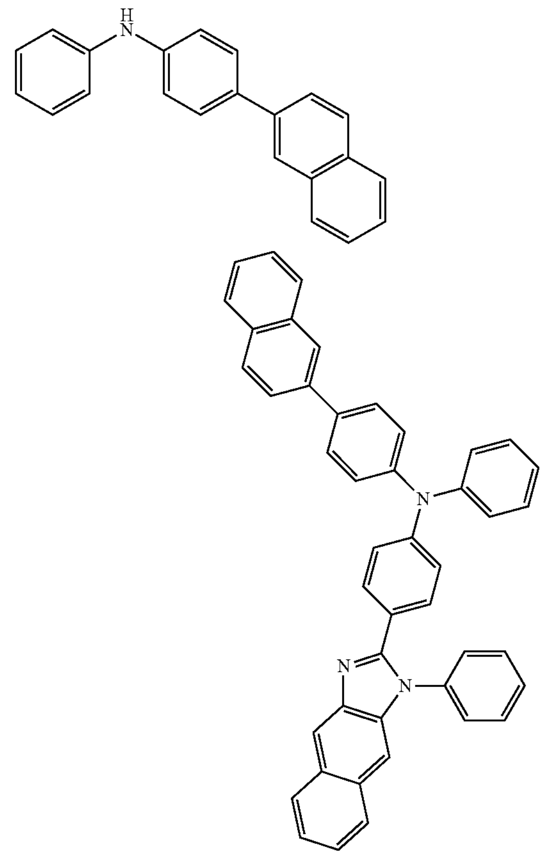

31

1$^{st}$ Step: Synthesis of Intermediate 8-b 1 eq (25 g) of 2,3-naphthalenediamine and 0.8 eq (12.8 g) of iodobenzene with 2.8 g of 1,10-phenanthroline and 3.0 g of CuI, and 25 g of $K_3PO_4$ were suspended in 270 ml of dioxane and then, refluxed and stirred under a nitrogen flow. When a reaction was completed, a solid was precipitated in methanol and filtered, treated with hexane:dichloromethane=7:3 (v/v) through a silica gel column after removing an organic solution, and recrystallized with dichloromethane and hexane to obtain 21 g (Y=48%) of Intermediate 8-b.

2$^{nd}$ Step: Synthesis of Intermediate 8-c 1 eq (10 g) of Intermediate 8-b and 1 eq (6 g) of 4-chloro-phenylaldehyde with 1.5 q (12.5 g) of sodium metabisulfite were suspended in 150 ml of dimethylformamide and then, refluxed and stirred for 12 hours. When a reaction was completed, an organic material was precipitated with distilled water, dissolved in dichloromethane, dried with magnesium sulfate, and filtered, and a filtrate therefrom was concentrated under a reduced pressure. After removing an organic solvent, a solid obtained therefrom was treated with hexane:dichloromethane=8:2 (v/v) through a silica gel column and recrystallized with dichloromethane and hexane to obtain 11.9 g (Y=79%) of Intermediate 8-c.

3rd Step: Synthesis of Compound 31

1 eq (4.6 g) of Intermediate 8-c and 1 eq (3.8 g) of 4-(2-naphthyl)phenyl-benzeneamine with 2 eq (2.5 g) of sodium-t-butoxide and 0.03 eq (0.36 g) of $Pd_2(dba)_3$ were suspended in 50 ml of xylene, and 0.09 eq of tri-tertiary-butylphosphine was added thereto and then, refluxed and stirred for 12 hours. When a reaction was completed, an organic layer was extracted therefrom with xylene and distilled water, dried with magnesium sulfate, and filtered, and a filtrate therefrom was concentrated under a reduced pressure. After removing an organic solvent, the residue was treated with hexane:dichloromethane=8:2 (v/v) through a silica gel column, and a solid obtained therefrom was recrystallized with dichloromethane and hexane to obtain 6.1 g (Y=76%) of Compound 31. LC-Mass measurement (theoretical value: 613.75 g/mol, measured value: M=614 g/mol)

Synthesis Example 9: Synthesis of Compound 33

According to the same method as the 3rd step of Synthesis Example 6, 1 eq (4.6 g) of Intermediate 8-c and 1 eq (4.8 g) of 4-(2-naphthyl)phenyl-(4-biphenyl)-amine with 2 eq (3.13 g) of sodium-t-butoxide and 0.03 eq (0.45 g) of $Pd_2(dba)_3$ were suspended in 70 ml of xylene, and 0.09 eq of tri-tertiary-butylphosphine was added thereto and then, refluxed and stirred for 12 hours. When a reaction was completed, an organic layer was extracted therefrom with xylene and distilled water, dried with magnesium sulfate, and filtered, and a filtrate therefrom was concentrated under a reduced pressure. After removing an organic solvent, the residue was treated with hexane:dichloromethane=8:2 (v/v) through a silica gel column, and a solid obtained therefrom was recrystallized with dichloromethane and hexane to obtain 6.5 g (Y=81%) of Compound 33. LC-Mass measurement (theoretical value: 689.84 g/mol, measured value: M=690 g/mol)

Comparative Synthesis Example 1: Synthesis of Compound Z-1

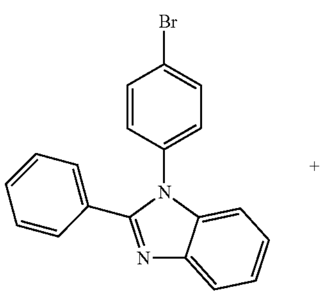

-continued

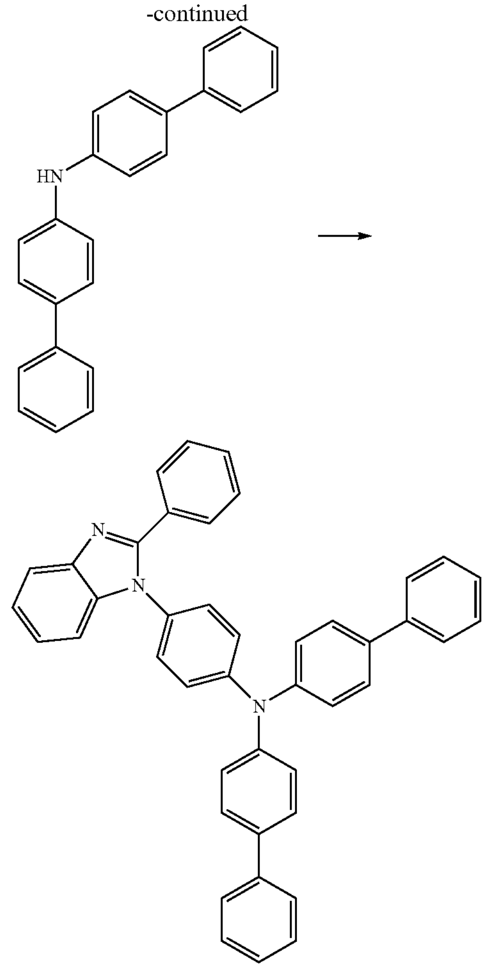

Z-1

1 eq (10 g) of 1-(4-bromophenyl)-2-phenylbenzimidazole and 1 eq (9 g) of bis(4-biphenylamine) with 2 eq (5.5 g) of sodium-t-butoxide and 0.03 eq (0.8 g) of $Pd_2(dba)_3$ were suspended in 120 ml of xylene, and 0.09 eq of tri-tertiary-butylphosphine was added thereto and then, refluxed and stirred for 12 hours. When a reaction was completed, an organic layer was extracted therefrom with xylene and distilled water, dried with magnesium sulfate, and filtered, and a filtrate was concentrated under a reduced pressure. After removing an organic solvent, the residue was treated with hexane:dichloromethane=8:2 (v/v) through a silica gel column, and a solid obtained therefrom was recrystallized with dichloromethane and hexane to obtain 12.2 g (Y=72%) of Compound Z-1. LC-Mass measurement (theoretical value: 589.73 g/mol, measured value: M=590 g/mol)

Comparative Synthesis Example 2: Synthesis of Compound Z-2

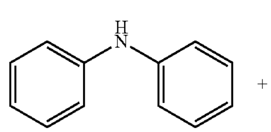

-continued

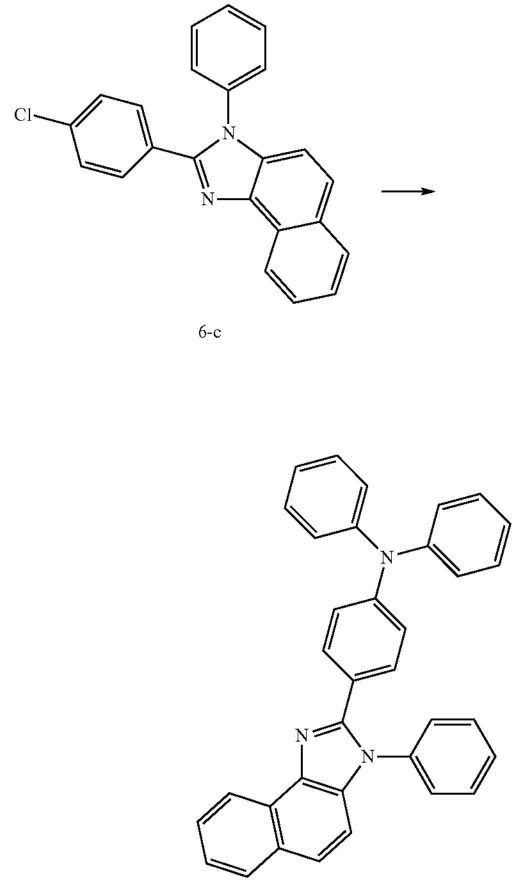

6-c

Z-2

1 eq (3.5 g) of Intermediate 6-c and 1 eq (7.3 g) of diphenylamine with 2 eq (3.9 g) of sodium-t-butoxide and 0.03 eq (0.5 g) of $Pd_2(dba)_3$ were suspended in 80 ml of xylene, and 0.09 eq of tri-tertiary-butylphosphine was added thereto and then, refluxed and stirred for 12 hours. When a reaction was completed, an organic layer was extracted therefrom with xylene and distilled water, dried with magnesium sulfate, and filtered, and a filtrate therefrom was concentrated under a reduced pressure. After removing an organic solvent, the residue was treated with hexane:dichloromethane=8:2 (v/v) through a silica gel column, and a solid therefrom was recrystallized with dichloromethane and hexane to obtain 7.9 g (Y=79%) of Compound Z-2. LC-Mass measurement (theoretical value: 487.59 g/mol, measured value: M=487 g/mol)

Synthesis Example 10: Synthesis of Compound C-21

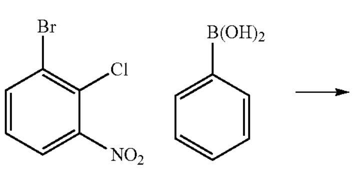

-continued

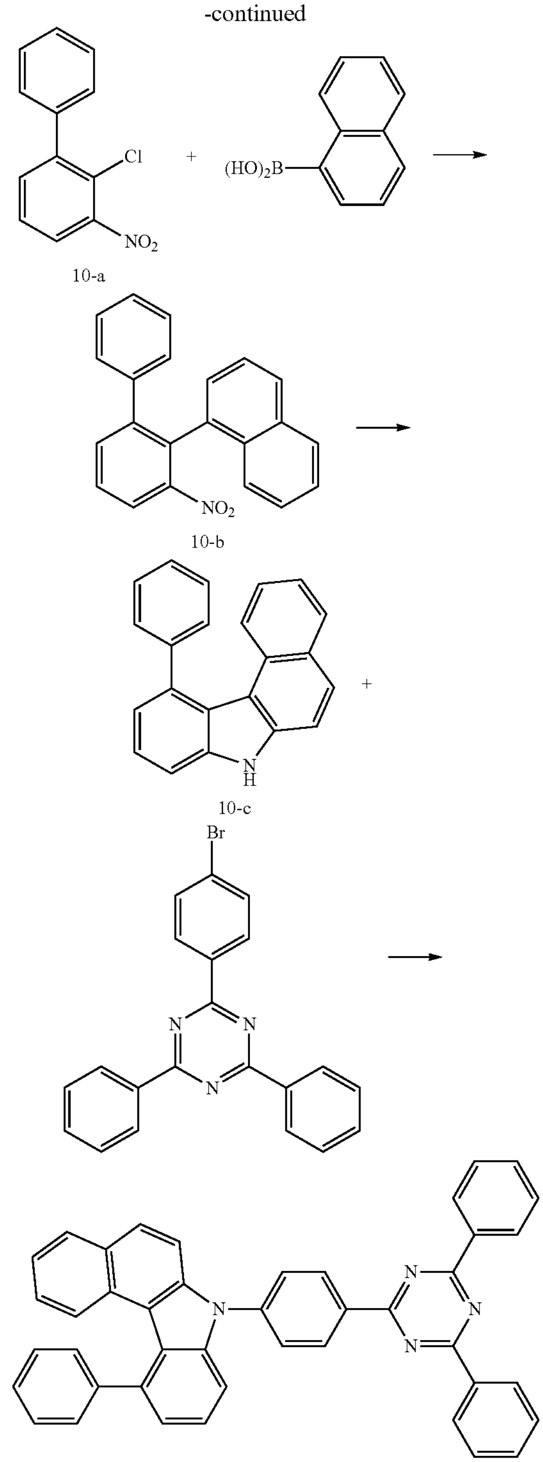

10-a 10-b 10-c

C-21

1st Step: Synthesis of Intermediate 10-a 1 eq (10 g) of 1-bromo-2-chloro-3-nitrobenzene, 1 eq (5.2 g) of phenylboronic acid, 0.05 eq (2.4 g) of $Pd(PPh_3)_4$, and 2 eq (11.8 g) of $K_2CO_3$ were suspended in 120 ml of tetrahydrofuran and 60 ml of distilled water and then, refluxed and stirred under a nitrogen flow for 12 hours. When a reaction was completed, an organic layer was extracted therefrom with tetrahydrofuran and distilled water, dried with magnesium sulfate ($MgSO_4$), and filtered, and a filtrate was concentrated under a reduced pressure. A product solid therefrom was recrystallized with dichloromethane and hexane to obtain 8.3 g (Y=83%) of Intermediate 10-a.

2nd Step: Synthesis of Intermediate 10-b 1 eq (8.3 g) of Intermediate 10-a, 1 eq (6.1 g) of 2-naphthaleneboronic acid, 0.05 eq (2.0 g) of $Pd(PPh_3)_4$, and 2 eq (9.8 g) of $K_2CO_3$ were suspended in 120 ml of tetrahydrofuran and 60 ml of distilled water and then, refluxed and stirred under a nitrogen flow for 24 hours. When a reaction was completed, an organic layer was extracted therefrom with tetrahydrofuran and distilled water, dried with magnesium sulfate ($MgSO_4$), and filtered, and a filtrate therefrom was concentrated under a reduced pressure. A product solid therefrom was recrystallized with dichloromethane and hexane to obtain 6.4 g (Y=56%) of Intermediate 10-b.

3rd Step: Synthesis of Intermediate 10-c 1 eq (6.4 g) of Intermediate 10-b and 20 g of triphenylphosphine were suspended in 100 ml of 1,2-dichlorobenzene and then, refluxed and stirred under a nitrogen flow for 18 hours. When a reaction was completed, after extracting a solvent, an organic layer was recrystallized with 80 ml of acetone to obtain 4.0 g (Y=69%) of Intermediate 10-c.

4th Step: Synthesis of Compound C-21

1 eq (4.0 g) of Intermediate 10-c and 1 eq (5.3 g) of 2-(4-bromophenyl)-4,6-diphenyl-1,3,5-triazine with 2 eq (2.6 g) of sodium-t-butoxide and 0.03 eq (0.38 g) of $Pd_2(dba)_3$ were suspended in 60 ml of xylene, and 0.09 eq of tri-tertiary-butylphosphine was added thereto and then, refluxed and stirred for 12 hours. When a reaction was completed, an organic layer was extracted therefrom with xylene and distilled water, dried with magnesium sulfate, and filtered, and a filtrate therefrom was concentrated under a reduced pressure. After removing an organic solvent therefrom, the residue was recrystallized with monochlorobenzene and hexane to obtain 7.5 g (Y=91%) of Compound C-21. LC-Mass measurement (theoretical value: 600.71 g/mol, measured value: M=601 g/mol)

(Manufacture of Organic Light Emitting Diode)

Example 1

The glass substrate coated with ITO (Indium tin oxide) was washed with distilled water and ultrasonic waves. After washing with the distilled water, the glass substrate was ultrasonically washed with isopropyl alcohol, acetone, or methanol, dried, and then, moved to a plasma cleaner, cleaned by using oxygen plasma for 10 minutes, and moved to a vacuum depositor. This obtained ITO transparent electrode was used as an anode, Compound A doped with 1% NDP-9 (available from Novaled) was vacuum-deposited on the ITO substrate to form a 1,400 Å-thick hole transport layer, and Compound B was deposited to be 600 Å-thick on the hole transport layer to form a hole transport auxiliary layer. On the hole transport auxiliary layer, 400 Å-thick light emitting layer was formed by using Compound 1 and Compound C-21 simultaneously as a host and 5 wt % of $[Ir(piq)_2acac]$ as a dopant by a vacuum-deposition. Herein, Compound 1 and Compound C-21 were used in a weight ratio of 3:7. Subsequently, Compound C was deposited at a thickness of 50 Å on the light emitting layer to form an electron transport auxiliary layer, and Compound D and LiQ were simultaneously vacuum-deposited in a weight ratio of 1:1 to form a 300 Å-thick electron transport layer. On the electron transport layer, Liq and Al were sequentially vacuum-deposited to be 15 Å-thick and 1,200 Å-thick, manufacturing an organic light emitting diode.

ITO/Compound A (1% NDP-9 doping, 1,400 Å)/Compound B (600 Å)/EML [mixture of Compound 1 and Compound C-21 in a weight ratio of 3:7:$[Ir(piq)_2acac]$=95 wt %:5 wt %] (400 Å)/Compound C (50 Å)/Compound D: Liq (300 Å)/LiQ (15 Å)/Al (1,200 Å).

Compound A: N-(biphenyl-4-yl)-9,9-dimethyl-N-(4-(9-phenyl-9H-carbazol-3-yl)phenyl)-9H-fluoren-2-amine Compound B: N,N-di([1,1'-biphenyl]-4-yl)-7,7-dimethyl-7H-fluoreno[4,3-b]benzofuran-10-amine Compound C: 2-(3-(3-(9,9-dimethyl-9H-fluoren-2-yl)phenyl)phenyl)-4,6-diphenyl-1,3,5-triazine Compound D: 8-(4-(4,6-di(naphthalen-2-yl)-1,3,5-triazin-2-yl)phenyl)quinoline

Examples 2 to 5, Comparative Examples 1 and 2

Diodes of Examples 2 to 5 and Comparative Examples 1 and 2 were respectively manufactured according to the same method as Example 1 except that the host was changed as shown in Tables 1 and 2.

Examples 6 to 8 and Comparative Example 3

Diodes according to Examples 6 to 8 and Comparative Example 3 were manufactured according to the same method as Example 1 except that the host was changed into a single host, as shown in Table 3.

Evaluation: Increase Effect of Life-Span

Driving voltages and life-span characteristics of the organic light emitting diodes according to Examples 1 and 2 and Comparative Examples 1 and 2 were evaluated. Specific measuring methods are as follows, and the results are shown in Tables 1 to 3.

(1) Measurement of Life-Span

T90 life-spans of the diodes according to Example 1 to Example 8, and Comparative Example 1 to Comparative Example 3 were measured as a time when their luminance decreased down to 90% relative to the initial luminance ($cd/m^2$) after emitting light with 24,000 $cd/m^2$ as the initial luminance ($cd/m^2$) and measuring their luminance decreases depending on a time with a Polanonix life-span measurement system.

(2) Measurement of Driving Voltage

A driving voltage of each diode was measured by using a current-voltage meter (Keithley 2400) at 15 $mA/cm^2$.

(3) Calculation of T90 Life-Span Ratio (%)

T90 life-span ratios based on the T90 life-span of Comparative Example 2 were evaluated, and the results are shown in Table 1.

(4) Calculation of Driving Voltage Ratio (%)

Driving voltage ratios based on the driving voltage of Comparative Example 2 were calculated, and the results are shown in Table 2, and driving voltage ratios based on the driving voltage of Comparative Example 3 were calculated, and the results are shown in Table 3.

TABLE 1

| | First host | Second host | T90 life-span ratio (%) |
|---|---|---|---|
| Example 1 | 1 | C-21 | 200 |
| Example 2 | 2 | C-21 | 240 |
| Example 3 | 6 | C-21 | 240 |
| Example 4 | 16 | C-21 | 150 |
| Example 5 | 31 | C-21 | 120 |

TABLE 1-continued

| | First host | Second host | T90 life-span ratio (%) |
|---|---|---|---|
| Comparative Example 1 | Z-1 | C-21 | 80 |
| Comparative Example 2 | Z-2 | C-21 | 100 |

TABLE 2

| | First host | Second host | Driving voltage ratio (%) |
|---|---|---|---|
| Example 1 | 1 | C-21 | 80 |
| Example 2 | 2 | C-21 | 70 |
| Example 3 | 6 | C-21 | 70 |
| Example 4 | 16 | C-21 | 80 |
| Example 5 | 31 | C-21 | 90 |
| Comparative Example 1 | Z-1 | C-21 | 100 |
| Comparative Example 2 | Z-2 | C-21 | 100 |

TABLE 3

| | Host | Driving voltage ratio (%) |
|---|---|---|
| Example 6 | 1 | 80 |
| Example 7 | 2 | 70 |
| Example 8 | 16 | 70 |
| Comparative Example 3 | Z-1 | 100 |

Referring to Tables 1 and 2, the compositions according to the Examples exhibited greatly improved life-span and driving, compared with the Comparative Examples.

Referring to Table 3, the compounds according to the Examples exhibited decreased driving voltage, compared with the Comparative Example, when used alone, and could accomplish the driving at a lower voltage.

One or more embodiments may provide a compound for an organic optoelectronic device capable of implementing a high efficiency and long life-span organic optoelectronic device.

Organic optoelectronic devices having high efficiency and long life-span may be implemented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A compound for an organic optoelectronic device, the compound being represented by Chemical Formula 1A or Chemical Formula 1B,

[Chemical Formula 1A]

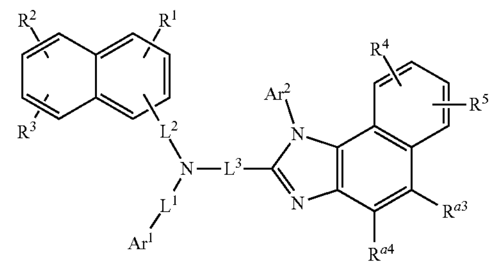

[Chemical Formula 1B]

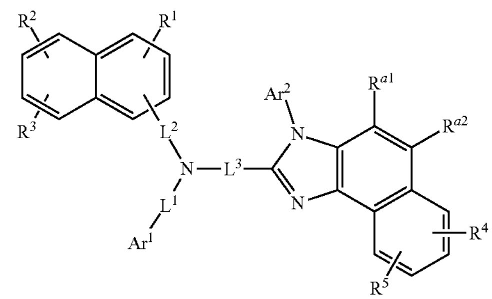

wherein, in Chemical Formula 1A and Chemical Formula 1B, $Ar^1$ and $Ar^2$ are each independently a substituted or unsubstituted C6 to C30 aryl group, $L^1$ and $L^2$ are each independently a single bond, or a substituted or unsubstituted C6 to C30 arylene group, $L^3$ is a substituted or unsubstituted C6 to C30 arylene group, and $R^{a1}$ to $R^{a4}$ and $R^1$ to $R^5$ are each independently hydrogen, deuterium, a cyano group, a halogen, a substituted or unsubstituted amine group, a substituted or unsubstituted C1 to C30 alkyl group, a substituted or unsubstituted C6 to C30 aryl group, a substituted or unsubstituted C2 to C30 heterocyclic group, or a combination thereof.

2. The compound as claimed in claim 1, wherein the compound is represented by Chemical Formula 1A-1, Chemical Formula 1A-2, or Chemical Formula 1B-2:

[Chemical Formula 1A-1]

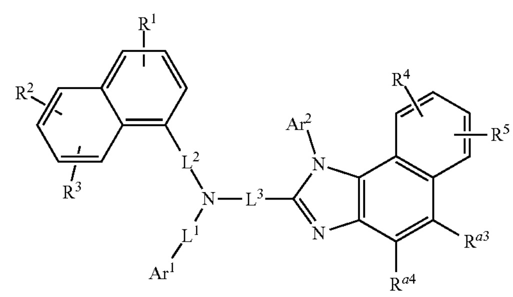

-continued

[Chemical Formula 1A-2]

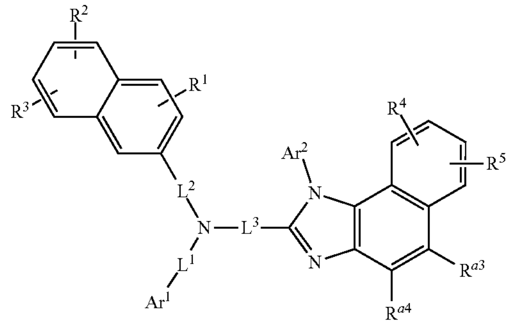

[Chemical Formula 1A-3]

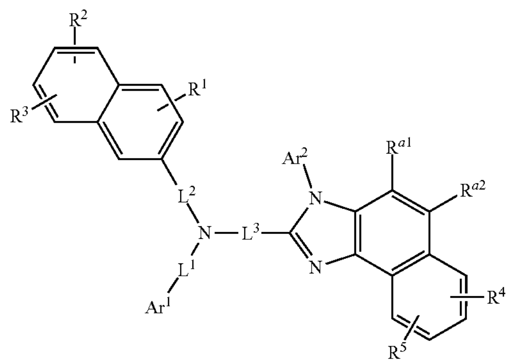

wherein, in Chemical Formula 1A-1, Chemical Formula 1A-2, and Chemical Formula 1B-2, $Ar^1$, $Ar^2$, $L^1$ to $L^3$, $R^1$ to $R^5$, and $R^{a1}$ to $R^{a4}$ are defined the same as those of Chemical Formula 1A and Chemical Formula 1B.

3. The compound as claimed in claim 2, wherein the compound is represented by Chemical Formula 1A-2 or Chemical Formula 1B-2.

4. The compound as claimed in claim 1, wherein $L^3$ is a substituted or unsubstituted C6 to C12 arylene group.

5. The compound as claimed in claim 4, wherein $L^3$ is a substituted or unsubstituted meta-phenylene group or a substituted or unsubstituted para-phenylene group.

6. The compound as claimed in claim 1, wherein:

$Ar^1$ and $Ar^2$ are each independently a substituted or unsubstituted phenyl group, a substituted or unsubstituted biphenyl group, or a substituted or unsubstituted naphthyl group, $L^1$ and $L^2$ are each independently a single bond, a substituted or unsubstituted phenylene group, a substituted or unsubstituted biphenylene group, or a substituted or unsubstituted naphthylene group, and $R^1$ to $R^5$ are each independently hydrogen, deuterium, a cyano group, a substituted or unsubstituted C1 to C10 alkyl group, or a substituted or unsubstituted C6 to C12 aryl group.

7. The compound as claimed in claim 1, wherein the compound is a compound of Group 1:

[Group 1]

[1]

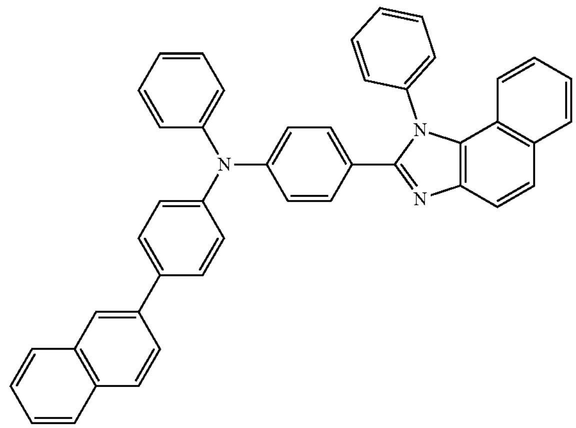

[2]

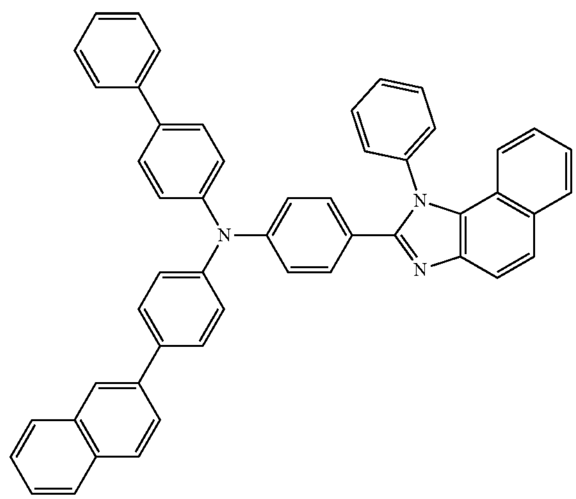

[3]

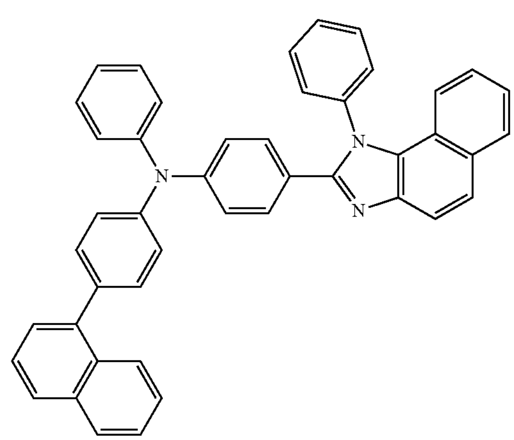

-continued
[4]
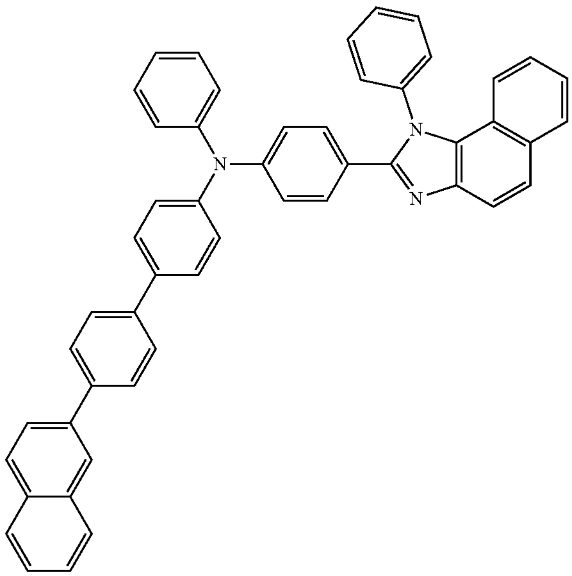
[5]
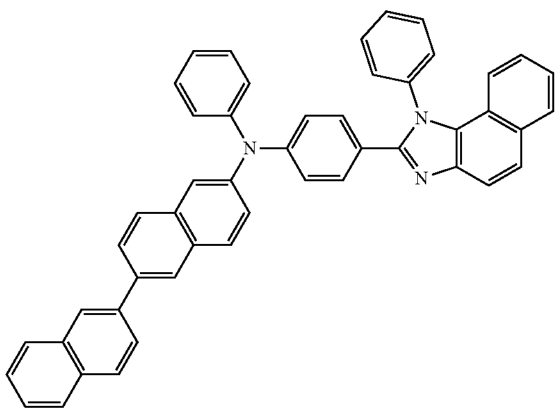
[6]
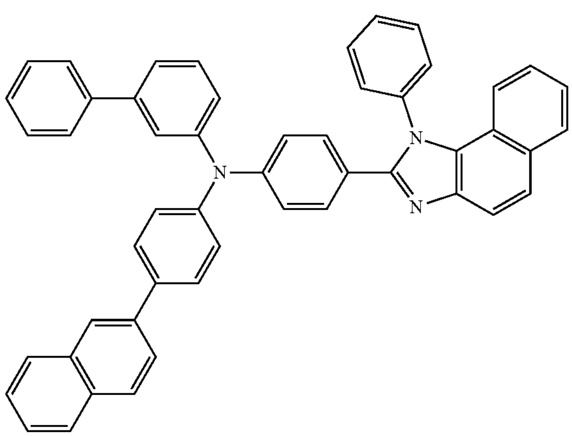
-continued
[7]
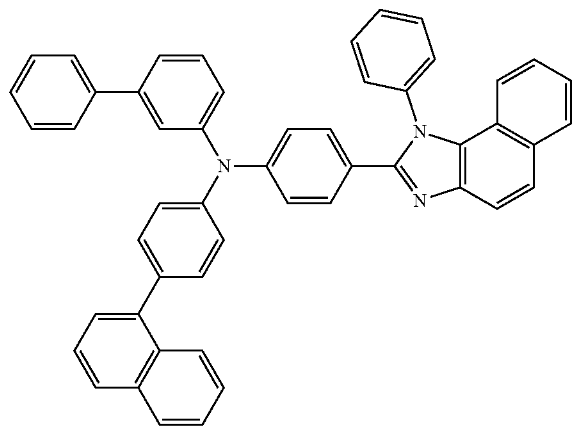
[8]
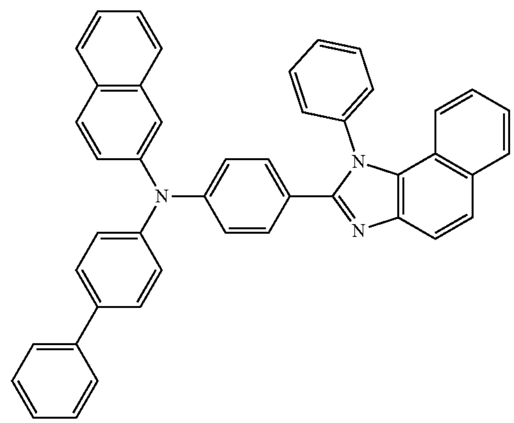
[9]
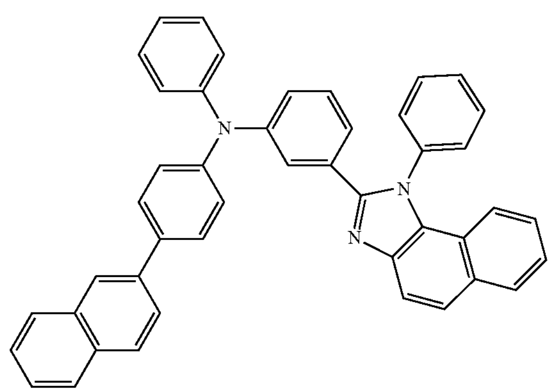

-continued
[10]
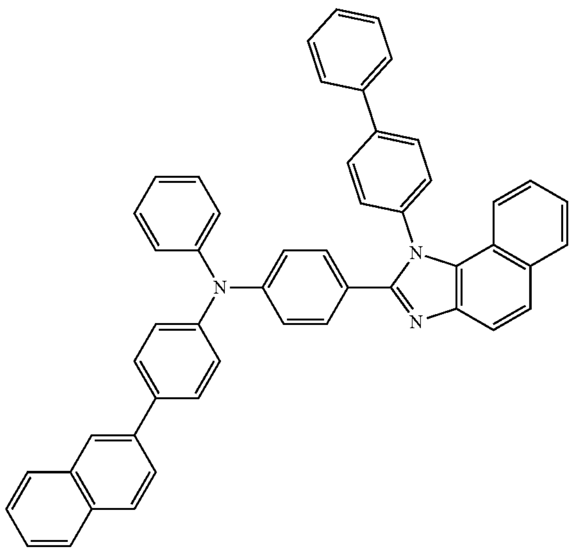
[11]
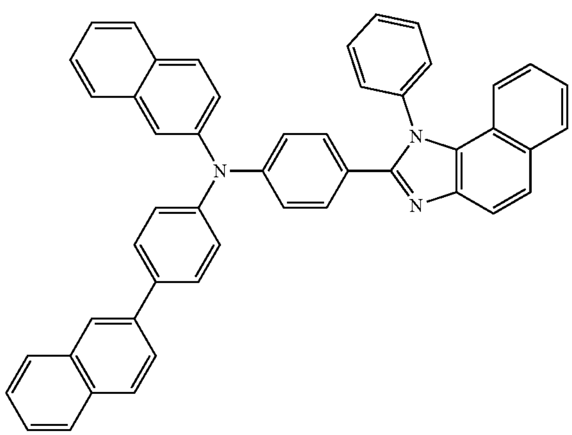
[12]
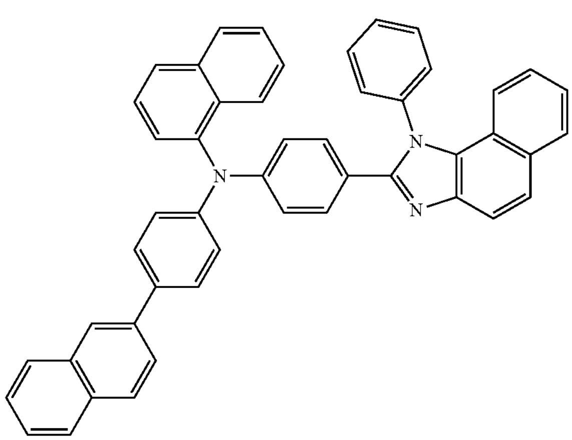
-continued
[13]
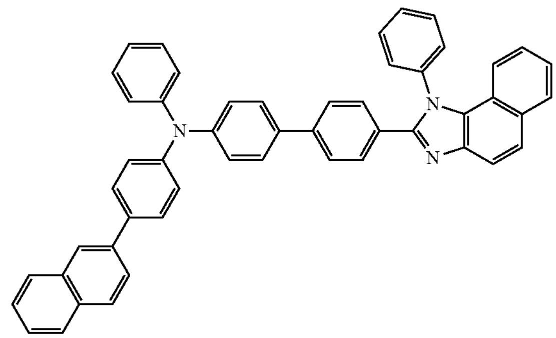
[14]
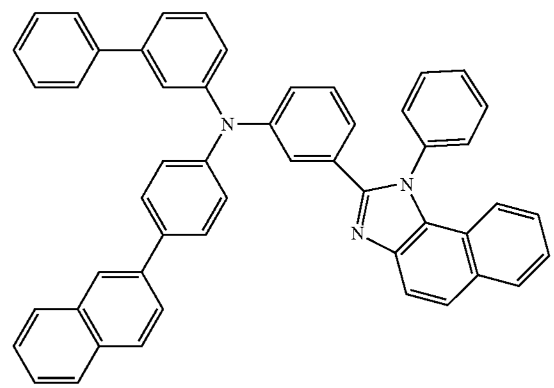
[15]
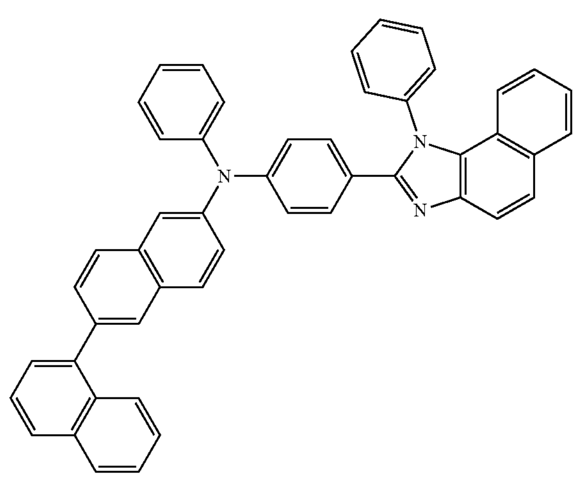

[16]
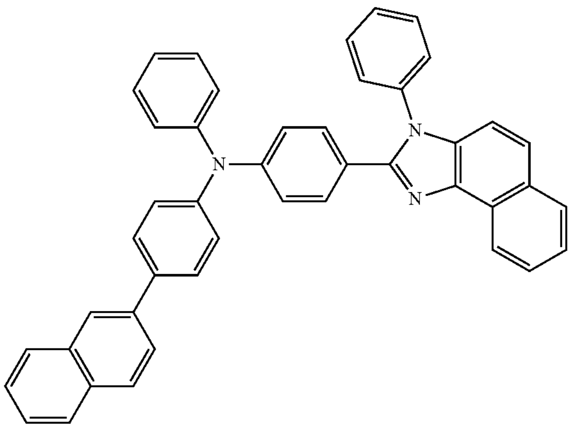
[17]
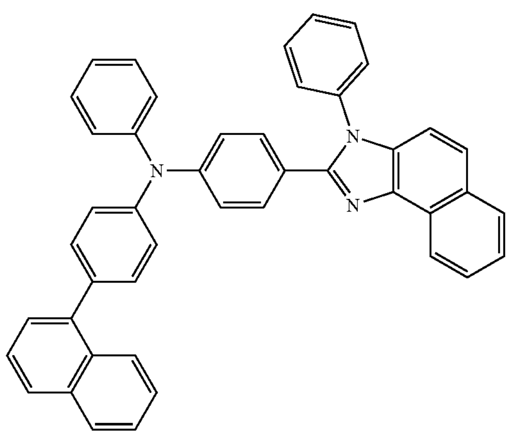
[18]
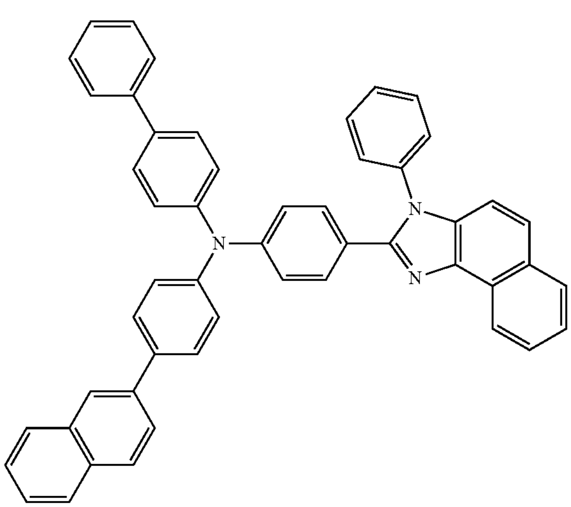
[19]
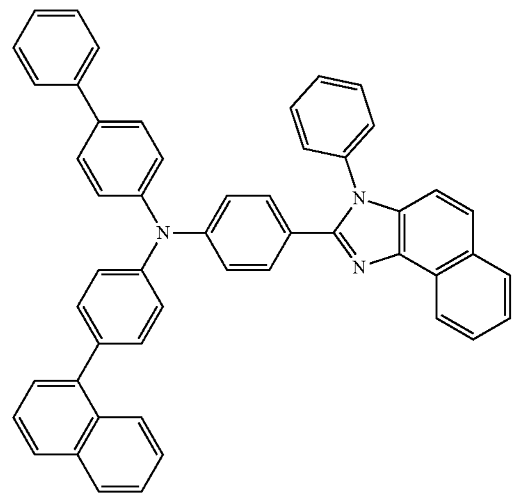
[20]
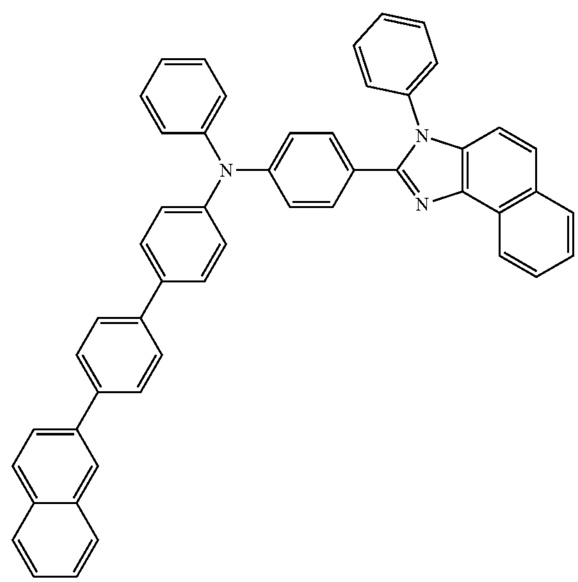
[21]
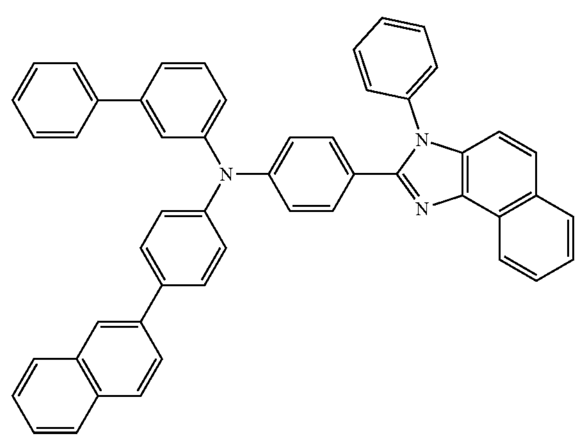

-continued
[22]
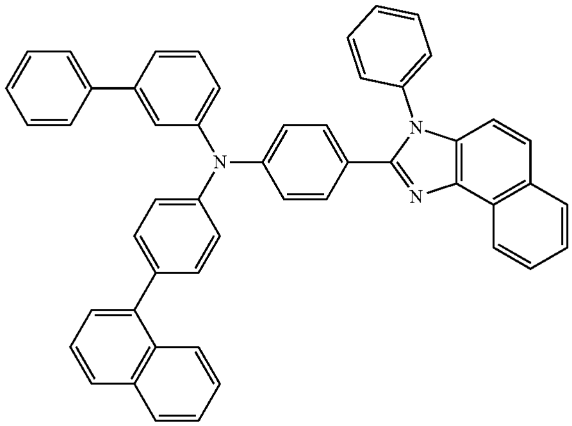
[23]
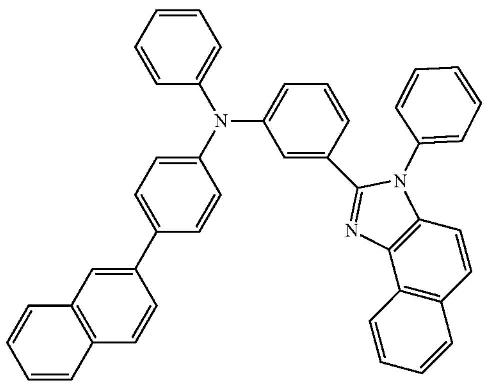
[24]
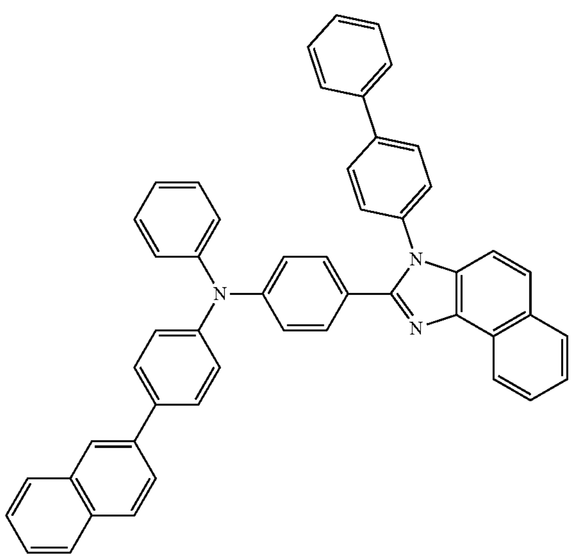
-continued
[25]
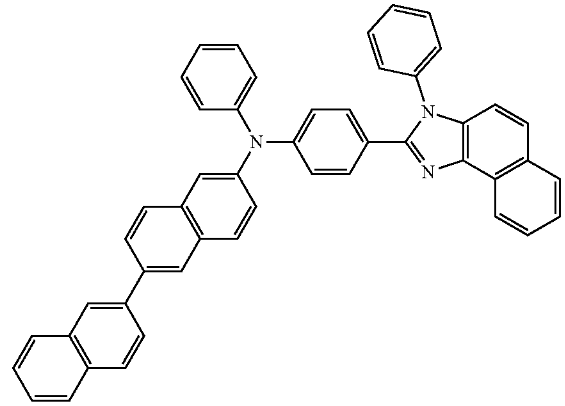
[26]
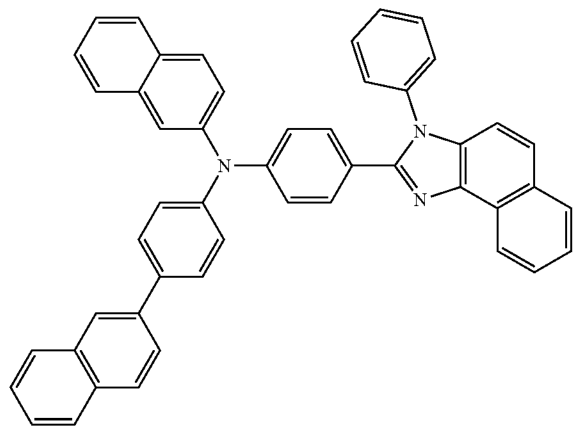
[27]
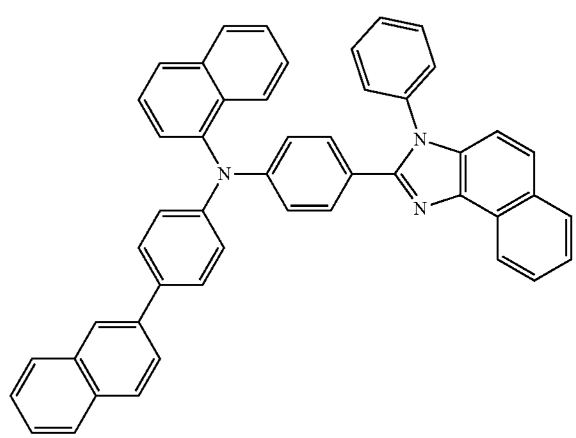

-continued

[28]

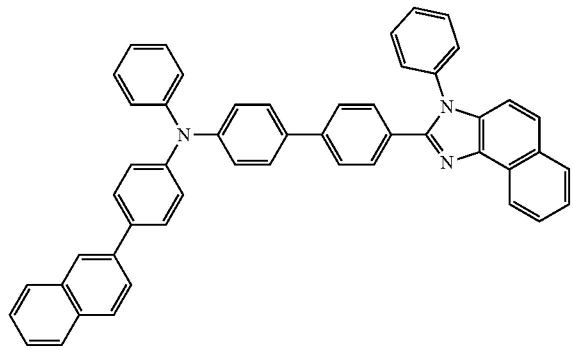

[29]

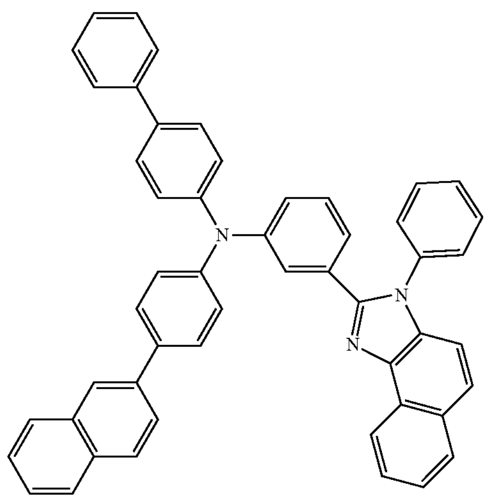

[30]

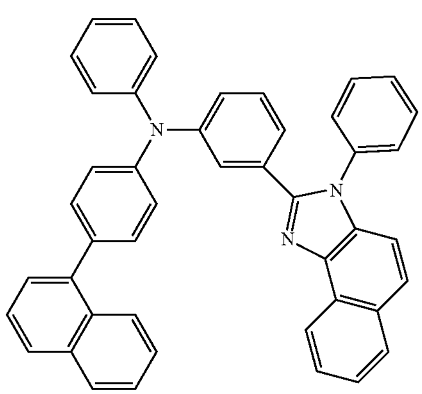

8. A composition for an organic optoelectronic device, the composition comprising a first compound for an organic optoelectronic device and a second compound for an organic optoelectronic device, wherein the first compound is the compound as claimed in claim 1, and the second compound is represented by Chemical Formula 3:

[Chemical Formula 3]

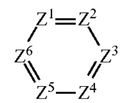

wherein, in Chemical Formula 3, $Z^1$ to $Z^6$ are each independently N or C-$L^b$-$R^b$, at least two of $Z^1$ to $Z^6$ are N, each $L^b$ is independently a single bond, a substituted or unsubstituted C6 to C20 arylene group, a substituted or unsubstituted C2 to C20 heterocyclic group, or a combination thereof, each $R^b$ is independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, and each $R^b$ is separately present or adjacent ones are linked to form a substituted or unsubstituted aliphatic monocyclic ring, a substituted or unsubstituted aliphatic polycyclic ring, a substituted or unsubstituted aromatic monocyclic ring, a substituted or unsubstituted aromatic polycyclic ring, a substituted or unsubstituted heteroaromatic monocyclic ring, or a substituted or unsubstituted heteroaromatic polycyclic ring.

9. The composition as claimed in claim 8, wherein the second compound represented by Chemical Formula 3 is represented by one of Chemical Formula 3A to Chemical Formula 3C:

[Chemical Formula 3A]

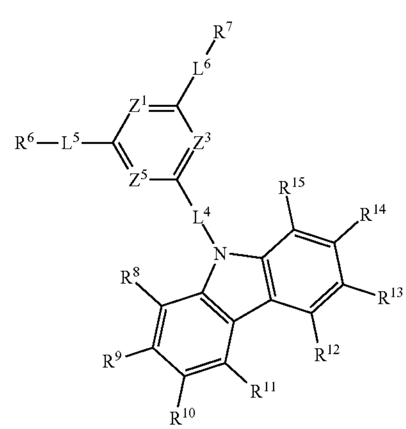

-continued

[Chemical Formula 3B]

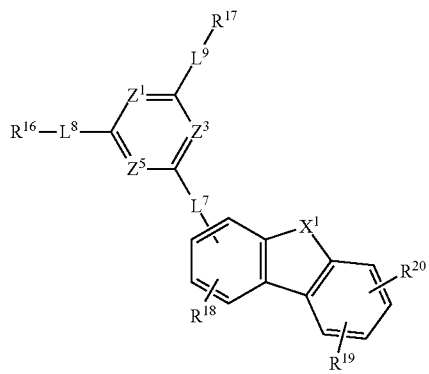

[Chemical Formula 3C]

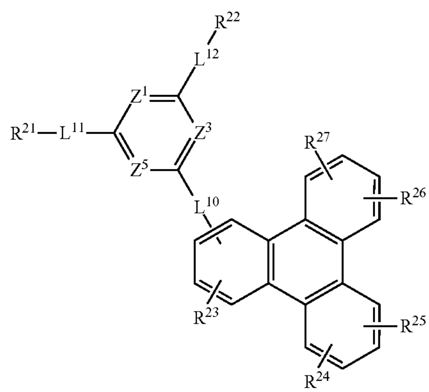

wherein, in Chemical Formulas 3A to 3C, $Z^1$, $Z^3$ and $Z^5$ are each independently N or C-$L^b$-$R^b$, at least two of $Z^1$, $Z^3$, and $Z^5$ are N, $X^1$ is O, S, or $NR^c$, $L^b$ and $L^4$ to $L^{12}$ are each independently a single bond, a substituted or unsubstituted C6 to C20 arylene group, a substituted or unsubstituted C2 to C20 heterocyclic group, or a combination thereof, $R^b$, $R^c$, and $R^6$ to $R^{27}$ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, $R^8$ to $R^{15}$ are separately present or adjacent ones thereof are linked to form a substituted or unsubstituted aromatic monocyclic or polycyclic ring, and $R^b$, $R^6$, $R^7$, $R^{16}$, $R^{17}$, $R^{21}$, and $R^{22}$ are separately present or adjacent ones among $R^b$, $R^6$, and $R^7$; $R^b$, $R^{16}$, and $R^{17}$, and $R^b$, $R^{21}$, and $R^{22}$ are linked to form a substituted or unsubstituted aromatic or heteroaromatic monocyclic ring or a substituted or unsubstituted aromatic or heteroaromatic polycyclic ring.

10. The composition as claimed in claim 8, wherein the second compound represented by Chemical Formula 3 is represented by Chemical Formula 3A-IV:

[Chemical Formula 3A-IV]

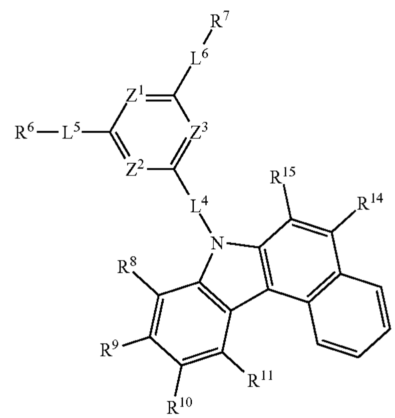

wherein, in Chemical Formula 3A-IV, $Z^1$, $Z^3$ and $Z^5$ are each independently N or C-$L^b$-$R^b$, at least two of $Z^1$, $Z^3$, and $Z^5$ are N, $L^b$ is a single bond, a substituted or unsubstituted C6 to C20 arylene group, a substituted or unsubstituted C2 to C20 heterocyclic group, or a combination thereof, $R^b$ is hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, $L^4$ to $L^6$ are each independently a single bond or a substituted or unsubstituted C6 to C12 aryl group, $R^6$ and $R^7$ are each independently a substituted or unsubstituted phenyl group, a substituted or unsubstituted biphenyl group, a substituted or unsubstituted terphenyl group, a substituted or unsubstituted naphthyl group, a substituted or unsubstituted triphenylene group, a substituted or unsubstituted dibenzofuranyl group, a substituted or unsubstituted dibenzothiophenyl group, or a substituted or unsubstituted carbazolyl group, and $R^8$ to $R^{11}$, $R^{14}$, and $R^{15}$ are each independently hydrogen, deuterium, a substituted or unsubstituted C1 to C10 alkyl group or a substituted or unsubstituted C6 to C12 aryl group.

11. An organic optoelectronic device, comprising:

an anode and a cathode facing each other, and at least one organic layer between the anode and the cathode, wherein the at least one organic layer includes the compound as claimed in claim 1.

12. The organic optoelectronic device as claimed in claim 11, wherein:

the at least one organic layer includes a light emitting layer, and the light emitting layer includes the compound.

13. A display device comprising the organic optoelectronic device as claimed in claim 11.

14. An organic optoelectronic device, comprising:

an anode and a cathode facing each other, and at least one organic layer between the anode and the cathode, wherein the at least one organic layer includes the composition as claimed in claim 8.

15. The organic optoelectronic device as claimed in claim 14, wherein:

the at least one organic layer includes a light emitting layer, and the light emitting layer includes the composition.

16. A display device comprising the organic optoelectronic device as claimed in claim 14.

* * * * *